US010669473B2

(12) United States Patent
Ambrosek et al.

(10) Patent No.: US 10,669,473 B2
(45) Date of Patent: Jun. 2, 2020

(54) ORGANIC MOLECULES FOR USE IN OPTOELECTRONIC COMPONENTS

(71) Applicant: CYNORA GMBH, Bruchsal (DE)

(72) Inventors: David Ambrosek, Berlin (DE); Michael Danz, Eggenstein-Leopoldshafen (DE); Harald Flügge, Karlsruhe (DE); Jana Friedrichs, Karlsruhe (DE); Tobias Grab, Karlsruhe (DE); Andreas Jacob, Hannover (DE); Stefan Seifermann, Brühl (DE); Daniel Volz, Karlsruhe (DE)

(73) Assignee: CYNORA GMBH, Bruchsal (DE)

( * ) Notice: Subject to any disclaimer, the term of this patent is extended or adjusted under 35 U.S.C. 154(b) by 67 days.

(21) Appl. No.: 15/544,557

(22) PCT Filed: Jan. 20, 2016

(86) PCT No.: PCT/EP2016/051124
§ 371 (c)(1),
(2) Date: Jul. 19, 2017

(87) PCT Pub. No.: WO2016/116497
PCT Pub. Date: Jul. 28, 2016

(65) Prior Publication Data
US 2018/0265777 A1    Sep. 20, 2018

(30) Foreign Application Priority Data

Jan. 20, 2015 (EP) .................................. 15151870
May 20, 2015 (DE) .................... 10 2015 107 905

(51) Int. Cl.
*H01L 51/00* (2006.01)
*C09K 11/06* (2006.01)
*H01L 51/50* (2006.01)

(52) U.S. Cl.
CPC .......... *C09K 11/06* (2013.01); *H01L 51/0067* (2013.01); *H01L 51/0071* (2013.01);
(Continued)

(58) Field of Classification Search
None
See application file for complete search history.

(56) References Cited

U.S. PATENT DOCUMENTS

2008/0169755 A1* 7/2008 Kim .................. C07D 209/88
                                                 313/504
2009/0072727 A1* 3/2009 Takeda .................. C09K 11/06
                                                 313/504
(Continued)

FOREIGN PATENT DOCUMENTS

CN      102459171 A       5/2012
CN      104327024 A  *    2/2015  ........... C07D 307/91
(Continued)

OTHER PUBLICATIONS

Machine translation of JP-2005044791, 36 pages, translation generated Mar. 2019. (Year: 2019).*
(Continued)

*Primary Examiner* — Robert S Loewe
(74) *Attorney, Agent, or Firm* — Ryan, Mason & Lewis, LLP

(57) ABSTRACT

The invention relates to organic molecules having a structure of formula 1

AF1-(Separator)$_m$-AF2    Formula 1 wherein:
m is 0 or 1;
AF1 is a first chemical entity, having a conjugated system, in particular at least six conjugated electrons (e.g., in the form of at least one aromatic system);
(Continued)

AF2 is a second chemical entity, having a conjugated system, in particular at least six conjugated π electrons (e.g., in the form of at least one aromatic system);
with AF1≠AF2;
wherein AF1 has a structure of formula 2-1:

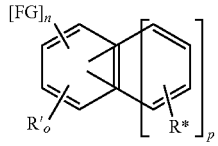

Formula 2-1 wherein
FG is selected from the group consisting of $CR^{}_2F$, $CF_3$, $CF_2R^{}$, $SF_5$, $N—(CF_3)_1$, $N—(CF_3)_2$, $O—CF_3$, $S—CF_3$ and $CF_2CO_2R^*$;
n=1 to 5;
o=1 to 5;
n+o=5;
p=0 or 1;
R'=linking point on the separator, linking point on the chemical entity AF2 or a radical R*;
wherein one R' represents a linking point on the separator or on the chemical entity AF2.

20 Claims, 18 Drawing Sheets

(52) U.S. Cl.
CPC ...... *H01L 51/0072* (2013.01); *H01L 51/5004* (2013.01); *C09K 2211/1007* (2013.01); *C09K 2211/1011* (2013.01); *C09K 2211/1029* (2013.01); *C09K 2211/1033* (2013.01); *C09K 2211/1044* (2013.01); *C09K 2211/1051* (2013.01); *C09K 2211/1059* (2013.01); *C09K 2211/1074* (2013.01); *H01L 51/5012* (2013.01); *Y02E 10/549* (2013.01); *Y02P 70/521* (2015.11)

(56) References Cited

U.S. PATENT DOCUMENTS

| | | |
|---|---|---|
| 2012/0034627 A1 | 2/2012 | Singh |
| 2012/0202856 A1 | 8/2012 | Player et al. |
| 2014/0231715 A1* | 8/2014 | Stoessel ................ C09K 11/06 252/500 |
| 2015/0105564 A1* | 4/2015 | Adachi ................ C07D 209/18 548/440 |
| 2015/0129849 A1* | 5/2015 | Kwong ............... H01L 51/0072 257/40 |
| 2016/0046563 A1 | 2/2016 | Stoessel et al. |
| 2016/0072076 A1* | 3/2016 | Stoessel ............... C07D 219/02 257/40 |

FOREIGN PATENT DOCUMENTS

| | | | | |
|---|---|---|---|---|
| DE | 102010045405 A1 | | 3/2012 | |
| JP | 2004178896 A | | 6/2004 | |
| JP | 2005044791 A | * | 2/2005 | ............. H05B 33/22 |
| JP | 2005044791 A | | 2/2005 | |
| JP | 2012191031 A | * | 10/2012 | ............. H01L 51/50 |
| KR | 20150056046 A | | 5/2015 | |
| WO | 2014061961 A1 | | 4/2014 | |
| WO | 2014128945 A1 | | 8/2014 | |
| WO | 2014146750 A1 | | 9/2014 | |
| WO | 2016003054 A1 | | 1/2016 | |

OTHER PUBLICATIONS

Dai et al. "Synthesis and biological evaluation of phenyl substituted polyoxygenated xanthone derivatives as anti-hepatoma agents" Eur. J. Med. Chem. 2013, 69, 159-166. (Year: 2013).*
Machine translation of JP-2012191031, 21 pages, translation generated Oct. 2019. (Year: 2019).*
C. Liu et al., "Oxygen-Promoted Pd/C-Catalyzed Suzuki-Miyaura Reaction of Potassium Aryltrifluoroborates," Chinese Chemical Letters, May 2016, pp. 631-634, vol. 27, No. 5.
Z. Ge et al., "Solution-Processible Fluorinated Carbazole Derivative for Phosphorescent Organic Light-Emitting Diodes," Chemistry Letters, Mar. 2008, pp. 294-295, vol. 37, No. 3.
P. Strohriegl et al., "Novel Host Materials for Blue Phosphorescent OLEDs," Proceedings of SPIE, Organic Light Emitting Materials and Devices XVII, Sep. 27, 2013, vol. 8829.

* cited by examiner

ORGANIC MOLECULES FOR USE IN OPTOELECTRONIC COMPONENTS

CROSS-REFERENCE TO RELATED APPLICATIONS

This application claims priority to international Application No. PCT/EP2016/051124, filed Jan. 20, 2016, which claims priority to European Patent Application No. 15151870.1 filed Jan. 20, 2015 and European Patent Application No. 102015107905.4 filed May 20, 2015 the disclosures of which are incorporated by reference herein in their entireties.

FIELD OF INVENTION

The invention relates to purely organic molecules and the use thereof in organic light-emitting diodes (OLEDs) and in other optoelectronic components.

BACKGROUND

In recent years, technology based on OLED (organic light-emitting diodes) has become established in the area of screen technology, so the first commercial products based on this are now available. In addition to screen technology, OLEDs are also suitable for use in two-dimensional lighting technology. For this reason, intensive research is being conducted on the development of new materials.

OLEDs are generally produced in layered structures consisting mainly of organic materials. For better understanding, a simplified structure is shown as an example in FIG. 1. The core of such components is the emitter layer, in which generally light-emitting molecules are embedded in a matrix. In this layer, negative charge carriers (electrons) and positive charge carriers (holes) meet and recombine into so-called excitons. The energy contained in the excitons can be released by the corresponding emitters in the form of light, and in this case the term electroluminescence is used. An overview of the function of OLEDs is available, for example, in H. Yersin, Top. Curr. Chem. 2004, 241, 1 and H. Yersin, "Highly Efficient OLEDs with Phosphorescent Materials," Wiley-VCH, Weinheim, Germany, 2008.

Since the first reports on OLEDs (Tang et al., Appl. Phys. Lett. 1987, 51, 913) this technology has undergone continuous further development, especially in the area of emitter materials. Whereas the first material based on purely organic molecules were able to convert a maximum of 25% of the excitons into light because of spin statistics, the use of phosphorescent compounds made it possible to circumvent this fundamental problem, so that at least theoretically all excitons can be converted to light. These material are generally transition metal complexes, in which the metal is selected from the third period of the transition metals. Primarily very expensive noble metals such as iridium, platinum or gold are used. (Also see H. Yersin, Top. Curr. Chem. 2004, 241, 1 and M. A. Baldo, D. F. O'Brien, M. E. Thompson, S. R. Forrest, Phys. Rev. B 1999, 60, 14422). In addition to the expense, the stability of the materials is sometimes the stability of the materials presents drawback for their use.

A new generation of OLEDs based on the use of delayed fluorescence (TADF: thermally activated delayed fluorescence or singlet harvesting). In this process, for example, it is possible to use Cu(I) complexes which, because of a small energy distance between the lowest triplet state $T_1$ and the singlet state $S_1$ ($\Delta E(S_1-T_1)$) located above it, triplet excitons can thermally return to a singlet state. In addition to the use of transition metal complexes, purely organic molecules can also utilize this effect.

Some such TADF materials having already been used in the first optoelectronic components. The solutions to date, however, have drawbacks and problems. The TADF materials in the optoelectronic components often do not have sufficient long-term stability, thermal stability or chemical stability against water and oxygen. In addition, not all important emission colors are available. Furthermore, some TADF materials are not vaporizable and thus are not suitable for use in commercial optoelectronic components. Additionally, some TADF materials do not have suitable energy layers for the other materials used in the optoelectronic component (e.g., HOMO energies of TADF emitters of greater than or equal to −5.9 eV). Sufficiently high efficiencies of the optoelectronic components cannot be achieved at high power densities or high luminous densities with all TADF materials. In addition, the synthesis of some TADF materials is complicated.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS OF THE INVENTION

Figure 1:
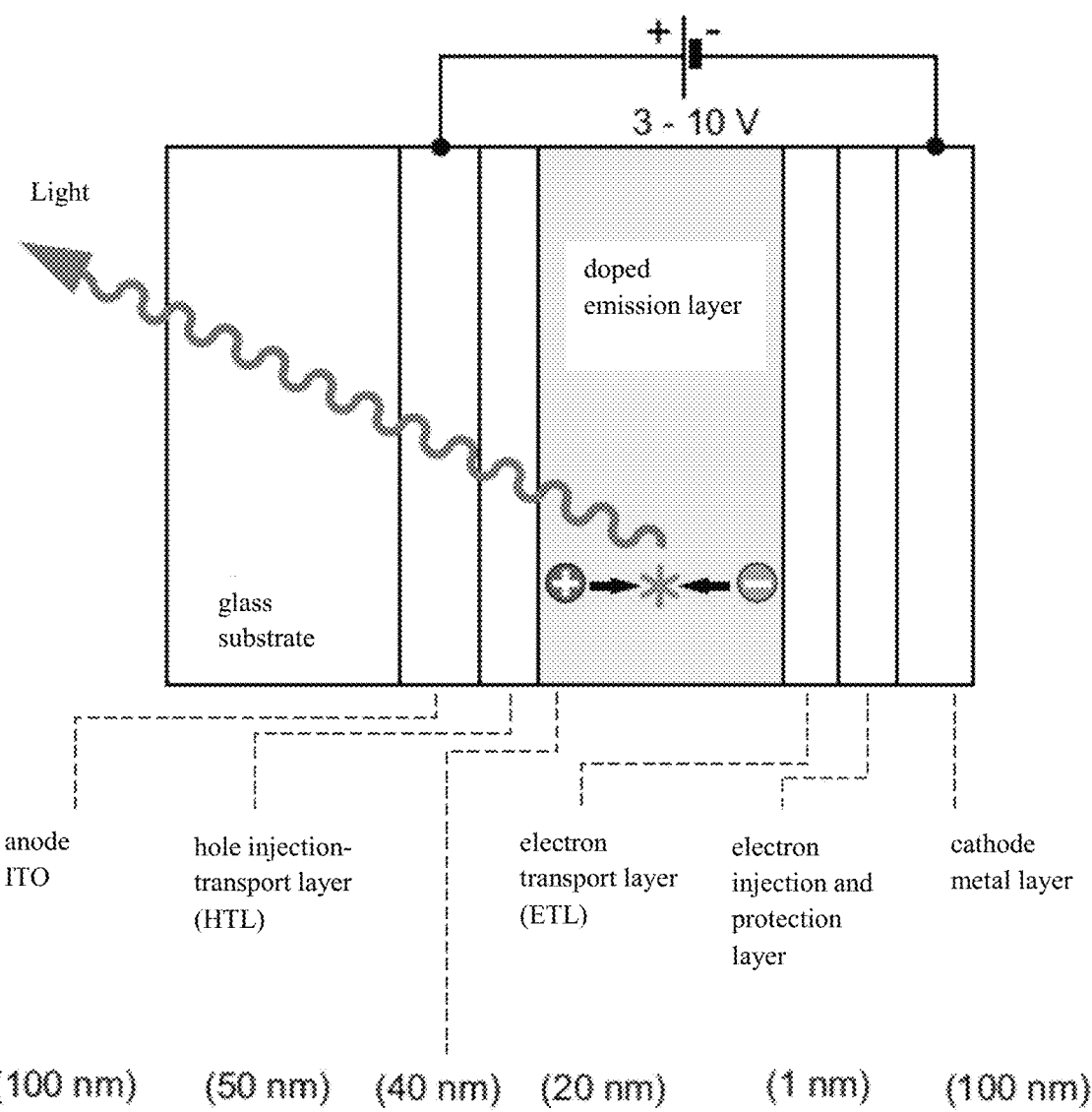
FIG. 1 is a schematic representation of the structure of an organic light-emitting diode (OLED).

Exemplary embodiments of the invention will now be discussed in further detail. This invention may, however, be embodied in many different forms and should not be construed as limited to the embodiments set forth herein.

The invention relates, in a first aspect, to providing organic molecules comprising a structure of formula 1 or consisting of a structure of formula 1:

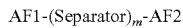  Formula 1 wherein:
m is 0 or 1;
AF1 is a first chemical entity, comprising a conjugated system, in particular at least six π electrons in conjugation (e.g., in the form of at least one aromatic system);
AF2 is a second chemical entity, comprising a conjugated system, in particular at least six it electrons in conjugation (e.g., in the form of at least one aromatic system;
AF1≠AF2;
the separator is a chemical entity linking AF1 and AF2 and interrupting their electronic communication with one another over conjugated bonds;
and wherein the separator is connected to the conjugated system of AF1 and of AF2 at two points at a distance from one another;
and wherein at least one of the two chemical entities AF1 or AF2 is substituted with fluorine or a fluorine-containing electron withdrawing group FG, selected from $CR^{}_2F$, $CF_3$, $CF_2R^{}$, $SF_5$, $N-(CF_3)_1$, $N-(CF_3)_2$, $O-CF_3$, $S-CF_3$, $CF_2CO_2R^*$ and a group $E^*$ which is an aryl or heteroaryl group with 6 to 18 aromatic ring atoms which may be substituted with one or more radicals $R^8$, and which contain as components of the aromatic ring one or more groups $V^*$, wherein the groups $V^*$ in each instance are selected, identical or different, from $=C(F)-$ and $=C(CF_3)-$.

In one embodiment only one of the two chemical entities AF1 or AF2 is substituted with fluorine or a fluorine-containing electron-withdrawing group FG.

In an additional embodiment the chemical entity AF1 substituted with fluorine or a fluorine-containing electron withdrawing group FG and the chemical entity AF2 is selected from among one of the structures listed in Table 2, or comprises a structure of formula 3.

$R^{**}$ is the same or different in each instance and is H, a linear alkyl, alkenyl, alkynyl group with 3 to 40 C atoms, or a linear alkenyl or alkynyl group with 2 to 40 C atoms or a branched or cyclic alkyl, alkenyl, alkynyl group with 3 to 40 C atoms, which is optionally partially fluorinated or perfluorinated;

and wherein:

$R^*$ in each instance is selected, independently of one another, from the group consisting of H, deuterium, phenyl, naphthyl, $N(R^2)_2$, $-CN$, $-NC$, $-SCN$, $-CF_3$, $-NO_2$, $C(=O)OH$, $C(=O)OR^3$, $C(=O)N(R^3)_2$, $C(=O)SR^3$, $C(=S)SR^3$, $Si(R^4)_3$, $B(OR^5)_2$, $B(N(R^6)_2)_2$, $C(=O)R^3$, $P(=O)(R^7)_2$, $As(=O)(R^7)_2$, $P(=S)(R^7)_2$, $As(=S)(R^7)_2$, $S(=O)R^3$, $S=NR^3$, $S(=O)NR^3$, $S(=O)_2NR^3$, $S(=O)_2R^3$, $O-S(=O)_2R^3$, $SF_5$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which may in each case be substituted with one or more radicals $R^9$, wherein one or more adjacent $CH_2$ groups may be replaced by $-R^9C=CR^9-$, $-C\equiv C-$, or one adjacent $CH_2$ group by $-Si(R^4)_2-$, $-Ge(R^4)_2-$, $-Sn(R^4)_2$, $-C(=O)-$, $-C(=S)-$, $-C(=Se)-$, $-C=N-$, $-C(=O)O-$, $-C(=O)N(R^3)-$, $-P(=O)(R^7)-$, $-As(=O)(R^7)-$, $-P(=S)(R^7)$, $-As(=S)(R^7)-$, $-S(=O)-$, $-S(=O)_2-$, $-NR^2-$, $-O-$, or $-S-$ and wherein one or more H atoms may be replaced by deuterium, F, Cl, Br, I, CN, $CF_3$ or $NO_2$, or may be an aromatic or heteroaromatic ring system with 5 to 60 aromatics, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; in this case two or more of these substituents $R^*$ may also, together with one another, also form a mono- or polycyclic, aliphatic, aromatic and/or benzoanellated ring system. In one embodiment the ring system that may be formed is limited to a monocyclic aliphatic ring system with a total of five or six ring members.

$R^2$ is in each instance, independently of one another, selected from the group of ring atoms that in each case may be substituted with one or more radicals $R^2$ consisting of H, deuterium, phenyl, naphthyl, $CF_3$, $C(=O)OR^3$, $C(=O)N(R^2)_2$, $Si(R^4)_3$, $C(=O)R^3$, $P(=O)(R^7)_2$, $As(=O)(R^7)_2P(=S)(R^7)_2$, $As(=S)(R^7)_2$, $S(=O)R^3$, $S(=O)_2R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by $-R^9C=CR^9-$, $-C\equiv C-$, or one adjacent $CH_2$-group by $-Si(R^4)_2-$, $-Ge(R^4)_2-$, $-Sn(R^4)_2$, $-C(=O)-$, $-C(=S)-$, $-C(=Se)-$, $-C=N-$, $-C(=O)O-$, $-C(=O)N(R^3)-$, $-P(=O)(R^7)-$, $-As(=O)(R^7)-$, $-P(=S)(R^7)-$, $-As(=S)(R^7)-$, $-S(=O)-$, $-S(=O)_2-$, $-NR^2-$, $-O-$, or $-S-$ and wherein one or more H atoms may be replaced by deuterium, F, Cl, Br, I, CN, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; here two or more of these substituents $R^2$ may also form with one another a mono- or polycyclic, aliphatic, aromatic and/or benzoanellated ring system;

$R^3$ is in each instance independently of one another selected from the group consisting of H, deuterium, phenyl, naphthyl, $CF_3$ or an aliphatic, aromatic and/or heteroaromatic hydrocarbon radical with 1 to 20 C atoms, in which also one or more H atoms may be replaced by F or $CF_3$; here also two or more substituents $R^3$ may also form a mono- or polycyclic, aliphatic ring system with one another;

$R^4$ is in each instance independently of one another selected from the group consisting of H, deuterium, phenyl, naphthyl, $N(R^2)_2$, CN, $CF_3$, OH, $C(=O)OR^3$, $C(=O)N(R^3)_2$, $C(=O)R^3$, $P(=O)(R^7)_2$, $As(=O)(R^7)_2$, $P(=S)(R^7)_2$, $As(=S)(R^7)_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals $R^9$, wherein one or more adjacent $CH_2$ groups may be replaced by $-R^9C=CR^9-$, $-C\equiv C-$, or one adjacent $CH_2$-groups by $-Si(R^4)_2-$, $-Ge(R^4)_2-$, $-Sn(R^4)_2-$, $-C(=O)-$, $-C(=S)-$, $-C(=Se)-$, $-C=N-$, $-C(=O)O-$, $-C(=O)N(R^3)-$, $-P(=O)(R^7)-$, $-As(=O)(R^7)-$, $-P(=S)(R^7)$, $-As(=S)(R^7)-$, $-S(=O)-$, $-S(=O)_2-$, $-NR^2-$, $-O-$, or $-S-$ and wherein one or more H atoms may be replaced by deuterium, F, Cl, Br, I, CN, $CF_3$ or $NO_2$, or an aromatic or heteroaromatic ring system with 5 to 60 aromatic ring atoms, each of which may be substituted with one or more radicals $R^8$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; here, two or more of these substituents $R^4$ may also form a mono- or polycyclic, aliphatic, aromatic and/or benzoanellated ring system with one another;

$R^5$ is in each instance independently of one another selected from the group consisting of phenyl, naphthyl, $CF_3$, $C(=O)R^3$, $P(=O)(R^7)_2$, $As(=O)(R^7)_2$, a linear alkyl, alkoxy or thioalkoxy group with 1 to 40 C atoms or a linear alkenyl or alkynyl group with 2 to 40 C atoms or branched or cyclic alkyl, alkenyl, alkynyl, alkoxy or thioalkoxy group with 3 to 40 C atoms, which in each case may be substituted with one or more radicals $R^9$, wherein one or more adjacent $CH_2$ groups may be replaced by $-R^9C=CR^9-$, $-C\equiv C-$, or one adjacent $CH_2$-group by $-Si(R^4)_2-$, $-Ge(R^4)_2-$, $-Sn(R^4)_2$, $-C(=O)-$, $-C(=S)-$, $-C(=Se)-$, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; in this connection two or more of these substituents R$^5$ may also form a mono- or polycyclic, aliphatic, aromatic and/or benzoanellated ring system;

R$^6$ is in each instance independently of one another selected from the group consisting of phenyl, naphthyl, CF$_3$, Si(R$^4$)$_3$, C(=O)R$^3$, P(=O)(R$^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which may be substituted in each case with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$), —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with or more radicals R*, or a diarylamino group, diheteroarylamino group or arylheteroarylamino group with 10 to 40 aromatic ring atoms, which may be substituted with one or more radicals R$^9$, or a combination of these systems; in this process two or more of these substituents R$^6$ may also form a mono- or polycyclic, aliphatic, aromatic and/or benzoanellated ring system with one another;

R$^7$ is in each instance, independently of one another, selected from the group consisting of phenyl, naphthyl, N(R$^2$)$_2$, CN, CF$_3$, C(=O)OR$^3$, C(=O)N(R$^3$)$_2$, Si(R$^4$)$_3$, C(=O)R$^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$), —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; here, two or more of these substituents R$^7$ may also form a mono- or polycyclic, aliphatic, aromatic and/or benzoanellated ring system;

R$^8$ is in each instance independently of one another selected from the group consisting of H, deuterium, phenyl, naphthyl, F, CF$_3$ or an aliphatic, aromatic and/or heteroaromatic hydrocarbon radical with 1 to 20 C atoms, in which also one or more H atoms may be replaced by F or CF$_3$; here, two or more substituents R$^8$ may also form a mono- or polycyclic, aliphatic ring system;

R$^9$ is in each instance independently of one another selected from the group consisting of H, deuterium, phenyl, naphthyl, N(R$^2$)$_2$, CN, CF$_3$, NO$_2$, OH, COOH, C(=O)OR$^3$, C(=O)N(R$^3$)$_2$, Si(R$^4$)$_3$, B(OR$^5$)$_2$, C(=O)R$^3$, P(=O)(R$^7$)$_2$, P(=S)(R$^7$)$_2$, As(=O)(R$^7$)$_2$, P(=S)(R$^7$)$_2$, S(=O)R$^3$, S(=O)$_2$R$^3$, OSO$_2$R$^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals R$^8$, wherein one or more non-adjacent CH$_2$ groups may be replaced by —R$^3$C=CR$^3$—, —C≡C—, or one adjacent CH$_2$-group by Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$), —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^8$, or an aryloxy or heteroaryloxy group with 5 to 60 aromatic ring atoms, which may be substituted with one or more radicals R$^3$, or a diarylamino group, diheteroarylamino group or arylheteroarylamino group with 10 to 40 aromatic ring atoms, which may be substituted with one or more radicals R$^8$, or a combination of these systems; here, two or more of these substituents R$^9$ may also form with one another a mono- or polycyclic, aliphatic, aromatic and/or benzoanellated ring system;

an aryl group in the sense of this invention contains 6 to 60 aromatic ring atoms; a heteroaryl group in the sense of this invention contains 5 to 60 aromatic ring atoms, at least one of which is a heteroatom. The heteroatoms are in particular N, O, and S. If definitions deviating from this are given in the description of the invention, for example with regard to the number of aromatic ring atoms or the heteroatoms present, these deviant definitions are valid.

In this connection an aryl group or heteroaryl group denotes a single aromatic ring, thus benzene, or a single heteroaromatic ring, for example pyridine, pyrimidine or thiophene, or a heteroaromatic polycyclic, for example naphthalene, phenanthrene, quinoline or carbazole. A condensed (anellated) aromatic or heteroaromatic polycyclic in the sense of the present application cons is s of two or more single aromatic or heteroaromatic rings condensed with one another.

An aryl or heteroaryl group, which in each case may be substituted with the above named radicals and which can be bonded with the aromatic or heteroaromatic compound over any arbitrary positions, denotes in particular groups derived from benzene, naphthalene, anthracene, phenanthrene, pyrene, dihydropyrene, chrysene, perylene, fluoranthene, benzanthracene, benzphenanthrene, tetracene, pentacene, benzpyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, isoquinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzpyrimidine, quinoxaline, pyrazine, phenazine, naphthyridine, azacarbazole, benzocarbolin, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, purine, pteridine, indolizine and benzothiadiazole.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are in particular selected from N, O and/or S. An aromatic or heteroaromatic ring system in the sense of this invention denotes a system that does not necessarily contain only aryl or heteroaryl groups, but in which also several aryl or heteroaryl groups may be bound by a non-aromatic entity (in particular less than 10% of the various atoms), for example a sp3-hybridized C, Si, or N atom, a sp2-hybridized C, N or O atom or a sp-hybridized C atom. For example, systems such as 9,9'-diarylfluorene, triarylamine, diaryl ether, stilbene etc. may be defined as aromatic ring systems in the sense of this invention, and likewise systems in which two or more aryl groups are connected, for example by a linear or cyclic alkyl, alkenyl or alkynyl group or by a silyl group. Furthermore systems in which two or more aryl or heteroaryl groups are connected over single bonds are also defined as aromatic or heteroaromatic ring systems in the sense of this invention, for example systems such as biphenyl, terphenyl or diphenyltriazine.

An aromatic or heteroaromatic ring system with 5 to 60 aromatic ring atoms, which may also be substituted with radicals as defined above, and which may be linked over any desired positions to the aromatics or heteroaromatics, in particular may represent groups derived from benzene, naphthalene, anthracene, benzanthracene, phenanthrene, benzphenanthrene, pyrene, chrysene, perylene, fluoranthene, naphthacene, pentacene, benzpyrene, biphenyl, biphenylene, terphenyl, terphenylene, quaterphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene; pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, napthoxazole, anthroxazole, phenanthroxazole, isoxazole, 1,2-thiazole, 1,3-thiazole, benzothiazole, pyridazine, benzopyridazine, pyrimidine, benzpyrimidine, quinoxaline, 1,5-diazaanthracene, 2,7-diazapyrine, 2,3-diazapyrine, 1,6-diazapyrine, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarbolin, phenanthroline, 1,2,3-triazole, 1,2,4-triazole, benzotriazole, 1,2,3-oxadiazole, 1,2,4-oxadiazole, 1,2,5-oxadiazole, 1,2,3-oxadiazole, 1,2,3-thiadiazole, 1,2,5-thiadiazole, 1,3,4-thiadiazole, 1,3,5-triazine, 1,2,4-triazine, 1,2,3-triazine, tetrazole, 1,2,3,5-tetrazine, 1,2,3,4-tetrazine, purine, pteridine, indolizine and benzothiadazole or combinations of these groups.

In one embodiment the chemical entities AF1 and AF2 are linked over the separator S in such a manner that electronic communication between them is interrupted. This interruption is characterized by localization of the limiting orbitals HOMO and LUMO on separate parts of the molecules, making a charge-transfer transition possible.

The electronic communication between the two chemical entities AF1 and AF2 over conjugated bonds with an optional separator is interrupted when the limiting orbitals HOMO and LUMO are localized on separate parts of the molecule, so that a charge-transfer transition is possible. The localization of the limiting orbitals HOMO or LUMO here is visualized using density functional theory (DFT) with the BP86 functional (Becke, A. D. Phys. Rev. A1988, 38, 3098-3100; Perdew, J. P. Phys. Rev. B1986, 33, 8822-8827): Using the single-electron wave function, the single-electron density is calculated by squaring and integrated over the volume occupied by the part of the molecule being investigated. This volume can be determined from the atomic coordinates and the van der Waals radii of the atoms. The resulting number corresponds to the fraction of the orbital on the part of the molecule. Repeated separation of the limiting orbitals in this connection corresponds to an overlap parameter O in the range of 0.1 to 20%, in order to allow a charge transfer transition. The overlap parameter O between the HOMO wave function $\phi_a$ and that of the LUMO wave function $\phi_b$ is obtained from the integral over the total volume over the respectively smaller value of the wave function squared:

$$O = \int \rho \, d\tau \text{ with } \rho = \begin{cases} \varphi_a^2, \text{ when } |\varphi_a| < |\varphi_b| \\ \varphi_b^2, \text{ when } |\varphi_a| \geq |\varphi_b| \end{cases}$$

Compared with AF1, AF2 has a quantitatively lower HOMO numerical value (and thus also correspondingly a quantitatively lower LUMO numerical value) than AF2 ($|E_{HOMO}(AF2)|<|E_{HOMO}(AF1)|$ und $|E_{LUMO}(AF2)|<|E_{LUMO}(AF1)|$).

In one embodiment the organic molecules are characterized by the fact that
  the difference between the energy of the HOMO of the second chemical entity AF2 and the energy of the HOMO of the first chemical entity AF1 is >0.8 eV (Δ HOMO=HOMO(AF2)−HOMO(AF1)>0.8 eV);
  the difference between the energy of the LUMO of the second chemical entity AF2 and the energy of the LUMO of the first chemical entity is AF1>0.8 eV (Δ LUMO=LUMO(AF2)−LUMO(AF1)>0.8 eV); and/or
  the difference between the energy of LUMO of the first chemical entity AF1 and the energy of the HOMO of the second chemical entity AF2 is >0.9 eV (Δ Gap=LUMO (AF1)−HOMO(AF2)>0.9 eV).

In this connection the energy values HOMO(AF1), HOMO(AF2), LUMO(AF1), LUMO(AF2) are calculated using density functional theory (DFT), wherein the linking points of the ambifunctional entities and the separators are saturated with a hydrogen atom corresponding to their chemical valences. The limits given relate to orbital energies in eV, which are calculated with the BP86 functional (Becke, A. D. Phys. Rev. A1988, 38, 3098-3100; Perdew, J. P. Phys. Rev. B1986, 33, 8822-8827).

In one embodiment at least one AF is substituted with fluorine or $CF_3$.

In one embodiment the chemical entity AF1 comprises a structure of formula 2-1 or consists of a structure of formula 2-1:

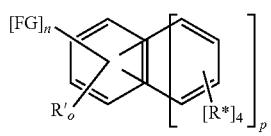

Formula 2-1 wherein the following is true for formula 2-1:
n=1 to 5;
o=1 to 5;
n+o=5;
p=0 or 1;
R'=linking point on the separator, linking point on the other chemical entity AF2 or a residue R*; wherein precisely one R' represents a linking point on the separator or on the other chemical entity AF2.
and wherein otherwise the definitions given for formula 1 apply.

In a further embodiment the chemical entity AF1 has a structure or comprises a structure selected from one of the following structures:

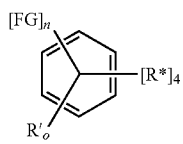

Formula 2-1a

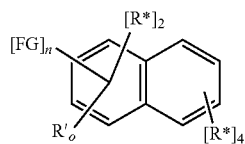

Formula 2-1b and wherein the definitions given for formula 2-1 apply.

In one embodiment the chemical entity AF1 has a structure of formula 2-2 or comprises a structure of formula 2-2

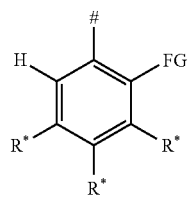

Formula 2-2 with
=linking point on the separator or linking point on the chemical entity AF2;
and wherein otherwise the definitions given in formula 1 apply.

In another embodiment the chemical entity AF1 consists of a structure or comprises a structure selected from one of the following structures:

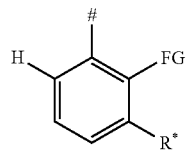

Formula 2-2A

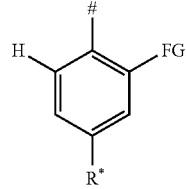

Formula 2-2B

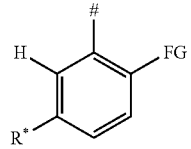

Formula 2-2C with
=linking point on the separator or linking point on the chemical entity AF2;
and wherein otherwise the definitions given in formula 1 apply.

In one embodiment the chemical entity AF1 comprises one of the structures shown in Table 1.

TABLE 1

Examples of fluorine-containing chemical entities AF1, wherein the linking point on the separator or on the chemical entity AF2 is designated with lower-case letters a to e

| | |
|---|---|
| 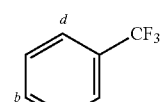 | 150 |
| 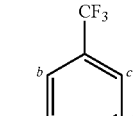 | 151 |
| 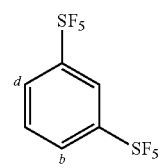 | 342 |

TABLE 1-continued

Examples of fluorine-containing chemical entities AF1, wherein the linking point on the separator or on the chemical entity AF2 is designated with lower-case letters a to e

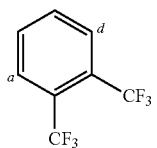
153

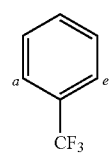
154

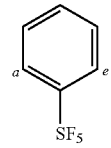
184

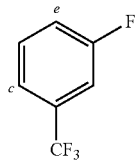
244

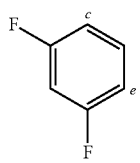
192

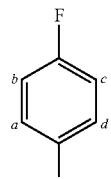
193

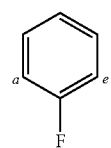
194

In one embodiment the chemical entities AF2 are selected from the compounds listed in Table 2 and are combined with a fluorine-containing AF1 as shown in formula 1.

TABLE 2

List of the second chemical entities AF2.

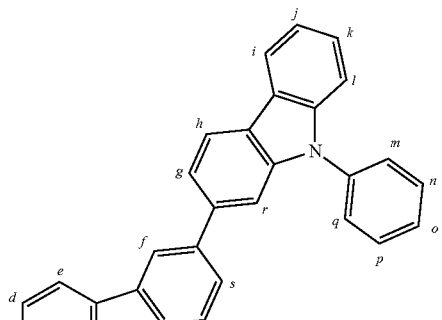
1

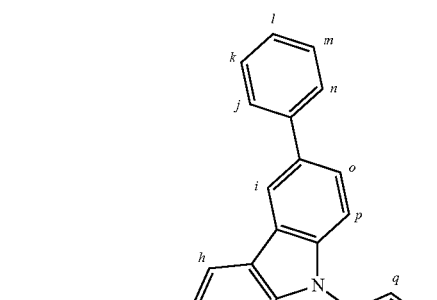
2

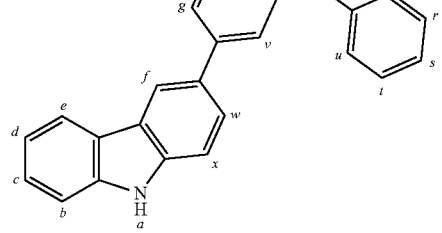
3

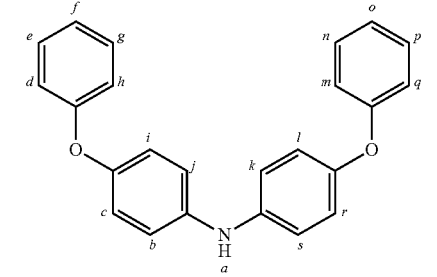
4

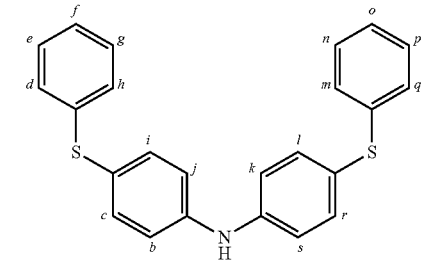

TABLE 2-continued

List of the second chemical entities AF2.

TABLE 2-continued
List of the second chemical entities AF2.
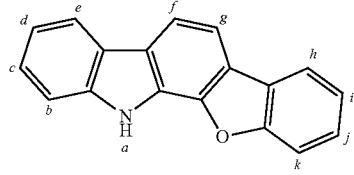 32
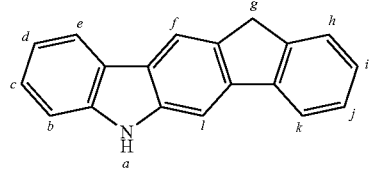 33
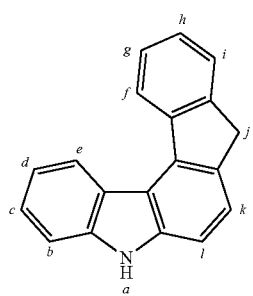 34
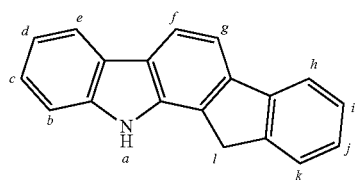 35
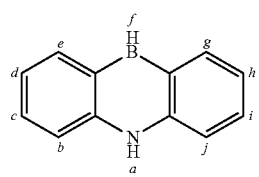 38
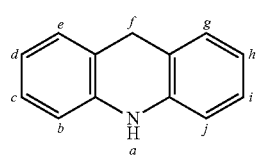 39
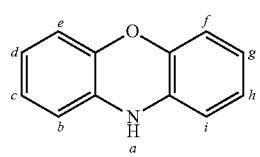 41
TABLE 2-continued
List of the second chemical entities AF2.
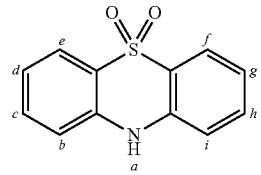 [SMILES: O=S1(=O)c2ccccc2Nc2ccccc21] 44
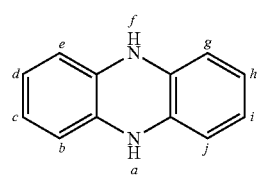 49
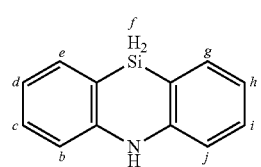 53
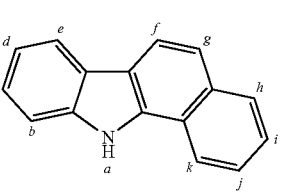 54
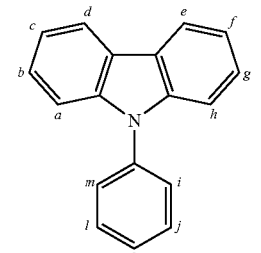 55
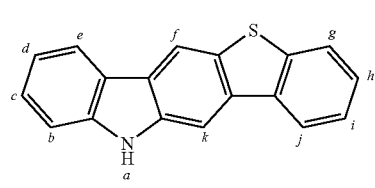 58
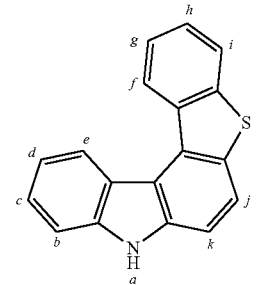 [SMILES: c1ccc2c(c1)[nH]c1ccc3sc4ccccc4c3c12] 59

TABLE 2-continued
List of the second chemical entities AF2.
60
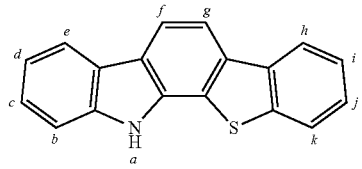
63
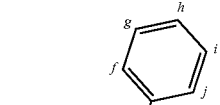
64
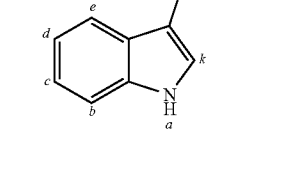
66
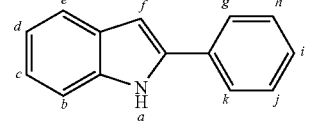
71
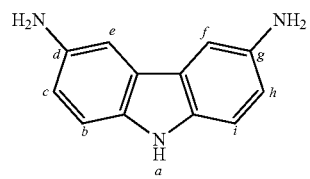
72
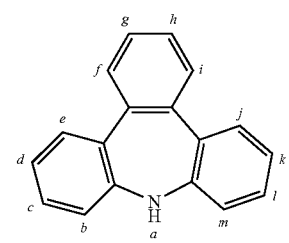
73
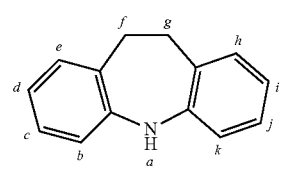
TABLE 2-continued
List of the second chemical entities AF2.
74
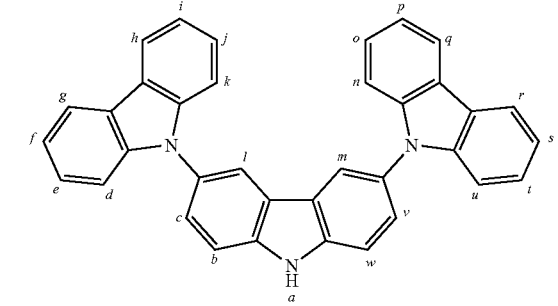 [SMILES: c1ccc2c(c1)c1ccccc1n2-c1ccc2[nH]c3ccc(-n4c5ccccc5c5ccccc54)cc3c2c1]
75
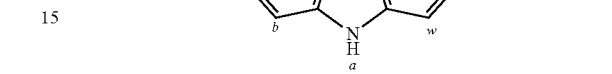
76
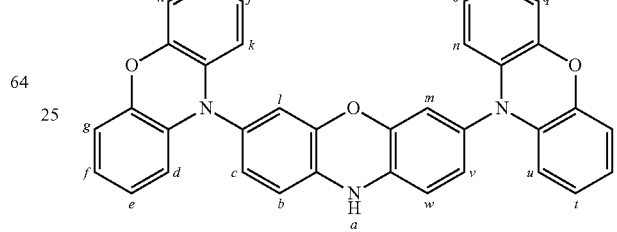
77
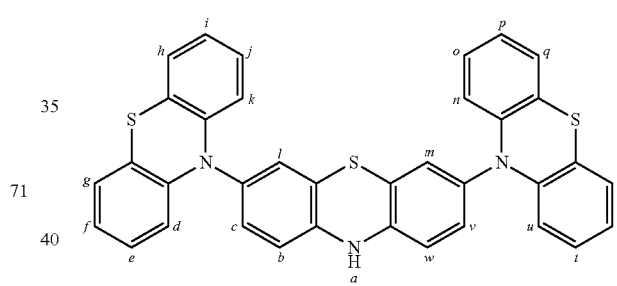
78
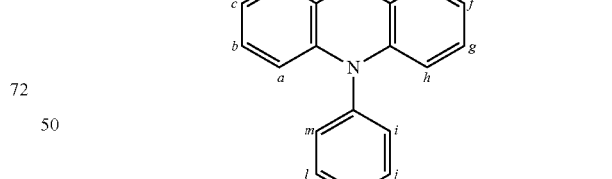

TABLE 2-continued

List of the second chemical entities AF2.

| | |
|---|---|
| (structure) | 82 |
| (structure) | 88 |
| (structure) | 91 |
| (structure) | 94 |
| (structure) | 95 |
| (structure) | 96 |
| (structure) | 97 |
| (structure) | 101 |
| (structure) | 120 |
| (structure) | 124 |
| (structure) | 128 |
| (structure) | 129 |

TABLE 2-continued
List of the second chemical entities AF2.
| | |
|---|---|
| 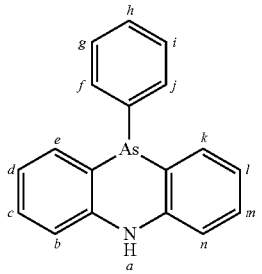 | 149 |
| 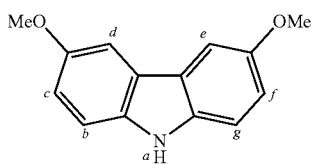 | 199 |
| 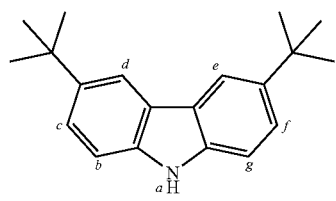 | 200 |
| 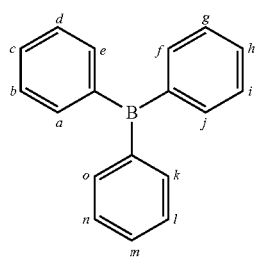 [SMILES: c1ccc(B(c2ccccc2)c2ccccc2)cc1] | 213 |
| 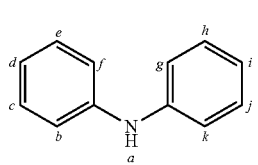 | 223 |
| 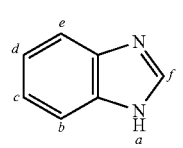 | 239 |
| 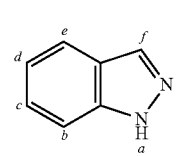 | 240 |
TABLE 2-continued
List of the second chemical entities AF2.
| | |
|---|---|
| 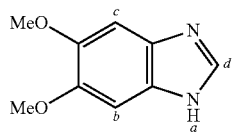 | 242 |
| 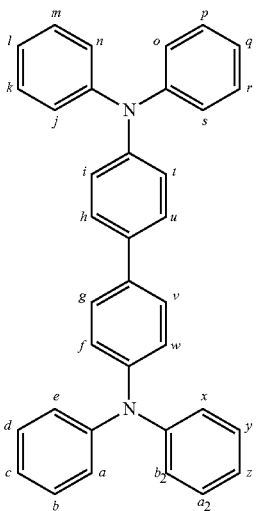 [SMILES: c1ccc(N(c2ccccc2)c2ccc(-c3ccc(N(c4ccccc4)c4ccccc4)cc3)cc2)cc1] | 278 |
| 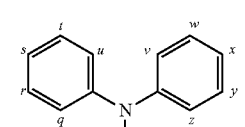 | 281 |
| 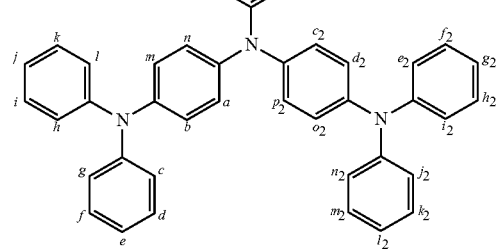 | |

TABLE 2-continued

List of the second chemical entities AF2.

| | |
|---|---|
| [structure 283] | 283 |
| [structure 314] | 314 |
| [structure 317] | 317 |
| [structure 328] | 328 |
| [structure 330] | 330 |
| [structure 331] | 331 |
| [structure 337] | 337 |
| [structure 339] | 339 |
| [structure 344] | 344 |
| [structure 345] | 345 |
| [structure 346] | 346 |
| [structure 347] | 347 |
| [structure 348] | 348 |
| [structure 349] | 349 |

TABLE 2-continued

List of the second chemical entities AF2.

| | |
|---|---|
| (structure) | 350 |
| (structure) | 351 |
| (structure) | 352 |
| (structure) | 353 |
| (structure) | 354 |
| (structure) | 360 |
| (structure) | 366 |
| (structure) | 377 |
| (structure) | 383 |
| (structure) | 384 |
| (structure) | 387 |
| (structure) | 388 |
| (structure) | 400 |
| (structure) | 404 |
| (structure) | 405 |
| (structure) | 406 |

TABLE 2-continued

List of the second chemical entities AF2.

TABLE 2-continued

List of the second chemical entities AF2.

| | |
|---|---|
| 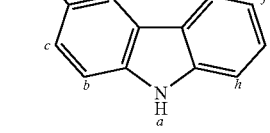 | 436 |
| 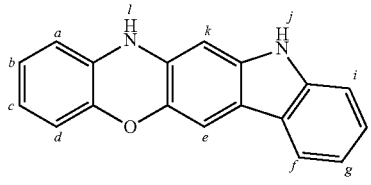 | 477 |
| 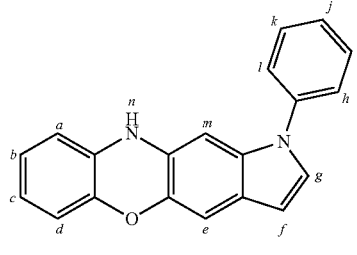 | 478 |
| 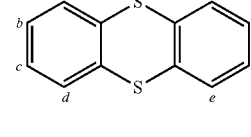 | 480 |
| 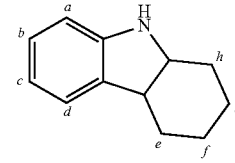 | 481 |

In Table 2, possible linking points on the separator or the chemical entity AF1 are designated with lower-case letters a to z.

In one embodiment of the invention, AF1 according to formula 19, a limited form of formula 2-1-a, is used.

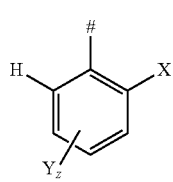

Formula 19 with X selected from F or CF$_3$ and Y selected from F, CF$_3$ or CN,
wherein z=1, 2 or 3,
wherein z in particular is 1 or 2,
wherein #=linking point on die chemical entity AF2.

In one embodiment AF1 is one of the subformulas of formula 19 listed here:

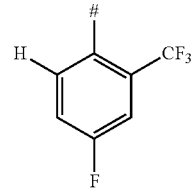 F19-1

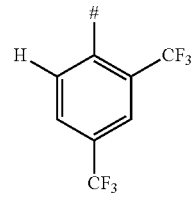 F19-2

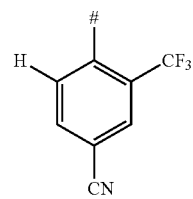 F19-3

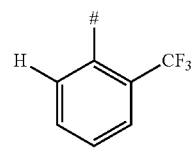 F19-4

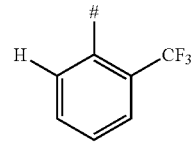 F19-5

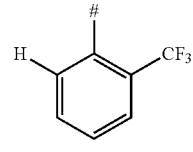 F19-6

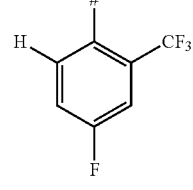 F19-7

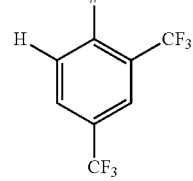 F19-8

F19-9
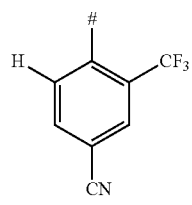
F19-10
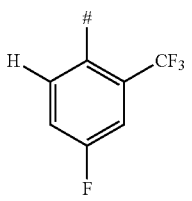
F19-11
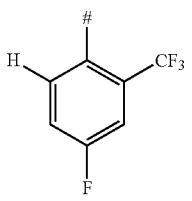
F19-12
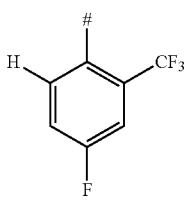
F19-13
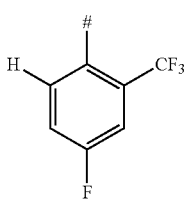
F19-14
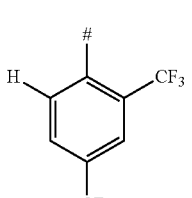
F19-15
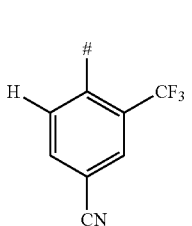
F19-16
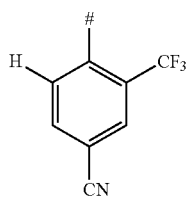
F19-17
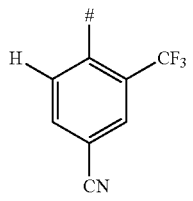
F19-18
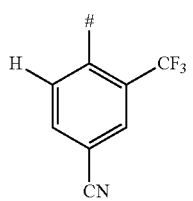
F19-19
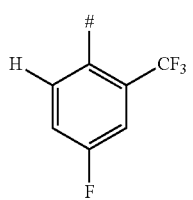
F19-20
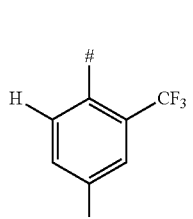
F19-21
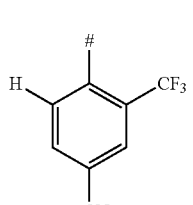
F19-22
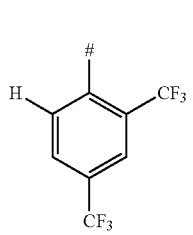

-continued
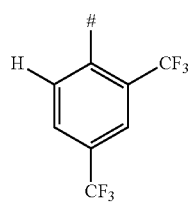 F19-23
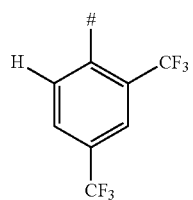 F19-24
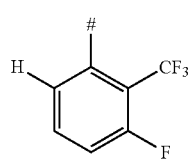 F19-25
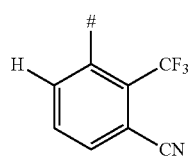 F19-26
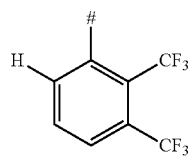 F19-27
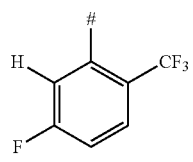 F19-28
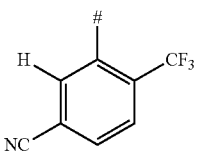 F19-29
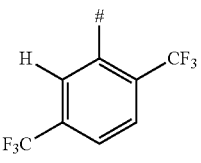 F19-30
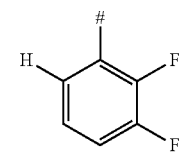 F19-31
-continued
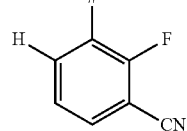 F19-32
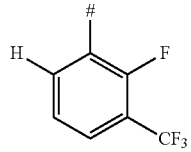 F19-33
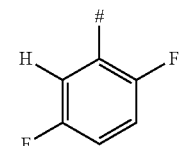 F19-34
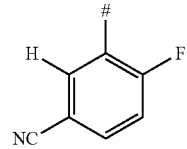 F19-35
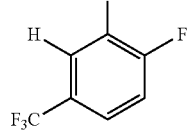 F19-36
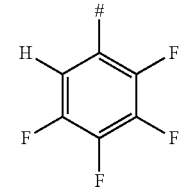 F19-37
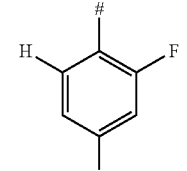 F19-38
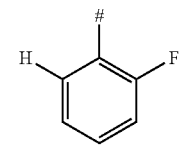 F19-39
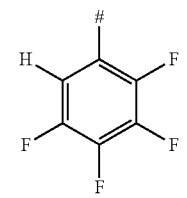 F19-40

-continued
F19-41
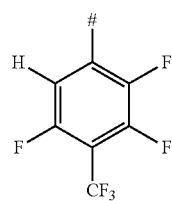
F19-42
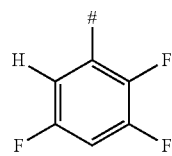
wherein #=linking point on the separator or linking point on the chemical entity AF2.
In one embodiment the chemical entities AF2 are selected from Table 3 and are combined with a fluorine-containing AF1 as shown in formula 1.
TABLE 3
Examples of chemical entities AF2
6
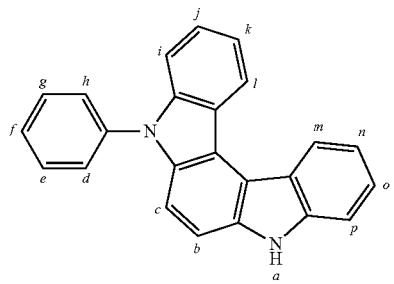 [SMILES: c1ccc(-n2c3ccccc3c3c4c(ccc32)[nH]c2ccccc24)cc1]
7
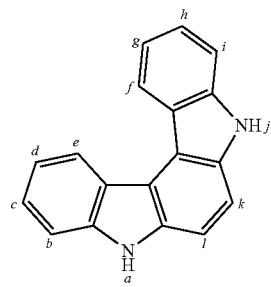 [SMILES: c1ccc2c(c1)[nH]c1ccc3[nH]c4ccccc4c3c12]
8
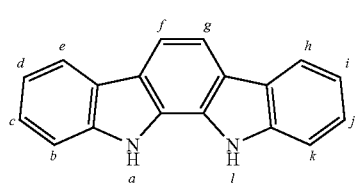
TABLE 3-continued
Examples of chemical entities AF2
10
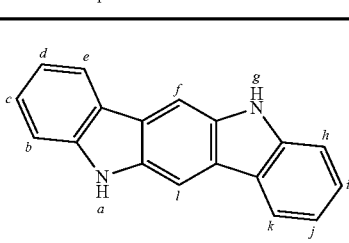
21
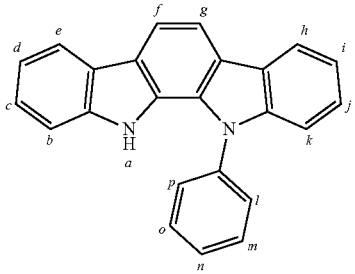 [SMILES: c1ccc(-n2c3ccccc3c3ccc4c5ccccc5[nH]c4c32)cc1]
22
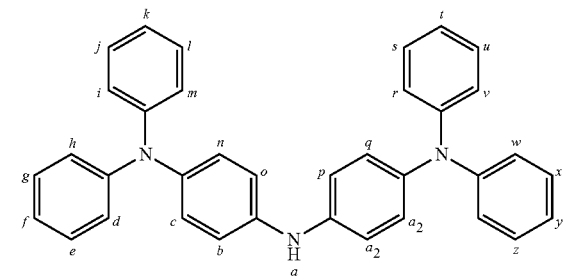
24
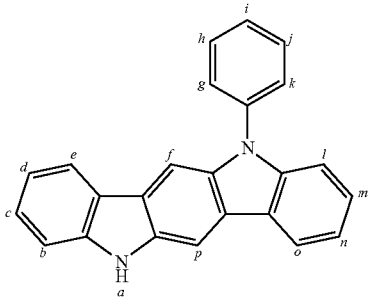 [SMILES: c1ccc(-n2c3ccccc3c3cc4[nH]c5ccccc5c4cc32)cc1]
31
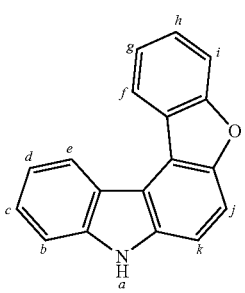

TABLE 3-continued
Examples of chemical entities AF2
32
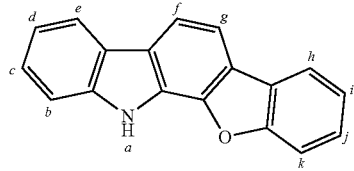 [SMILES: c1ccc2c(c1)[nH]c1c2ccc2c3ccccc3oc21]
33
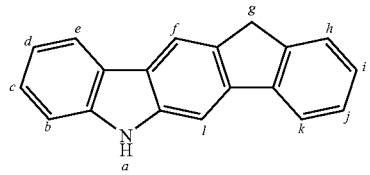
34
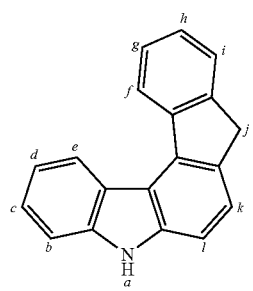
35
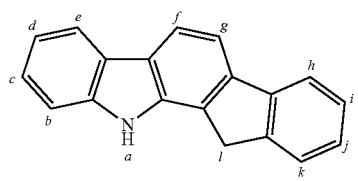
37
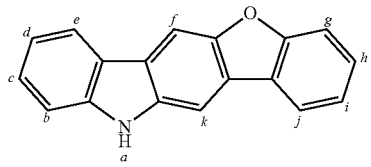
38
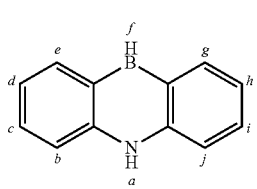
39
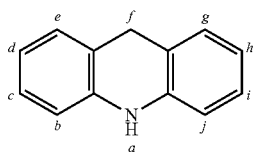
TABLE 3-continued
Examples of chemical entities AF2
41
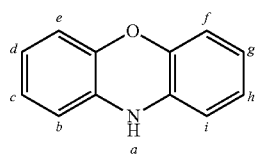
43
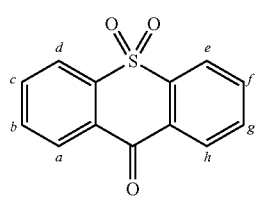 [SMILES: O=C1c2ccccc2S(=O)(=O)c2ccccc21]
44
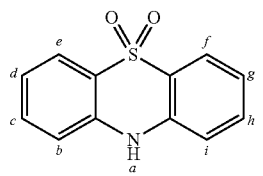 [SMILES: O=S1(=O)c2ccccc2Nc2ccccc21]
49
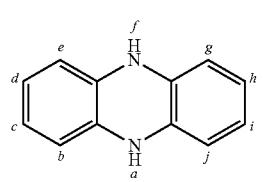
54
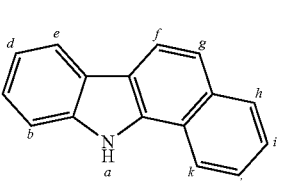
55
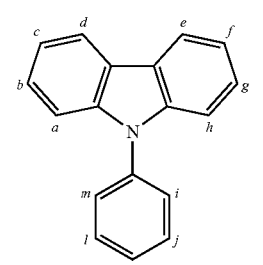
58
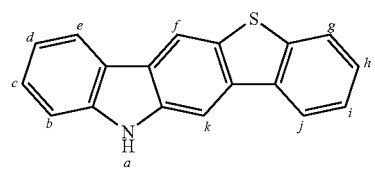

TABLE 3-continued
Examples of chemical entities AF2
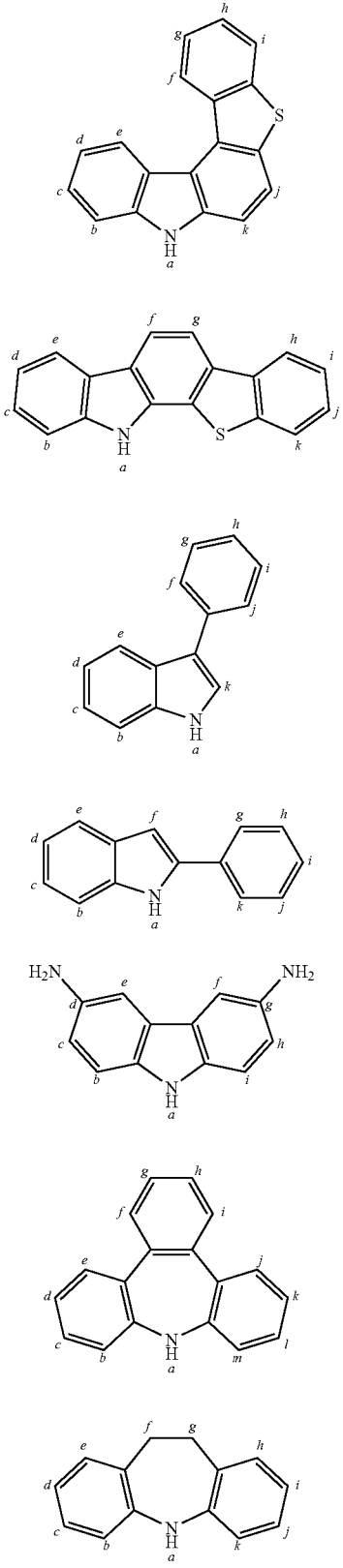
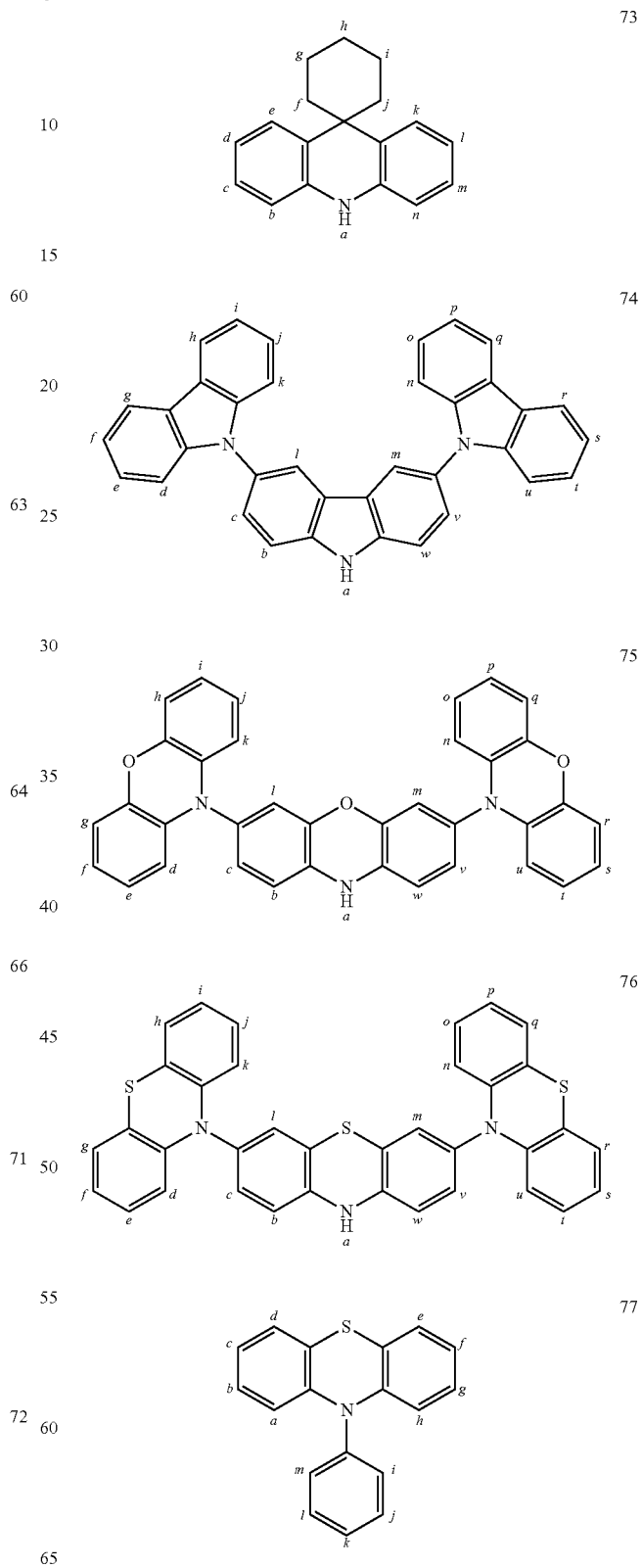

TABLE 3-continued

Examples of chemical entities AF2

TABLE 3-continued
Examples of chemical entities AF2
351 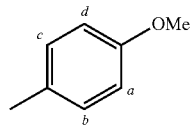
366 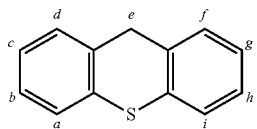
383 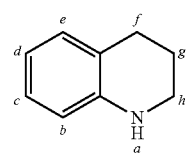
400 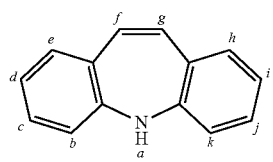
404 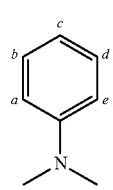
406 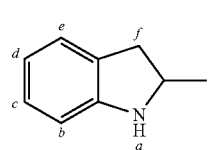
407 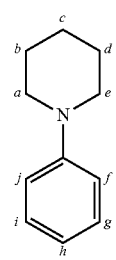
TABLE 3-continued
Examples of chemical entities AF2
425 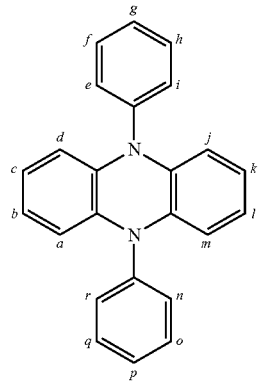 [SMILES: c1ccc(N2c3ccccc3N(c3ccccc3)c3ccccc32)cc1]
432 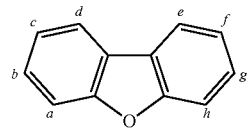
433 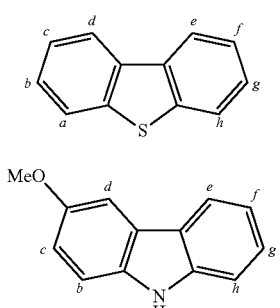
436 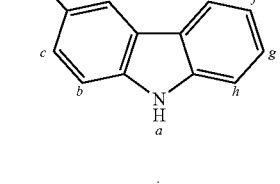
481 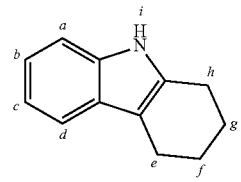 [SMILES: c1ccc2c3c([nH]c2c1)CCCC3]
In Table 3 possible linking points to the separator or the chemical entity AF1 are designated with lower-case letters a to z.
In another embodiment the entity AF2 comprises a structure of formula 3 or consists of a structure of formula 3
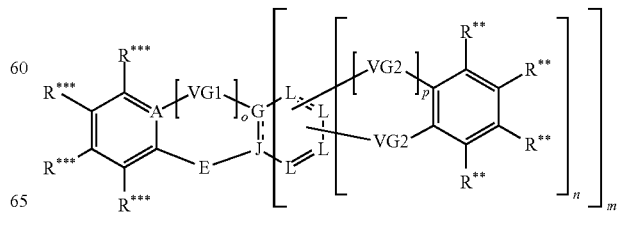
Formula 3 wherein:

m is 0 or 1;
n is 0 or 1, wherein when m=0 always also n=0 as well;
o is 0 or 1;
p is 0 or 1;
A is CR*** when o=0, otherwise C;
VG1=bridging group, is selected from the group consisting of
NR, CR$_2$, O, S and a C—C single bond; or
NR CR$_2$, O, S, a C—C single bond, BR, AsR, SiR$_2$, GeR$_2$,

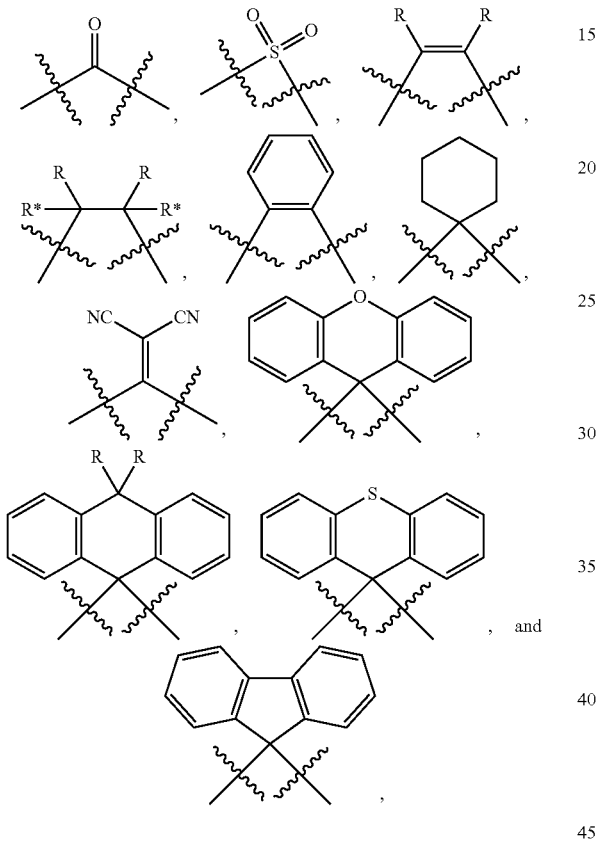

when m=1 and simultaneously n=0; VG2=bridging group is in each instance independently of one another selected from the group consisting of CR$_2$, NR, O, S and a C—C single bond, wherein two VG2 entities are not simultaneously each a C—C single bond;
E is NR**,

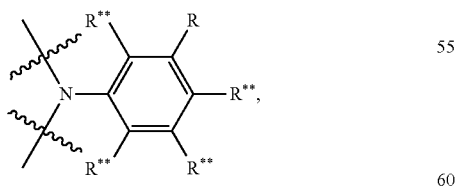

O or S;
G is C when o=1 and simultaneously m=1; G is CR when o=0 and simultaneously m=1; G is CR or CR**$_2$ when o=1 and simultaneously m=0; G is R* when o=0 and simultaneously m=0; G is CR, CR$_2$, N or NR* when m=0 and simultaneously VG1 is a C—C single bond;

J is C when m=1; J is CR, CR$_2$ or NR** when m=0;
L is CR* when n=0; L is CR or C (in the case of covalent bonding to VG2) when n=1;
R* is R or is selected from the following entites, wherein at most two of the radicals R*** simultaneously are equal to one of the following entities:

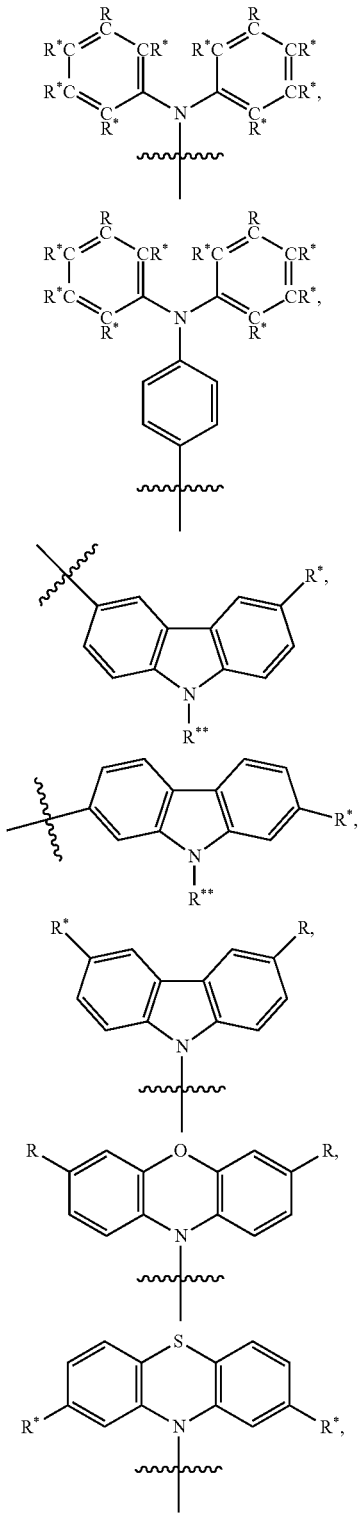

-continued

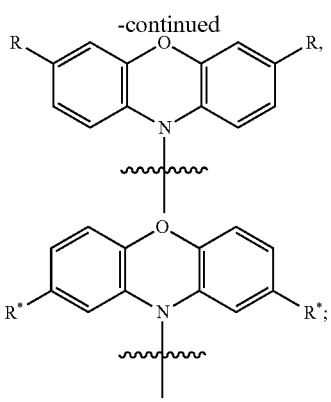

R** is in each instance independently of one another a radical R* or indicates a linking point on a separator S or the chemical entity AF1, wherein exactly one R** is a linking point to a separator S or to the chemical entity AF1.

R* is as defined in formula 1.

In another embodiment the entity AF2 comprises a structure of formula 4 or consists of a structure of formula 4

Formula 4

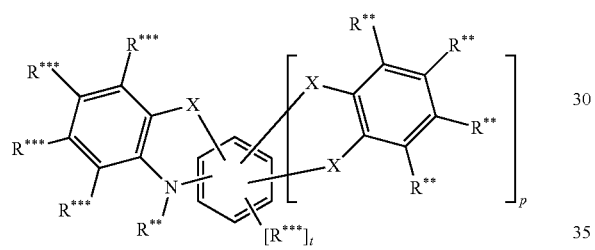

wherein in formula 4:

p is 0 or 1;

t=4−2p;

X is CR$_2$, NR, oxygen, sulfur or a direct bond, wherein a maximum of two place holders X simultaneously are a direct bond, wherein these are not a constituent of the same ring;

and otherwise the definitions given for formula 3 apply.

In another embodiment at least one AF2 of the organic molecules comprises a structure of formula 4A1-4A7 or consists of a structure of formula 4A1-4A7;

Formula 4A1

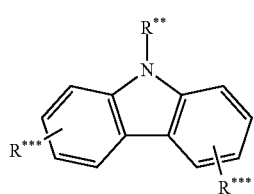

Formula 4A2

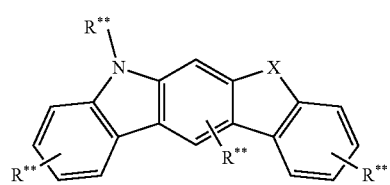

Formula 4A3

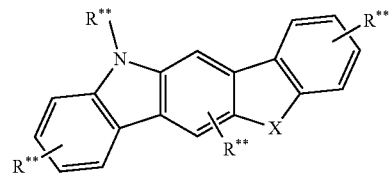

Formula 4A4

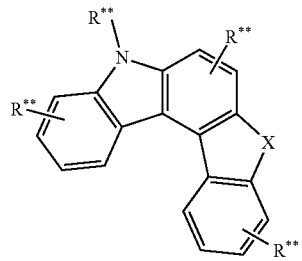

Formula 4A5

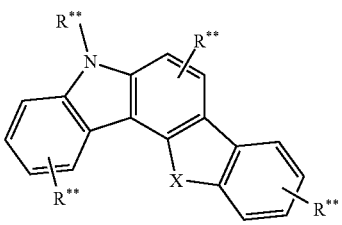

Formula 4A6

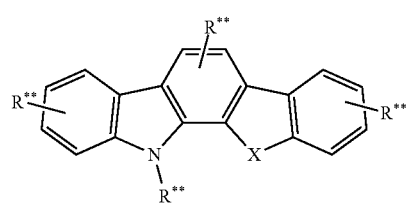

Formula 4A7

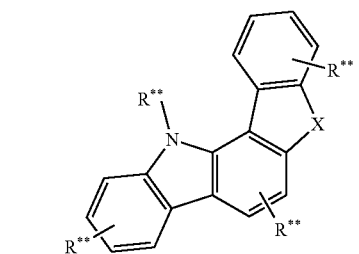

wherein formula 4A1-4A7:

X is C(R)$_2$, NR, oxygen or sulfur;

and otherwise the definitions given for formula 3 apply.

In an additional embodiment the molecules according to the invention comprise a separator S of formula 4S, Formula 4S

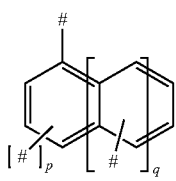

wherein the linking points for the chemical entities AF1 and AF2 are indicated by the place holders #.

p=0 or 1,
q=0 or 1,
and wherein p≠q.

In one embodiment the separator is selected from the structures presented in Table 4:

TABLE 4

Examples of separators S. The linking points for the chemical entities AF1 and AF2 are marked with #.

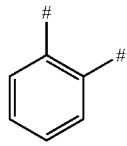
S-1

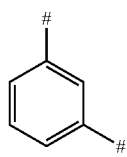
S-2

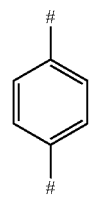
S-3

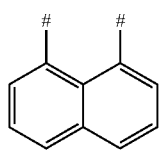
S-4

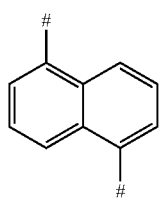
S-5

In one embodiment of the invention the separators S-1, S-2 or S-3 are used.

By combining the above-defined pairs of chemical entities AF1 and AF2 and fixing the linking through a separator S, correspondingly the example molecules of Table 5 are obtained. Additional organic molecules can be obtained analogously by combining the molecular entities analogously.

In an additional embodiment the organic molecule comprises a structure of formula 5 or has a structure of formula 5;

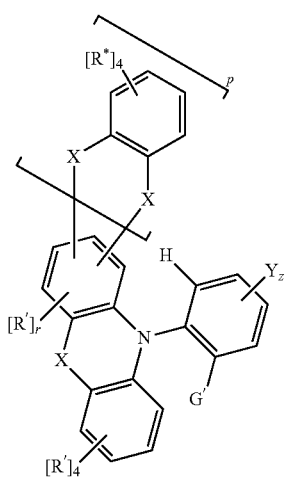

Formula 5 wherein in formula 5 the following meanings apply:

p iso or 1;

X is $CR^*_2$, $NR^*$, oxygen, sulfur, a direct bond, wherein a maximum of two place holders X are simultaneously a direct bond, wherein these are not part of the same ring;

G'=F, $CF_3$;

Y=F, $CF_3$ or CN;

z=1 or 2;

r=4−2p

R' is R* or is selected from the following entities, wherein a maximum of two of the radicals R' are simultaneously equal to one of the following entities:

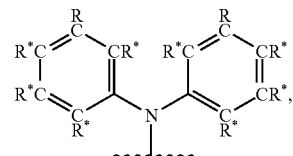

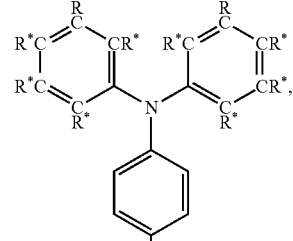

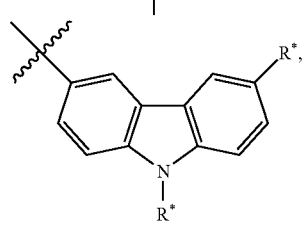

-continued

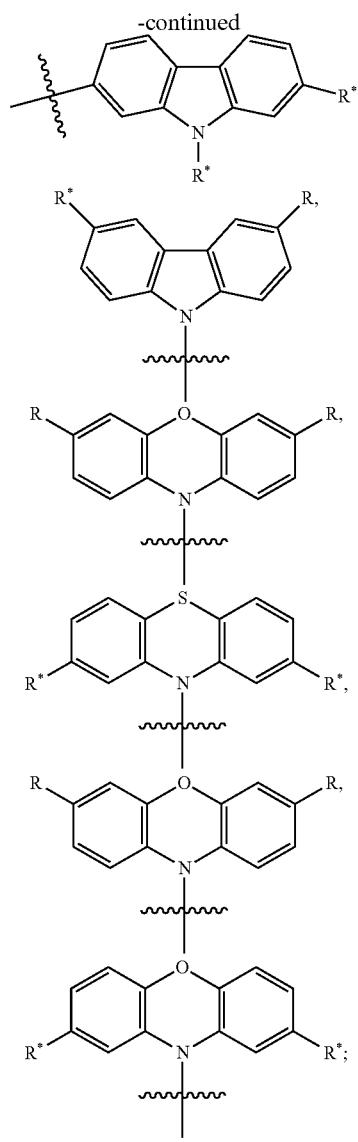

and otherwise the definitions given for formula 3 are applicable.

In an additional embodiment the organic molecule comprises a structure of formula 6 or has a structure of formula 6;

Formula 6

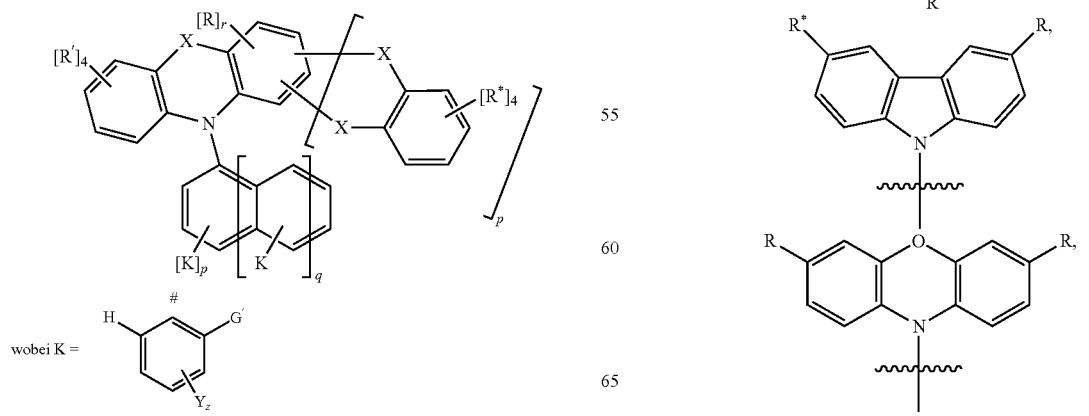

wherein in formula 6 the following meanings apply:
p=0 or 1,
q=0 or 1,
and wherein p≠q;
r=4−2p;
X is $CR^*_2$, $NR^*$, oxygen, sulfur, or a direct bond, wherein a maximum of two place holders X are simultaneously a direct bond, wherein these are not constituents of the same ring;
G'=F, $CF_3$;
Y=F, $CF_3$ or CN;
z=1 or 2;
# indicates the position over which the entity K is linked;
R' is R* or is selected from the following entities, wherein a maximum of two of the radicals R' are simultaneously equal to one of the following entities:

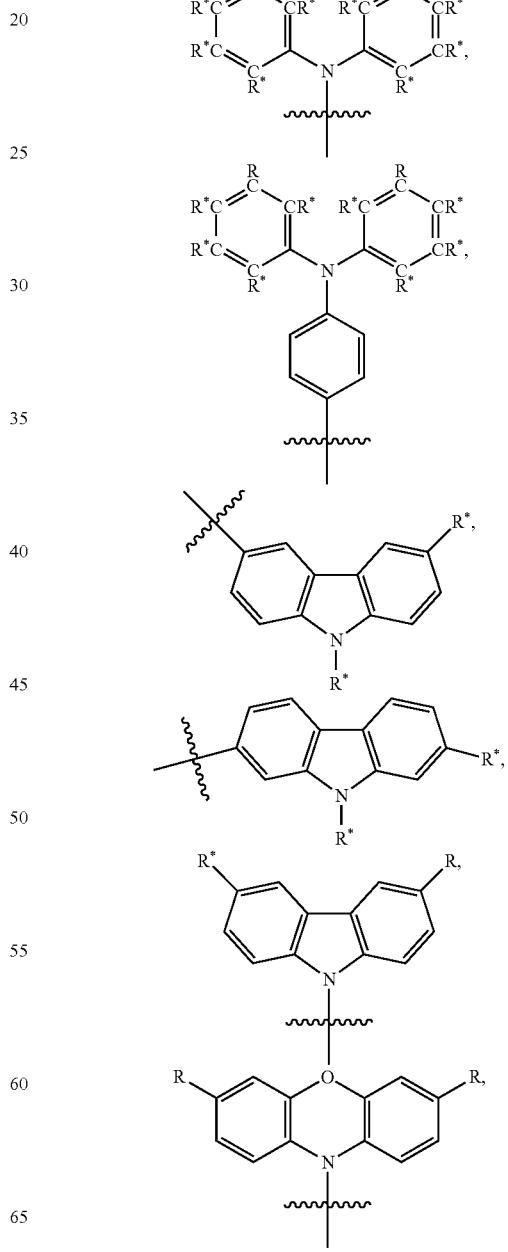

-continued
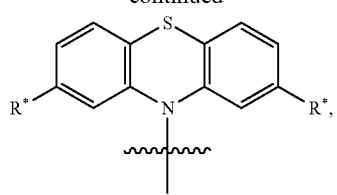
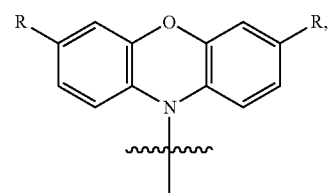
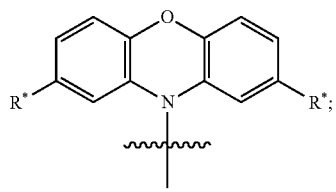
and otherwise the definitions given for formula 3 are applicable.
TABLE 5
Examples of organic molecules (AF1-(S-)AF2) according to the invention with the calculated ΔE(S1-T1) values.
| Molecular structure | ΔE(S1-T1) |
|---|---|
|  | 0.064 eV |
|  | 0.059 eV |
|  | 0.115 eV |
|  | 0.016 eV |

TABLE 5-continued

Examples of organic molecules (AF1-(S-)AF2) according to the invention with the calculated ΔE(S1-T1) values.

| Molecular structure | ΔE(S1-T1) |
| --- | --- |
| [benzimidazole-N-phenyl(CF3)-CN] | 0.524 eV |
| [3,6-di-tert-butylcarbazole-N-phenyl(CF3)-tetrazole-NH] | 0.011 eV |
| [phenoxazine-N-phenyl(CF3)-1-phenyl-1,2,4-triazole] | 0.012 eV |
| [3,6-dimethoxycarbazole-N-biphenyl(CF3)-tetrazole-NH] | 0.150 eV |
| [3,6-di-tert-butylcarbazole-N-phenyl(CF3)-1-phenyl-1,2,4-triazole] | 0.010 eV |
| [3,6-dimethoxycarbazole-N-phenyl(CF3)-1-phenyl-1,2,4-triazole] | 0.013 eV |
| [3,6-di-tert-butylcarbazole-N-phenyl(CF3)-CN] | 0.013 eV |
| [carbazole-N-phenyl(CF3)-CN] | 0.015 eV |

TABLE 5-continued

Examples of organic molecules (AF1-(S-)AF2) according to the invention with the calculated ΔE(S1-T1) values.

| Molecular structure | ΔE(S1-T1) |
|---|---|
| 9,9-dimethyl-10-(2,4-bis(trifluoromethyl)phenyl)acridine | 0.017 eV |
| 9-(4-cyano-2-(trifluoromethyl)phenyl)-1,2,3,4-tetrahydrocarbazole | 0.025 eV |
| 3,6-dimethoxy-9-(2,4-bis(trifluoromethyl)phenyl)carbazole | 0.014 eV |
| 2,7-dimethoxy-9-(5-cyano-3',5'-bis(trifluoromethyl)biphenyl-2-yl)carbazole | 0.212 eV |
| 3,6-dimethoxy-9-(3',5,5'-tris(trifluoromethyl)biphenyl-2-yl)carbazole | 0.133 eV |
| 3,6-dimethoxy-9-(4',5-bis(trifluoromethyl)biphenyl-2-yl)carbazole | 0.160 eV |
| 3,6-dimethoxy-9-(4-cyano-2-(trifluoromethyl)phenyl)carbazole | 0.120 eV |
| 10-(4-cyano-2-(trifluoromethyl)phenyl)phenoxazine | 0.014 eV |

TABLE 5-continued

Examples of organic molecules (AF1-(S-)AF2) according to the invention with the calculated ΔE(S1-T1) values.

| Molecular structure | ΔE(S1-T1) |
|---|---|
| (phenoxazine–phenyl(CF3)–tetrazole) | 0.012 eV |
| (3,6-dimethoxycarbazole–phenylene–phenyl(CF3)–tetrazole) | 0.145 eV |
| (3,6-dimethoxycarbazole–phenyl(CF3)–tetrazole) | 0.041 eV |
| (3,6-dimethoxycarbazole–phenyl–phenyl(2,4-bisCF3)) | 0.225 eV |
| (3,6-dimethoxycarbazole–phenyl–phenyl(CF3)–CN) | 0.165 eV |
| (2,5-difluorophenyl–phenyl–phenazine–phenyl) | 0.007 eV |

TABLE 5-continued

Examples of organic molecules (AF1-(S-)AF2) according to the invention with the calculated ΔE(S1-T1) values.

| Molecular structure | ΔE(S1-T1) |
|---|---|
| [structure: 2,5-difluorophenyl-phenyl-dimethylacridine] | 0.009 eV |
| [structure: carbazole-phenyl-2,5-difluorophenyl] | 0.434 eV |
| [structure: carbazole-methylphenyl-2,5-difluorophenyl] | 0.598 eV |
| [structure: phenoxazine-phenyl-2,5-difluorophenyl] | 0.010 eV |
| [structure: phenothiazine-phenyl-tetrafluorophenyl] | 0.111 eV |
| [structure: phenothiazine-phenyl-2,5-difluorophenyl] | 0.156 eV |
| [structure: fluoro-cyano-phenyl-dimethylacridine] | 0.018 eV |
| [structure: fluoro-cyano-phenyl-phenothiazine] | 0.012 eV |

Additional examples of molecules according to the invention

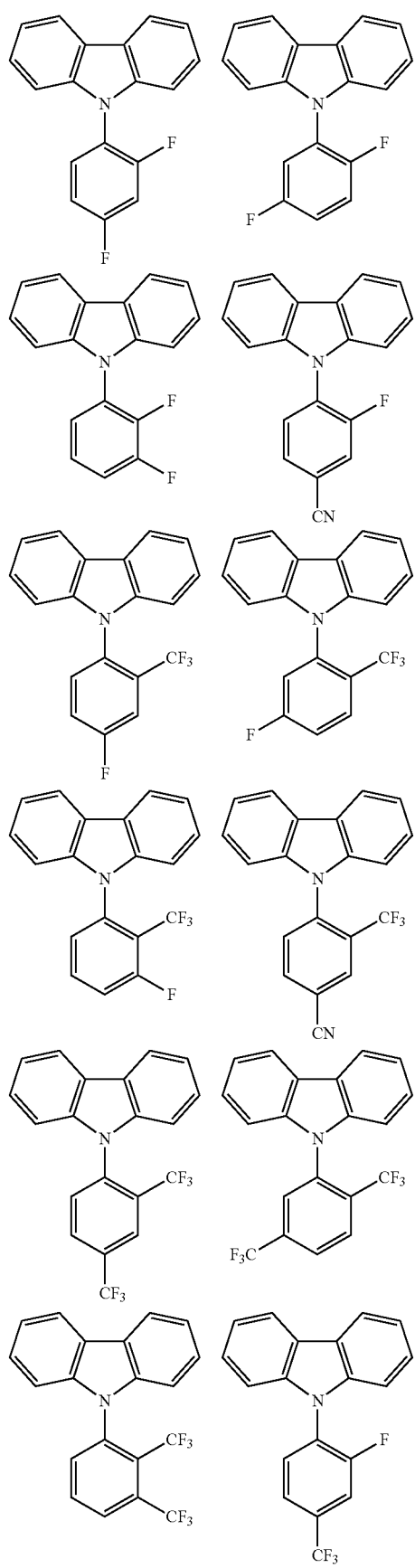
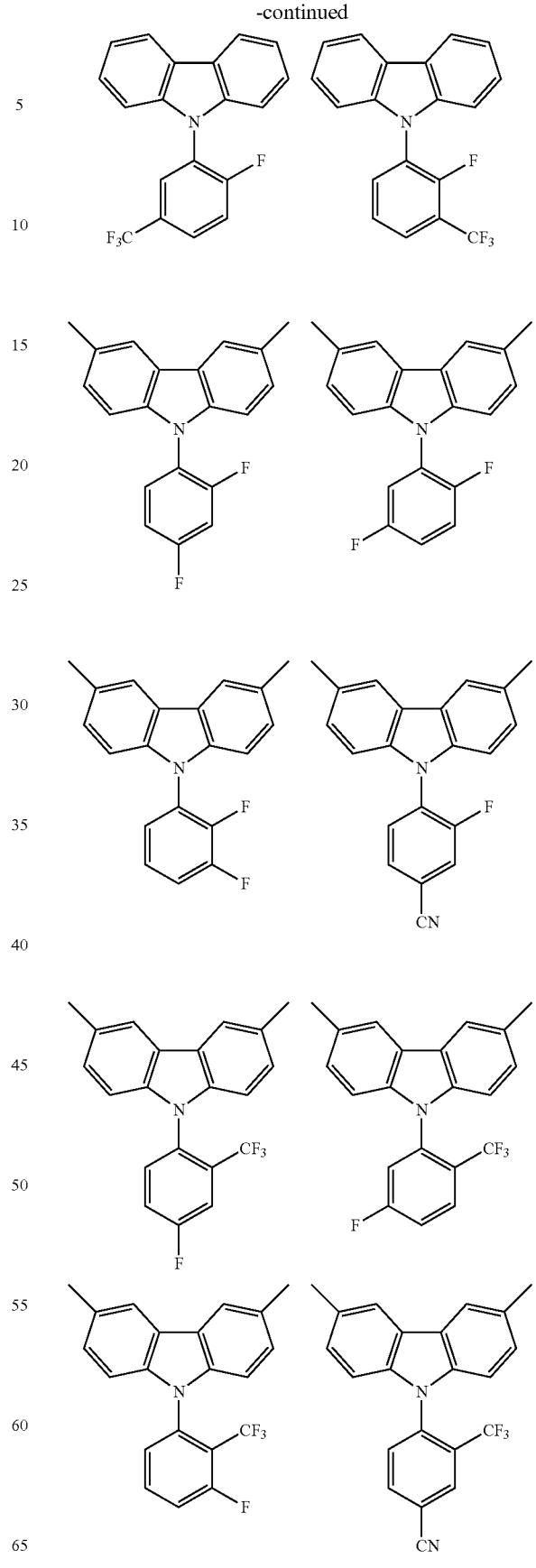

-continued
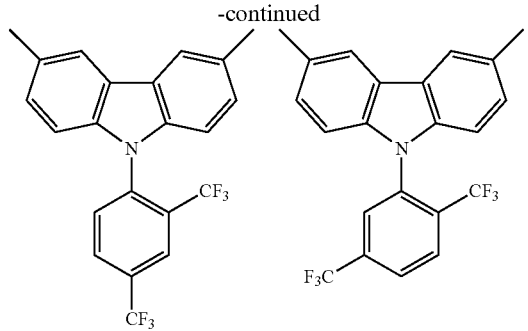
-continued
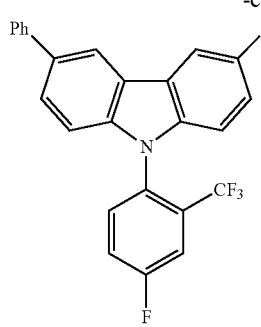
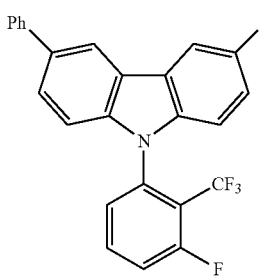
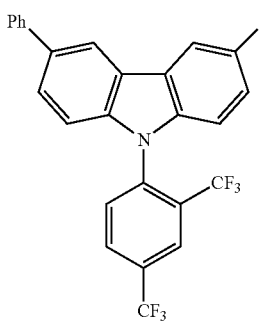
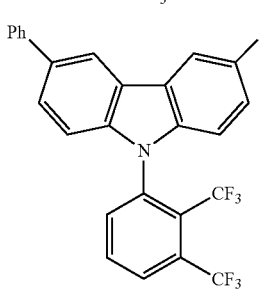
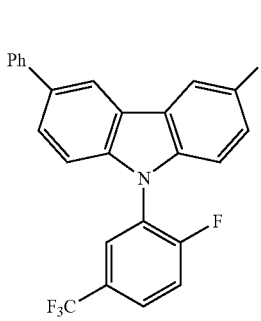

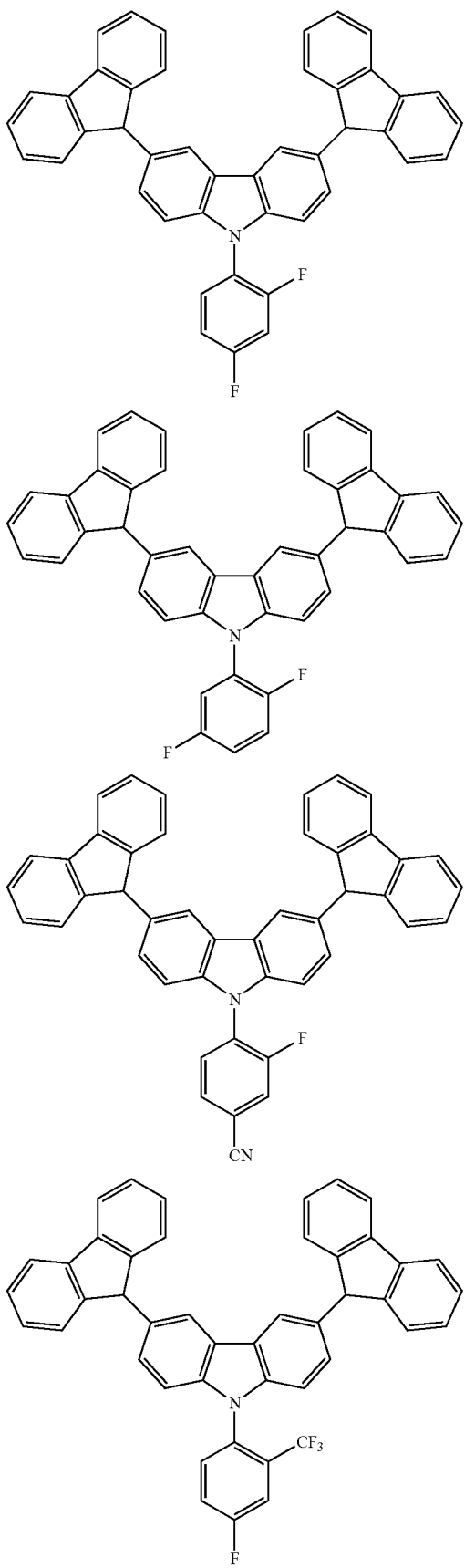
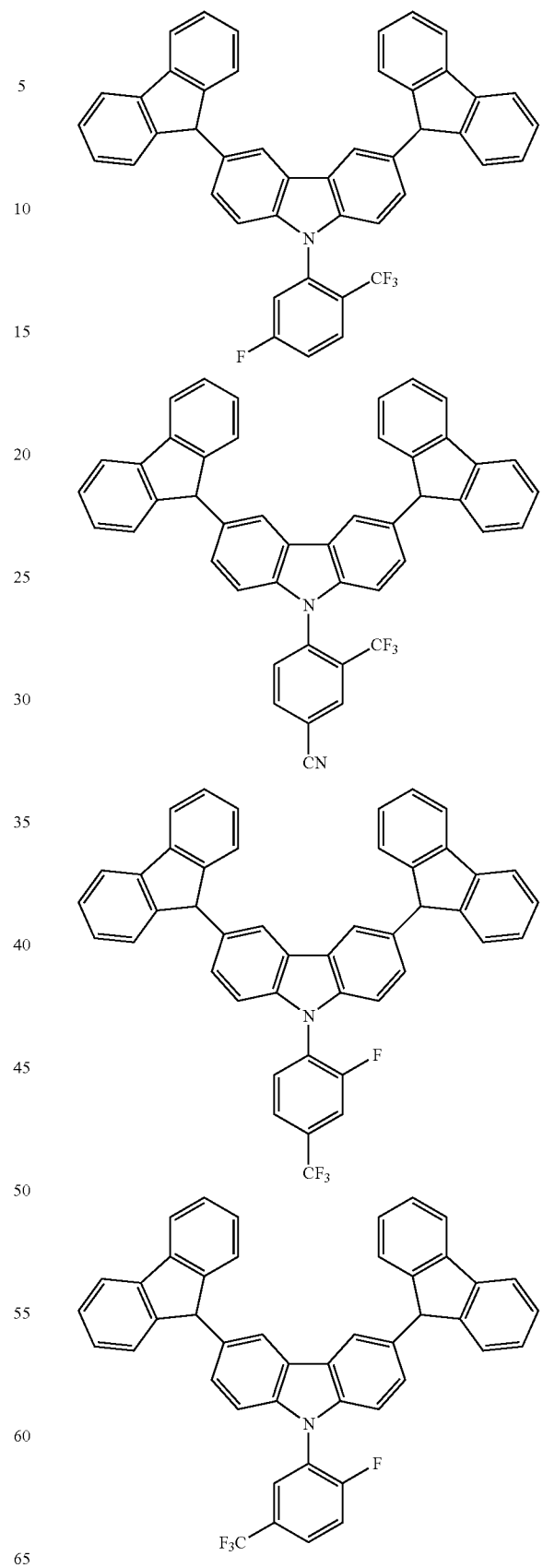

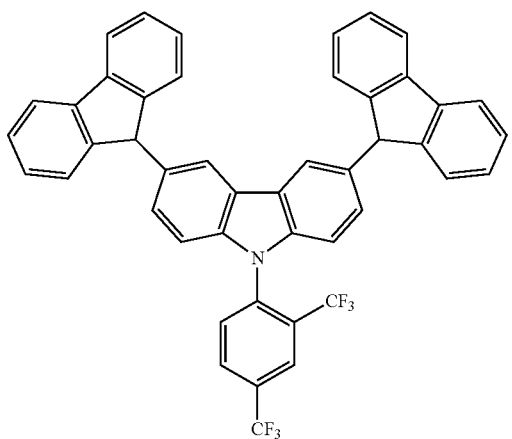
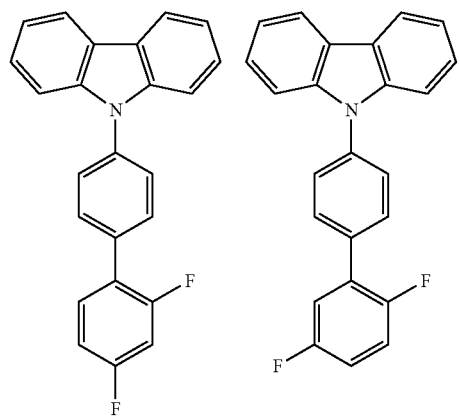
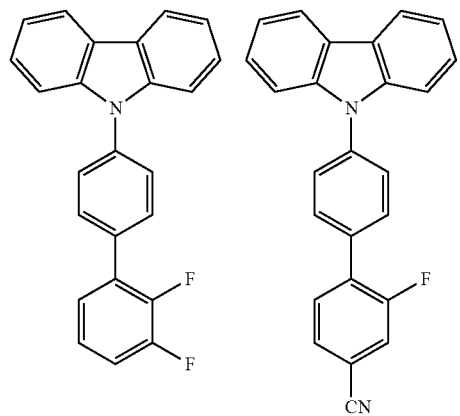
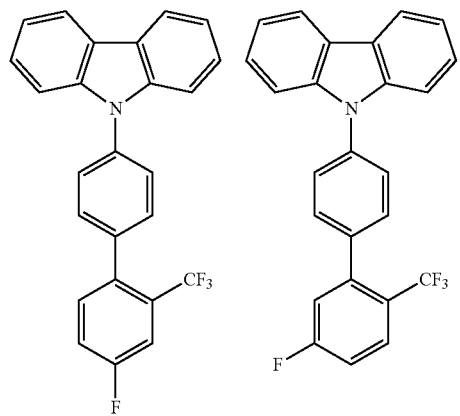
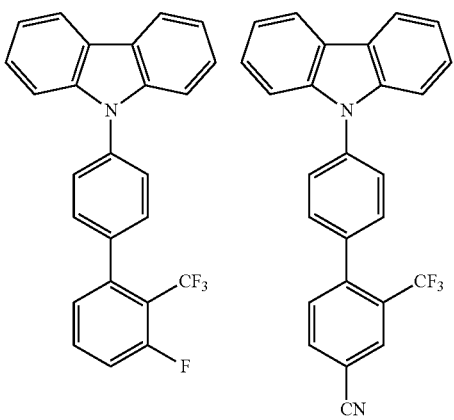
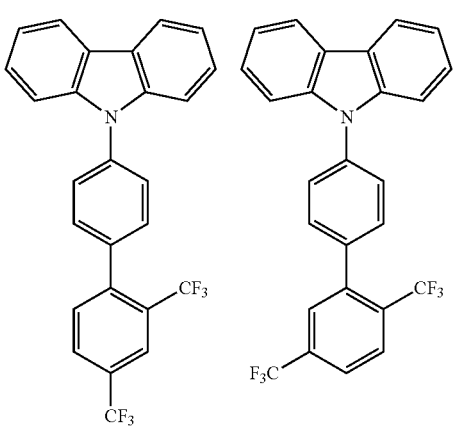
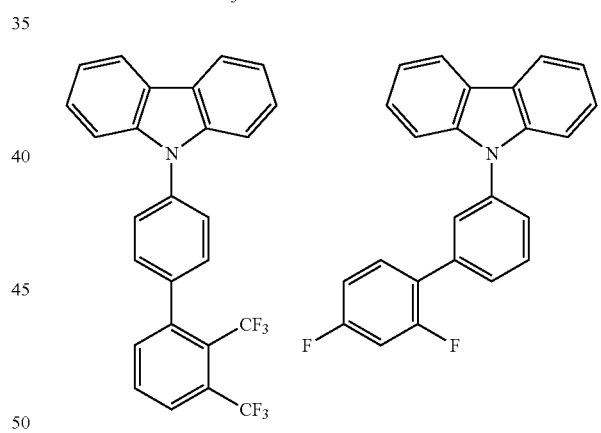
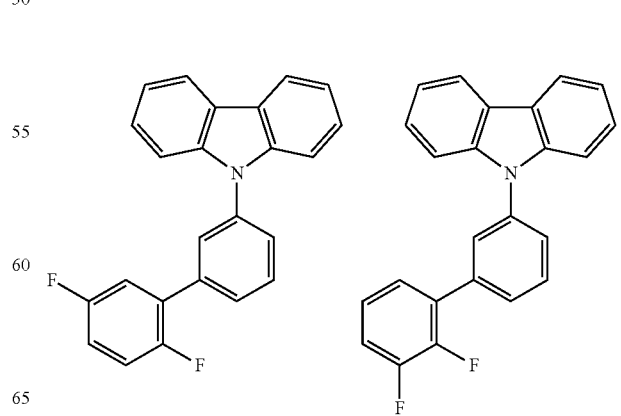

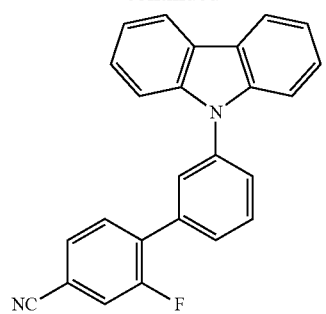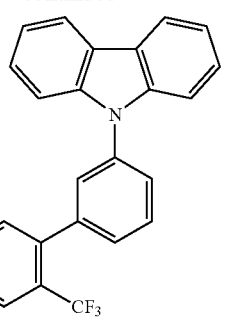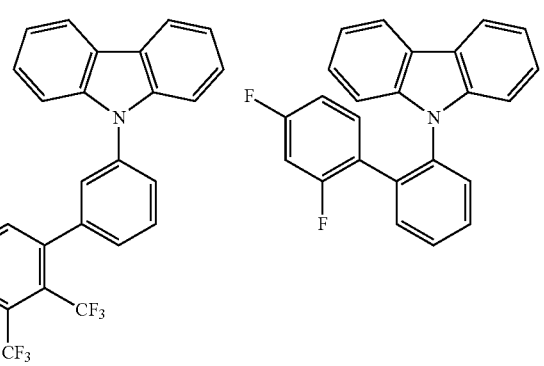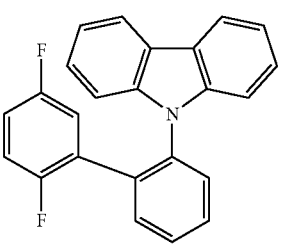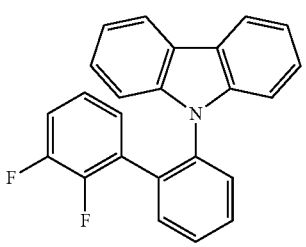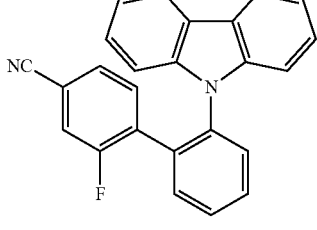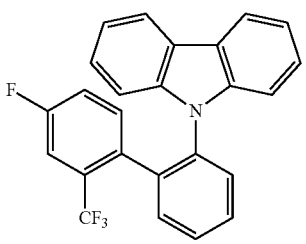

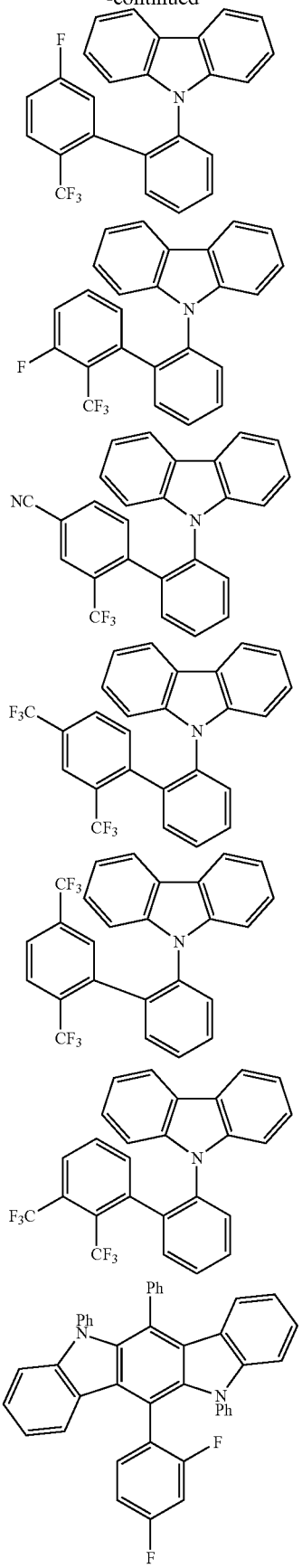
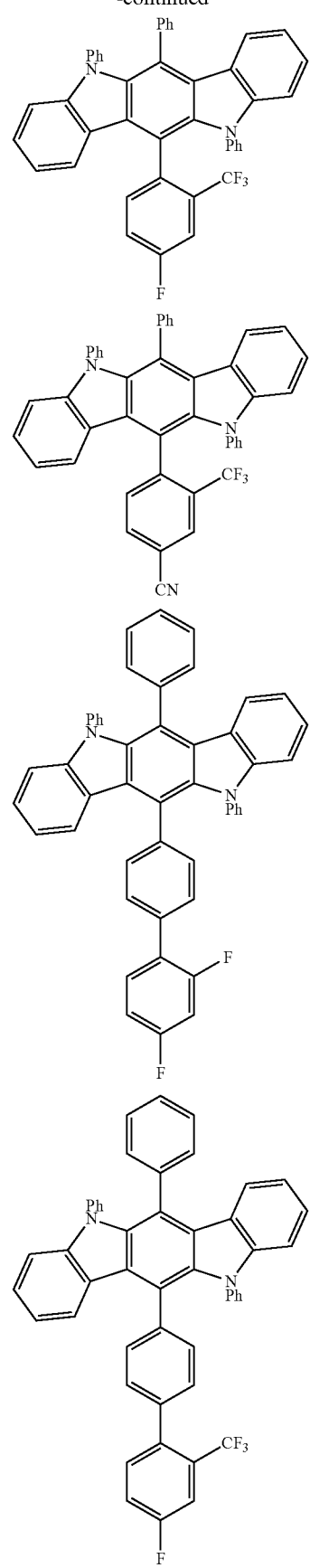

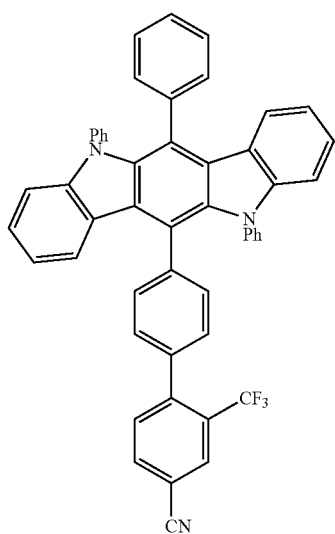
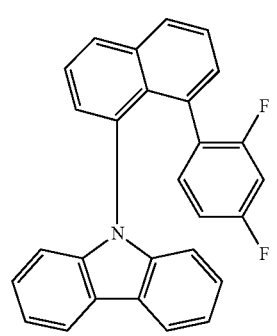
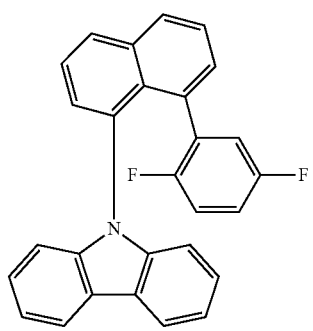
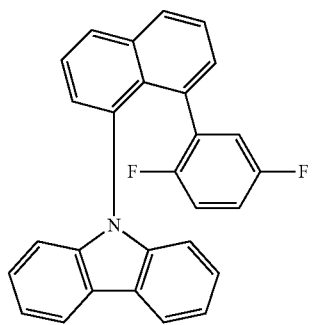
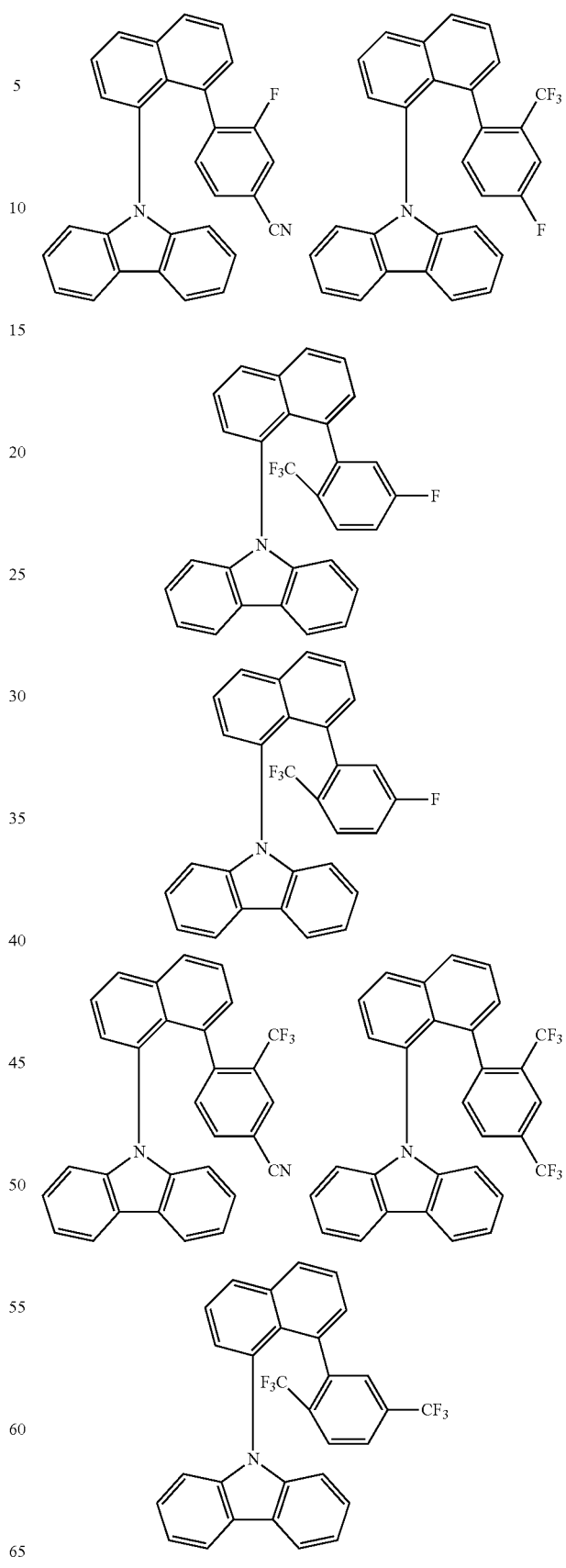

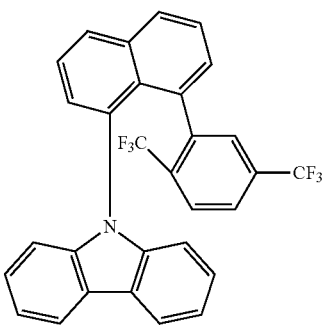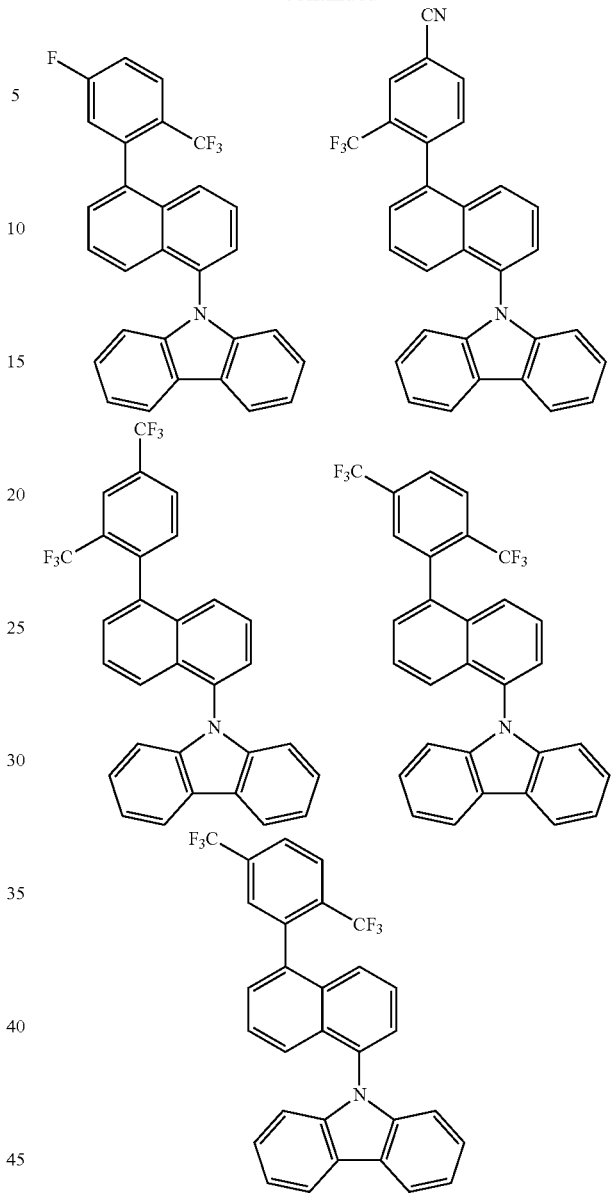

Examples of additional organic molecules according to the invention obtained by combining the named molecular entities in analogy to the above description are shown in Table 6. The naming of the molecules is done according to the pattern AF-S-AF, wherein the naming was done according to the following pattern: the numbers to the right and left represent the chemical entities AF1 from Table 1 and AF2 from Table 2 or from formula 3; "S" represents a separator, to be chosen from the structures of Table 4, wherein the linking of the individual entities AF to a separator S takes place over the points defined with lower-case letters in Table 1 and Table 2.

Table 6 also simultaneously contains molecules according to the invention of the Form AF1-AF2, which contain no separator S, wherein the entities AF1 and AF2 are covalently linked with one another over the above-named linking points. These molecules are obtained from Table 6, ignoring the column "S".

TABLE 6

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

Molecules according to the invention, in which the chemical entities from Table 1 act as AF2
(electron donors)

| | | | |
|---|---|---|---|
| 154-S-152 (1.09 1.33 2.93) | 154-S-342 (0.94 0.93 3.33) | 154-S-343 (1.47 1.42 2.84) | 154-S-429 (1.03 2.12 2.14) |
| 184-S-152 (0.80 0.97 3.22) | 184-S-343 (1.18 1.06 3.13) | 189-S-150 (0.93 1.41 3.10) | 189-S-151 (0.84 1.67 2.84) |
| 189-S-152 (1.48 1.97 2.54) | 189-S-153 (0.86 1.51 3.00) | 189-S-342 (1.33 1.57 2.94) | 189-S-343 (1.86 2.06 2.45) |
| 189-S-371 (1.02 1.65 2.85) | 189-S-429 (1.42 2.76 1.75) | 192-S-429 (1.14 1.24 2.03) | 193-S-57 (1.07 1.62 1.41) |
| 193-S-70 (0.86 1.29 1.74) | 193-S-125 (1.31 2.06 0.96) | 193-S-133 (0.91 0.85 2.17) | 193-S-151 (1.64 0.98 2.04) |
| 193-S-152 (2.28 1.28 1.74) | 193-S-153 (1.66 0.83 2.20) | 193-S-192 (1.08 0.84 2.19) | 193-S-215 (0.89 1.41 1.62) |
| 193-S-231 (1.13 0.95 2.07) | 193-S-255 (1.04 0.93 2.10) | 193-S-259 (0.90 1.74 1.28) | 193-S-271 (1.31 1.02 2.01) |
| 193-S-291 (1.39 0.86 2.16) | 193-S-320 (0.98 1.34 1.68) | 193-S-324 (0.96 1.84 1.19) | 193-S-342 (2.13 0.88 2.14) |
| 193-S-343 (2.66 1.37 1.65) | 193-S-364 (0.84 1.50 1.52) | 193-S-371 (1.82 0.97 2.05) | 193-S-429 (2.22 2.07 0.95) |
| 193-S-472 (1.21 1.65 1.37) | 206-S-125 (1.17 0.87 1.09) | 206-S-250 (0.94 1.00 0.96) | 206-S-429 (2.09 0.88 1.08) |
| 207-S-429 (1.57 0.93 1.60) | 244-S-125 (0.91 1.70 1.36) | 244-S-152 (1.88 0.91 2.14) | 244-S-343 (2.26 1.01 2.05) |
| 244-S-429 (1.82 1.71 1.35) | 244-S-472 (0.82 1.28 1.77) | 287-S-43 (0.82 1.02 1.92) | 287-S-57 (1.09 1.56 1.38) |
| 287-S-70 (0.89 1.23 1.71) | 287-S-125 (1.33 2.01 0.93) | 287-S-151 (1.66 0.93 2.01) | 287-S-152 (2.31 1.23 1.71) |
| 287-S-215 (0.91 1.35 1.59) | 287-S-231 (1.15 0.90 2.05) | 287-S-247 (0.81 1.86 1.08) | 287-S-255 (1.07 0.87 2.07) |
| 287-S-259 (0.92 1.69 1.25) | 287-S-271 (1.33 0.96 1.98) | 287-S-291 (1.41 0.81 2.13) | 287-S-320 (1.01 1.29 1.65) |
| 287-S-324 (0.98 1.78 1.16) | 287-S-342 (2.16 0.83 2.11) | 287-S-343 (2.68 1.32 1.62) | 287-S-364 (0.86 1.45 1.49) |
| 287-S-371 (1.84 0.92 2.03) | 287-S-429 (2.25 2.02 0.92) | 287-S-472 (1.24 1.60 1.35) | 291-S-429 (0.83 1.21 2.34) |
| 292-S-343 (1.94 0.85 2.37) | 292-S-429 (1.50 1.55 1.67) | 294-S-152 (1.60 0.92 2.42) | 294-S-343 (1.98 1.01 2.33) |
| 294-S-429 (1.54 1.71 1.63) | 295-S-125 (0.87 1.46 1.39) | 295-S-429 (1.79 1.47 1.38) | 296-S-429 (1.51 1.47 1.66) |
| 300-S-46 (1.11 0.99 2.71) | 300-S-125 (1.02 2.46 1.24) | 300-S-150 (1.44 1.12 2.58) | 300-S-151 (1.35 1.38 2.33) |
| 300-S-152 (1.99 1.67 2.03) | 300-S-153 (1.37 1.22 2.48) | 300-S-231 (0.84 1.34 2.36) | 300-S-271 (1.02 1.41 2.29) |
| 300-S-291 (1.10 1.26 2.45) | 300-S-342 (1.84 1.27 2.43) | 300-S-343 (2.37 1.77 1.93) | 300-S-371 (1.53 1.36 2.34) |
| 300-S-429 (1.93 2.47 1.24) | 300-S-472 (0.93 2.04 1.66) | 301-S-46 (1.06 1.28 2.76) | 301-S-125 (0.97 2.75 1.30) |
| 301-S-150 (1.39 1.41 2.64) | 301-S-151 (1.30 1.66 2.38) | 301-S-152 (1.94 1.96 2.08) | 301-S-153 (1.32 1.51 2.53) |
| 301-S-184 (1.14 1.00 3.04) | 301-S-271 (0.97 1.70 2.34) | 301-S-291 (1.05 1.54 2.50) | 301-S-342 (1.79 1.56 2.48) |
| 301-S-343 (2.32 2.06 1.99) | 301-S-371 (1.48 1.65 2.39) | 301-S-429 (1.88 2.75 1.29) | 301-S-472 (0.88 2.33 1.71) |
| 302-S-46 (0.94 1.43 2.88) | 302-S-125 (0.85 2.90 1.42) | 302-S-150 (1.27 1.56 2.76) | 302-S-151 (1.18 1.82 2.50) |
| 302-S-152 (1.82 2.12 2.20) | 302-S-153 (1.20 1.66 2.66) | 302-S-184 (1.02 1.15 3.16) | 302-S-271 (0.85 1.85 2.46) |
| 302-S-291 (0.93 1.70 2.62) | 302-S-342 (1.67 1.72 2.60) | 302-S-343 (2.20 2.21 2.11) | 302-S-371 (1.36 1.80 2.51) |
| 302-S-429 (1.76 2.91 1.41) | 305-S-152 (1.68 1.01 2.34) | 305-S-343 (2.06 1.10 2.25) | 305-S-429 (1.62 1.80 1.55) |
| 331-S-57 (0.83 1.77 1.64) | 331-S-125 (1.07 2.21 1.19) | 331-S-150 (1.49 0.88 2.53) | 331-S-151 (1.40 1.13 2.27) |
| 331-S-152 (2.05 1.43 1.97) | 331-S-153 (1.43 0.98 2.43) | 331-S-192 (0.85 0.99 2.42) | 331-S-231 (0.89 1.10 2.31) |
| 331-S-250 (0.84 2.34 1.07) | 331-S-255 (0.81 1.08 2.33) | 331-S-271 (1.07 1.17 2.24) | 331-S-291 (1.15 1.01 2.39) |
| 331-S-342 (1.90 1.03 2.37) | 331-S-343 (2.43 1.52 1.88) | 331-S-371 (1.58 1.12 2.29) | 331-S-429 (1.99 2.22 1.18) |
| 331-S-472 (0.98 1.80 1.61) | 468-S-57 (1.13 1.14 1.35) | 468-S-70 (0.92 0.81 1.68) | 468-S-125 (1.36 1.58 0.90) |
| 468-S-152 (2.34 0.80 1.68) | 468-S-215 (0.94 0.93 1.56) | 468-S-247 (0.84 1.43 1.05) | 468-S-259 (0.96 1.26 1.22) |
| 468-S-320 (1.04 0.86 1.62) | 468-S-324 (1.01 1.36 1.13) | 468-S-343 (2.72 0.89 1.59) | 468-S-364 (0.90 1.02 1.46) |
| 468-S-368 (0.83 0.89 1.60) | 468-S-472 (1.27 1.17 1.31) | | |

Molecules according to the invention, in which the chemical entities from Table 1 act as AF1
(electron acceptors)

| | | | |
|---|---|---|---|
| 1-S-150 (2.45 1.42 1.57) | 1-S-151 (2.36 1.68 1.31) | 1-S-152 (3.01 1.98 1.01) | 1-S-153 (2.39 1.52 1.47) |
| 1-S-184 (2.20 1.01 1.98) | 1-S-192 (1.81 1.53 1.46) | 1-S-206 (0.86 1.89 1.10) | 1-S-207 (1.38 1.84 1.15) |
| 1-S-244 (1.12 1.06 1.93) | 1-S-291 (2.11 1.56 1.43) | 1-S-292 (1.45 1.22 1.77) | 1-S-294 (1.41 1.06 1.93) |
| 1-S-295 (1.16 1.30 1.69) | 1-S-296 (1.44 1.30 1.69) | 1-S-305 (1.33 0.96 2.03) | 1-S-342 (2.86 1.58 1.41) |
| 1-S-343 (3.39 2.07 0.92) | 2-S-150 (2.44 1.34 1.58) | 2-S-151 (2.35 1.60 1.32) | 2-S-152 (3.00 1.90 1.02) |
| 2-S-153 (2.38 1.44 1.48) | 2-S-184 (2.19 0.93 1.99) | 2-S-192 (1.80 1.45 1.47) | 2-S-206 (0.85 1.81 1.11) |
| 2-S-207 (1.37 1.76 1.16) | 2-S-244 (1.11 0.98 1.94) | 2-S-291 (2.11 1.48 1.44) | 2-S-292 (1.44 1.14 1.78) |
| 2-S-294 (1.40 0.98 1.94) | 2-S-295 (1.15 1.22 1.70) | 2-S-296 (1.43 1.22 1.70) | 2-S-305 (1.32 0.88 2.03) |
| 2-S-342 (2.85 1.50 1.42) | 2-S-343 (3.38 1.99 0.93) | 3-S-150 (2.70 1.79 1.32) | 3-S-151 (2.61 2.05 1.06) |
| 3-S-153 (2.64 1.89 1.22) | 3-S-154 (2.17 1.02 2.09) | 3-S-184 (2.45 1.39 1.73) | 3-S-192 (2.06 1.91 1.21) |
| 3-S-193 (0.95 1.07 2.05) | 3-S-207 (1.63 2.21 0.90) | 3-S-244 (1.37 1.44 1.68) | 3-S-287 (0.95 1.12 1.99) |
| 3-S-291 (2.36 1.93 1.18) | 3-S-292 (1.70 1.59 1.52) | 3-S-294 (1.65 1.43 1.68) | 3-S-295 (1.41 1.68 1.44) |
| 3-S-296 (1.69 1.67 1.44) | 3-S-305 (1.58 1.34 1.78) | 3-S-331 (1.21 0.92 2.20) | 3-S-342 (3.11 1.95 1.16) |
| 3-S-468 (0.92 1.55 1.57) | 4-S-150 (2.33 1.26 1.70) | 4-S-151 (2.23 1.52 1.44) | 4-S-152 (2.88 1.82 1.14) |
| 4-S-153 (2.26 1.36 1.60) | 4-S-184 (2.08 0.85 2.11) | 4-S-192 (1.68 1.37 1.59) | 4-S-207 (1.25 1.68 1.28) |
| 4-S-244 (1.00 0.90 2.06) | 4-S-291 (1.99 1.40 1.56) | 4-S-292 (1.32 1.06 1.90) | 4-S-294 (1.28 0.90 2.06) |
| 4-S-295 (1.03 1.14 1.82) | 4-S-296 (1.31 1.14 1.82) | 4-S-305 (1.20 0.80 2.15) | 4-S-342 (2.73 1.42 1.54) |
| 4-S-343 (3.26 1.91 1.05) | 5-S-150 (2.46 1.03 1.56) | 5-S-151 (2.37 1.29 1.30) | 5-S-152 (3.01 1.59 1.01) |
| 5-S-153 (2.39 1.13 1.46) | 5-S-192 (1.82 1.15 1.45) | 5-S-206 (0.87 1.50 1.09) | 5-S-207 (1.39 1.45 1.15) |
| 5-S-291 (2.12 1.17 1.42) | 5-S-292 (1.46 0.83 1.77) | 5-S-295 (1.17 0.92 1.68) | 5-S-296 (1.45 0.91 1.68) |
| 5-S-342 (2.86 1.19 1.41) | 5-S-343 (3.39 1.68 0.91) | 6-S-150 (2.70 1.33 1.33) | 6-S-151 (2.61 1.58 1.07) |
| 6-S-153 (2.63 1.43 1.23) | 6-S-184 (2.45 0.92 1.74) | 6-S-192 (2.05 1.44 1.22) | 6-S-207 (1.62 1.74 0.91) |
| 6-S-244 (1.37 0.97 1.69) | 6-S-291 (2.36 1.46 1.19) | 6-S-292 (1.69 1.12 1.53) | 6-S-294 (1.65 0.97 1.69) |
| 6-S-295 (1.40 1.21 1.45) | 6-S-296 (1.68 1.20 1.45) | 6-S-305 (1.57 0.87 1.78) | 6-S-342 (3.10 1.48 1.17) |
| 6-S-468 (0.91 1.08 1.57) | 7-S-150 (2.69 1.34 1.34) | 7-S-151 (2.60 1.60 1.08) | 7-S-153 (2.62 1.44 1.23) |
| 7-S-184 (2.44 0.93 1.74) | 7-S-192 (2.05 1.45 1.22) | 7-S-207 (1.61 1.76 0.92) | 7-S-244 (1.36 0.98 1.69) |
| 7-S-291 (2.35 1.48 1.20) | 7-S-292 (1.68 1.14 1.54) | 7-S-294 (1.64 0.98 1.70) | 7-S-295 (1.40 1.22 1.45) |
| 7-S-296 (1.67 1.22 1.46) | 7-S-305 (1.56 0.88 1.79) | 7-S-342 (3.09 1.50 1.18) | 7-S-468 (0.90 1.09 1.58) |
| 8-S-150 (2.55 1.46 1.48) | 8-S-151 (2.46 1.72 1.22) | 8-S-152 (3.10 2.02 0.92) | 8-S-153 (2.48 1.56 1.38) |
| 8-S-184 (2.30 1.06 1.88) | 8-S-192 (1.90 1.58 1.36) | 8-S-206 (0.95 1.93 1.01) | 8-S-207 (1.47 1.88 1.06) |
| 8-S-244 (1.22 1.11 1.83) | 8-S-291 (2.21 1.60 1.34) | 8-S-292 (1.54 1.26 1.68) | 8-S-294 (1.50 1.10 1.84) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 8-S-295 (1.25 1.35 1.59) | 8-S-296 (1.53 1.34 1.60) | 8-S-305 (1.42 1.01 1.93) | 8-S-342 (2.95 1.62 1.32) |
| 9-S-150 (1.58 1.00 2.44) | 9-S-151 (1.49 1.25 2.18) | 9-S-152 (2.14 1.55 1.88) | 9-S-153 (1.52 1.10 2.34) |
| 9-S-192 (0.94 1.11 2.33) | 9-S-291 (1.24 1.13 2.30) | 9-S-342 (1.99 1.52 1.90) | 9-S-343 (2.52 1.65 1.79) |
| 10-S-150 (2.72 1.27 1.30) | 10-S-151 (2.63 1.53 1.05) | 10-S-153 (2.65 1.37 1.20) | 10-S-184 (2.47 0.86 1.71) |
| 10-S-192 (2.08 1.38 1.19) | 10-S-244 (1.39 0.91 1.66) | 10-S-291 (2.38 1.41 1.17) | 10-S-292 (1.71 1.07 1.51) |
| 10-S-294 (1.67 0.91 1.67) | 10-S-295 (1.43 1.15 1.42) | 10-S-296 (1.70 1.15 1.43) | 10-S-305 (1.59 0.82 1.76) |
| 10-S-342 (3.12 1.43 1.15) | 10-S-468 (0.94 1.02 1.55) | 11-S-152 (2.38 1.01 1.29) | 11-S-152 (3.03 1.31 0.99) |
| 11-S-153 (2.41 0.85 1.45) | 11-S-192 (1.83 0.87 1.44) | 11-S-206 (0.88 1.22 1.08) | 11-S-207 (1.40 1.17 1.13) |
| 11-S-291 (2.14 0.89 1.41) | 11-S-342 (2.88 0.91 1.39) | 12-S-150 (2.72 1.02 1.30) | 12-S-151 (2.63 1.28 1.05) |
| 12-S-153 (2.65 1.12 1.20) | 12-S-192 (2.08 1.14 1.19) | 12-S-291 (2.38 1.16 1.17) | 12-S-292 (1.72 0.82 1.51) |
| 12-S-295 (1.43 0.91 1.42) | 12-S-296 (1.70 0.90 1.43) | 12-S-342 (3.12 1.18 1.15) | 13-S-150 (2.76 1.72 1.26) |
| 13-S-151 (2.67 1.98 1.00) | 13-S-153 (2.70 1.82 1.16) | 13-S-154 (2.23 0.95 2.03) | 13-S-184 (2.51 1.31 1.67) |
| 13-S-192 (2.12 1.83 1.15) | 13-S-193 (1.04 0.99 1.99) | 13-S-244 (1.43 1.36 1.62) | 13-S-287 (1.01 1.05 1.93) |
| 13-S-291 (2.42 1.86 1.12) | 13-S-292 (1.76 1.52 1.46) | 13-S-294 (1.72 1.36 1.62) | 13-S-295 (1.47 1.60 1.38) |
| 13-S-296 (1.75 1.60 1.38) | 13-S-305 (1.64 1.26 1.72) | 13-S-331 (1.27 0.84 2.14) | 13-S-342 (3.17 1.88 1.10) |
| 13-S-468 (0.98 1.47 1.51) | 14-S-150 (2.17 1.36 1.86) | 14-S-151 (2.08 1.61 1.60) | 14-S-152 (2.72 1.91 1.30) |
| 14-S-153 (2.10 1.46 1.76) | 14-S-184 (1.92 0.95 2.27) | 14-S-192 (1.52 1.47 1.74) | 14-S-207 (1.09 1.77 1.44) |
| 14-S-244 (0.84 1.00 2.21) | 14-S-291 (1.83 1.49 1.72) | 14-S-292 (1.16 1.15 2.06) | 14-S-294 (1.12 1.00 2.22) |
| 14-S-295 (0.87 1.24 1.97) | 14-S-296 (1.15 1.23 1.98) | 14-S-305 (1.04 0.90 2.31) | 14-S-342 (2.57 1.51 1.70) |
| 14-S-343 (3.10 2.01 1.21) | 15-S-287 (1.96 0.84 0.99) | 16-S-150 (2.69 1.33 1.34) | 16-S-151 (2.60 1.58 1.08) |
| 16-S-153 (2.62 1.43 1.24) | 16-S-184 (2.44 0.92 1.74) | 16-S-192 (2.04 1.44 1.22) | 16-S-207 (1.61 1.74 0.92) |
| 16-S-244 (1.36 0.97 1.69) | 16-S-291 (2.35 1.46 1.20) | 16-S-292 (1.68 1.12 1.54) | 16-S-294 (1.64 0.97 1.70) |
| 16-S-295 (1.39 1.21 1.45) | 16-S-296 (1.67 1.21 1.46) | 16-S-305 (1.56 0.87 1.79) | 16-S-342 (3.09 1.48 1.18) |
| 16-S-468 (0.90 1.08 1.58) | 17-S-150 (3.01 1.44 1.02) | 17-S-153 (2.94 1.54 0.91) | 17-S-184 (2.76 1.03 1.42) |
| 17-S-192 (2.37 1.55 0.90) | 17-S-244 (1.68 1.08 1.37) | 17-S-292 (2.00 1.24 1.22) | 17-S-294 (1.96 1.08 1.38) |
| 17-S-295 (1.72 1.32 1.13) | 17-S-296 (1.99 1.32 1.14) | 17-S-305 (1.88 0.98 1.47) | 17-S-468 (1.22 1.19 1.26) |
| 18-S-150 (2.96 1.16 1.06) | 18-S-153 (2.90 1.26 0.96) | 18-S-192 (2.32 1.28 0.95) | 18-S-244 (1.63 0.81 1.42) |
| 18-S-291 (2.62 1.30 0.92) | 18-S-292 (1.96 0.96 1.26) | 18-S-294 (1.91 0.80 1.42) | 18-S-295 (1.67 1.05 1.18) |
| 18-S-296 (1.95 1.04 1.18) | 18-S-342 (3.37 1.32 0.90) | 18-S-468 (1.18 0.92 1.31) | 19-S-150 (2.01 1.10 2.01) |
| 19-S-151 (1.92 1.36 1.75) | 19-S-152 (2.57 1.66 1.45) | 19-S-153 (1.95 1.20 1.91) | 19-S-192 (1.37 1.21 1.90) |
| 19-S-207 (0.94 1.52 1.59) | 19-S-291 (1.67 1.24 1.87) | 19-S-292 (1.01 0.90 2.21) | 19-S-296 (1.00 0.98 2.13) |
| 19-S-342 (2.42 1.26 1.85) | 19-S-343 (2.97 1.75 1.36) | 20-S-152 (2.03 1.01 1.99) | 20-S-343 (2.41 1.10 1.90) |
| 21-S-150 (2.57 1.36 1.45) | 21-S-151 (2.48 1.62 1.19) | 21-S-153 (2.51 1.46 1.35) | 21-S-184 (2.32 0.95 1.86) |
| 21-S-192 (1.93 1.47 1.34) | 21-S-206 (0.98 1.83 0.98) | 21-S-207 (1.50 1.78 1.03) | 21-S-244 (1.24 1.00 1.81) |
| 21-S-291 (2.23 1.50 1.31) | 21-S-292 (1.57 1.16 1.65) | 21-S-294 (1.52 1.00 1.81) | 21-S-295 (1.28 1.24 1.57) |
| 21-S-296 (1.56 1.24 1.57) | 21-S-305 (1.45 0.91 1.91) | 21-S-342 (2.98 1.52 1.29) | 22-S-150 (3.10 1.70 0.93) |
| 22-S-154 (2.56 0.93 1.70) | 22-S-184 (2.85 1.29 1.33) | 22-S-193 (1.37 0.97 1.65) | 22-S-244 (1.77 1.34 1.28) |
| 22-S-287 (1.35 1.03 1.60) | 22-S-292 (2.09 1.50 1.13) | 22-S-294 (2.05 1.34 1.29) | 22-S-295 (1.80 1.58 1.04) |
| 22-S-296 (2.08 1.58 1.05) | 22-S-305 (1.97 1.24 1.38) | 22-S-331 (1.61 0.82 1.80) | 22-S-468 (1.31 1.45 1.17) |
| 23-S-150 (2.99 1.85 1.04) | 23-S-153 (2.92 1.95 0.93) | 23-S-154 (2.45 1.08 1.81) | 23-S-184 (2.74 1.44 1.44) |
| 23-S-192 (2.35 1.96 0.92) | 23-S-193 (1.26 1.12 1.76) | 23-S-244 (1.66 1.49 1.39) | 23-S-287 (1.24 1.18 1.71) |
| 23-S-292 (1.98 1.65 1.24) | 23-S-294 (1.94 1.49 1.40) | 23-S-295 (1.70 1.73 1.15) | 23-S-296 (1.97 1.73 1.16) |
| 23-S-305 (1.86 1.40 1.49) | 23-S-331 (1.50 0.97 1.91) | 23-S-468 (1.20 1.60 1.28) | 24-S-150 (2.73 1.25 1.30) |
| 24-S-151 (2.64 1.51 1.04) | 24-S-153 (2.66 1.35 1.20) | 24-S-184 (2.48 0.84 1.70) | 24-S-192 (2.08 1.36 1.18) |
| 24-S-244 (1.40 0.89 1.65) | 24-S-291 (2.39 1.39 1.16) | 24-S-292 (1.72 1.05 1.50) | 24-S-294 (1.68 0.89 1.66) |
| 24-S-295 (1.43 1.13 1.41) | 24-S-296 (1.71 1.13 1.42) | 24-S-342 (3.13 1.41 1.14) | 24-S-468 (0.94 1.01 1.54) |
| 26-S-150 (3.09 2.16 0.93) | 26-S-154 (2.56 1.39 1.70) | 26-S-184 (2.84 1.75 1.34) | 26-S-193 (1.36 1.43 1.66) |
| 26-S-244 (1.76 1.80 1.29) | 26-S-287 (1.34 1.49 1.61) | 26-S-292 (2.09 1.96 1.14) | 26-S-294 (2.04 1.80 1.29) |
| 26-S-295 (1.80 2.04 1.05) | 26-S-296 (2.08 2.04 1.06) | 26-S-300 (1.65 1.60 1.45) | 26-S-305 (1.97 1.70 1.39) |
| 26-S-331 (1.60 1.28 1.81) | 26-S-468 (1.31 1.91 1.18) | 27-S-152 (2.12 0.84 1.90) | 27-S-343 (2.50 0.93 1.81) |
| 29-S-152 (2.29 0.85 1.73) | 29-S-343 (2.67 0.94 1.63) | 30-S-150 (2.33 1.07 1.69) | 30-S-151 (2.24 1.33 1.44) |
| 30-S-152 (2.88 1.63 1.14) | 30-S-153 (2.26 1.18 1.59) | 30-S-192 (1.69 1.19 1.58) | 30-S-207 (1.26 1.49 1.28) |
| 30-S-291 (1.99 1.21 1.56) | 30-S-292 (1.32 0.87 1.90) | 30-S-295 (1.04 0.96 1.81) | 30-S-296 (1.31 0.95 1.82) |
| 30-S-342 (2.73 1.23 1.54) | 30-S-343 (3.26 1.72 1.05) | 31-S-150 (2.31 1.12 1.71) | 31-S-151 (2.22 1.38 1.45) |
| 31-S-152 (2.87 1.68 1.15) | 31-S-153 (2.25 1.22 1.61) | 31-S-192 (1.67 1.23 1.60) | 31-S-207 (1.24 1.54 1.29) |
| 31-S-291 (1.97 1.26 1.57) | 31-S-292 (1.31 0.92 1.91) | 31-S-295 (1.02 1.00 1.83) | 31-S-296 (1.30 1.00 1.83) |
| 31-S-342 (2.72 1.28 1.55) | 31-S-343 (3.25 1.77 1.06) | 32-S-150 (2.23 1.27 1.80) | 32-S-151 (2.13 1.53 1.54) |
| 32-S-152 (2.78 1.83 1.24) | 32-S-153 (2.16 1.37 1.70) | 32-S-184 (1.97 0.86 2.21) | 32-S-192 (1.58 1.38 1.69) |
| 32-S-207 (1.15 1.69 1.38) | 32-S-244 (0.90 0.91 2.16) | 32-S-291 (1.89 1.41 1.66) | 32-S-292 (1.22 1.07 2.00) |
| 32-S-294 (1.18 0.91 2.16) | 32-S-295 (0.93 1.15 1.92) | 32-S-296 (1.21 1.15 1.92) | 32-S-305 (1.10 0.82 2.25) |
| 32-S-342 (2.63 1.43 1.64) | 32-S-343 (3.16 1.92 1.15) | 33-S-150 (2.28 1.24 1.74) | 33-S-151 (2.19 1.49 1.49) |
| 33-S-152 (2.83 1.79 1.19) | 33-S-153 (2.21 1.34 1.64) | 33-S-184 (2.03 0.83 2.15) | 33-S-192 (1.64 1.35 1.63) |
| 33-S-207 (1.21 1.65 1.33) | 33-S-244 (0.95 0.88 2.10) | 33-S-291 (1.94 1.37 1.61) | 33-S-292 (1.27 1.03 1.95) |
| 33-S-294 (1.23 0.87 2.11) | 33-S-295 (0.99 1.12 1.86) | 33-S-296 (1.26 1.11 1.87) | 33-S-342 (2.68 1.39 1.59) |
| 33-S-343 (3.21 1.88 1.10) | 34-S-150 (2.40 1.24 1.62) | 34-S-151 (2.31 1.50 1.36) | 34-S-152 (2.96 1.80 1.06) |
| 34-S-153 (2.34 1.34 1.52) | 34-S-184 (2.15 0.84 2.03) | 34-S-192 (1.76 1.29 1.51) | 34-S-206 (0.81 1.71 1.15) |
| 34-S-207 (1.33 1.66 1.20) | 34-S-244 (1.07 0.89 1.98) | 34-S-291 (2.06 1.38 1.48) | 34-S-292 (1.40 1.04 1.82) |
| 34-S-294 (1.36 0.88 1.98) | 34-S-295 (1.11 1.13 1.74) | 34-S-296 (1.39 1.12 1.74) | 34-S-342 (2.81 1.40 1.46) |
| 34-S-343 (3.34 1.89 0.97) | 35-S-150 (2.27 1.29 1.76) | 35-S-151 (2.17 1.55 1.50) | 35-S-152 (2.82 1.85 1.20) |
| 35-S-153 (2.20 1.39 1.66) | 35-S-184 (2.02 0.88 2.17) | 35-S-192 (1.62 1.40 1.65) | 35-S-207 (1.19 1.71 1.34) |
| 35-S-244 (0.94 0.93 2.12) | 35-S-291 (1.93 1.43 1.62) | 35-S-292 (1.26 1.09 1.96) | 35-S-294 (1.22 0.93 2.12) |
| 35-S-295 (0.97 1.17 1.88) | 35-S-296 (1.25 1.17 1.88) | 35-S-305 (1.14 0.84 2.21) | 35-S-342 (2.67 1.45 1.60) |
| 35-S-343 (3.20 1.94 1.11) | 38-S-150 (2.12 0.86 1.90) | 38-S-151 (2.03 1.12 1.64) | 38-S-152 (2.68 1.41 1.34) |
| 38-S-153 (2.06 0.96 1.80) | 38-S-192 (1.48 0.97 1.79) | 38-S-207 (1.05 1.27 1.48) | 38-S-291 (1.78 0.99 1.76) |
| 38-S-342 (2.53 1.01 1.74) | 38-S-343 (3.06 1.51 1.25) | 39-S-150 (2.70 2.03 1.32) | 39-S-151 (2.61 2.29 1.07) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 39-S-153 (2.63 2.13 1.22) | 39-S-154 (2.17 1.26 2.10) | 39-S-184 (2.45 1.62 1.73) | 39-S-192 (2.06 2.14 1.21) |
| 39-S-193 (0.97 1.31 2.05) | 39-S-207 (1.63 2.45 0.91) | 39-S-244 (1.37 1.67 1.68) | 39-S-287 (0.95 1.36 2.00) |
| 39-S-291 (2.36 2.17 1.19) | 39-S-292 (1.69 1.83 1.53) | 39-S-294 (1.65 1.67 1.69) | 39-S-295 (1.41 1.91 1.44) |
| 39-S-296 (1.68 1.91 1.45) | 39-S-300 (1.26 0.91 2.44) | 39-S-305 (1.57 1.58 1.78) | 39-S-331 (1.21 1.16 2.20) |
| 39-S-342 (3.10 2.19 1.17) | 39-S-468 (0.91 1.79 1.57) | 40-S-152 (2.47 0.85 1.55) | 40-S-343 (2.85 0.94 1.46) |
| 41-S-150 (3.01 1.88 1.01) | 41-S-153 (2.95 1.98 0.91) | 41-S-154 (2.48 1.11 1.78) | 41-S-184 (2.76 1.47 1.42) |
| 41-S-193 (1.29 1.16 1.74) | 41-S-244 (1.68 1.52 1.37) | 41-S-287 (1.26 1.21 1.68) | 41-S-292 (2.01 1.68 1.21) |
| 41-S-294 (1.96 1.52 1.37) | 41-S-295 (1.72 1.76 1.13) | 41-S-296 (2.00 1.76 1.13) | 41-S-305 (1.89 1.43 1.47) |
| 41-S-331 (1.52 1.01 1.89) | 41-S-468 (1.23 1.64 1.26) | 44-S-150 (1.85 1.13 2.17) | 44-S-151 (1.76 1.39 1.92) |
| 44-S-152 (2.40 1.69 1.62) | 44-S-153 (1.78 1.23 2.07) | 44-S-192 (1.21 1.25 2.06) | 44-S-291 (1.51 1.27 2.04) |
| 44-S-292 (0.84 0.93 2.38) | 44-S-296 (0.83 1.01 2.30) | 44-S-342 (2.25 1.29 2.02) | 44-S-343 (2.78 1.78 1.53) |
| 45-S-151 (2.36 0.90 1.31) | 45-S-152 (3.00 1.20 1.02) | 45-S-206 (0.86 1.11 1.10) | 45-S-207 (1.38 1.06 1.16) |
| 45-S-342 (2.86 0.80 1.42) | 45-S-343 (3.38 1.29 0.92) | 47-S-150 (2.59 0.82 1.43) | 47-S-151 (2.50 1.08 1.17) |
| 47-S-153 (2.53 0.92 1.33) | 47-S-192 (1.95 0.93 1.32) | 47-S-206 (1.00 1.29 0.96) | 47-S-207 (1.52 1.24 1.01) |
| 47-S-291 (2.25 0.96 1.29) | 47-S-342 (3.00 0.98 1.27) | 48-S-151 (2.43 1.05 1.24) | 48-S-152 (3.08 1.35 0.94) |
| 48-S-153 (2.46 0.89 1.40) | 48-S-192 (1.88 0.90 1.39) | 48-S-206 (0.93 1.26 1.03) | 48-S-207 (1.45 1.21 1.08) |
| 48-S-291 (2.18 0.93 1.36) | 48-S-342 (2.93 0.95 1.34) | 49-S-154 (2.96 1.27 1.30) | 49-S-184 (3.24 1.63 0.94) |
| 49-S-193 (1.77 1.31 1.26) | 49-S-287 (1.74 1.37 1.20) | 49-S-300 (2.05 0.92 1.65) | 49-S-305 (2.37 1.58 0.99) |
| 49-S-331 (2.00 1.16 1.41) | 53-S-150 (2.47 1.60 1.56) | 53-S-151 (2.37 1.85 1.30) | 53-S-152 (3.02 2.15 1.00) |
| 53-S-153 (2.40 1.70 1.46) | 53-S-154 (1.93 0.83 2.33) | 53-S-184 (2.21 1.19 1.97) | 53-S-192 (1.82 1.71 1.45) |
| 53-S-206 (0.87 2.07 1.09) | 53-S-207 (1.39 2.01 1.14) | 53-S-244 (1.14 1.24 1.92) | 53-S-291 (2.13 1.73 1.42) |
| 53-S-292 (1.46 1.39 1.76) | 53-S-294 (1.42 1.24 1.92) | 53-S-295 (1.17 1.48 1.68) | 53-S-296 (1.45 1.47 1.68) |
| 53-S-305 (1.34 1.14 2.01) | 53-S-342 (2.87 1.75 1.40) | 53-S-343 (3.40 2.25 0.91) | 54-S-150 (2.37 1.34 1.65) |
| 54-S-151 (2.28 1.60 1.39) | 54-S-152 (2.92 1.90 1.10) | 54-S-153 (2.30 1.44 1.55) | 54-S-184 (2.12 0.93 2.06) |
| 54-S-192 (1.73 1.45 1.54) | 54-S-207 (1.30 1.76 1.24) | 54-S-244 (1.04 0.98 2.01) | 54-S-291 (2.03 1.48 1.51) |
| 54-S-292 (1.37 1.14 1.86) | 54-S-294 (1.32 0.98 2.01) | 54-S-295 (1.08 1.22 1.77) | 54-S-296 (1.36 1.22 1.77) |
| 54-S-305 (1.25 0.89 2.11) | 54-S-342 (2.77 1.50 1.50) | 54-S-343 (3.30 1.99 1.00) | 55-S-150 (2.29 1.53 1.73) |
| 55-S-151 (2.20 1.79 1.47) | 55-S-152 (2.85 2.09 1.17) | 55-S-153 (2.23 1.63 1.63) | 55-S-184 (2.04 1.13 2.14) |
| 55-S-192 (1.65 1.65 1.62) | 55-S-207 (1.22 1.95 1.31) | 55-S-244 (0.96 1.18 2.09) | 55-S-291 (1.95 1.67 1.59) |
| 55-S-292 (1.29 1.33 1.93) | 55-S-294 (1.25 1.17 2.09) | 55-S-295 (1.00 1.42 1.85) | 55-S-296 (1.28 1.41 1.85) |
| 55-S-305 (1.17 1.08 2.18) | 55-S-342 (2.70 1.69 1.57) | 55-S-343 (3.23 2.18 1.08) | 56-S-150 (1.58 0.82 2.45) |
| 56-S-151 (1.49 1.08 2.19) | 56-S-152 (2.13 1.38 1.89) | 56-S-153 (1.51 0.92 2.35) | 56-S-192 (0.93 0.93 2.34) |
| 56-S-291 (1.24 0.96 2.31) | 56-S-342 (1.98 0.98 2.29) | 56-S-343 (2.51 1.47 1.80) | 58-S-150 (2.43 1.06 1.59) |
| 58-S-151 (2.34 1.32 1.33) | 58-S-152 (2.99 1.62 1.03) | 58-S-153 (2.37 1.16 1.49) | 58-S-192 (1.79 1.17 1.48) |
| 58-S-206 (0.84 1.53 1.12) | 58-S-207 (1.36 1.48 1.17) | 58-S-291 (2.09 1.20 1.45) | 58-S-292 (1.43 0.86 1.79) |
| 58-S-295 (1.14 0.94 1.71) | 58-S-296 (1.42 0.94 1.71) | 58-S-342 (2.84 1.22 1.43) | 58-S-343 (3.37 1.71 0.94) |
| 59-S-150 (2.39 1.09 1.63) | 59-S-151 (2.30 1.35 1.37) | 59-S-152 (2.95 1.65 1.07) | 59-S-153 (2.33 1.19 1.53) |
| 59-S-192 (1.75 1.20 1.52) | 59-S-207 (1.32 1.51 1.21) | 59-S-291 (2.05 1.23 1.49) | 59-S-292 (1.39 0.89 1.83) |
| 59-S-295 (1.10 0.97 1.75) | 59-S-296 (1.38 0.97 1.75) | 59-S-342 (2.80 1.25 1.47) | 59-S-343 (3.33 1.74 0.98) |
| 60-S-150 (2.29 1.21 1.74) | 60-S-151 (2.20 1.46 1.48) | 60-S-152 (2.84 1.76 1.18) | 60-S-153 (2.22 1.31 1.64) |
| 60-S-192 (1.64 1.32 1.62) | 60-S-207 (1.21 1.62 1.32) | 60-S-244 (0.96 0.85 2.09) | 60-S-291 (1.95 1.34 1.60) |
| 60-S-292 (1.28 1.00 1.94) | 60-S-294 (1.24 0.85 2.10) | 60-S-295 (0.99 1.09 1.85) | 60-S-296 (1.27 1.08 1.86) |
| 60-S-342 (2.69 1.36 1.58) | 60-S-343 (3.22 1.86 1.09) | 61-S-152 (2.14 0.87 1.88) | 61-S-343 (2.52 0.96 1.78) |
| 63-S-150 (2.43 1.79 1.59) | 63-S-151 (2.34 2.05 1.34) | 63-S-152 (2.98 2.35 1.04) | 63-S-153 (2.36 1.89 1.49) |
| 63-S-154 (1.90 1.02 2.36) | 63-S-184 (2.18 1.38 2.00) | 63-S-192 (1.79 1.90 1.48) | 63-S-206 (0.84 2.26 1.12) |
| 63-S-207 (1.36 2.21 1.18) | 63-S-244 (1.10 1.43 1.95) | 63-S-291 (2.09 1.93 1.46) | 63-S-292 (1.43 1.59 1.80) |
| 63-S-294 (1.38 1.43 1.96) | 63-S-295 (1.14 1.67 1.71) | 63-S-296 (1.41 1.67 1.72) | 63-S-305 (1.31 1.33 2.05) |
| 63-S-331 (0.94 0.91 2.47) | 63-S-342 (2.83 1.95 1.44) | 63-S-343 (3.36 2.44 0.94) | 64-S-150 (2.36 1.30 1.66) |
| 64-S-151 (2.27 1.56 1.40) | 64-S-152 (2.92 1.86 1.10) | 64-S-153 (2.30 1.40 1.56) | 64-S-184 (2.11 0.89 2.07) |
| 64-S-192 (1.72 1.41 1.55) | 64-S-207 (1.29 1.72 1.24) | 64-S-244 (1.03 0.94 2.02) | 64-S-291 (2.02 1.44 1.52) |
| 64-S-292 (1.36 1.10 1.86) | 64-S-294 (1.32 0.94 2.02) | 64-S-295 (1.07 1.18 1.78) | 64-S-296 (1.35 1.18 1.78) |
| 64-S-305 (1.24 0.85 2.12) | 64-S-342 (2.77 1.46 1.50) | 64-S-343 (3.30 1.95 1.01) | 65-S-152 (2.13 1.07 1.89) |
| 65-S-343 (2.51 1.16 1.79) | 66-S-154 (2.84 1.08 1.42) | 66-S-184 (3.12 1.45 1.09) | 66-S-193 (1.64 1.13 1.38) |
| 66-S-244 (2.04 1.50 1.01) | 66-S-287 (1.62 1.18 1.33) | 66-S-294 (2.32 1.49 1.01) | 66-S-305 (2.25 1.40 1.11) |
| 66-S-331 (1.88 0.98 1.53) | 68-S-151 (1.78 0.81 1.90) | 68-S-152 (2.42 1.11 1.60) | 68-S-343 (2.80 1.20 1.51) |
| 71-S-150 (2.44 1.31 1.59) | 71-S-151 (2.35 1.57 1.33) | 71-S-152 (2.99 1.87 1.03) | 71-S-153 (2.37 1.42 1.49) |
| 71-S-184 (2.19 0.91 1.99) | 71-S-192 (1.79 1.43 1.47) | 71-S-206 (0.84 1.78 1.12) | 71-S-207 (1.36 1.73 1.17) |
| 71-S-244 (1.11 0.96 1.94) | 71-S-291 (2.10 1.45 1.45) | 71-S-292 (1.43 1.11 1.79) | 71-S-294 (1.39 0.95 1.95) |
| 71-S-295 (1.14 1.20 1.70) | 71-S-296 (1.42 1.19 1.71) | 71-S-305 (1.31 0.86 2.04) | 71-S-342 (2.84 1.47 1.43) |
| 71-S-343 (3.37 1.96 0.94) | 72-S-150 (2.70 2.07 1.32) | 72-S-151 (2.61 2.32 1.06) | 72-S-153 (2.64 2.17 1.22) |
| 72-S-154 (2.17 1.30 2.09) | 72-S-184 (2.45 1.66 1.73) | 72-S-192 (2.06 2.18 1.21) | 72-S-193 (0.98 1.34 2.05) |
| 72-S-207 (1.63 2.48 0.90) | 72-S-244 (1.37 1.71 1.68) | 72-S-287 (0.95 1.39 1.99) | 72-S-291 (2.37 2.20 1.18) |
| 72-S-292 (1.70 1.86 1.52) | 72-S-294 (1.66 1.71 1.68) | 72-S-295 (1.41 1.95 1.44) | 72-S-296 (1.69 1.95 1.44) |
| 72-S-300 (1.26 0.95 2.44) | 72-S-305 (1.58 1.61 1.77) | 72-S-331 (1.21 1.19 2.20) | 72-S-342 (3.11 2.22 1.16) |
| 72-S-468 (0.92 1.82 1.56) | 73-S-150 (2.60 2.10 1.42) | 73-S-151 (2.51 2.36 1.17) | 73-S-153 (2.53 2.20 1.32) |
| 73-S-154 (2.07 1.33 2.12) | 73-S-184 (2.35 1.69 1.83) | 73-S-192 (1.96 2.21 1.31) | 73-S-193 (0.87 1.37 2.15) |
| 73-S-206 (1.01 2.57 0.95) | 73-S-207 (1.53 2.52 1.01) | 73-S-244 (1.27 1.74 1.78) | 73-S-287 (0.85 1.43 2.10) |
| 73-S-291 (2.26 2.24 1.29) | 73-S-292 (1.60 1.90 1.63) | 73-S-294 (1.55 1.74 1.78) | 73-S-295 (1.31 1.98 1.54) |
| 73-S-296 (1.59 1.98 1.54) | 73-S-300 (1.16 0.98 2.54) | 73-S-305 (1.48 1.64 1.88) | 73-S-331 (1.11 1.22 2.30) |
| 73-S-342 (3.00 2.26 1.27) | 73-S-468 (0.82 1.85 1.67) | 74-S-150 (2.43 0.98 1.60) | 74-S-151 (2.33 1.24 1.34) |
| 74-S-152 (2.98 1.54 1.04) | 74-S-153 (2.36 1.08 1.50) | 74-S-192 (1.78 1.09 1.49) | 74-S-206 (0.83 1.45 1.13) |
| 74-S-207 (1.35 1.40 1.18) | 74-S-291 (2.09 1.12 1.46) | 74-S-295 (1.13 0.86 1.72) | 74-S-296 (1.41 0.86 1.72) |
| 74-S-342 (2.83 1.14 1.44) | 74-S-343 (3.36 1.63 0.95) | 75-S-150 (3.05 1.19 0.98) | 75-S-244 (1.72 0.83 1.33) |
| 75-S-292 (2.04 0.98 1.18) | 75-S-294 (2.00 0.82 1.34) | 75-S-295 (1.76 1.07 1.09) | 75-S-296 (2.03 1.06 1.10) |
| 75-S-468 (1.26 0.94 1.22) | 76-S-154 (2.85 0.87 1.42) | 76-S-184 (3.13 1.23 1.05) | 76-S-193 (1.65 0.91 1.37) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 76-S-244 (2.05 1.28 1.00) | 76-S-287 (1.63 0.97 1.32) | 76-S-294 (2.33 1.28 1.01) | 76-S-305 (2.25 1.18 1.10) |
| 77-S-150 (2.89 1.52 1.13) | 77-S-153 (2.83 1.63 1.03) | 77-S-184 (2.64 1.12 1.54) | 77-S-192 (2.25 1.64 1.02) |
| 77-S-244 (1.56 1.17 1.49) | 77-S-287 (1.14 0.85 1.80) | 77-S-291 (2.56 1.66 0.99) | 77-S-292 (1.89 1.32 1.33) |
| 77-S-294 (1.85 1.16 1.49) | 77-S-295 (1.60 1.41 1.25) | 77-S-296 (1.88 1.40 1.25) | 77-S-305 (1.77 1.07 1.58) |
| 77-S-342 (3.30 1.68 0.97) | 77-S-468 (1.11 1.28 1.37) | 78-S-150 (3.07 1.58 0.95) | 78-S-154 (2.54 0.81 1.72) |
| 78-S-184 (2.82 1.17 1.36) | 78-S-193 (1.34 0.85 1.68) | 78-S-244 (1.74 1.22 1.31) | 78-S-287 (1.32 0.90 1.63) |
| 78-S-292 (2.07 1.37 1.16) | 78-S-294 (2.02 1.22 1.31) | 78-S-295 (1.78 1.46 1.07) | 78-S-296 (2.05 1.46 1.08) |
| 78-S-305 (1.95 1.12 1.41) | 78-S-468 (1.29 1.33 1.20) | 80-S-343 (2.58 0.83 1.73) | 83-S-150 (1.54 0.88 2.49) |
| 83-S-151 (1.45 1.14 2.23) | 83-S-152 (2.09 1.44 1.93) | 83-S-153 (1.47 0.98 2.39) | 83-S-192 (0.89 0.99 2.37) |
| 83-S-291 (1.20 1.02 2.35) | 83-S-342 (1.94 1.04 2.33) | 83-S-343 (2.47 1.53 1.84) | 85-S-152 (1.64 0.88 2.38) |
| 85-S-343 (2.02 0.97 2.29) | 88-S-150 (2.37 1.21 1.66) | 88-S-151 (2.28 1.47 1.40) | 88-S-152 (2.92 1.76 1.10) |
| 88-S-153 (2.30 1.31 1.56) | 88-S-192 (1.72 1.32 1.54) | 88-S-207 (1.29 1.62 1.24) | 88-S-244 (1.04 0.85 2.01) |
| 88-S-291 (2.03 1.34 1.52) | 88-S-292 (1.36 1.00 1.86) | 88-S-294 (1.32 0.85 2.02) | 88-S-295 (1.07 1.09 1.77) |
| 88-S-296 (1.35 1.09 1.78) | 88-S-342 (2.77 1.36 1.50) | 88-S-343 (3.30 1.86 1.01) | 91-S-150 (3.12 2.58 0.90) |
| 91-S-154 (2.59 1.81 1.68) | 91-S-184 (2.87 2.18 1.31) | 91-S-189 (2.19 1.18 2.31) | 91-S-193 (1.39 1.86 1.63) |
| 91-S-244 (1.79 2.23 1.26) | 91-S-287 (1.37 1.91 1.58) | 91-S-292 (2.11 2.38 1.11) | 91-S-294 (2.07 2.22 1.27) |
| 91-S-295 (1.83 2.47 1.02) | 91-S-296 (2.10 2.46 1.03) | 91-S-300 (1.68 1.47 2.02) | 91-S-301 (1.73 1.18 2.31) |
| 91-S-302 (1.85 1.03 2.46) | 91-S-305 (1.99 2.13 1.36) | 91-S-331 (1.63 1.71 1.78) | 91-S-468 (1.34 2.34 1.15) |
| 94-S-150 (2.63 1.63 1.40) | 94-S-151 (2.54 1.89 1.14) | 94-S-153 (2.56 1.73 1.30) | 94-S-154 (2.09 0.86 2.17) |
| 94-S-184 (2.38 1.22 1.80) | 94-S-192 (1.98 1.74 1.28) | 94-S-193 (0.90 0.91 2.12) | 94-S-206 (1.03 2.10 0.93) |
| 94-S-207 (1.55 2.05 0.98) | 94-S-244 (1.30 1.27 1.75) | 94-S-287 (0.88 0.96 2.07) | 94-S-291 (2.29 1.77 1.26) |
| 94-S-292 (1.62 1.43 1.60) | 94-S-294 (1.58 1.27 1.76) | 94-S-295 (1.33 1.51 1.51) | 94-S-296 (1.61 1.51 1.52) |
| 94-S-305 (1.50 1.18 1.85) | 94-S-342 (3.03 1.79 1.24) | 94-S-468 (0.84 1.39 1.64) | 95-S-150 (2.62 1.52 1.40) |
| 95-S-151 (2.53 1.78 1.14) | 95-S-153 (2.56 1.62 1.30) | 95-S-184 (2.37 1.11 1.81) | 95-S-192 (1.98 1.63 1.29) |
| 95-S-206 (1.03 1.99 0.93) | 95-S-207 (1.55 1.93 0.98) | 95-S-244 (1.29 1.16 1.76) | 95-S-287 (0.87 0.85 2.07) |
| 95-S-291 (2.28 1.65 1.26) | 95-S-292 (1.62 1.31 1.60) | 95-S-294 (1.58 1.16 1.76) | 95-S-295 (1.33 1.40 1.52) |
| 95-S-296 (1.61 1.40 1.52) | 95-S-305 (1.50 1.06 1.85) | 95-S-342 (3.03 1.67 1.24) | 95-S-468 (0.84 1.27 1.64) |
| 96-S-152 (3.05 1.08 0.97) | 96-S-206 (0.91 0.99 1.06) | 96-S-207 (1.43 0.94 1.11) | 97-S-150 (2.72 1.76 1.31) |
| 97-S-151 (2.63 2.01 1.05) | 97-S-153 (2.65 1.86 1.21) | 97-S-154 (2.18 0.99 2.08) | 97-S-184 (2.47 1.35 1.71) |
| 97-S-192 (2.07 1.87 1.19) | 97-S-193 (0.99 1.03 2.03) | 97-S-244 (1.39 1.40 1.66) | 97-S-287 (0.97 1.08 1.98) |
| 97-S-291 (2.38 1.89 1.17) | 97-S-292 (1.71 1.55 1.51) | 97-S-294 (1.67 1.40 1.67) | 97-S-295 (1.42 1.64 1.42) |
| 97-S-296 (1.70 1.63 1.43) | 97-S-305 (1.59 1.30 1.76) | 97-S-331 (1.23 0.88 2.18) | 97-S-342 (3.12 1.91 1.15) |
| 97-S-468 (0.93 1.51 1.55) | 98-S-150 (2.37 1.15 1.66) | 98-S-151 (2.28 1.41 1.40) | 98-S-152 (2.92 1.71 1.10) |
| 98-S-153 (2.30 1.25 1.55) | 98-S-192 (1.73 1.26 1.54) | 98-S-207 (1.30 1.57 1.24) | 98-S-291 (2.03 1.29 1.52) |
| 98-S-292 (1.36 0.95 1.86) | 98-S-295 (1.08 1.03 1.77) | 98-S-296 (1.35 1.03 1.78) | 98-S-342 (2.77 1.31 1.50) |
| 98-S-343 (3.30 1.80 1.01) | 102-S-150 (1.82 0.99 2.20) | 102-S-151 (1.73 1.25 1.95) | 102-S-152 (2.37 1.55 1.65) |
| 102-S-153 (1.75 1.09 2.10) | 102-S-192 (1.18 1.10 2.09) | 102-S-291 (1.48 1.13 2.07) | 102-S-296 (0.80 0.87 2.33) |
| 102-S-342 (2.22 1.15 2.05) | 102-S-343 (2.75 1.64 1.55) | 103-S-154 (2.74 0.84 1.52) | 103-S-184 (3.03 1.21 1.15) |
| 103-S-193 (1.55 0.89 1.47) | 103-S-244 (1.95 1.26 1.10) | 103-S-287 (1.53 0.94 1.42) | 103-S-292 (2.27 1.41 0.95) |
| 103-S-294 (2.23 1.25 1.11) | 103-S-305 (2.15 1.16 1.20) | 103-S-468 (1.49 1.37 0.99) | 104-S-150 (2.17 1.42 1.86) |
| 104-S-151 (2.07 1.68 1.60) | 104-S-152 (2.72 1.98 1.30) | 104-S-153 (1.20 1.52 1.76) | 104-S-184 (1.92 1.01 2.27) |
| 104-S-192 (1.52 1.53 1.75) | 104-S-207 (1.09 1.84 1.44) | 104-S-244 (0.84 1.06 2.22) | 104-S-291 (1.83 1.56 1.72) |
| 104-S-292 (1.16 1.21 2.06) | 104-S-294 (1.12 1.06 2.22) | 104-S-295 (0.87 1.30 1.98) | 104-S-296 (1.15 1.30 1.98) |
| 104-S-305 (1.04 0.96 2.31) | 104-S-342 (2.57 1.57 1.70) | 104-S-343 (3.10 2.07 1.21) | 105-S-150 (1.28 0.90 2.74) |
| 105-S-151 (1.19 1.16 2.48) | 105-S-152 (1.84 1.46 2.18) | 105-S-153 (1.22 1.00 2.64) | 105-S-291 (0.94 1.04 2.60) |
| 105-S-342 (1.69 1.06 2.58) | 105-S-343 (2.22 1.55 2.09) | 106-S-150 (1.87 1.46 2.15) | 106-S-151 (1.78 1.72 1.90) |
| 106-S-152 (2.42 2.02 1.60) | 106-S-153 (1.80 1.57 2.05) | 106-S-184 (1.62 1.06 2.56) | 106-S-192 (1.23 1.58 2.04) |
| 106-S-291 (1.53 1.60 2.02) | 106-S-292 (0.87 1.26 2.36) | 106-S-294 (0.82 1.10 2.51) | 106-S-296 (0.86 1.34 2.28) |
| 106-S-342 (2.27 1.62 2.00) | 106-S-343 (2.80 2.11 1.50) | 107-S-343 (1.75 0.81 2.55) | 111-S-150 (0.83 0.88 3.20) |
| 111-S-152 (1.38 1.44 2.64) | 111-S-342 (1.23 1.04 3.04) | 111-S-343 (1.76 1.53 2.55) | 112-S-152 (2.19 1.06 1.83) |
| 112-S-343 (2.57 1.15 1.74) | 114-S-150 (1.99 1.23 2.04) | 114-S-151 (1.90 1.48 1.78) | 114-S-152 (2.54 1.78 1.48) |
| 114-S-153 (1.92 1.33 1.94) | 114-S-184 (1.74 0.82 2.44) | 114-S-192 (1.34 1.34 1.92) | 114-S-207 (0.91 1.64 1.62) |
| 114-S-291 (1.65 1.36 1.90) | 114-S-292 (0.98 1.02 2.24) | 114-S-294 (0.94 0.86 2.40) | 114-S-296 (0.97 1.10 2.16) |
| 114-S-342 (2.39 1.38 1.88) | 114-S-343 (2.92 1.87 1.39) | 117-S-150 (2.46 1.68 1.57) | 117-S-151 (2.37 1.94 1.31) |
| 117-S-152 (3.01 2.24 1.01) | 117-S-153 (2.39 1.78 1.47) | 117-S-154 (1.92 0.91 2.34) | 117-S-184 (2.21 1.27 1.98) |
| 117-S-192 (1.81 1.79 1.46) | 117-S-206 (0.86 2.15 1.10) | 117-S-207 (1.38 2.10 1.15) | 117-S-244 (1.13 1.32 1.93) |
| 117-S-291 (2.12 1.82 1.43) | 117-S-292 (1.45 1.47 1.77) | 117-S-294 (1.41 1.32 1.93) | 117-S-295 (1.16 1.56 1.69) |
| 117-S-296 (1.44 1.56 1.69) | 117-S-305 (1.33 1.22 2.02) | 117-S-331 (0.96 0.80 2.44) | 117-S-342 (2.86 1.84 1.41) |
| 117-S-343 (3.39 2.33 0.92) | 118-S-151 (1.45 0.86 2.22) | 118-S-152 (2.10 1.16 1.92) | 118-S-343 (2.48 1.25 1.83) |
| 119-S-152 (2.13 0.95 1.89) | 119-S-343 (2.51 1.04 1.80) | 120-S-150 (2.29 2.49 1.74) | 120-S-151 (2.20 2.75 1.48) |
| 120-S-152 (2.84 3.05 1.18) | 120-S-153 (2.22 2.59 1.64) | 120-S-154 (1.75 1.72 2.51) | 120-S-184 (2.04 2.08 2.14) |
| 120-S-189 (1.36 1.08 3.15) | 120-S-192 (1.64 2.60 1.62) | 120-S-207 (1.21 2.91 1.32) | 120-S-244 (0.96 2.13 2.09) |
| 120-S-291 (1.95 2.63 1.60) | 120-S-292 (1.28 2.29 1.94) | 120-S-294 (1.24 2.13 2.10) | 120-S-295 (0.99 2.37 1.85) |
| 120-S-296 (1.27 2.37 1.86) | 120-S-300 (0.85 1.37 2.85) | 120-S-301 (0.90 1.08 3.14) | 120-S-302 (1.02 0.93 3.30) |
| 120-S-305 (1.16 2.04 2.19) | 120-S-342 (2.69 2.65 1.58) | 120-S-343 (3.22 3.14 1.09) | 123-S-152 (2.49 0.82 1.53) |
| 123-S-343 (2.87 0.91 1.44) | 124-S-150 (2.68 1.00 1.34) | 124-S-151 (2.59 1.25 1.08) | 124-S-153 (2.62 1.10 1.24) |
| 124-S-192 ()2.04 1.11 1.23) | 124-S-207 (1.61 1.41 0.92) | 124-S-291 (2.34 1.13 1.20) | 124-S-295 (1.39 0.88 1.46) |
| 124-S-296 (1.67 0.87 1.46) | 124-S-342 (3.09 1.15 1.18) | 127-S-150 (1.92 1.58 2.11) | 127-S-151 (1.83 1.84 1.85) |
| 127-S-152 (2.47 2.14 1.55) | 127-S-153 (1.85 1.68 2.01) | 127-S-154 (1.38 0.81 2.88) | 127-S-184 (1.67 1.17 2.51) |
| 127-S-192 (1.27 1.69 1.99) | 127-S-207 (0.84 2.00 1.69) | 127-S-291 (1.58 1.72 1.97) | 127-S-292 (0.91 1.38 2.31) |
| 127-S-294 (0.87 1.22 2.47) | 127-S-296 (0.90 1.46 2.23) | 127-S-342 (2.32 1.74 1.95) | 127-S-343 (2.85 2.23 1.46) |
| 128-S-150 (2.77 2.40 1.26) | 128-S-151 (2.67 2.66 1.00) | 128-S-153 (2.70 2.50 1.16) | 128-S-154 (2.23 1.63 2.03) |
| 128-S-184 (2.52 1.99 1.67) | 128-S-189 (1.84 0.99 2.67) | 128-S-192 (2.12 2.51 1.15) | 128-S-193 (1.04 1.67 1.98) |
| 128-S-244 (1.44 2.04 1.62) | 128-S-287 (1.01 1.73 1.93) | 128-S-291 (2.43 2.54 1.12) | 128-S-292 (1.76 2.19 1.46) |
| 128-S-294 (1.72 2.04 1.62) | 128-S-295 (1.47 2.28 1.38) | 128-S-296 (1.75 2.28 1.38) | 128-S-300 (1.33 1.28 2.38) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 128-S-301 (1.38 0.99 2.66) | 128-S-302 (1.50 0.84 2.82) | 128-S-305 (1.64 1.94 1.71) | 128-S-331 (1.27 1.52 2.13) |
| 128-S-342 (3.17 2.55 1.10) | 128-S-468 (0.98 2.15 1.50) | 129-S-150 (2.15 2.10 1.88) | 129-S-151 (2.06 2.36 1.62) |
| 129-S-152 (2.70 2.66 1.32) | 129-S-153 (2.08 2.20 1.78) | 129-S-154 (1.61 1.33 2.65) | 129-S-184 (1.90 1.69 2.29) |
| 129-S-192 (1.50 2.21 1.77) | 129-S-207 (1.07 2.52 1.46) | 129-S-244 (0.82 1.74 2.24) | 129-S-291 (1.81 2.24 1.74) |
| 129-S-292 (1.14 1.90 2.08) | 129-S-294 (1.10 1.74 2.24) | 129-S-295 (0.85 1.98 2.00) | 129-S-296 (1.13 1.98 2.00) |
| 129-S-305 (1.02 1.65 2.33) | 129-S-342 (2.55 2.26 1.72) | 129-S-343 (3.08 2.75 1.23) | 130-S-150 (2.84 1.80 1.19) |
| 130-S-151 (2.75 2.06 0.93) | 130-S-153 (2.77 1.90 1.09) | 130-S-154 (2.30 1.03 1.96) | 130-S-184 (2.59 1.39 1.60) |
| 130-S-192 (2.19 1.91 1.07) | 130-S-193 (1.11 1.08 1.91) | 130-S-244 (1.51 1.44 1.54) | 130-S-287 (1.08 1.13 1.86) |
| 130-S-291 (2.50 1.94 1.05) | 130-S-292 (1.83 1.60 1.39) | 130-S-294 (1.79 1.44 1.55) | 130-S-295 (1.54 1.68 1.30) |
| 130-S-296 (1.82 1.68 1.31) | 130-S-305 (1.71 1.35 1.64) | 130-S-331 (1.34 0.93 2.06) | 130-S-342 (3.24 1.96 1.03) |
| 130-S-468 (1.05 1.56 1.43) | 131-S-150 (1.52 0.93 2.50) | 131-S-151 (1.43 1.18 2.25) | 131-S-152 (2.07 1.48 1.95) |
| 131-S-153 (1.45 1.03 2.40) | 131-S-192 (0.88 1.04 2.39) | 131-S-291 (1.18 1.06 2.37) | 131-S-342 (1.92 1.08 2.35) |
| 131-S-343 (2.45 1.57 1.86) | 132-S-151 (1.52 0.94 2.16) | 132-S-152 (2.16 1.24 1.86) | 132-S-291 (1.27 0.82 2.28) |
| 132-S-342 (2.01 0.84 2.26) | 132-S-343 (2.54 1.33 1.77) | 134-S-150 (2.31 3.44 1.72) | 134-S-151 (2.22 3.69 1.46) |
| 134-S-152 (2.86 3.99 1.16) | 134-S-153 (2.24 3.54 1.62) | 134-S-154 (1.77 2.66 2.49) | 134-S-184 (2.06 3.03 2.12) |
| 134-S-189 (1.38 2.03 3.12) | 134-S-192 (1.66 3.55 1.60) | 134-S-207 (1.23 3.85 1.30) | 134-S-244 (0.98 3.08 2.07) |
| 134-S-291 (1.97 3.57 1.58) | 134-S-292 (1.30 3.23 1.92) | 134-S-294 (1.26 3.07 2.08) | 134-S-295 (1.01 3.32 1.83) |
| 134-S-296 (1.29 3.31 1.84) | 134-S-300 (0.87 2.32 2.83) | 134-S-301 (0.92 2.03 3.12) | 134-S-302 (1.04 1.88 3.27) |
| 134-S-305 (1.18 2.98 2.17) | 134-S-331 (0.82 2.56 2.59) | 134-S-342 (2.71 3.59 1.56) | 134-S-343 (3.24 4.08 1.07) |
| 135-S-150 (1.71 2.59 2.31) | 135-S-151 (1.62 2.85 2.06) | 135-S-152 (2.26 3.15 1.76) | 135-S-153 (1.64 2.69 2.21) |
| 135-S-154 (1.18 1.82 3.09) | 135-S-184 (1.46 2.18 2.72) | 135-S-192 (1.07 2.70 2.20) | 135-S-291 (1.37 2.73 2.18) |
| 135-S-342 (2.11 2.75 2.16) | 135-S-343 (2.64 3.24 1.67) | 136-S-150 (1.50 1.99 2.52) | 136-S-151 (1.41 2.25 2.26) |
| 136-S-152 (2.06 2.54 1.96) | 136-S-153 (1.44 2.09 2.42) | 136-S-154 (0.97 1.22 3.29) | 136-S-184 (1.25 1.58 2.93) |
| 136-S-192 (0.86 2.10 2.41) | 136-S-291 (1.16 2.12 2.38) | 136-S-342 (1.91 2.14 2.36) | 136-S-343 (2.44 2.64 1.87) |
| 137-S-150 (2.97 1.56 1.06) | 137-S-153 (2.90 1.66 0.96) | 137-S-184 (2.72 1.16 1.46) | 137-S-192 (2.32 1.68 0.94) |
| 137-S-193 (1.24 0.84 1.78) | 137-S-244 (1.64 1.21 1.41) | 137-S-287 (1.22 0.89 1.73) | 137-S-291 (2.63 1.70 0.92) |
| 137-S-292 (1.96 1.36 1.26) | 137-S-294 (1.92 1.20 1.42) | 137-S-295 (1.67 1.45 1.17) | 137-S-296 (1.95 1.44 1.18) |
| 137-S-305 (1.84 1.11 1.51) | 137-S-468 (1.18 1.32 1.30) | 138-S-150 (2.29 0.95 1.74) | 138-S-151 (2.20 1.21 1.48) |
| 138-S-152 (2.84 1.51 1.18) | 138-S-153 (2.22 1.05 1.64) | 138-S-192 (1.64 1.06 1.62) | 138-S-207 (1.21 1.37 1.32) |
| 138-S-291 (1.95 1.09 1.60) | 138-S-295 (0.99 0.83 1.85) | 138-S-296 (1.27 0.83 1.86) | 138-S-342 (2.69 1.11 1.58) |
| 138-S-343 (3.22 1.60 1.09) | 140-S-150 (2.19 2.23 1.84) | 140-S-151 (2.10 2.49 1.58) | 140-S-152 (2.74 2.79 1.28) |
| 140-S-153 (2.12 2.33 1.74) | 140-S-154 (1.65 1.46 2.61) | 140-S-184 (1.94 1.83 2.25) | 140-S-189 (1.26 0.82 3.25) |
| 140-S-192 (1.54 2.35 1.73) | 140-S-207 (1.11 2.65 1.42) | 140-S-244 (0.86 1.88 2.20) | 140-S-291 (1.85 2.37 1.70) |
| 140-S-292 (1.18 2.03 2.04) | 140-S-294 (1.14 1.87 2.20) | 140-S-295 (0.89 2.12 1.96) | 140-S-296 (1.17 2.11 1.96) |
| 140-S-305 (1.06 1.78 2.29) | 140-S-342 (2.59 2.39 1.68) | 140-S-343 (3.12 2.88 1.19) | 141-S-150 (1.04 2.15 2.99) |
| 141-S-151 (0.94 2.41 2.73) | 141-S-152 (1.59 2.71 2.43) | 141-S-153 (0.97 2.25 2.89) | 141-S-342 (1.44 2.31 2.83) |
| 141-S-343 (1.97 2.80 2.34) | 147-S-152 (2.63 0.94 1.39) | 147-S-207 (1.01 0.80 1.53) | 147-S-343 (3.01 1.04 1.30) |
| 148-S-150 (1.83 1.09 2.20) | 148-S-151 (1.74 1.35 1.94) | 148-S-152 (2.38 1.65 1.64) | 148-S-153 (1.76 1.19 2.10) |
| 148-S-192 (1.18 1.21 2.09) | 148-S-291 (1.49 1.23 2.06) | 148-S-292 (0.82 0.89 2.40) | 148-S-296 (0.81 0.97 2.32) |
| 148-S-342 (2.23 1.25 2.04) | 148-S-343 (2.76 1.74 1.55) | 149-S-150 (2.46 1.76 1.57) | 149-S-151 (2.36 2.01 1.31) |
| 149-S-152 (3.01 2.31 1.01) | 149-S-153 (2.39 1.86 1.47) | 149-S-154 (1.92 0.98 2.34) | 149-S-184 (2.20 1.35 1.98) |
| 149-S-192 (1.81 1.87 1.46) | 149-S-206 (0.86 2.23 1.10) | 149-S-207 (1.38 2.17 1.15) | 149-S-244 (1.13 1.40 1.93) |
| 149-S-291 (2.12 1.89 1.43) | 149-S-292 (1.45 1.55 1.77) | 149-S-294 (1.41 1.39 1.93) | 149-S-295 (1.16 1.64 1.69) |
| 149-S-296 (1.44 1.63 1.69) | 149-S-305 (1.33 1.30 2.02) | 149-S-331 (0.96 0.88 2.44) | 149-S-342 (2.86 1.91 1.41) |
| 149-S-343 (3.39 2.40 0.92) | 154-S-152 (1.09 1.33 2.93) | 154-S-342 (0.94 0.93 3.33) | 154-S-343 (1.47 1.42 2.84) |
| 155-S-150 (1.55 2.24 2.47) | 155-S-151 (1.46 2.50 2.22) | 155-S-152 (2.10 2.80 1.92) | 155-S-153 (1.48 2.35 2.37) |
| 155-S-154 (1.02 1.47 3.25) | 155-S-184 (1.30 1.84 2.88) | 155-S-192 (0.91 2.36 2.36) | 155-S-291 (1.21 2.38 2.34) |
| 155-S-342 (1.95 2.40 2.32) | 155-S-343 (2.48 2.89 1.83) | 156-S-150 (2.28 2.89 1.75) | 156-S-151 (2.19 3.15 1.49) |
| 156-S-152 (2.83 3.45 1.19) | 156-S-153 (2.21 2.99 1.64) | 156-S-154 (1.75 2.12 2.52) | 156-S-184 (2.03 2.48 2.15) |
| 156-S-189 (1.35 1.48 3.15) | 156-S-192 (1.64 3.00 1.63) | 156-S-207 (1.21 3.31 1.33) | 156-S-244 (0.95 2.53 2.10) |
| 156-S-291 (1.94 3.03 1.61) | 156-S-292 (1.27 2.69 1.95) | 156-S-294 (1.23 2.53 2.11) | 156-S-295 (0.99 2.77 1.86) |
| 156-S-296 (1.26 2.77 1.87) | 156-S-300 (0.84 1.77 2.86) | 156-S-301 (0.89 1.48 3.15) | 156-S-302 (1.01 1.33 3.30) |
| 156-S-305 (1.15 2.44 2.20) | 156-S-342 (2.68 3.05 1.59) | 156-S-343 (3.21 3.54 1.10) | 157-S-150 (1.52 2.48 2.50) |
| 157-S-151 (1.43 2.74 2.24) | 157-S-152 (2.08 3.04 1.94) | 157-S-153 (1.46 2.58 2.40) | 157-S-154 (0.99 1.71 3.27) |
| 157-S-184 (1.27 2.08 2.91) | 157-S-192 (0.88 2.60 2.39) | 157-S-291 (1.18 2.62 2.36) | 157-S-342 (1.93 2.64 2.34) |
| 157-S-343 (2.46 3.13 1.85) | 158-S-150 (1.46 1.56 2.56) | 158-S-151 (1.37 1.82 2.30) | 158-S-152 (2.01 2.12 2.01) |
| 158-S-153 (1.39 1.66 2.46) | 158-S-184 (1.21 1.15 2.97) | 158-S-192 (0.82 1.67 2.45) | 158-S-291 (1.12 1.70 2.42) |
| 158-S-342 (1.87 1.72 2.41) | 158-S-343 (2.39 2.21 1.91) | 159-S-150 (1.73 1.92 2.20) | 159-S-151 (1.64 3.23 2.03) |
| 159-S-152 (2.28 3.53 1.74) | 159-S-153 (1.66 3.08 2.19) | 159-S-154 (1.20 2.20 3.06) | 159-S-184 (1.48 2.57 2.70) |
| 159-S-189 (0.80 1.57 3.70) | 159-S-192 (1.09 3.09 2.18) | 159-S-291 (1.39 3.11 2.15) | 159-S-342 (2.13 3.13 2.14) |
| 159-S-343 (2.66 3.62 1.64) | 160-S-150 (1.04 2.06 2.99) | 160-S-151 (0.95 2.32 2.73) | 160-S-152 (1.59 2.62 2.43) |
| 160-S-153 (0.97 2.16 2.89) | 160-S-342 (1.44 2.22 2.83) | 160-S-343 (1.97 2.71 2.34) | 161-S-150 (1.02 1.47 3.00) |
| 161-S-151 (0.93 1.73 2.74) | 161-S-152 (1.58 2.03 2.44) | 161-S-153 (0.96 1.57 2.90) | 161-S-342 (1.43 1.63 2.84) |
| 161-S-343 (1.96 2.12 2.35) | 166-S-150 (0.81 0.94 3.21) | 166-S-152 (1.37 1.50 2.65) | 166-S-342 (1.22 1.10 3.05) |
| 166-S-343 (1.75 1.59 2.56) | 167-S-150 (0.95 1.26 3.07) | 167-S-151 (0.86 1.52 2.82) | 167-S-152 (1.50 1.82 2.52) |
| 167-S-153 (0.88 1.36 2.97) | 167-S-342 (1.35 1.42 2.92) | 167-S-343 (1.88 1.91 2.42) | 168-S-150 (1.39 1.97 2.64) |
| 168-S-151 (1.30 2.23 2.38) | 168-S-152 (1.94 2.53 2.08) | 168-S-153 (1.32 2.07 2.54) | 168-S-154 (0.85 1.20 3.41) |
| 168-S-184 (1.14 1.57 3.04) | 168-S-291 (1.05 2.11 2.50) | 168-S-342 (1.79 2.13 2.48) | 168-S-343 (2.32 2.62 1.99) |
| 170-S-152 (1.30 2.09 2.72) | 170-S-342 (1.15 1.69 3.12) | 170-S-343 (1.68 2.18 2.63) | 171-S-150 (1.04 0.95 2.98) |
| 171-S-151 (0.95 1.21 2.72) | 171-S-152 (1.60 1.51 2.42) | 171-S-153 (0.98 1.05 2.88) | 171-S-342 (1.45 1.12 2.87) |
| 171-S-343 (1.98 1.60 2.33) | 175-S-150 (1.81 1.31 2.21) | 175-S-151 (1.72 1.57 1.95) | 175-S-152 (2.36 1.87 1.66) |
| 175-S-153 (1.74 1.41 2.11) | 175-S-184 (1.56 0.9 2.62) | 175-S-192 (1.17 1.42 2.10) | 175-S-291 (1.47 1.45 2.07) |
| 175-S-292 (0.81 1.11 2.42) | 175-S-342 (2.22 1.47 2.06) | 175-S-343 (2.74 1.96 1.56) | 176-S-150 (1.87 1.55 2.16) |
| 176-S-151 (1.78 1.81 1.90) | 176-S-152 (2.42 2.11 1.60) | 176-S-153 (1.80 1.66 2.06) | 176-S-184 (1.62 1.15 2.57) |
| 176-S-192 (1.22 1.67 2.04) | 176-S-291 (1.53 1.69 2.02) | 176-S-292 (0.86 1.35 2.36) | 176-S-294 (0.82 1.19 2.52) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 176-S-296 (0.85 1.43 2.28) | 176-S-342 (2.27 1.71 2.00) | 176-S-343 (2.80 2.20 1.51) | 177-S-343 (1.92 0.87 2.39) |
| 182-S-150 (1.85 1.38 2.18) | 182-S-151 (1.75 1.64 1.92) | 182-S-152 (2.40 1.94 1.62) | 182-S-153 (1.78 1.48 2.08) |
| 182-S-184 (1.60 0.97 2.59) | 182-S-192 (1.20 1.49 2.07) | 182-S-291 (1.51 1.52 2.04) | 182-S-292 (0.84 1.18 2.38) |
| 182-S-296 (0.83 1.26 2.30) | 182-S-342 (2.25 1.54 2.02) | 182-S-343 (2.78 2.03 1.53) | 184-S-152 (0.80 0.97 3.22) |
| 184-S-343 (1.18 1.06 3.13) | 187-S-150 (1.11 1.04 2.92) | 187-S-151 (1.01 1.29 2.66) | 187-S-152 (1.66 1.59 2.36) |
| 187-S-153 (1.04 1.14 2.82) | 187-S-342 (1.51 1.19 2.76) | 187-S-343 (2.04 1.68 2.27) | 188-S-152 (1.23 1.55 2.79) |
| 188-S-342 (1.08 1.15 3.19) | 188-S-343 (1.61 1.64 2.70) | 189-S-150 (0.93 1.41 3.10) | 189-S-151 (0.84 1.67 2.84) |
| 189-S-152 (1.48 1.97 2.54) | 189-S-153 (0.86 1.51 3.00) | 189-S-342 (1.33 1.57 2.94) | 189-S-343 (1.86 2.06 2.45) |
| 193-S-151 (1.64 0.98 2.04) | 193-S-152 (2.28 1.28 1.74) | 193-S-153 (1.66 0.83 2.20) | 193-S-192 (1.08 0.84 2.19) |
| 193-S-291 (1.39 0.86 2.16) | 193-S-342 (2.13 0.88 2.14) | 193-S-343 (2.66 1.37 1.65) | 194-S-150 (0.87 1.28 3.15) |
| 194-S-152 (1.43 1.84 2.59) | 194-S-153 (0.81 1.38 3.05) | 194-S-342 (1.28 1.44 2.99) | 194-S-343 (1.81 1.93 2.50) |
| 195-S-152 (1.37 1.12 2.65) | 195-S-343 (1.75 1.21 2.56) | 195-S-150 (1.78 1.24 2.25) | 195-S-151 (1.68 2.44 1.99) |
| 196-S-152 (2.33 2.74 1.69) | 196-S-153 (1.71 2.28 2.15) | 196-S-154 (1.24 1.41 3.02) | 196-S-184 (1.53 1.77 2.66) |
| 196-S-192 (1.13 2.29 2.14) | 196-S-291 (1.44 2.32 2.11) | 196-S-342 (2.18 2.34 2.09) | 196-S-343 (2.71 2.83 1.60) |
| 197-S-152 (1.23 2.06 2.79) | 197-S-342 (1.08 1.66 3.19) | 197-S-343 (1.61 2.15 2.70) | 198-S-152 (1.66 1.06 2.36) |
| 198-S-343 (2.04 1.15 2.27) | 199-S-150 (2.88 1.62 1.15) | 199-S-153 (2.81 1.72 1.04) | 199-S-154 (2.35 0.85 1.92) |
| 199-S-184 (2.63 1.21 1.55) | 199-S-192 (2.24 1.73 1.03) | 199-S-193 (1.15 0.90 1.87) | 199-S-244 (1.55 1.26 1.50) |
| 199-S-287 (1.13 0.95 1.82) | 199-S-291 (2.54 1.76 1.01) | 199-S-292 (1.87 1.42 1.35) | 199-S-294 (1.83 1.26 1.51) |
| 199-S-295 (1.59 1.50 1.26) | 199-S-296 (1.86 1.50 1.27) | 199-S-305 (1.75 1.17 1.60) | 199-S-342 (3.28 1.78 0.99) |
| 199-S-468 (1.09 1.38 1.39) | 200-S-150 (2.42 1.66 1.61) | 200-S-151 (2.33 1.92 1.35) | 200-S-152 (2.97 2.22 1.05) |
| 200-S-153 (2.35 1.76 1.51) | 200-S-154 (1.88 0.89 2.38) | 200-S-184 (2.17 1.25 2.02) | 200-S-192 (1.77 1.77 1.50) |
| 200-S-206 (0.82 2.13 1.14) | 200-S-207 (1.34 2.08 1.19) | 200-S-244 (1.09 1.30 1.96) | 200-S-291 (2.08 1.80 1.47) |
| 200-S-292 (1.41 1.46 1.81) | 200-S-294 (1.37 1.30 1.97) | 200-S-295 (1.12 1.54 1.73) | 200-S-296 (1.40 1.54 1.73) |
| 200-S-305 (1.29 1.21 2.06) | 200-S-342 (2.82 1.82 1.45) | 200-S-343 (3.35 2.31 0.96) | 205-S-152 (2.14 1.00 1.88) |
| 205-S-343 (2.52 1.09 1.79) | 208-S-150 (1.63 0.97 2.40) | 208-S-151 (1.53 1.23 2.14) | 208-S-152 (2.18 1.53 1.84) |
| 208-S-153 (1.56 1.07 2.30) | 208-S-192 (0.98 1.08 2.29) | 208-S-291 (1.29 1.11 2.26) | 208-S-342 (2.03 1.13 2.24) |
| 208-S-343 (2.56 1.62 1.75) | 209-S-150 (1.88 0.89 2.15) | 209-S-151 (1.79 1.15 1.89) | 209-S-152 (2.43 1.45 1.59) |
| 209-S-153 (1.81 0.99 2.05) | 209-S-192 (1.23 1.01 2.03) | 209-S-207 (0.80 1.31 1.73) | 209-S-291 (1.54 1.03 2.01) |
| 209-S-342 (2.28 1.05 1.99) | 209-S-343 (2.81 1.54 1.50) | 210-S-150 (1.98 1.49 2.04) | 210-S-151 (1.89 1.75 1.78) |
| 210-S-152 (2.53 2.05 1.48) | 210-S-153 (1.92 1.59 1.94) | 210-S-184 (1.73 1.08 2.45) | 210-S-192 (1.34 1.60 1.93) |
| 210-S-207 (0.91 1.91 1.62) | 210-S-291 (1.64 1.63 1.90) | 210-S-292 (0.98 1.29 2.25) | 210-S-294 (0.93 1.13 2.40) |
| 210-S-296 (0.97 1.37 2.16) | 210-S-305 (0.86 1.04 2.50) | 210-S-342 (2.39 1.65 1.89) | 210-S-343 (2.91 2.14 1.39) |
| 211-S-151 (2.44 0.98 1.24) | 211-S-152 (3.08 1.28 0.94) | 211-S-153 (2.46 0.83 1.39) | 211-S-192 (1.89 0.84 1.38) |
| 211-S-206 (0.94 1.19 1.03) | 211-S-207 (1.46 1.14 1.08) | 211-S-291 (2.19 0.86 1.36) | 211-S-342 (2.93 0.88 1.34) |
| 212-S-150 (2.72 1.21 1.31) | 212-S-151 (2.63 1.47 1.05) | 212-S-153 (2.65 1.32 1.21) | 212-S-184 (2.47 0.81 1.71) |
| 212-S-192 (2.07 1.33 1.19) | 212-S-244 (1.36 0.86 1.66) | 212-S-291 (2.38 1.35 1.17) | 212-S-292 (1.71 1.01 1.51) |
| 212-S-294 (1.67 0.85 1.67) | 212-S-295 (1.42 1.10 1.42) | 212-S-296 (1.70 1.09 1.43) | 212-S-342 (3.12 1.37 1.15) |
| 212-S-468 (0.93 0.97 1.55) | 213-S-151 (1.05 0.81 2.63) | 213-S-152 (1.69 1.11 2.33) | 213-S-343 (2.07 1.20 2.23) |
| 214-S-150 (1.58 1.31 2.44) | 214-S-151 (1.49 1.57 2.19) | 214-S-152 (2.13 1.87 1.89) | 214-S-153 (1.51 1.41 2.34) |
| 214-S-184 (1.33 0.91 2.85) | 214-S-192 (0.94 1.43 2.33) | 214-S-291 (1.24 1.45 2.31) | 214-S-342 (1.98 1.47 2.29) |
| 214-S-343 (2.51 1.96 1.79) | 217-S-152 (2.27 1.07 1.75) | 217-S-343 (2.65 1.16 1.66) | 218-S-152 (2.30 0.89 1.72) |
| 218-S-343 (2.68 0.99 1.63) | 219-S-151 (1.86 1.04 1.82) | 219-S-152 (2.50 1.34 1.52) | 219-S-153 (1.88 0.88 1.98) |
| 219-S-192 (1.30 0.89 1.96) | 219-S-207 (0.87 1.20 1.66) | 219-S-291 (1.61 0.92 1.94) | 219-S-342 (2.34 0.94 1.92) |
| 219-S-343 (2.88 1.43 1.43) | 222-S-150 (1.83 0.93 2.19) | 222-S-151 (1.74 1.19 1.93) | 222-S-152 (2.39 1.49 1.63) |
| 222-S-153 (1.77 1.03 2.09) | 222-S-192 (1.19 1.05 2.08) | 222-S-291 (1.50 1.07 2.05) | 222-S-296 (0.82 0.81 2.31) |
| 222-S-342 (2.24 1.09 2.03) | 222-S-343 (2.77 1.58 1.54) | 223-S-150 (2.59 1.99 1.44) | 223-S-151 (2.50 2.25 1.18) |
| 223-S-153 (2.52 2.09 1.34) | 223-S-154 (2.05 1.22 2.21) | 223-S-184 (2.34 1.58 1.85) | 223-S-192 (1.94 2.10 1.32) |
| 223-S-193 (0.86 1.26 2.16) | 223-S-206 (0.99 2.46 0.97) | 223-S-207 (1.51 2.41 1.02) | 223-S-244 (1.26 1.63 1.79) |
| 223-S-287 (0.83 1.32 2.11) | 223-S-291 (2.25 2.13 1.30) | 223-S-292 (1.58 1.79 1.64) | 223-S-294 (1.54 1.63 1.80) |
| 223-S-295 (1.29 1.87 1.55) | 223-S-296 (1.57 1.87 1.56) | 223-S-300 (1.15 0.87 2.55) | 223-S-305 (1.46 1.54 1.89) |
| 223-S-331 (1.09 1.11 2.31) | 223-S-342 (2.99 2.15 1.28) | 223-S-468 (0.80 1.74 1.68) | 224-S-150 (2.20 1.26 1.82) |
| 224-S-151 (2.11 1.52 1.57) | 224-S-152 (2.75 1.82 1.27) | 224-S-153 (2.13 1.36 1.72) | 224-S-184 (1.95 0.86 2.23) |
| 224-S-192 (1.56 1.38 1.71) | 224-S-207 (1.13 1.68 1.41) | 224-S-244 (0.87 0.91 2.18) | 224-S-291 (1.86 1.40 1.69) |
| 224-S-292 (1.19 1.06 2.03) | 224-S-294 (1.15 0.90 2.19) | 224-S-295 (0.91 1.15 1.94) | 224-S-296 (1.18 1.14 1.95) |
| 224-S-305 (1.07 0.81 2.28) | 224-S-342 (2.60 1.42 1.67) | 224-S-343 (3.13 1.91 1.18) | 225-S-150 (2.34 0.93 1.68) |
| 225-S-151 (2.25 1.19 1.42) | 225-S-152 (2.89 1.49 1.13) | 225-S-153 (2.27 1.03 1.58) | 225-S-192 (1.70 1.04 1.57) |
| 225-S-207 (1.27 1.35 1.27) | 225-S-291 (2.00 1.07 1.55) | 225-S-295 (1.05 0.81 1.80) | 225-S-296 (1.33 0.81 1.80) |
| 225-S-342 (2.74 1.09 1.53) | 225-S-343 (3.27 1.58 1.03) | 227-S-152 (3.10 0.96 0.92) | 227-S-206 (0.95 0.88 1.01) |
| 227-S-207 (1.47 0.82 1.06) | 228-S-151 (2.12 1.04 1.56) | 228-S-152 (2.76 1.34 1.26) | 228-S-153 (2.14 0.88 1.72) |
| 228-S-192 (1.56 0.89 1.70) | 228-S-207 (1.13 1.20 1.40) | 228-S-291 (1.87 0.92 1.68) | 228-S-342 (2.61 0.94 1.66) |
| 228-S-343 (3.14 1.43 1.17) | 230-S-150 (1.91 1.11 2.12) | 230-S-151 (1.81 1.36 1.86) | 230-S-152 (2.46 1.66 1.56) |
| 230-S-153 (1.84 1.21 2.02) | 230-S-192 (1.26 1.22 2.01) | 230-S-207 (0.83 0.52 1.70) | 230-S-291 (1.57 1.24 1.98) |
| 230-S-292 (0.90 0.90 2.32) | 230-S-296 (0.89 0.98 2.24) | 230-S-342 (2.31 1.26 1.96) | 230-S-343 (2.84 1.76 1.47) |
| 232-S-150 (2.90 1.16 1.12) | 232-S-153 (2.83 1.26 1.02) | 232-S-192 (2.26 1.27 1.01) | 232-S-291 (2.56 1.30 0.99) |
| 232-S-292 (1.89 0.95 1.33) | 232-S-295 (1.61 1.04 1.24) | 232-S-296 (1.88 1.04 1.25) | 232-S-342 (3.30 1.31 0.97) |
| 232-S-468 (1.12 0.91 1.37) | 233-S-152 (1.77 0.91 2.25) | 233-S-343 (2.15 1.00 2.16) | 234-S-152 (1.95 0.83 2.07) |
| 234-S-343 (2.33 0.92 1.98) | 235-S-150 (2.48 3.20 1.54) | 235-S-151 (2.39 3.46 1.28) | 235-S-152 (3.04 3.76 0.98) |
| 235-S-153 (2.42 3.30 1.44) | 235-S-154 (1.95 2.43 2.31) | 235-S-184 (2.23 2.79 1.95) | 235-S-189 (1.56 1.79 2.95) |
| 235-S-192 (1.84 3.32 1.43) | 235-S-206 (0.89 3.67 1.07) | 235-S-207 (1.41 3.62 1.12) | 235-S-244 (1.15 2.85 1.90) |
| 235-S-291 (2.14 3.34 1.41) | 235-S-292 (1.48 3.00 1.74) | 235-S-294 (1.44 2.84 1.90) | 235-S-295 (1.19 3.08 1.66) |
| 235-S-296 (1.47 3.08 1.66) | 235-S-300 (1.04 2.08 2.66) | 235-S-301 (1.09 1.80 2.95) | 235-S-302 (1.22 1.64 3.10) |
| 235-S-305 (1.36 2.75 2.00) | 235-S-331 (0.99 2.33 2.42) | 235-S-342 (2.89 3.36 1.38) | 236-S-150 (1.17 1.38 2.85) |
| 236-S-151 (1.08 1.64 2.59) | 236-S-152 (1.73 1.94 2.29) | 236-S-153 (1.11 1.48 2.75) | 236-S-184 (0.92 0.97 3.26) |
| 236-S-291 (0.83 1.52 2.71) | 236-S-342 (1.58 1.54 2.69) | 236-S-343 (2.11 2.03 2.20) | 239-S-150 (1.68 1.81 2.35) |
| 239-S-151 (1.59 2.07 2.09) | 239-S-152 (2.23 2.37 1.79) | 239-S-153 (1.61 1.92 2.24) | 239-S-154 (1.14 1.04 3.12) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

239-S-184 (1.43 1.41 2.75) 239-S-192 (1.04 1.93 2.23) 239-S-291 (1.34 1.95 2.21) 239-S-342 (2.08 1.97 2.19)
239-S-343 (2.61 2.46 1.70) 240-S-150 (1.78 1.49 2.24) 240-S-151 (1.69 1.74 1.98) 240-S-152 (2.34 2.04 1.68)
240-S-153 (1.72 1.59 2.14) 240-S-184 (1.53 1.08 2.65) 240-S-291 (1.14 1.60 2.13) 240-S-291 (1.44 1.62 2.10)
240-S-342 (2.19 1.64 2.08) 240-S-343 (2.72 2.13 1.59) 242-S-150 (2.40 2.01 1.62) 242-S-151 (2.31 2.27 1.37)
242-S-152 (2.95 2.57 1.07) 242-S-153 (2.33 2.12 1.52) 242-S-154 (1.87 1.24 2.39) 242-S-184 (2.15 1.61 2.03)
242-S-192 (1.76 2.13 1.51) 242-S-206 (0.81 2.48 1.15) 242-S-207 (1.33 2.43 1.21) 242-S-244 (1.07 1.66 1.98)
242-S-291 (2.06 2.15 1.49) 242-S-292 (1.40 1.81 1.83) 242-S-294 (1.35 1.65 1.98) 242-S-295 (1.11 1.90 1.74)
242-S-296 (1.39 1.89 1.74) 242-S-300 (0.96 0.90 2.74) 242-S-305 (1.28 1.56 2.08) 242-S-331 (0.91 1.14 2.50)
242-S-342 (2.80 2.17 1.47) 242-S-343 (3.33 2.66 0.97) 243-S-152 (1.20 1.70 2.82) 243-S-342 (1.05 1.30 3.22)
243-S-343 (1.58 1.79 2.73) 244-S-152 (1.88 0.91 2.14) 244-S-343 (2.26 1.01 2.05) 245-S-151 (1.32 0.84 2.35)
245-S-152 (1.96 1.14 2.06) 245-S-343 (2.34 1.23 1.96) 254-S-151 (1.48 0.92 2.19) 254-S-152 (2.13 1.22 1.89)
254-S-342 (1.98 0.82 2.29) 254-S-343 (2.51 1.31 1.80) 256-S-150 (2.83 1.97 1.19) 256-S-151 (2.74 2.23 0.93)
256-S-153 (2.76 2.07 1.09) 256-S-154 (2.30 1.20 1.96) 256-S-184 (2.58 1.56 1.60) 256-S-192 (2.19 2.08 1.08)
256-S-193 (1.11 1.24 1.92) 256-S-244 (1.50 1.61 1.55) 256-S-287 (1.08 1.30 1.86) 256-S-291 (2.49 2.11 1.05)
256-S-292 (1.83 1.77 1.40) 256-S-294 (1.78 1.61 1.55) 256-S-295 (1.54 1.85 1.31) 256-S-296 (1.82 1.85 1.31)
256-S-300 (1.39 0.85 2.31) 256-S-305 (1.71 1.51 1.65) 256-S-331 (1.34 1.49 2.07) 256-S-342 (3.23 2.13 1.04)
256-S-468 (1.05 1.72 1.44) 261-S-150 (1.95 1.58 2.07) 261-S-151 (1.86 1.83 1.82) 261-S-152 (2.50 2.13 1.52)
261-S-153 (1.88 1.68 1.97) 261-S-154 (1.42 0.81 2.85) 261-S-184 (1.70 1.17 2.48) 261-S-192 (1.31 1.69 1.96)
261-S-207 (0.88 1.99 1.66) 261-S-291 (1.61 1.71 1.94) 261-S-292 (0.94 1.37 2.28) 261-S-294 (0.90 1.22 2.44)
261-S-296 (0.93 1.45 2.20) 261-S-305 (0.82 1.12 2.53) 261-S-342 (2.35 1.73 1.92) 261-S-343 (2.88 2.23 1.43)
262-S-150 (1.85 1.90 2.18) 262-S-151 (1.76 2.16 1.92) 262-S-152 (2.40 2.45 1.62) 262-S-153 (1.78 2.00 2.08)
262-S-154 (1.31 1.13 2.95) 262-S-184 (1.60 1.49 2.59) 262-S-192 (1.20 2.01 2.06) 262-S-291 (1.51 2.03 2.04)
262-S-292 (0.84 1.69 2.38) 262-S-296 (0.83 1.78 2.30) 262-S-342 (2.25 2.05 2.02) 262-S-343 (2.78 2.55 1.53)
263-S-150 (2.02 2.49 2.00) 263-S-151 (1.93 2.75 1.74) 263-S-152 (2.58 3.05 1.44) 263-S-153 (1.96 2.59 1.90)
263-S-154 (1.49 1.72 2.77) 263-S-184 (1.77 2.08 2.41) 263-S-189 (1.10 1.08 3.41) 263-S-192 (1.38 2.60 1.89)
263-S-207 (0.95 2.91 1.58) 263-S-291 (1.69 2.63 1.86) 263-S-292 (1.02 2.29 2.20) 263-S-294 (0.98 2.13 2.36)
263-S-296 (1.01 2.37 2.12) 263-S-305 (0.90 2.04 2.45) 263-S-342 (2.43 2.65 1.84) 263-S-343 (2.96 3.14 1.35)
264-S-150 (1.29 1.94 2.73) 264-S-151 (1.20 2.19 2.47) 264-S-152 (1.85 2.49 2.17) 264-S-153 (1.23 2.04 2.63)
264-S-184 (1.04 1.53 3.14) 264-S-291 (0.95 2.07 2.59) 264-S-342 (1.70 2.09 2.57) 264-S-343 (2.23 2.58 2.08)
266-S-152 (2.03 0.86 1.99) 266-S-343 (2.41 0.95 1.90) 267-S-151 (1.59 0.86 2.09) 267-S-152 (2.23 1.16 1.79)
267-S-343 (2.61 1.25 1.70) 272-S-150 (1.29 1.25 2.73) 272-S-151 (1.20 1.51 2.47) 272-S-152 (1.85 1.81 2.17)
272-S-153 (1.23 1.35 2.63) 272-S-184 (1.04 0.85 3.14) 272-S-291 (0.95 1.39 2.59) 272-S-342 (1.70 1.41 2.57)
272-S-353 (2.23 1.90 2.08) 274-S-151 (1.72 1.06 1.96) 274-S-153 (2.36 1.36 1.66) 274-S-184 (1.74 0.90 2.11)
274-S-192 (1.17 0.91 2.10) 274-S-291 (1.47 0.94 2.08) 274-S-342 (2.21 0.96 2.06) 274-S-343 (2.74 1.45 1.57)
275-S-152 (2.56 0.94 1.46) 275-S-343 (2.94 1.03 1.37) 276-S-150 (1.89 1.39 2.14) 276-S-151 (1.80 1.65 1.88)
276-S-152 (2.44 1.95 1.58) 276-S-153 (1.82 1.49 2.03) 276-S-184 (1.64 0.98 2.54) 276-S-192 (1.25 1.50 2.02)
276-S-207 (0.81 1.81 1.72) 276-S-291 (1.55 1.53 2.00) 276-S-292 (0.88 1.19 2.34) 276-S-294 (0.84 1.03 2.50)
276-S-296 (0.87 1.27 2.26) 276-S-342 (2.29 1.55 1.98) 276-S-343 (2.82 2.04 1.49) 277-S-152 (2.14 1.09 1.88)
277-S-343 (2.52 1.18 1.79) 278-S-150 (2.89 1.36 1.14) 278-S-153 (2.82 1.46 1.04) 278-S-184 (2.64 0.95 1.55)
278-S-192 (2.24 1.47 1.03) 278-S-244 (1.56 1.00 1.50) 278-S-291 (2.55 1.50 1.00) 278-S-292 (1.88 1.16 1.34)
278-S-294 (1.84 1.00 1.50) 278-S-295 (1.95 1.24 1.26) 278-S-305 (1.76 0.91 1.59)
278-S-342 (3.29 1.52 0.98) 278-S-468 (1.10 1.12 1.38) 279-S-152 (2.09 1.03 1.93) 279-S-343 (2.47 1.12 1.84)
280-S-151 (1.77 1.05 1.91) 280-S-152 (2.41 1.35 1.61) 280-S-153 (1.79 0.89 2.07) 280-S-192 (1.21 0.90 2.05)
280-S-291 (1.52 0.93 2.03) 280-S-342 (2.26 0.95 2.01) 280-S-343 (2.79 1.44 1.52) 281-S-154 (2.67 0.82 1.59)
281-S-184 (2.96 1.18 1.23) 281-S-193 (1.48 0.86 1.54) 281-S-244 (1.88 1.23 1.17) 281-S-287 (1.45 0.92 1.49)
281-S-292 (2.20 1.39 1.02) 281-S-294 (2.16 1.23 1.18) 281-S-295 (1.91 1.47 0.93) 281-S-296 (2.19 1.47 0.94)
281-S-305 (2.08 1.13 1.27) 281-S-468 (1.42 1.34 1.06) 282-S-150 (1.74 0.96 2.29) 282-S-151 (1.65 1.22 2.03)
282-S-152 (2.29 1.52 1.73) 282-S-153 (1.67 1.06 2.18) 282-S-192 (1.10 1.08 2.17) 282-S-291 (1.40 1.10 2.15)
282-S-342 (2.14 1.12 2.13) 282-S-343 (2.67 1.61 1.64) 283-S-150 (3.09 1.36 0.94) 283-S-184 (2.84 0.96 1.34)
283-S-244 (1.76 1.01 1.29) 283-S-292 (2.08 1.16 1.14) 283-S-294 (2.04 1.00 1.30) 283-S-295 (1.79 1.25 1.05)
283-S-296 (2.07 1.24 1.06) 283-S-305 (1.96 0.91 1.39) 283-S-468 (1.30 1.12 1.18) 284-S-150 (1.96 0.96 2.07)
284-S-151 (1.87 1.21 1.81) 284-S-152 (2.51 1.51 1.51) 284-S-153 (1.89 1.06 1.96) 284-S-192 (1.32 1.07 1.95)
284-S-207 (0.89 1.37 1.65) 284-S-291 (1.62 1.09 1.93) 284-S-296 (0.94 1.37 1.93) 284-S-342 (2.36 1.11 1.91)
284-S-343 (2.89 1.61 1.42) 285-S-151 (1.72 0.85 1.95) 285-S-152 (2.37 1.14 1.65) 285-S-343 (2.75 1.24 1.56)
286-S-151 (1.47 0.94 2.21) 286-S-152 (2.11 1.24 1.91) 286-S-291 (1.22 0.82 2.33) 286-S-342 (1.96 0.84 2.31)
286-S-343 (2.49 1.33 1.82) 287-S-151 (1.66 0.93 2.01) 287-S-152 (2.31 1.23 1.71) 287-S-291 (1.41 0.81 2.13)
287-S-342 (2.16 0.83 2.11) 287-S-343 (2.68 1.32 1.62) 288-S-151 (1.68 0.99 2.00) 288-S-152 (2.32 1.29 1.70)
288-S-153 (1.70 0.83 2.16) 288-S-192 (1.12 0.85 2.15) 288-S-291 (1.43 0.87 2.12) 288-S-342 (2.17 0.89 2.10)
288-S-343 (2.70 1.38 1.61) 289-S-150 (1.51 0.89 2.52) 289-S-151 (1.42 1.15 2.26) 289-S-152 (2.06 1.45 1.96)
289-S-153 (1.44 0.99 2.42) 289-S-192 (0.86 1.01 2.40) 289-S-291 (1.17 1.03 2.38) 289-S-342 (1.91 1.05 2.36)
289-S-343 (2.44 1.54 1.87) 290-S-152 (2.03 0.83 1.99) 290-S-343 (2.41 0.92 1.90) 292-S-343 (1.94 0.85 2.37)
293-S-152 (2.05 0.95 1.97) 293-S-343 (2.43 1.04 1.87) 294-S-152 (1.60 0.92 2.42) 294-S-343 (1.98 1.01 2.33)
297-S-150 (1.70 0.99 2.32) 297-S-151 (1.61 1.25 2.06) 297-S-152 (2.26 1.55 1.76) 297-S-153 (1.64 1.09 2.22)
297-S-192 (1.06 1.10 2.21) 297-S-291 (1.36 1.13 2.18) 297-S-342 (2.11 1.15 2.16) 297-S-343 (2.64 1.64 1.67)
298-S-152 (2.00 1.07 2.02) 298-S-343 (2.38 1.17 1.93) 299-S-343 (3.12 0.83 1.19) 300-S-150 (1.44 1.12 2.58)
300-S-151 (1.35 1.38 2.33) 300-S-152 (1.99 1.67 2.03) 300-S-153 (1.37 1.22 2.48) 300-S-291 (1.10 1.26 2.45)
300-S-342 (1.84 1.27 2.43) 300-S-343 (2.37 1.77 1.93) 301-S-150 (1.39 1.41 2.64) 301-S-151 (1.30 1.66 2.38)
301-S-152 (1.94 1.96 2.08) 301-S-153 (1.32 1.51 2.53) 301-S-184 (1.14 1.00 3.04) 301-S-291 (1.05 1.54 2.50)
301-S-342 (1.79 1.56 2.48) 301-S-343 (2.32 2.06 1.99) 302-S-150 (1.27 1.56 2.76) 302-S-151 (1.18 1.82 2.50)
302-S-152 (1.82 2.12 2.20) 302-S-153 (1.20 1.66 2.66) 302-S-184 (1.02 1.15 3.16) 302-S-291 (0.93 1.70 2.62)
302-S-342 (1.67 1.72 2.60) 302-S-343 (2.20 2.21 2.11) 303-S-150 (1.68 1.14 2.34) 303-S-151 (1.59 1.40 2.08)
303-S-152 (2.23 1.70 1.78) 303-S-153 (1.62 1.25 2.24) 303-S-192 (1.04 1.26 2.23) 303-S-291 (1.34 1.28 2.20)
303-S-342 (2.09 1.30 2.19) 303-S-343 (2.61 1.79 1.69) 304-S-151 (1.55 0.93 2.13) 304-S-152 (2.19 1.23 1.83)
304-S-291 (1.30 0.81 2.25) 304-S-342 (2.04 0.83 2.23) 304-S-343 (2.57 1.32 1.73) 305-S-152 (1.68 1.01 2.34)
305-S-343 (2.06 1.10 2.25) 308-S-150 (1.65 1.51 2.38) 308-S-151 (1.56 1.77 2.12) 308-S-152 (2.20 2.07 1.82)

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

308-S-153 (1.58 1.61 2.28)  308-S-184 (1.40 1.10 2.78)  308-S-192 (1.00 1.62 2.26)  308-S-291 (1.31 1.65 2.24)
308-S-342 (2.05 1.67 2.22)  308-S-343 (2.58 2.16 1.73)  310-S-150 (1.53 1.06 2.50)  310-S-151 (1.44 1.32 2.24)
310-S-152 (2.08 1.62 1.94)  310-S-153 (1.46 1.16 2.40)  310-S-192 (0.88 1.17 2.38)  310-S-291 (1.19 1.20 2.36)
310-S-342 (1.93 1.22 2.34)  310-S-343 (2.46 1.71 1.85)  311-S-151 (1.71 1.04 1.96)  311-S-152 (2.36 1.34 1.66)
311-S-153 (1.74 0.88 2.12)  311-S-192 (1.16 0.90 2.11)  311-S-291 (1.46 0.92 2.08)  311-S-342 (2.21 0.94 2.06)
311-S-343 (2.74 1.43 1.57)  312-S-150 (1.71 0.91 2.32)  312-S-151 (1.61 1.17 2.06)  312-S-152 (2.26 1.47 1.76)
312-S-153 (1.64 1.01 2.22)  312-S-192 (1.06 1.02 2.21)  312-S-291 (1.37 1.05 2.18)  312-S-342 (2.11 1.07 2.16)
312-S-343 (2.64 1.56 1.67)  313-S-151 (1.84 1.00 1.84)  313-S-152 (2.48 1.30 1.54)  313-S-153 (1.86 0.84 2.00)
313-S-192 (1.28 0.86 1.98)  313-S-207 (0.85 1.16 1.68)  313-S-291 (1.59 0.88 1.96)  313-S-342 (2.33 0.90 1.94)
313-S-343 (2.86 1.39 1.45)  314-S-150 (3.12 2.08 0.90)  314-S-154 (2.59 1.31 1.68)  314-S-184 (2.87 1.67 1.31)
314-S-193 (1.39 1.36 1.63)  314-S-244 (1.79 1.72 1.26)  314-S-287 (1.37 1.41 1.58)  314-S-292 (2.11 1.88 1.11)
314-S-294 (2.07 1.72 1.27)  314-S-295 (1.83 1.96 1.02)  314-S-296 (2.10 1.96 1.03)  314-S-300 (1.68 0.96 2.02)
314-S-305 (1.99 1.63 1.36)  314-S-331 (1.63 1.21 1.78)  314-S-468 (1.34 1.84 1.15)  314-S-154 (3.04 1.58 1.22)
315-S-189 (2.65 0.94 1.86)  315-S-193 (1.85 1.62 1.18)  315-S-287 (1.82 1.67 1.12)  315-S-300 (2.13 1.23 1.57)
315-S-301 (2.18 0.94 1.86)  315-S-305 (2.45 1.89 0.91)  315-S-331 (2.08 1.47 1.33)  316-S-152 (2.19 1.01 1.83)
316-S-343 (2.57 1.10 1.73)  317-S-150 (2.70 1.80 1.33)  317-S-151 (2.61 2.06 1.07)  317-S-153 (2.63 1.90 1.22)
317-S-154 (2.16 1.03 2.10)  317-S-184 (2.45 1.39 1.73)  317-S-192 (2.06 1.91 1.21)  317-S-193 (0.97 1.07 2.05)
317-S-207 (1.62 2.22 0.91)  317-S-244 (1.37 1.44 1.68)  317-S-287 (0.95 1.13 2.00)  317-S-291 (2.36 1.94 1.19)
317-S-292 (1.69 1.60 1.53)  317-S-294 (1.65 1.44 1.69)  317-S-295 (1.40 1.68 1.44)  317-S-296 (1.68 1.68 1.45)
317-S-305 (1.57 1.35 1.78)  317-S-331 (1.21 0.92 2.20)  317-S-342 (3.10 1.96 1.17)  317-S-468 (0.91 1.55 1.57)
318-S-150 (1.35 1.41 2.68)  318-S-151 (1.26 1.67 2.42)  318-S-152 (1.90 1.92 2.12)  318-S-153 (1.28 1.51 2.58)
318-S-184 (1.10 1.01 3.09)  318-S-291 (1.01 1.55 2.54)  318-S-342 (1.75 1.57 2.52)  318-S-343 (2.28 2.06 2.03)
319-S-151 (2.35 0.85 1.33)  319-S-152 (2.99 1.15 1.03)  319-S-206 (0.85 1.07 1.11)  319-S-207 (1.37 1.01 1.17)
319-S-343 (3.37 1.25 0.94)  321-S-150 (2.94 1.58 1.09)  321-S-153 (2.87 1.69 0.99)  321-S-154 (2.40 0.81 1.86)
321-S-184 (2.69 1.18 1.50)  321-S-192 (2.29 1.70 0.98)  321-S-193 (1.21 0.86 1.81)  321-S-244 (1.61 1.23 1.45)
321-S-287 (1.18 0.91 1.76)  321-S-291 (2.60 1.72 0.95)  321-S-292 (1.93 1.38 1.29)  321-S-294 (1.89 1.22 1.45)
321-S-295 (1.64 1.47 1.21)  321-S-296 (1.92 1.46 1.21)  321-S-305 (1.81 1.13 1.54)  321-S-342 (3.34 1.74 0.93)
321-S-468 (1.15 1.34 1.33)  322-S-154 (2.99 1.12 1.28)  322-S-184 (3.27 1.48 0.91)  322-S-193 (1.79 1.17 1.23)
322-S-287 (1.77 1.22 1.18)  322-S-305 (2.39 1.44 0.96)  322-S-331 (2.03 1.02 1.38)  323-S-150 (2.71 1.80 1.32)
323-S-151 (2.62 2.06 1.06)  323-S-153 (2.64 1.90 1.22)  323-S-154 (2.17 1.03 2.09)  323-S-184 (2.46 1.39 1.72)
323-S-192 (2.06 1.91 1.20)  323-S-193 (0.98 1.07 2.04)  323-S-244 (1.38 1.44 1.67)  323-S-287 (0.96 1.13 1.99)
323-S-291 (2.37 1.94 1.18)  323-S-292 (1.70 1.60 1.52)  323-S-294 (1.66 1.44 1.68)  323-S-295 (1.41 1.68 1.43)
323-S-296 (1.69 1.68 1.44)  323-S-305 (1.58 1.34 1.77)  323-S-331 (1.22 0.92 2.19)  323-S-342 (3.11 1.96 1.16)
323-S-468 (0.92 1.55 1.56)  325-S-151 (2.50 0.92 1.17)  325-S-206 (1.00 1.13 0.96)  325-S-207 (1.52 1.08 1.01)
325-S-342 (3.00 0.82 1.27)  328-S-150 (2.23 1.55 1.80)  328-S-151 (2.14 1.81 1.54)  328-S-152 (2.78 2.11 1.24)
328-S-153 (2.16 1.65 1.70)  328-S-184 (1.98 1.14 2.21)  328-S-192 (1.58 1.66 1.69)  328-S-207 (1.15 1.97 1.38)
328-S-244 (0.90 1.19 2.15)  328-S-291 (1.89 1.69 1.66)  328-S-292 (1.22 1.35 2.00)  328-S-294 (1.18 1.19 2.16)
328-S-295 (0.93 1.43 1.92)  328-S-296 (1.21 1.43 1.92)  328-S-305 (1.10 1.10 2.25)  328-S-342 (2.63 1.71 1.64)
328-S-343 (3.16 2.20 1.15)  330-S-150 (2.02 1.05 2.00)  330-S-151 (1.93 1.31 1.74)  330-S-152 (2.58 1.60 1.44)
330-S-153 (1.96 1.15 1.90)  330-S-192 (1.38 1.16 1.89)  330-S-207 (0.95 1.46 1.58)  330-S-291 (1.68 1.18 1.86)
330-S-292 (1.02 0.84 2.20)  330-S-296 (1.01 0.93 2.12)  330-S-342 (2.43 1.20 1.84)  330-S-343 (2.96 1.70 1.35)
331-S-150 (1.49 0.88 2.53)  331-S-151 (1.40 1.13 2.27)  331-S-152 (2.05 1.43 1.97)  331-S-153 (1.43 0.98 2.43)
331-S-192 (0.85 0.99 2.42)  331-S-291 (1.15 1.01 2.39)  331-S-342 (1.90 1.03 2.37)  331-S-343 (2.43 1.52 1.88)
332-S-151 (1.55 0.96 2.13)  332-S-152 (2.19 1.26 1.83)  332-S-153 (1.57 0.80 2.28)  332-S-192 (1.00 0.81 2.27)
332-S-291 (1.30 0.84 2.25)  332-S-342 (2.04 0.86 2.23)  332-S-343 (2.57 1.35 1.74)  336-S-150 (1.54 0.81 2.49)
336-S-151 (1.45 1.07 2.23)  336-S-152 (2.09 1.37 1.93)  336-S-153 (1.47 0.91 2.39)  336-S-192 (0.89 0.92 2.37)
336-S-291 (1.20 0.95 2.35)  336-S-342 (1.94 0.97 2.33)  336-S-343 (2.47 1.46 1.84)  337-S-150 (2.78 2.07 1.24)
337-S-151 (2.69 2.32 0.98)  337-S-153 (2.71 2.17 1.14)  337-S-154 (2.24 1.29 2.01)  337-S-184 (2.53 1.66 1.65)
337-S-192 (2.14 2.18 1.13)  337-S-193 (1.06 1.34 1.97)  337-S-244 (1.45 1.71 1.60)  337-S-287 (1.03 1.39 1.91)
337-S-291 (2.44 2.20 1.11)  337-S-292 (1.78 1.86 1.45)  337-S-294 (1.73 1.70 1.60)  337-S-295 (1.49 1.95 1.36)
337-S-296 (1.77 1.94 1.36)  337-S-300 (1.34 0.95 2.36)  337-S-305 (1.66 1.61 1.70)  337-S-331 (1.29 1.19 2.12)
337-S-342 (3.18 2.22 1.09)  337-S-468 (1.00 1.82 1.49)  338-S-150 (1.24 2.04 2.79)  338-S-151 (1.15 2.30 2.53)
338-S-152 (1.79 2.60 2.23)  338-S-153 (1.17 2.14 2.69)  338-S-184 (0.99 1.64 3.20)  338-S-291 (0.90 2.18 2.65)
338-S-342 (1.64 2.20 2.63)  338-S-343 (2.17 2.69 2.14)  339-S-150 (2.84 2.43 1.18)  339-S-151 (2.75 2.69 0.93)
339-S-153 (2.77 2.53 1.08)  339-S-154 (2.31 1.66 1.96)  339-S-184 (2.59 2.02 1.59)  339-S-189 (1.91 1.02 2.59)
339-S-192 (2.20 2.54 1.07)  339-S-193 (1.11 1.71 1.91)  339-S-244 (1.51 2.07 1.54)  339-S-287 (1.09 1.76 1.86)
339-S-291 (2.50 2.57 1.05)  339-S-292 (1.83 2.23 1.39)  339-S-294 (1.79 2.07 1.55)  339-S-295 (1.55 2.31 1.30)
339-S-296 (1.82 2.31 1.31)  339-S-300 (1.40 1.31 2.30)  339-S-301 (1.45 1.02 2.59)  339-S-302 (1.57 0.87 2.74)
339-S-305 (1.71 1.98 1.64)  339-S-331 (1.35 1.56 2.06)  339-S-342 (3.24 2.59 1.03)  339-S-468 (1.06 2.19 1.43)
341-S-343 (2.97 0.83 1.33)  344-S-150 (2.49 2.54 1.54)  344-S-151 (2.39 2.80 1.28)  344-S-152 (3.04 3.10 0.98)
344-S-153 (2.42 2.64 1.44)  344-S-154 (1.95 1.77 2.31)  344-S-184 (2.23 2.14 1.95)  344-S-189 (1.56 1.14 2.95)
344-S-192 (1.84 2.66 1.43)  344-S-206 (0.89 3.01 1.07)  344-S-207 (1.41 2.69 1.17)  344-S-244 (1.16 2.19 1.90)
344-S-291 (2.15 2.68 1.40)  344-S-292 (1.48 2.34 1.74)  344-S-294 (1.44 2.18 1.90)  344-S-295 (1.19 2.43 1.66)
344-S-296 (1.47 2.42 1.66)  344-S-300 (1.04 1.43 2.66)  344-S-301 (1.10 1.14 2.95)  344-S-302 (1.22 0.99 3.10)
344-S-305 (1.36 2.09 1.99)  344-S-331 (0.99 1.67 2.41)  344-S-342 (2.89 2.70 1.38)  345-S-150 (2.36 2.39 1.67)
345-S-151 (2.27 2.65 1.41)  345-S-152 (2.91 2.95 1.11)  345-S-153 (2.29 2.49 1.56)  345-S-154 (1.83 1.62 2.44)
345-S-184 (2.11 1.98 2.07)  345-S-189 (1.43 0.98 3.07)  345-S-192 (1.72 2.50 1.55)  345-S-207 (1.29 2.81 1.25)
345-S-244 (1.03 2.03 1.02)  345-S-291 (2.02 2.53 1.53)  345-S-292 (1.35 2.19 1.87)  345-S-294 (1.31 2.03 2.03)
345-S-295 (1.07 2.27 1.78)  345-S-296 (1.34 2.27 1.79)  345-S-300 (0.92 1.27 2.78)  345-S-301 (0.97 0.99 3.07)
345-S-302 (1.09 0.83 3.22)  345-S-305 (1.23 1.94 2.12)  345-S-331 (0.87 1.52 2.54)  345-S-342 (2.76 2.55 1.51)
345-S-343 (3.29 3.04 1.02)  346-S-150 (2.18 2.38 1.85)  346-S-151 (2.09 2.63 1.59)  346-S-152 (2.73 2.93 1.29)
346-S-153 (2.11 2.48 1.75)  346-S-154 (1.64 1.60 2.62)  346-S-184 (1.93 1.97 2.26)  346-S-189 (1.25 0.97 3.26)
346-S-192 (1.53 2.49 1.73)  346-S-207 (1.10 2.79 1.43)  346-S-244 (0.85 2.02 2.20)  346-S-291 (1.84 2.51 1.71)
346-S-292 (1.17 2.17 2.05)  346-S-294 (1.13 2.01 2.21)  346-S-295 (0.88 2.26 1.97)  346-S-296 (1.16 2.25 1.97)
346-S-302 (0.91 0.82 3.41)  346-S-305 (1.05 1.92 2.30)  346-S-342 (2.58 2.53 1.69)  346-S-343 (3.11 3.02 1.20)

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 347-S-150 (2.23 2.46 1.80) | 347-S-151 (2.14 2.72 1.54) | 347-S-152 (2.78 3.02 1.24) | 347-S-153 (2.16 2.56 1.70) |
| 347-S-154 (1.69 1.69 2.57) | 347-S-184 (1.98 2.06 2.20) | 347-S-189 (1.30 1.06 3.20) | 347-S-192 (1.58 2.58 1.68) |
| 347-S-207 (1.15 2.88 1.38) | 347-S-244 (0.90 2.11 2.15) | 347-S-291 (1.89 2.60 1.66) | 347-S-292 (1.22 2.26 2.00) |
| 347-S-294 (1.18 2.10 2.16) | 347-S-295 (0.93 2.35 1.91) | 347-S-296 (1.21 2.34 1.92) | 347-S-301 (0.84 1.06 3.20) |
| 347-S-302 (0.96 0.91 3.35) | 347-S-305 (1.10 2.01 2.25) | 347-S-342 (2.63 2.62 1.64) | 347-S-343 (3.16 3.11 1.15) |
| 348-S-150 (2.58 2.23 1.45) | 348-S-151 (2.48 2.48 1.19) | 348-S-153 (2.51 2.33 1.35) | 348-S-154 (2.04 1.45 2.22) |
| 348-S-184 (2.33 1.82 1.86) | 348-S-189 (1.65 0.82 2.86) | 348-S-192 (1.93 2.34 1.34) | 348-S-193 (0.85 1.50 2.17) |
| 348-S-206 (0.98 2.69 0.98) | 348-S-207 (1.50 2.64 1.03) | 348-S-244 (1.25 1.87 1.81) | 348-S-287 (0.82 1.55 2.12) |
| 348-S-291 (2.24 2.36 1.31) | 348-S-292 (1.57 2.02 1.65) | 348-S-294 (1.53 1.86 1.81) | 348-S-295 (1.28 2.11 1.57) |
| 348-S-296 (1.56 2.10 1.57) | 348-S-300 (1.14 1.11 2.57) | 348-S-301 (1.19 0.82 2.86) | 348-S-305 (1.45 1.77 1.99) |
| 348-S-331 (1.08 1.35 2.32) | 348-S-342 (2.98 2.38 1.29) | 349-S-150 (2.09 2.36 1.93) | 349-S-151 (2.00 2.62 1.68) |
| 349-S-154 (2.64 2.92 1.38) | 349-S-153 (2.02 2.46 1.83) | 349-S-154 (1.56 1.59 2.70) | 349-S-184 (1.84 1.95 2.34) |
| 349-S-189 (1.16 0.95 3.34) | 349-S-192 (1.45 2.47 1.82) | 349-S-207 (1.02 2.78 1.52) | 349-S-291 (1.75 2.50 1.80) |
| 349-S-292 (1.09 2.16 2.14) | 349-S-294 (1.04 2.00 2.29) | 349-S-296 (1.07 2.24 2.06) | 349-S-302 (0.82 0.80 3.49) |
| 349-S-305 (0.97 1.91 2.39) | 349-S-342 (2.49 2.52 1.78) | 349-S-343 (3.02 3.01 1.28) | 350-S-150 (2.07 2.27 1.96) |
| 350-S-151 (1.98 2.53 1.70) | 350-S-152 (2.62 2.83 1.40) | 350-S-153 (2.00 2.27 1.36) | 350-S-154 (1.53 1.50 2.73) |
| 350-S-184 (1.82 1.87 2.37) | 350-S-189 (1.14 0.87 3.37) | 350-S-192 (1.42 2.39 1.85) | 350-S-207 (0.99 2.69 1.54) |
| 350-S-291 (1.73 2.41 1.82) | 350-S-292 (1.06 2.07 2.16) | 350-S-294 (1.02 1.91 2.32) | 350-S-296 (1.05 2.15 2.08) |
| 350-S-305 (0.94 1.82 2.41) | 350-S-342 (2.47 2.43 1.80) | 350-S-343 (3.00 2.92 1.31) | 351-S-150 (2.17 2.27 1.86) |
| 351-S-151 (2.08 2.53 1.60) | 351-S-152 (2.72 2.83 1.30) | 351-S-153 (2.10 2.17 1.55) | 351-S-154 (1.63 1.50 2.63) |
| 351-S-184 (1.92 1.87 2.27) | 351-S-189 (1.24 0.87 3.27) | 351-S-192 (1.52 2.39 1.75) | 351-S-207 (1.09 2.69 1.44) |
| 351-S-244 (0.84 1.92 2.22) | 351-S-291 (1.83 2.41 1.72) | 351-S-292 (1.16 2.07 2.06) | 351-S-294 (1.12 1.91 2.22) |
| 351-S-295 (0.87 2.16 1.98) | 351-S-296 (1.15 2.15 1.98) | 351-S-305 (1.04 1.82 2.31) | 351-S-342 (2.57 2.43 1.70) |
| 351-S-343 (3.10 2.92 1.21) | 352-S-150 (1.93 1.57 2.09) | 352-S-151 (1.84 1.83 1.84) | 352-S-152 (2.48 2.13 1.54) |
| 352-S-153 (1.86 1.67 1.99) | 352-S-154 (1.40 0.80 2.86) | 352-S-184 (1.68 1.17 2.50) | 352-S-192 (1.29 1.69 1.98) |
| 352-S-207 (0.86 1.99 1.68) | 352-S-291 (1.59 1.71 1.96) | 352-S-292 (0.93 1.37 2.30) | 352-S-294 (0.88 1.21 2.46) |
| 352-S-296 (0.91 1.45 2.22) | 352-S-305 (0.81 1.12 2.55) | 352-S-342 (2.33 1.73 1.94) | 352-S-343 (2.86 2.22 1.44) |
| 353-S-150 (2.00 1.53 2.02) | 353-S-151 (1.91 1.79 1.76) | 353-S-153 (2.56 2.09 1.46) | 353-S-153 (1.94 1.64 1.92) |
| 353-S-184 (1.75 1.13 2.43) | 353-S-192 (1.36 1.65 1.91) | 353-S-207 (0.93 1.95 1.60) | 353-S-291 (1.66 1.67 1.88) |
| 353-S-292 (1.00 1.33 2.22) | 353-S-294 (0.96 1.17 2.38) | 353-S-296 (0.99 1.41 2.14) | 353-S-305 (0.88 1.08 2.48) |
| 353-S-342 (2.41 1.69 1.86) | 353-S-343 (2.94 2.18 1.37) | 354-S-150 (2.51 1.71 1.52) | 354-S-151 (2.41 1.97 1.26) |
| 354-S-152 (3.06 2.26 0.96) | 354-S-153 (2.44 1.81 1.42) | 354-S-154 (1.97 0.94 2.29) | 354-S-184 (2.26 1.30 1.93) |
| 354-S-192 (1.86 1.82 1.41) | 354-S-206 (0.91 2.18 1.05) | 354-S-207 (1.43 2.12 1.10) | 354-S-244 (1.18 1.35 1.88) |
| 354-S-291 (2.17 1.84 1.38) | 354-S-292 (1.50 1.50 1.72) | 354-S-294 (1.46 1.35 1.88) | 354-S-295 (1.21 1.59 1.64) |
| 354-S-296 (1.49 1.59 1.64) | 354-S-305 (1.38 1.25 1.97) | 354-S-331 (1.01 0.83 2.39) | 354-S-342 (2.91 1.86 1.36) |
| 355-S-184 (3.25 1.02 0.93) | 355-S-305 (2.38 0.97 0.98) | 356-S-150 (1.87 0.99 2.15) | 356-S-151 (1.78 1.25 1.89) |
| 356-S-152 (2.43 1.55 1.59) | 356-S-153 (1.81 1.10 2.05) | 356-S-192 (1.23 1.11 2.04) | 356-S-207 (0.80 1.41 1.73) |
| 356-S-291 (1.53 1.13 2.01) | 356-S-296 (0.86 0.87 2.27) | 356-S-342 (2.28 1.15 1.99) | 356-S-343 (2.81 1.64 1.50) |
| 357-S-150 (1.18 1.25 2.85) | 357-S-151 (1.09 1.51 2.59) | 357-S-152 (1.73 1.80 2.29) | 357-S-153 (1.11 1.35 2.75) |
| 357-S-184 (0.93 0.84 3.25) | 357-S-291 (0.84 1.38 2.71) | 357-S-342 (1.58 1.40 2.69) | 357-S-343 (2.11 1.90 2.20) |
| 358-S-150 (2.25 1.09 1.77) | 358-S-343 (2.63 1.18 1.68) | 359-S-151 (2.20 1.70 1.48) | |
| 359-S-152 (2.84 2.00 1.18) | 359-S-153 (2.22 1.54 1.64) | 359-S-184 (2.04 1.03 2.14) | 359-S-192 (1.64 1.55 1.62) |
| 359-S-207 (1.21 1.86 1.32) | 359-S-244 (0.96 1.08 2.09) | 359-S-291 (1.95 1.58 1.60) | 359-S-292 (1.28 1.24 1.94) |
| 359-S-294 (1.24 1.08 2.10) | 359-S-295 (0.99 1.32 1.85) | 359-S-296 (1.27 1.32 1.86) | 359-S-305 (1.16 0.98 2.19) |
| 359-S-342 (2.69 1.60 1.58) | 359-S-343 (3.22 2.09 1.09) | 360-S-150 (2.25 1.14 1.78) | 360-S-151 (2.16 1.40 1.52) |
| 360-S-152 (2.80 1.70 1.22) | 360-S-153 (2.18 1.24 1.68) | 360-S-192 (1.60 1.25 1.66) | 360-S-207 (1.17 1.56 1.36) |
| 360-S-291 (1.91 1.28 1.64) | 360-S-292 (1.24 0.94 1.98) | 360-S-295 (0.95 1.02 1.89) | 360-S-296 (1.23 1.02 1.90) |
| 360-S-342 (2.65 1.30 1.62) | 360-S-343 (3.18 1.79 1.13) | 361-S-150 (2.53 1.83 1.49) | 361-S-151 (2.44 2.09 1.24) |
| 361-S-152 (3.08 2.39 0.94) | 361-S-153 (2.46 1.93 1.39) | 361-S-154 (2.28 1.06 2.26) | 361-S-184 (2.28 1.42 1.90) |
| 361-S-192 (1.89 1.94 1.38) | 361-S-193 (0.80 1.11 2.22) | 361-S-206 (0.94 2.30 1.02) | 361-S-207 (1.46 2.25 1.08) |
| 361-S-244 (1.20 1.47 1.85) | 361-S-291 (2.19 1.97 1.36) | 361-S-292 (1.53 1.63 1.70) | 361-S-294 (1.48 1.47 1.85) |
| 361-S-295 (1.24 1.71 1.61) | 361-S-296 (1.52 1.71 1.62) | 361-S-305 (1.41 1.38 1.95) | 361-S-331 (1.04 0.96 2.37) |
| 361-S-342 (2.93 1.99 1.34) | 366-S-150 (2.15 1.88 1.87) | 366-S-151 (2.06 2.14 1.62) | 366-S-152 (2.70 2.44 1.32) |
| 366-S-153 (2.08 1.98 1.77) | 366-S-154 (1.62 1.11 2.65) | 366-S-184 (1.90 1.48 2.28) | 366-S-192 (1.51 2.00 1.76) |
| 366-S-207 (1.08 2.30 1.46) | 366-S-244 (0.82 1.53 2.23) | 366-S-291 (1.81 2.02 1.74) | 366-S-292 (1.14 1.68 2.08) |
| 366-S-294 (1.10 1.52 2.24) | 366-S-295 (0.86 1.77 1.99) | 366-S-296 (1.13 1.76 2.00) | 366-S-305 (1.02 1.43 2.33) |
| 366-S-342 (2.55 2.04 1.72) | 366-S-343 (3.08 2.53 1.23) | 369-S-150 (2.64 1.72 1.38) | 369-S-151 (2.55 1.98 1.13) |
| 369-S-153 (2.57 1.82 1.28) | 369-S-154 (2.11 0.95 2.15) | 369-S-184 (1.93 1.31 1.92) | 369-S-192 (2.00 1.83 1.27) |
| 369-S-193 (0.91 0.99 2.11) | 369-S-206 (1.05 2.19 0.91) | 369-S-207 (1.57 2.13 0.97) | 369-S-244 (1.31 1.36 1.74) |
| 369-S-287 (0.89 1.05 2.06) | 369-S-291 (2.30 1.86 1.25) | 369-S-292 (1.64 1.51 1.59) | 369-S-294 (1.59 1.36 1.74) |
| 369-S-295 (1.35 1.60 1.50) | 369-S-296 (1.62 1.60 1.51) | 369-S-305 (1.52 1.26 1.84) | 369-S-331 (1.15 0.84 2.26) |
| 369-S-342 (3.04 1.87 1.23) | 369-S-468 (0.86 1.47 1.63) | 370-S-152 (2.28 1.19 1.71) | 370-S-343 (2.66 1.12 1.65) |
| 372-S-151 (1.41 1.03 2.27) | 372-S-152 (2.05 1.33 1.97) | 372-S-153 (1.43 0.87 2.43) | 372-S-192 (0.85 0.88 2.41) |
| 372-S-291 (1.16 0.91 2.39) | 372-S-342 (1.90 0.93 2.37) | 372-S-343 (2.43 1.42 1.88) | 373-S-151 (2.02 1.02 1.66) |
| 373-S-152 (2.66 1.32 1.36) | 373-S-153 (2.04 0.86 1.82) | 373-S-192 (1.46 0.88 1.80) | 373-S-207 (1.03 1.18 1.50) |
| 373-S-291 (1.77 0.90 1.78) | 373-S-342 (2.51 0.92 1.76) | 373-S-343 (3.04 1.41 1.72) | 374-S-152 (2.44 0.83 1.58) |
| 374-S-343 (2.82 0.93 1.49) | 375-S-150 (2.63 1.40 1.40) | 375-S-151 (2.54 1.66 1.14) | 375-S-153 (2.56 1.50 1.29) |
| 375-S-184 (2.38 0.99 1.80) | 375-S-192 (1.99 1.51 1.28) | 375-S-206 (1.03 1.87 0.93) | 375-S-207 (1.55 1.82 0.98) |
| 375-S-244 (1.30 1.04 1.75) | 375-S-291 (2.29 1.54 1.26) | 375-S-292 (1.62 1.20 1.60) | 375-S-294 (1.58 1.04 1.76) |
| 375-S-295 (1.34 1.28 1.51) | 375-S-296 (1.61 1.28 1.52) | 375-S-305 (1.50 0.95 1.85) | 375-S-342 (3.03 1.56 1.24) |
| 375-S-468 (0.84 1.16 1.64) | 377-S-150 (2.68 1.44 1.34) | 377-S-151 (2.59 1.70 1.08) | 377-S-153 (2.62 1.54 1.24) |
| 377-S-184 (2.43 1.03 1.75) | 377-S-192 (2.04 1.55 1.23) | 377-S-207 (1.61 1.86 0.92) | 377-S-244 (1.35 1.08 1.70) |
| 377-S-291 (2.34 1.58 1.20) | 377-S-292 (1.68 1.24 1.54) | 377-S-294 (1.64 1.08 1.70) | 377-S-295 (1.39 1.32 1.46) |
| 377-S-296 (1.67 1.32 1.46) | 377-S-305 (1.56 0.99 1.80) | 377-S-342 (3.09 1.60 1.18) | 377-S-468 (0.90 1.20 1.59) |
| 378-S-150 (2.37 0.92 1.65) | 378-S-151 (2.28 1.18 1.39) | 378-S-152 (2.92 1.48 1.10) | 378-S-153 (2.30 1.02 1.55) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

378-S-192 (1.73 1.04 1.54) 378-S-207 (1.30 1.34 1.24) 378-S-291 (2.03 1.06 1.52) 378-S-295 (1.08 0.81 1.77)
378-S-296 (1.36 0.80 1.77) 378-S-342 (2.77 1.08 1.50) 378-S-343 (3.30 1.57 1.00) 379-S-151 (1.72 1.03 1.95)
379-S-152 (2.37 1.33 1.65) 379-S-153 (1.75 0.87 2.11) 379-S-192 (1.17 0.88 2.10) 379-S-291 (1.48 0.91 2.07)
379-S-342 (2.22 0.93 2.05) 379-S-343 (2.75 1.42 1.56) 380-S-150 (1.97 1.36 2.05) 380-S-151 (1.88 1.61 1.79)
380-S-152 (2.53 1.91 1.49) 380-S-153 (1.91 1.46 1.95) 380-S-184 (1.72 0.95 2.46) 380-S-192 (1.33 1.47 1.94)
380-S-207 (0.90 1.77 1.63) 380-S-291 (1.63 1.49 1.91) 380-S-292 (0.97 1.15 2.25) 380-S-294 (0.93 0.99 2.41)
380-S-296 (0.96 1.23 2.17) 380-S-305 (0.85 0.90 2.51) 380-S-342 (2.38 1.51 1.89) 380-S-343 (2.91 2.00 1.40)
381-S-151 (2.15 0.86 1.52) 381-S-152 (2.80 1.16 1.22) 381-S-207 (1.17 1.02 1.36) 381-S-343 (3.18 1.25 1.13)
382-S-151 (1.65 0.85 2.02) 382-S-152 (2.30 1.15 1.72) 382-S-343 (2.68 1.24 1.63) 383-S-150 (2.86 2.48 1.16)
383-S-151 (2.77 2.74 0.91) 383-S-153 (2.79 2.58 1.06) 383-S-154 (2.33 1.71 1.94) 383-S-184 (2.61 2.08 1.57)
383-S-189 (1.93 1.08 2.57) 383-S-192 (2.22 2.60 1.05) 383-S-193 (1.13 1.76 1.89) 383-S-244 (1.53 2.13 1.52)
383-S-287 (1.11 1.81 1.84) 383-S-291 (2.52 2.62 1.03) 383-S-292 (1.85 2.28 1.37) 383-S-294 (1.81 2.12 1.53)
383-S-295 (1.57 2.37 1.28) 383-S-296 (1.84 2.36 1.29) 383-S-300 (1.42 1.37 2.28) 383-S-301 (1.47 1.08 2.57)
383-S-302 (1.59 0.93 2.72) 383-S-305 (1.73 2.03 1.62) 383-S-331 (1.37 1.61 2.04) 383-S-342 (3.26 2.64 1.01)
383-S-468 (1.08 2.24 1.41) 384-S-150 (2.32 2.23 1.70) 384-S-151 (2.23 2.49 1.44) 384-S-152 (2.88 2.79 1.14)
384-S-153 (2.26 2.33 1.60) 384-S-154 (1.79 1.46 2.47) 384-S-189 (1.39 0.82 3.11) 384-S-192 (1.68 2.34 1.59) 384-S-207 (1.25 2.65 1.28) 384-S-244 (0.99 1.87 2.06) 384-S-291 (1.98 2.37 1.56)
384-S-292 (1.32 2.03 1.90) 384-S-294 (1.28 1.87 2.06) 384-S-295 (1.03 2.11 1.82) 384-S-296 (1.31 2.11 1.82)
384-S-300 (0.88 1.11 2.82) 384-S-301 (0.93 0.82 3.11) 384-S-305 (1.20 1.78 2.16) 384-S-331 (0.83 1.35 2.58)
384-S-342 (2.73 2.39 1.54) 384-S-343 (3.26 2.88 1.05) 385-S-150 (3.03 2.27 1.00) 385-S-154 (2.49 1.49 1.77)
385-S-184 (2.77 1.86 1.41) 385-S-189 (2.10 0.86 2.41) 385-S-193 (1.30 1.54 1.72) 385-S-244 (1.70 1.91 1.36)
385-S-287 (1.27 1.59 1.67) 385-S-292 (2.02 2.06 1.20) 385-S-294 (1.98 1.90 1.36) 385-S-295 (1.73 2.15 1.12)
385-S-296 (2.01 2.14 1.12) 385-S-300 (1.58 1.15 2.12) 385-S-301 (1.64 0.86 2.41) 385-S-305 (1.90 1.81 1.45)
385-S-331 (1.53 1.39 1.87) 385-S-468 (1.24 2.02 1.24) 386-S-153 (3.01 1.94 1.02) 386-S-153 (2.94 2.05 0.92)
386-S-154 (2.47 1.17 1.79) 386-S-184 (2.76 1.54 1.42) 386-S-192 (2.36 2.06 0.90) 386-S-193 (1.28 1.22 1.74)
386-S-244 (1.68 1.59 1.37) 386-S-287 (1.26 1.27 1.69) 386-S-292 (2.00 1.74 1.22) 386-S-294 (1.96 1.58 1.38)
386-S-295 (1.71 1.83 1.13) 386-S-296 (1.99 1.82 1.14) 386-S-300 (1.57 0.83 2.13) 386-S-305 (1.88 1.49 1.47)
386-S-331 (1.52 1.07 1.89) 386-S-468 (1.22 1.70 1.26) 387-S-153 (2.92 2.50 1.10) 387-S-153 (2.85 2.60 1.00)
387-S-154 (2.39 1.72 1.87) 387-S-184 (2.67 2.09 1.51) 387-S-189 (1.99 1.09 2.51) 387-S-192 (2.28 2.61 0.99)
387-S-193 (1.20 1.77 1.83) 387-S-244 (1.59 2.14 1.46) 387-S-287 (1.17 1.82 1.77) 387-S-291 (2.58 2.63 0.96)
387-S-292 (1.92 2.29 1.31) 387-S-294 (1.87 2.13 1.46) 387-S-295 (1.63 2.38 1.22) 387-S-296 (1.91 2.37 1.22)
387-S-300 (1.48 1.38 2.22) 387-S-301 (1.53 1.09 2.51) 387-S-302 (1.65 0.94 2.66) 387-S-305 (1.80 2.04 1.56)
387-S-331 (1.43 1.62 1.98) 387-S-342 (3.33 2.65 0.95) 387-S-468 (1.14 2.25 1.35) 388-S-150 (2.45 2.18 1.57)
388-S-151 (2.36 2.44 1.31) 388-S-152 (3.00 2.74 1.01) 388-S-153 (2.39 2.29 1.47) 388-S-154 (1.92 1.41 2.34)
388-S-184 (2.20 1.78 1.98) 388-S-192 (1.81 2.30 1.46) 388-S-206 (0.86 2.65 1.10) 388-S-207 (1.38 2.60 1.15)
388-S-244 (1.12 1.83 1.93) 388-S-291 (2.11 2.32 1.43) 388-S-292 (1.45 1.98 1.78) 388-S-294 (1.40 1.82 1.93)
388-S-295 (1.16 2.07 1.69) 388-S-296 (1.44 2.06 1.69) 388-S-300 (1.01 1.74 2.69) 388-S-305 (1.33 1.73 2.03)
388-S-331 (0.96 1.31 2.45) 388-S-342 (2.86 2.34 1.42) 388-S-343 (3.38 2.83 0.92) 389-S-150 (3.08 2.29 0.94)
389-S-154 (2.55 1.51 1.72) 389-S-184 (2.83 1.88 1.35) 389-S-189 (2.15 0.88 2.35) 389-S-193 (1.35 1.56 1.67)
389-S-244 (1.75 1.93 1.30) 389-S-287 (1.33 1.61 1.62) 389-S-292 (2.07 2.08 1.15) 389-S-294 (2.03 1.92 1.31)
389-S-295 (1.79 2.17 1.06) 389-S-296 (2.06 2.16 1.07) 389-S-300 (1.64 1.19 2.08) 389-S-301 (1.69 0.88 2.35)
389-S-305 (1.95 1.83 1.40) 389-S-331 (1.59 1.41 1.82) 389-S-468 (1.30 2.04 1.19) 390-S-150 (3.08 1.94 0.95)
390-S-154 (2.54 1.16 1.72) 390-S-184 (2.83 1.53 1.36) 390-S-193 (1.35 1.21 1.67) 390-S-244 (1.75 1.58 1.31)
390-S-287 (1.32 1.26 1.62) 390-S-292 (2.07 1.73 1.15) 390-S-294 (2.03 1.57 1.31) 390-S-295 (1.78 1.82 1.07)
390-S-296 (2.06 1.81 1.07) 390-S-300 (1.64 0.82 2.07) 390-S-305 (1.95 1.48 1.40) 390-S-331 (1.58 1.06 1.82)
390-S-468 (1.29 1.69 1.19) 391-S-151 (1.72 1.04 1.96) 391-S-152 (2.36 1.34 1.66) 391-S-153 (1.74 0.89 2.12)
391-S-192 (1.16 0.90 2.11) 391-S-291 (1.47 0.92 2.08) 391-S-342 (2.21 0.94 2.06) 391-S-343 (2.74 1.43 1.57)
392-S-150 (2.35 1.62 1.67) 392-S-151 (2.26 1.88 1.41) 392-S-152 (2.90 2.18 1.12) 392-S-153 (2.28 1.72 1.57)
392-S-154 (1.82 0.85 2.44) 392-S-184 (2.10 1.21 2.08) 392-S-192 (1.71 1.73 1.56) 392-S-207 (1.28 2.04 1.26)
392-S-244 (1.02 1.26 2.03) 392-S-291 (2.01 1.76 1.53) 392-S-292 (1.35 1.42 1.88) 392-S-294 (1.30 1.26 2.03)
392-S-295 (1.06 1.50 1.79) 392-S-296 (1.34 1.50 1.79) 392-S-305 (1.23 1.16 2.13) 392-S-342 (2.76 1.78 1.52)
392-S-343 (3.28 2.27 1.02) 393-S-150 (2.11 3.92 1.91) 393-S-151 (2.02 4.18 1.66) 393-S-152 (2.66 4.48 1.36)
393-S-153 (2.04 4.03 1.81) 393-S-154 (1.58 3.15 2.69) 393-S-184 (1.86 3.52 2.32) 393-S-189 (1.18 2.52 3.32)
393-S-192 (1.47 4.04 1.80) 393-S-207 (1.04 4.34 1.50) 393-S-291 (1.77 4.06 1.78) 393-S-292 (1.10 3.72 2.12)
393-S-294 (1.06 3.56 2.28) 393-S-295 (0.82 3.81 2.03) 393-S-296 (1.09 3.80 2.04) 393-S-302 (0.84 2.37 3.47)
393-S-305 (0.98 3.47 2.37) 393-S-342 (2.51 4.08 1.76) 393-S-343 (3.04 4.57 1.27) 394-S-150 (1.91 1.49 2.12)
394-S-151 (1.82 1.75 1.86) 394-S-152 (2.46 2.05 1.56) 394-S-153 (1.84 1.59 2.01) 394-S-154 (1.66 1.08 2.52)
394-S-192 (1.27 1.60 2.00) 394-S-207 (0.84 1.91 1.70) 394-S-291 (1.57 1.63 1.98) 394-S-292 (0.90 1.29 2.32)
394-S-294 (0.86 1.13 2.48) 394-S-296 (0.89 1.37 2.24) 394-S-342 (2.31 1.65 1.96) 394-S-343 (2.84 2.14 1.47)
396-S-151 (1.36 0.87 2.31) 396-S-152 (2.01 1.17 2.01) 396-S-343 (2.39 1.27 1.92) 397-S-151 (1.56 1.03 2.12)
397-S-152 (2.20 1.33 1.82) 397-S-153 (1.58 0.87 2.27) 397-S-192 (1.01 0.88 2.26) 397-S-291 (1.31 0.91 2.24)
397-S-342 (2.05 0.93 2.22) 397-S-343 (2.58 1.42 1.73) 398-S-150 (1.74 1.64 2.28) 398-S-151 (1.65 1.90 2.02)
398-S-152 (2.30 2.20 1.72) 398-S-153 (1.68 1.74 2.18) 398-S-154 (1.21 0.87 3.05) 398-S-184 (1.49 1.24 2.69)
398-S-192 (1.10 1.76 2.17) 398-S-291 (1.40 1.78 2.14) 398-S-342 (2.15 1.80 2.12) 398-S-343 (2.68 2.29 1.63)
399-S-150 (2.98 1.85 1.04) 399-S-153 (2.91 1.95 0.94) 399-S-154 (2.45 1.08 1.81) 399-S-184 (2.73 1.44 1.45)
399-S-192 (2.34 1.96 0.93) 399-S-193 (1.26 1.12 1.77) 399-S-244 (1.65 1.49 1.40) 399-S-287 (1.23 1.18 1.71)
399-S-291 (2.64 1.99 0.90) 399-S-292 (1.98 1.65 1.25) 399-S-294 (1.93 1.49 1.40) 399-S-295 (1.69 1.73 1.16)
399-S-296 (1.97 1.73 1.16) 399-S-305 (1.86 1.39 1.50) 399-S-331 (1.49 0.97 1.92) 399-S-468 (1.20 1.60 1.29)
400-S-150 (2.82 0.91 1.21) 400-S-151 (2.72 1.17 0.95) 400-S-153 (2.75 1.01 1.11) 400-S-192 (2.17 1.03 1.10)
400-S-291 (2.48 1.05 1.07) 400-S-342 (3.22 1.07 1.05) 401-S-150 (1.81 1.74 2.22) 401-S-151 (1.72 1.99 1.96)
401-S-152 (2.36 2.29 1.66) 401-S-153 (1.74 1.84 2.12) 401-S-154 (1.27 0.97 2.99) 401-S-184 (1.56 1.33 2.63)
401-S-192 (1.16 1.85 2.11) 401-S-291 (1.47 1.87 2.08) 401-S-292 (0.80 1.53 2.42) 401-S-342 (2.21 1.89 2.06)
401-S-343 (2.74 2.39 1.57) 402-S-150 (2.69 1.55 1.34) 402-S-151 (2.60 1.81 1.08) 402-S-153 (2.62 1.65 1.23)
402-S-184 (2.44 1.14 1.74) 402-S-192 (2.05 1.66 1.22) 402-S-193 (0.96 0.82 2.06) 402-S-207 (1.61 1.97 0.92)
402-S-244 (1.36 1.19 1.69) 402-S-287 (0.94 0.88 2.01) 402-S-291 (2.35 1.69 1.20) 402-S-292 (1.68 1.35 1.54)

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 402-S-294 (1.64 1.19 1.70) | 402-S-296 (1.40 1.43 1.45) | 402-S-296 (1.67 1.43 1.46) | 402-S-305 (1.56 1.09 1.79) |
| 402-S-342 (3.09 1.71 1.18) | 402-S-468 (0.90 1.30 1.58) | 403-S-150 (1.86 1.52 2.16) | 403-S-151 (1.77 1.78 1.91) |
| 403-S-152 (2.41 2.08 1.61) | 403-S-153 (1.79 1.62 2.06) | 403-S-184 (1.61 1.11 2.57) | 403-S-192 (1.22 1.63 2.05) |
| 403-S-291 (1.52 1.66 2.03) | 403-S-292 (0.85 1.32 2.37) | 403-S-294 (0.81 1.16 2.53) | 403-S-296 (0.84 1.40 2.29) |
| 403-S-342 (2.26 1.68 2.01) | 403-S-343 (2.79 2.17 1.52) | 404-S-150 (2.82 2.50 1.21) | 404-S-151 (2.73 2.76 0.95) |
| 404-S-153 (2.75 2.60 1.10) | 404-S-154 (2.28 1.73 1.98) | 404-S-184 (2.57 2.09 1.61) | 404-S-189 (1.89 1.09 2.61) |
| 404-S-192 (2.18 2.62 1.09) | 404-S-193 (1.09 1.78 1.93) | 404-S-244 (1.49 2.15 1.56) | 404-S-287 (1.07 1.83 1.88) |
| 404-S-291 (2.48 2.64 1.07) | 404-S-292 (1.81 2.30 1.41) | 404-S-294 (1.77 2.14 1.57) | 404-S-295 (1.53 2.39 1.32) |
| 404-S-296 (1.80 2.38 1.33) | 404-S-300 (1.38 1.39 2.32) | 404-S-301 (1.43 1.10 2.61) | 404-S-302 (1.55 0.94 2.76) |
| 404-S-305 (1.69 2.05 1.66) | 404-S-331 (1.33 1.63 2.08) | 404-S-342 (3.22 2.66 1.05) | 404-S-468 (1.03 2.26 1.45) |
| 405-S-150 (2.47 1.83 1.55) | 405-S-151 (2.38 2.09 1.29) | 405-S-152 (3.03 2.38 0.99) | 405-S-153 (2.41 1.93 1.45) |
| 405-S-154 (1.94 1.06 2.32) | 405-S-184 (2.22 1.42 1.96) | 405-S-192 (1.83 1.94 1.44) | 405-S-206 (0.88 2.30 1.08) |
| 405-S-207 (1.40 2.24 1.13) | 405-S-244 (1.14 1.47 1.91) | 405-S-291 (2.13 1.96 1.41) | 405-S-292 (1.47 1.62 1.75) |
| 405-S-294 (1.42 1.47 1.91) | 405-S-295 (1.18 1.71 1.67) | 405-S-296 (1.46 1.71 1.67) | 405-S-305 (1.35 1.37 2.01) |
| 405-S-331 (0.98 0.95 2.43) | 405-S-342 (2.88 1.98 1.39) | 405-S-343 (3.41 2.48 0.90) | 406-S-150 (2.76 2.41 1.27) |
| 406-S-151 (2.66 2.67 1.01) | 406-S-153 (2.69 2.51 1.17) | 406-S-154 (2.22 1.64 2.04) | 406-S-184 (2.51 2.00 1.68) |
| 406-S-189 (1.83 1.00 2.68) | 406-S-192 (2.11 2.52 1.16) | 406-S-193 (1.03 1.68 1.99) | 406-S-244 (1.43 2.05 1.63) |
| 406-S-287 (1.00 1.74 1.94) | 406-S-291 (2.42 2.55 1.13) | 406-S-292 (1.75 2.21 1.47) | 406-S-294 (1.71 2.05 1.63) |
| 406-S-295 (1.46 2.29 1.39) | 406-S-296 (1.74 2.29 1.39) | 406-S-300 (1.31 1.29 2.39) | 406-S-301 (1.37 1.00 2.68) |
| 406-S-302 (1.49 0.85 2.83) | 406-S-305 (1.63 1.96 1.72) | 406-S-331 (1.26 1.53 2.14) | 406-S-342 (3.16 2.57 1.11) |
| 406-S-468 (0.97 2.17 1.51) | 407-S-150 (2.89 2.45 1.14) | 407-S-153 (2.82 2.55 1.04) | 407-S-154 (2.35 1.68 1.91) |
| 407-S-184 (2.64 2.04 1.54) | 407-S-189 (1.96 1.04 2.54) | 407-S-192 (2.24 2.56 1.02) | 407-S-193 (1.16 1.72 1.86) |
| 407-S-244 (1.56 2.09 1.49) | 407-S-287 (1.14 1.77 1.81) | 407-S-291 (2.55 2.58 1.00) | 407-S-292 (1.88 2.24 1.34) |
| 407-S-294 (1.84 2.09 1.50) | 407-S-295 (1.59 2.33 1.25) | 407-S-296 (1.87 2.33 1.26) | 407-S-300 (1.45 1.33 2.25) |
| 407-S-301 (1.50 1.04 2.54) | 407-S-302 (1.62 0.89 2.69) | 407-S-305 (1.76 1.99 1.59) | 407-S-331 (1.40 1.57 2.01) |
| 407-S-342 (3.29 2.60 0.98) | 407-S-468 (1.10 2.20 1.38) | 408-S-150 (2.57 2.29 1.46) | 408-S-151 (2.48 2.54 1.20) |
| 408-S-153 (2.50 2.39 1.36) | 408-S-154 (2.03 1.52 2.23) | 408-S-184 (2.32 1.88 1.86) | 408-S-189 (1.64 0.88 2.86) |
| 408-S-192 (1.93 2.40 1.34) | 408-S-193 (0.84 1.56 2.18) | 408-S-206 (0.97 2.76 0.99) | 408-S-207 (1.49 2.70 1.04) |
| 408-S-244 (1.24 1.93 1.81) | 408-S-287 (0.82 1.61 2.13) | 408-S-291 (2.23 2.42 1.32) | 408-S-292 (1.56 2.08 1.66) |
| 408-S-294 (1.52 1.93 1.82) | 408-S-295 (1.27 2.17 1.57) | 408-S-296 (1.55 2.16 1.58) | 408-S-300 (1.13 1.17 2.57) |
| 408-S-301 (1.18 0.88 2.86) | 408-S-305 (1.44 1.83 1.91) | 408-S-331 (1.08 1.41 2.33) | 408-S-342 (2.97 2.44 1.30) |
| 409-S-150 (2.72 2.27 1.31) | 409-S-151 (2.62 2.53 1.05) | 409-S-153 (2.65 2.37 1.21) | 409-S-154 (2.18 1.50 2.08) |
| 409-S-184 (2.47 1.86 1.72) | 409-S-189 (1.79 0.86 2.72) | 409-S-192 (2.07 2.38 1.20) | 409-S-193 (0.99 1.55 2.03) |
| 409-S-244 (1.39 1.91 1.67) | 409-S-287 (0.96 1.60 1.98) | 409-S-291 (2.38 2.41 1.17) | 409-S-292 (1.71 2.07 1.51) |
| 409-S-294 (1.67 1.91 1.67) | 409-S-295 (1.42 2.15 1.43) | 409-S-296 (1.70 2.15 1.43) | 409-S-300 (1.28 1.15 2.43) |
| 409-S-301 (1.33 0.86 2.71) | 409-S-305 (1.59 1.82 1.76) | 409-S-331 (1.22 1.40 2.18) | 409-S-342 (3.12 2.43 1.15) |
| 409-S-468 (0.93 2.03 1.55) | 410-S-150 (2.82 2.58 1.20) | 410-S-151 (2.73 2.84 0.94) | 410-S-153 (2.75 2.68 1.10) |
| 410-S-154 (2.29 1.81 1.97) | 410-S-184 (2.57 2.17 1.61) | 410-S-189 (1.89 1.17 2.61) | 410-S-192 (2.18 2.69 1.09) |
| 410-S-193 (1.10 1.85 1.93) | 410-S-244 (1.49 2.22 1.56) | 410-S-287 (1.07 1.91 1.87) | 410-S-291 (2.48 2.72 1.06) |
| 410-S-292 (1.82 2.38 1.41) | 410-S-294 (1.77 2.22 1.56) | 410-S-295 (1.53 2.46 1.32) | 410-S-296 (1.81 2.46 1.32) |
| 410-S-300 (1.38 1.46 2.32) | 410-S-301 (1.43 1.17 2.61) | 410-S-302 (1.55 1.02 2.76) | 410-S-305 (1.70 2.12 1.66) |
| 410-S-331 (1.33 1.70 2.08) | 410-S-342 (3.23 2.74 1.05) | 410-S-468 (1.04 2.33 1.45) | 411-S-150 (2.89 2.64 1.13) |
| 411-S-153 (2.83 2.74 1.03) | 411-S-154 (2.36 1.87 1.90) | 411-S-184 (2.64 2.24 1.54) | 411-S-189 (1.97 1.24 2.54) |
| 411-S-192 (2.25 2.76 1.02) | 411-S-193 (1.17 1.92 1.86) | 411-S-244 (1.56 2.29 1.49) | 411-S-287 (1.14 1.97 1.80) |
| 411-S-291 (2.56 2.78 0.99) | 411-S-292 (1.89 2.44 1.33) | 411-S-294 (1.85 2.28 1.49) | 411-S-295 (1.60 2.53 1.25) |
| 411-S-296 (1.88 2.52 1.25) | 411-S-300 (1.45 1.53 2.25) | 411-S-301 (1.51 1.24 2.54) | 411-S-302 (1.63 1.09 2.69) |
| 411-S-305 (1.77 2.19 1.58) | 411-S-331 (1.40 1.77 2.00) | 411-S-342 (3.30 2.80 0.97) | 411-S-468 (1.10 2.40 1.37) |
| 412-S-150 (2.51 2.41 1.52) | 412-S-151 (2.42 2.67 1.26) | 412-S-152 (3.06 2.97 0.96) | 412-S-153 (2.44 2.51 1.42) |
| 412-S-154 (1.97 1.64 2.29) | 412-S-184 (2.26 2.00 1.92) | 412-S-189 (1.58 1.00 2.92) | 412-S-192 (1.86 2.52 1.40) |
| 412-S-206 (0.91 2.88 1.05) | 412-S-207 (1.43 2.83 1.10) | 412-S-244 (1.18 2.05 1.87) | 412-S-291 (2.17 2.55 1.38) |
| 412-S-292 (1.50 2.21 1.72) | 412-S-294 (1.46 2.05 1.88) | 412-S-295 (1.21 2.29 1.63) | 412-S-296 (1.49 2.29 1.64) |
| 412-S-300 (1.07 1.29 2.63) | 412-S-301 (1.12 1.00 2.92) | 412-S-302 (1.24 0.85 3.07) | 412-S-305 (1.38 1.95 1.97) |
| 412-S-331 (1.02 1.53 2.39) | 412-S-342 (2.91 2.57 1.36) | 413-S-184 (2.77 2.06 1.49) | 413-S-184 (3.05 2.42 1.13) |
| 413-S-189 (2.37 1.42 2.13) | 413-S-193 (1.58 2.10 1.45) | 413-S-244 (1.97 2.47 1.08) | 413-S-287 (1.55 2.16 1.39) |
| 413-S-292 (2.30 2.63 0.92) | 413-S-294 (2.26 2.47 1.08) | 413-S-300 (1.86 1.71 1.84) | 413-S-301 (1.91 1.42 2.13) |
| 413-S-302 (2.04 1.27 2.28) | 413-S-305 (2.18 2.37 1.18) | 413-S-331 (1.81 1.95 1.60) | 413-S-468 (1.52 2.58 0.97) |
| 414-S-154 (2.78 2.08 1.48) | 414-S-184 (3.07 2.44 1.12) | 414-S-189 (2.39 1.44 2.12) | 414-S-193 (1.59 2.12 1.43) |
| 414-S-244 (1.99 2.49 1.07) | 414-S-287 (1.56 2.17 1.38) | 414-S-292 (2.31 2.64 0.91) | 414-S-294 (2.27 2.49 1.07) |
| 414-S-300 (1.88 1.73 1.83) | 414-S-301 (1.93 1.44 2.11) | 414-S-302 (2.05 1.29 2.27) | 414-S-305 (2.19 2.39 1.16) |
| 414-S-331 (1.82 1.97 1.58) | 414-S-468 (1.53 2.60 0.95) | 415-S-150 (1.76 0.89 2.27) | 415-S-151 (1.67 1.15 2.01) |
| 415-S-152 (2.31 1.45 1.71) | 415-S-153 (1.69 0.99 2.17) | 415-S-192 (1.11 1.00 2.15) | 415-S-291 (1.42 1.03 2.13) |
| 415-S-342 (2.16 1.05 2.11) | 415-S-343 (2.69 1.54 1.62) | 416-S-150 (1.16 2.60 2.00 1.42) | 416-S-151 (2.51 2.25 1.17) |
| 416-S-153 (2.53 2.10 1.32) | 416-S-154 (2.07 1.23 2.19) | 416-S-184 (2.35 1.59 1.83) | 416-S-192 (1.96 2.11 1.31) |
| 416-S-193 (0.87 1.27 2.15) | 416-S-206 (1.01 2.47 0.95) | 416-S-207 (1.53 2.41 1.01) | 416-S-244 (1.27 1.64 1.78) |
| 416-S-287 (0.85 1.32 2.10) | 416-S-291 (2.26 2.13 1.29) | 416-S-292 (1.60 1.79 1.63) | 416-S-294 (1.55 1.64 1.78) |
| 416-S-295 (1.31 1.88 1.54) | 416-S-296 (1.59 1.87 1.54) | 416-S-300 (1.16 0.88 2.54) | 416-S-305 (1.48 1.54 1.88) |
| 416-S-331 (1.11 1.12 2.30) | 416-S-342 (3.00 2.15 1.27) | 416-S-468 (0.82 1.75 1.67) | 417-S-150 (2.90 2.58 1.13) |
| 417-S-153 (2.83 2.68 1.03) | 417-S-154 (2.36 1.81 1.90) | 417-S-184 (2.65 2.17 1.54) | 417-S-189 (1.97 1.17 2.54) |
| 417-S-192 (2.25 2.70 1.02) | 417-S-193 (1.17 1.86 1.85) | 417-S-244 (1.57 2.23 1.49) | 417-S-287 (1.14 1.91 1.80) |
| 417-S-291 (2.56 2.72 0.99) | 417-S-292 (1.89 2.38 1.33) | 417-S-294 (1.85 2.22 1.49) | 417-S-295 (1.60 2.47 1.25) |
| 417-S-296 (1.88 2.46 1.24) | 417-S-300 (1.46 1.46 2.25) | 417-S-301 (1.51 1.18 2.53) | 417-S-302 (1.63 1.02 2.69) |
| 417-S-305 (1.77 2.13 1.58) | 417-S-331 (1.40 1.71 2.00) | 417-S-342 (3.30 2.74 0.97) | 417-S-468 (1.11 2.34 1.37) |
| 418-S-150 (2.86 1.94 1.17) | 418-S-151 (2.77 2.20 0.91) | 418-S-153 (2.79 2.04 1.07) | 418-S-154 (2.32 1.17 1.94) |
| 418-S-184 (2.61 1.53 1.57) | 418-S-192 (2.21 2.05 1.05) | 418-S-193 (1.13 1.21 1.89) | 418-S-244 (1.53 1.58 1.52) |
| 418-S-287 (1.11 1.27 1.84) | 418-S-291 (2.52 2.08 1.03) | 418-S-292 (1.85 1.74 1.37) | 418-S-294 (1.81 1.58 1.53) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 418-S-295 (1.56 1.82 1.28) | 418-S-296 (1.84 1.82 1.29) | 418-S-300 (1.42 0.82 2.28) | 418-S-305 (1.73 1.48 1.62) |
| 418-S-331 (1.37 1.06 2.04) | 418-S-342 (3.26 2.10 1.01) | 418-S-468 (1.07 1.69 1.41) | 419-S-151 (2.27 1.05 1.40) |
| 419-S-152 (2.92 1.35 1.10) | 419-S-153 (2.30 0.89 1.56) | 419-S-192 (1.72 0.90 1.55) | 419-S-207 (1.29 1.21 1.24) |
| 419-S-291 (2.03 0.93 1.52) | 419-S-342 (2.77 0.95 1.50) | 419-S-343 (3.30 1.44 1.01) | 421-S-150 (2.11 1.75 1.92) |
| 421-S-151 (2.02 2.01 1.66) | 421-S-152 (2.66 2.31 1.36) | 421-S-153 (2.04 1.85 1.82) | 421-S-154 (1.57 0.98 2.69) |
| 421-S-184 (1.86 1.34 2.33) | 421-S-192 (1.46 1.86 1.80) | 421-S-207 (1.03 2.17 1.50) | 421-S-291 (1.77 1.89 1.78) |
| 421-S-292 (1.10 1.55 2.12) | 421-S-294 (1.06 1.39 2.28) | 421-S-295 (0.81 1.63 2.03) | 421-S-296 (1.09 1.63 2.04) |
| 421-S-305 (0.98 1.30 2.37) | 421-S-342 (2.51 1.91 1.76) | 421-S-343 (3.04 2.40 1.27) | 422-S-150 (2.46 1.20 1.57) |
| 422-S-151 (2.37 1.46 1.31) | 422-S-152 (3.01 1.76 1.01) | 422-S-153 (2.39 1.30 1.47) | 422-S-192 (1.81 1.31 1.45) |
| 422-S-206 (0.86 1.67 1.10) | 422-S-207 (1.38 1.62 1.15) | 422-S-244 (1.13 0.84 1.92) | 422-S-291 (2.12 1.34 1.43) |
| 422-S-292 (1.45 1.00 1.77) | 422-S-294 (1.41 0.84 1.93) | 422-S-295 (1.16 1.08 1.68) | 422-S-296 (1.44 1.08 1.69) |
| 422-S-342 (2.86 1.36 1.41) | 422-S-343 (3.39 1.85 0.92) | 423-S-150 (2.48 2.12 1.55) | 423-S-151 (2.39 2.38 1.29) |
| 423-S-152 (3.03 2.68 0.99) | 423-S-153 (2.41 2.23 1.44) | 423-S-154 (1.95 1.35 2.32) | 423-S-184 (2.23 1.72 1.95) |
| 423-S-192 (1.84 2.24 1.43) | 423-S-206 (0.89 2.59 1.08) | 423-S-294 (1.41 2.54 1.13) | 423-S-244 (1.15 1.77 1.90) |
| 423-S-291 (2.14 2.26 1.41) | 423-S-292 (1.47 1.92 1.75) | 423-S-207 (1.43 1.76 1.91) | 423-S-295 (1.19 2.01 1.66) |
| 423-S-296 (1.46 2.00 1.67) | 423-S-300 (1.04 1.01 2.66) | 423-S-305 (1.35 1.67 2.00) | 423-S-331 (0.99 1.25 2.42) |
| 423-S-342 (2.88 2.28 1.39) | 424-S-150 (2.56 2.24 1.47) | 424-S-151 (2.47 2.50 1.21) | 424-S-152 (3.11 2.79 0.91) |
| 424-S-153 (2.49 2.34 1.37) | 424-S-154 (2.02 1.47 2.24) | 424-S-184 (2.31 1.83 1.88) | 424-S-189 (1.63 0.83 2.88) |
| 424-S-192 (1.91 2.35 1.35) | 424-S-193 (0.83 1.51 2.19) | 424-S-206 (0.96 2.71 1.00) | 424-S-207 (1.48 2.65 1.05) |
| 424-S-244 (1.23 1.88 1.82) | 424-S-287 (0.81 1.57 2.14) | 424-S-291 (2.22 2.38 1.33) | 424-S-292 (1.55 2.03 1.67) |
| 424-S-294 (1.51 1.88 1.83) | 424-S-295 (1.26 2.12 1.58) | 424-S-296 (1.54 2.12 1.59) | 424-S-300 (1.12 1.12 2.58) |
| 424-S-301 (1.17 0.83 2.87) | 424-S-305 (1.43 1.78 1.92) | 424-S-331 (1.06 1.36 2.34) | 424-S-342 (2.96 2.39 1.31) |
| 425-S-154 (3.02 0.95 1.24) | 425-S-193 (1.83 1.00 1.19) | 425-S-287 (1.81 1.05 1.14) | 425-S-305 (2.43 1.27 0.92) |
| 425-S-331 (2.07 0.85 1.34) | 426-S-150 (2.53 1.95 1.49) | 426-S-151 (2.44 2.21 1.23) | 426-S-152 (3.09 2.51 0.93) |
| 426-S-153 (2.47 2.05 1.39) | 426-S-154 (2.00 1.18 2.26) | 426-S-184 (2.28 1.55 1.90) | 426-S-192 (1.89 2.07 1.38) |
| 426-S-193 (0.81 1.23 2.22) | 426-S-206 (0.94 2.42 1.02) | 426-S-207 (1.46 2.37 1.07) | 426-S-244 (1.20 1.60 1.85) |
| 426-S-291 (2.19 2.09 1.35) | 426-S-292 (1.53 1.75 1.69) | 426-S-294 (1.49 1.59 1.85) | 426-S-295 (1.24 1.84 1.61) |
| 426-S-296 (1.52 1.83 1.61) | 426-S-300 (1.09 0.84 2.61) | 426-S-305 (1.41 1.50 1.95) | 426-S-331 (1.04 1.08 2.37) |
| 426-S-342 (2.94 2.11 1.33) | 427-S-150 (2.85 2.23 1.18) | 427-S-151 (2.75 2.49 0.92) | 427-S-153 (2.78 2.33 1.08) |
| 427-S-154 (2.31 1.46 1.95) | 427-S-184 (2.59 1.83 1.59) | 427-S-189 (1.92 0.83 2.59) | 427-S-192 (2.20 2.35 1.07) |
| 427-S-193 (1.12 1.51 1.90) | 427-S-244 (1.51 1.88 1.54) | 427-S-287 (1.09 1.56 1.85) | 427-S-291 (2.51 2.37 1.04) |
| 427-S-292 (1.84 2.03 1.38) | 427-S-294 (1.80 1.87 1.54) | 427-S-295 (1.55 2.12 1.30) | 427-S-296 (1.83 2.11 1.30) |
| 427-S-300 (1.40 1.12 2.30) | 427-S-301 (1.46 0.83 2.59) | 427-S-305 (1.72 1.78 1.63) | 427-S-331 (1.35 1.36 2.05) |
| 427-S-342 (3.25 2.39 1.02) | 427-S-468 (1.06 1.99 1.42) | 428-S-154 (2.77 0.96 1.49) | 428-S-184 (3.05 1.32 1.13) |
| 428-S-193 (1.58 1.00 1.45) | 428-S-244 (1.97 1.37 1.08) | 428-S-287 (1.55 1.06 1.39) | 428-S-292 (2.30 1.52 0.92) |
| 428-S-294 (2.26 1.37 1.08) | 428-S-305 (2.18 1.27 1.17) | 428-S-331 (1.81 0.85 1.60) | 428-S-468 (1.52 1.48 0.97) |
| 432-S-150 (1.63 1.28 2.39) | 432-S-151 (1.54 1.54 2.14) | 432-S-152 (2.18 1.84 1.84) | 432-S-153 (1.56 1.38 2.29) |
| 432-S-184 (1.38 0.87 2.80) | 432-S-192 (0.99 1.39 2.28) | 432-S-291 (1.29 1.42 2.26) | 432-S-342 (2.03 1.44 2.24) |
| 432-S-343 (2.56 1.93 1.75) | 433-S-150 (1.92 1.27 2.11) | 433-S-151 (1.82 1.53 1.85) | 433-S-152 (2.47 1.83 1.55) |
| 433-S-153 (1.85 1.37 2.01) | 433-S-184 (1.67 0.86 2.52) | 433-S-192 (1.27 1.38 2.00) | 433-S-207 (0.84 1.69 1.69) |
| 433-S-291 (1.58 1.41 1.97) | 433-S-292 (0.91 1.07 2.31) | 433-S-294 (0.87 0.91 2.47) | 433-S-296 (0.90 1.15 2.23) |
| 433-S-342 (2.32 1.43 1.95) | 433-S-343 (2.85 1.92 1.46) | 433-S-152 (2.36 1.04 1.66) | 434-S-343 (2.74 1.13 1.57) |
| 435-S-152 (2.27 0.87 1.75) | 435-S-343 (2.65 0.96 1.66) | 436-S-150 (2.62 1.59 1.40) | 436-S-151 (2.53 1.85 1.15) |
| 436-S-153 (2.55 1.69 1.30) | 436-S-154 (2.09 0.82 2.18) | 436-S-184 (2.37 1.18 1.81) | 436-S-192 (1.98 1.70 1.29) |
| 436-S-193 (0.89 0.87 2.13) | 436-S-206 (1.03 2.06 0.94) | 436-S-207 (1.55 2.01 0.99) | 436-S-244 (1.29 1.23 1.76) |
| 436-S-287 (0.87 0.92 2.08) | 436-S-291 (2.28 1.73 1.27) | 436-S-292 (1.61 1.39 1.61) | 436-S-294 (1.57 1.23 1.77) |
| 436-S-295 (1.33 1.47 1.52) | 436-S-296 (1.60 1.47 1.53) | 436-S-305 (1.49 1.14 1.86) | 436-S-342 (3.02 1.75 1.25) |
| 436-S-468 (0.83 1.35 1.65) | 437-S-150 (1.54 0.94 2.49) | 437-S-151 (1.45 1.19 2.23) | 437-S-152 (2.09 1.49 1.93) |
| 437-S-153 (1.47 1.04 2.39) | 437-S-192 (0.89 1.05 2.38) | 437-S-291 (1.20 1.07 2.35) | 437-S-342 (1.94 1.09 2.33) |
| 437-S-343 (2.47 1.59 1.84) | 441-S-343 (2.19 0.87 2.11) | 444-S-150 (1.73 1.63 2.29) | 444-S-151 (1.64 1.88 2.04) |
| 444-S-152 (2.28 2.18 1.74) | 444-S-153 (1.66 1.73 2.19) | 444-S-154 (1.20 0.86 3.06) | 444-S-184 (1.48 1.22 2.70) |
| 444-S-192 (1.09 1.74 2.18) | 444-S-291 (1.39 1.76 2.16) | 444-S-342 (2.13 1.78 2.14) | 444-S-343 (2.66 2.28 1.64) |
| 445-S-150 (2.05 1.67 1.97) | 445-S-151 (1.96 1.92 1.71) | 445-S-152 (2.61 2.22 1.41) | 445-S-153 (1.99 1.77 1.87) |
| 445-S-154 (1.52 0.90 2.74) | 445-S-184 (1.80 1.26 2.38) | 445-S-192 (1.41 1.78 1.86) | 445-S-207 (0.98 2.08 1.55) |
| 445-S-291 (1.71 1.80 1.83) | 445-S-292 (1.05 1.46 2.17) | 445-S-294 (1.01 1.31 2.33) | 445-S-296 (1.04 1.54 2.09) |
| 445-S-305 (0.93 1.21 2.43) | 445-S-342 (2.46 1.82 1.81) | 445-S-343 (2.99 2.32 1.32) | 446-S-150 (2.05 1.67 1.97) |
| 446-S-151 (1.96 1.92 1.71) | 446-S-152 (2.61 2.22 1.41) | 446-S-153 (1.99 1.77 1.87) | 446-S-154 (1.52 0.90 2.74) |
| 446-S-184 (1.80 1.26 2.38) | 446-S-192 (1.41 1.78 1.86) | 446-S-207 (0.98 2.08 1.55) | 446-S-291 (1.71 1.80 1.83) |
| 446-S-292 (1.05 1.46 2.17) | 446-S-294 (1.01 1.31 2.33) | 446-S-296 (1.04 1.54 2.09) | 446-S-305 (0.93 1.21 2.43) |
| 446-S-342 (2.46 1.82 1.81) | 446-S-343 (2.99 2.32 1.32) | 448-S-150 (2.31 1.28 1.71) | 448-S-151 (2.22 1.54 1.46) |
| 448-S-152 (2.86 1.84 1.16) | 448-S-153 (2.24 1.38 1.61) | 448-S-184 (2.06 0.87 2.12) | 448-S-192 (1.67 1.39 1.60) |
| 448-S-207 (1.24 1.70 1.30) | 448-S-244 (0.98 0.92 2.07) | 448-S-291 (1.97 1.42 1.58) | 448-S-292 (1.31 1.08 1.92) |
| 448-S-294 (1.26 0.92 2.07) | 448-S-295 (1.02 1.16 1.83) | 448-S-296 (1.30 1.16 1.84) | 448-S-305 (1.19 0.82 2.17) |
| 448-S-342 (2.71 1.44 1.45) | 448-S-343 (3.24 1.93 1.06) | 450-S-152 (2.44 0.95 1.58) | 450-S-207 (0.81 0.81 1.72) |
| 450-S-343 (2.82 1.04 1.49) | 453-S-150 (1.62 1.09 2.40) | 453-S-151 (1.53 1.35 2.15) | 453-S-152 (2.17 1.65 1.85) |
| 453-S-153 (1.55 1.19 2.30) | 453-S-192 (0.98 1.20 2.29) | 453-S-291 (1.28 1.23 2.27) | 453-S-342 (2.02 1.25 2.25) |
| 453-S-343 (2.55 1.74 1.75) | 454-S-150 (1.80 0.93 2.23) | 454-S-151 (1.71 1.18 1.97) | 454-S-152 (2.35 1.48 1.67) |
| 454-S-152 (1.73 1.03 2.13) | 454-S-192 (1.15 1.04 2.12) | 454-S-291 (1.46 1.06 2.09) | 454-S-342 (2.20 1.08 2.07) |
| 454-S-343 (2.73 1.58 1.58) | 455-S-151 (1.72 0.91 1.95) | 455-S-152 (2.37 1.21 1.65) | 455-S-342 (2.22 0.81 2.05) |
| 455-S-343 (2.75 1.31 1.56) | 456-S-150 (2.12 0.94 1.91) | 456-S-151 (2.03 1.20 1.65) | 456-S-152 (2.67 1.50 1.35) |
| 456-S-153 (2.05 1.04 1.80) | 456-S-192 (1.48 1.06 1.79) | 456-S-207 (1.04 1.36 1.49) | 456-S-291 (1.78 1.08 1.77) |
| 456-S-295 (0.83 0.83 2.02) | 456-S-296 (1.10 0.82 2.03) | 456-S-342 (2.52 1.10 1.75) | 456-S-343 (3.05 1.59 1.26) |
| 458-S-152 (2.67 0.91 1.35) | 458-S-343 (3.05 1.01 1.25) | 466-S-150 (2.29 1.07 1.73) | 466-S-151 (2.20 1.33 1.47) |
| 466-S-152 (2.84 1.63 1.18) | 466-S-153 (2.22 1.17 1.63) | 466-S-192 (1.65 1.19 1.62) | 466-S-207 (1.22 1.49 1.32) |
| 466-S-291 (1.95 1.21 1.60) | 466-S-292 (1.29 0.87 1.94) | 466-S-295 (1.00 0.96 1.85) | 466-S-296 (1.28 0.95 1.85) |

TABLE 6-continued

Organic molecules according to the invention following the pattern AF1-S-AF2, wherein S optional is not present, so that Table 6 also simultaneously represents molecules according to the pattern AF1-AF2. The values for ΔHOMO, ΔLUMO and Gap are given in parentheses.

| | | | |
|---|---|---|---|
| 466-S-342 (2.69 1.23 1.58) | 466-S-343 (3.22 1.72 1.08) | 467-S-151 (1.89 0.81 1.78) | 467-S-152 (2.54 1.11 1.48) |
| 467-S-207 (0.91 0.97 1.62) | 467-S-343 (2.92 1.20 1.39) | 468-S-152 (2.34 0.80 1.68) | 468-S-343 (2.72 0.89 1.59) |
| 471-S-152 (1.64 1.04 2.38) | 471-S-343 (2.02 1.14 2.29) | 475-S-150 (2.25 0.86 1.78) | 475-S-151 (2.16 1.12 1.52) |
| 475-S-152 (2.80 1.42 1.22) | 475-S-153 (2.18 0.96 1.68) | 475-S-192 (1.60 0.98 1.66) | 475-S-207 (1.17 1.28 1.36) |
| 475-S-291 (1.91 1.00 1.64) | 475-S-343 (2.65 1.02 1.62) | 475-S-343 (3.18 1.51 1.13) | 476-S-150 (2.57 0.83 1.46) |
| 476-S-151 (2.48 1.09 1.20) | 476-S-153 (2.50 0.93 1.36) | 476-S-192 (1.92 0.95 1.34) | 476-S-206 (0.97 1.30 0.99) |
| 476-S-207 (1.49 1.25 1.04) | 476-S-291 (2.23 0.97 1.32) | 476-S-342 (2.97 0.99 1.30) | 477-S-154 (2.60 0.84 1.66) |
| 477-S-184 (2.89 1.20 1.29) | 477-S-193 (1.41 0.88 1.61) | 477-S-244 (1.81 1.25 1.24) | 477-S-287 (1.39 0.94 1.56) |
| 477-S-292 (2.13 1.40 1.09) | 477-S-294 (2.09 1.25 1.25) | 477-S-295 (1.84 1.49 1.00) | 477-S-296 (2.12 1.49 1.01) |
| 477-S-305 (2.01 1.15 1.34) | 477-S-468 (1.35 1.36 1.13) | 478-S-154 (2.67 0.88 1.59) | 478-S-184 (2.95 1.24 1.23) |
| 478-S-193 (1.48 0.93 1.55) | 478-S-244 (1.87 1.29 1.18) | 478-S-287 (1.45 0.98 1.49) | 478-S-292 (2.20 1.45 1.02) |
| 478-S-294 (2.15 1.29 1.18) | 478-S-295 (1.91 1.53 0.94) | 478-S-296 (2.19 1.53 0.94) | 478-S-305 (2.08 1.20 1.28) |
| 478-S-468 (1.42 1.41 1.07) | 479-S-184 (3.08 1.10 1.10) | 479-S-244 (2.00 1.15 1.05) | 479-S-287 (1.58 0.84 1.37) |
| 479-S-294 (2.28 1.15 1.05) | 479-S-305 (2.21 1.06 1.15) | 479-S-468 (1.55 1.27 0.94) | 480-S-150 (2.17 1.51 1.86) |
| 480-S-151 (2.07 1.77 1.60) | 480-S-152 (2.72 2.07 1.30) | 480-S-153 (2.10 1.61 1.76) | 480-S-184 (1.91 1.10 2.27) |
| 480-S-192 (1.52 1.62 1.75) | 480-S-207 (1.09 1.93 1.44) | 480-S-244 (0.84 1.15 2.38) | 480-S-291 (1.83 1.65 1.72) |
| 480-S-292 (1.16 1.31 2.06) | 480-S-294 (1.12 1.15 2.22) | 480-S-295 (0.87 1.39 1.98) | 480-S-296 (1.15 1.39 1.98) |
| 480-S-305 (1.04 1.06 2.31) | 480-S-342 (2.57 1.67 1.70) | 480-S-343 (3.10 2.16 1.21) | 481-S-150 (2.62 2.22 1.41) |
| 481-S-151 (2.52 2.48 1.15) | 481-S-153 (2.55 2.32 1.31) | 481-S-154 (2.08 1.45 2.18) | 481-S-184 (2.36 1.81 1.82) |
| 481-S-189 (1.69 0.81 2.82) | 481-S-192 (1.97 2.33 1.30) | 481-S-193 (0.89 1.50 2.13) | 481-S-206 (1.02 2.69 0.94) |
| 481-S-207 (1.54 2.64 0.99) | 481-S-244 (1.29 1.86 1.77) | 481-S-287 (0.86 1.55 2.08) | 481-S-291 (2.28 2.36 1.27) |
| 481-S-292 (1.61 2.02 1.61) | 481-S-294 (1.57 1.86 1.77) | 481-S-295 (1.32 2.10 1.53) | 481-S-296 (1.60 2.10 1.53) |
| 481-S-300 (1.17 1.10 2.53) | 481-S-301 (1.23 0.81 2.82) | 481-S-305 (1.49 1.77 1.86) | 481-S-331 (1.12 1.35 2.28) |
| 481-S-342 (3.02 2.38 1.25) | 481-S-468 (0.83 1.98 1.65) | 482-S-152 (2.71 0.93 1.31) | 482-S-343 (3.09 1.02 1.22) |
| 483-S-152 (2.66 0.86 1.36) | 483-S-343 (3.04 0.95 1.27) | 484-S-150 (1.85 1.21 2.18) | 484-S-151 (1.76 1.46 1.92) |
| 484-S-152 (2.40 1.76 1.62) | 484-S-153 (1.78 1.31 2.07) | 484-S-192 (1.21 1.32 2.06) | 484-S-291 (1.51 1.34 2.04) |
| 484-S-292 (0.84 1.002.38) | 484-S-294 (0.80 0.84 2.54) | 484-S-296 (0.83 1.08 2.30) | 484-S-342 (2.25 1.36 2.02) |
| 484-S-343 (2.78 1.85 1.53) | 485-S-150 (3.01 1.88 1.01) | 485-S-153 (2.95 1.98 0.91) | 485-S-154 (2.48 1.11 1.78) |
| 485-S-184 (2.76 1.47 1.42) | 485-S-193 (1.29 1.15 1.74) | 485-S-244 (1.68 1.52 1.37) | 485-S-287 (1.26 1.21 1.68) |
| 485-S-292 (2.01 1.68 1.21) | 485-S-294 (1.97 1.52 1.37) | 485-S-295 (1.72 1.76 1.13) | 485-S-296 (2.00 1.76 1.13) |
| 485-S-305 (1.89 1.43 1.46) | 485-S-331 (1.52 1.00 1.89) | 485-S-468 (1.23 1.64 1.25) | 486-S-150 (0.91 0.95 3.12) |
| 486-S-151 (0.82 1.21 2.86) | 486-S-152 (1.46 1.51 2.56) | 486-S-153 (0.84 1.05 3.02) | 486-S-342 (1.31 1.11 2.96) |
| 486-S-343 (1.84 1.60 2.47) | | | |

In particular the use of the chemical entities AF1 und AF2 according to the invention distinguishes the organic molecules functionally from molecules according to the prior art. As a result of the linking patterns present, the two pi systems of AF1 and AF2 are not in conjugation due to twisting, but are nevertheless fixed in close spatial proximity.

In one embodiment in particular the separator S distinguishes the organic molecules functionally from molecules according to the prior art, since the method of separation of AFs (or donors and acceptors) shown here is not yet known. Separators serve to interrupt the electronic communication between the chemical entities AF1 and AF2 by linking the entities in such a way that the limiting orbitals HOMO and LUMO are on mostly separate parts of the molecules, which is not necessarily the case without the separator.

Separators in the sense of this invention do not significantly change the positions of the HOMO or LUMO of the AFs. Not significant within the framework of this invention means a change of no more than +/−0.4 eV. The calculation of such energies is known and functions in the above-described manner through DFT computation.

On the basis of spectroscopic selection rules (symmetrical molecules) or by measuring the extinction coefficients (UV/VIS spectroscopy) or using quantum chemical calculation of the oscillator strengths it is possible to predict whether a quantum mechanical transition is allowed. The higher the oscillator strength, the more likely it is that a transition will be allowed, and the faster is the associated process (decay time). Decay times of <300 µs, in particular <100 µs, or of <50 µs are sought. In the case of a long decay time of the (organic) emitter, saturation effects take place rapidly at high current intensivities, which has a negative effect on the lifetime of the component and prevents the achievement of high brightnesses.

Figure 2:
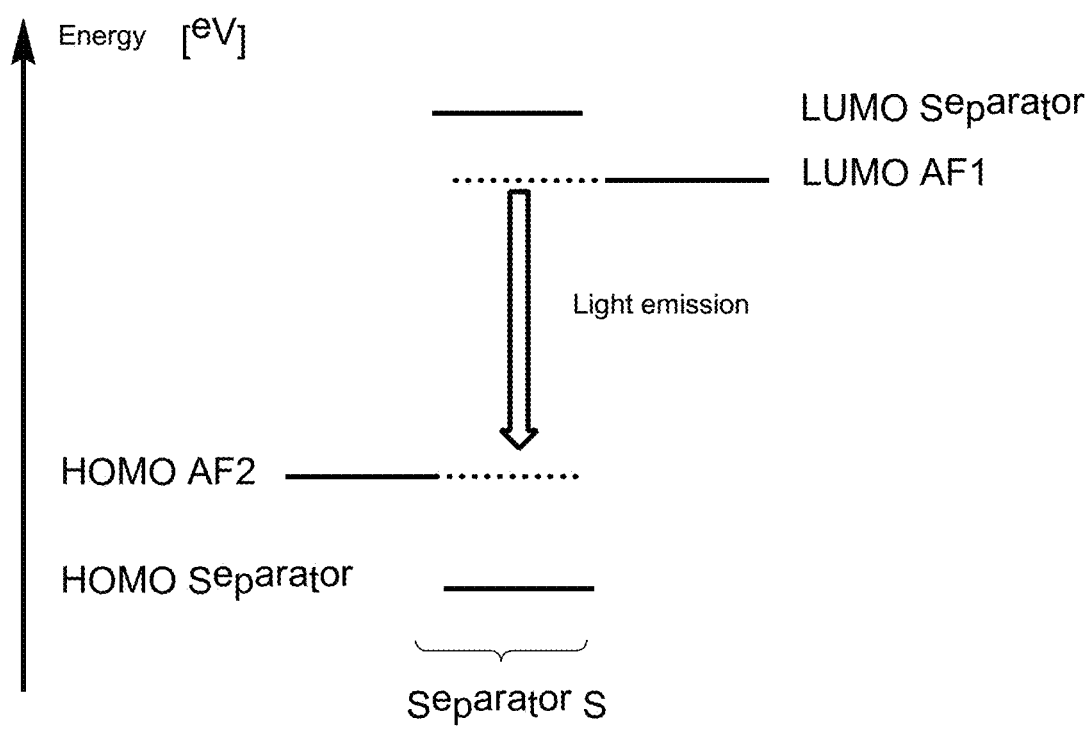
FIG. 2 is a schematic representation of the energy level diagram (relative energy in eV) of an emitter molecule according to the invention, with a separator.

In one embodiment the separators S fulfill the following two functional comprises (see FIG. 2):
  the HOMO energy is lower than the HOMO energy of the chemical entity AF functioning as the donor and
  the LUMO energy is higher than the LUMO energy of the chemical entity AF functioning as the acceptor.

In one embodiment additional radicals R are attached to the chemically substitutable positions of the organic molecules obtained in this way in order to increase the solubility of the emitters and/or to enable polymerizability without significantly altering the electronic properties of the molecules, so that an emitter exists even when R is used, wherein in each instance R is selected independently of one another from the group consisting of H, deuterium, phenyl, naphthyl, F, Cl, Br, I, $N(R^2)_2$, —CN, —NC, —SCN, —$CF_3$, —$NO_2$, —OH, C(=O)OH, C(=O)$OR^3$, C(=O)$N(R^3)_2$, C(=O)$SR^3$, C(=S)$SR^3$, Si$(R^4)_3$, B$(OR^5)_2$, B$(N(R^6)_2)_2$, C(=O)$R^3$, P(=O)$(R^7)_2$, As(=O)$(R^7)_2$, P(=S)$(R^7)_2$, As(=S)$(R^7)_2$, S(=O)$R^3$, S=$NR^3$, S(=O)$NR^3$, S(=O)$_2$ $NR^3$, S(=O)$_2R^3$, O—S(=O)$_2R^3$, $SF_5$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals $R^9$, wherein one or more adjacent $CH_2$ groups may be replaced by —$R^9C=CR^9$—, —C≡C—, or one adjacent $CH_2$-group by —Si$(R^4)_2$—, —Ge$(R^4)_2$—, —Sn$(R^4)_2$, —C(=O)—, —C(=S)—, —C(=Se)—, —C=N—, —C(=O)O—, —C(=O)$N(R^3)$—, —P(=O)

(R$^7$)—, —As(=O)(R$^7$)—, —P(=S)(R$^7$)—, —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$ or an aromatic or heteroaromatic ring system with 5 to 60 aromatic ring atoms, which in each case may be substituted with one or more radicals R$^2$ or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; two or more of these substituents R may also form a mono- or polycyclic aliphatic, aromatic and/or benzoanellated ring system. In one embodiment the ring system that may be formed is limited to a monocyclic aliphatic ring system with a total of five or six ring members.

R$^2$ in each instance independently of one another is selected from the group consisting of H, deuterium, phenyl, naphthyl, CF$_3$, C(=O)OR$^3$, C(=O)N(R$^2$)$_2$, Si(R$^4$)$_3$, C(=O)R$^3$, P(=O)(R$^7$)$_2$, As(=O)(R$^7$)$_2$P(=S)(R$^7$)$_2$, As(=S)(R$^7$)$_2$, S(=O)R$^3$, S(=O)$_2$R$^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$—, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; two or more of these substituents R$^2$ may also form a mono- or polycyclic, aliphatic, aromatic and/or benzoanellated ring system with one another.

R$^3$ in each instance, independently of one another, is selected from the group consisting of H, deuterium, phenyl, naphthyl, CF$_3$ or an aliphatic, aromatic and/or heteroaromatic hydrocarbon radical with 1 to 20 C atoms, in which also one or more H atoms may be replaced by F or CF$_3$; two or more substituents R$^3$ may also form a mono- or polycyclic, aliphatic ring system with one another.

R$^4$ in each instance, independently of one another, is selected from the group consisting of H, deuterium, phenyl, naphthyl, N(R$^2$)$_2$, CN, CF$_3$, OH, C(=O)OR$^3$, C(=O)N(R$^3$)$_2$, C(=O)R$^3$, P(=O)(R$^7$)$_2$, As(=O)(R$^7$)$_2$, P(=S)(R$^7$)$_2$, As(=S)(R$^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$ or an aromatic or heteroaromatic ring system with 5 to 60 aromatic ring atoms, which in each case may be substituted with one or more radicals R$^8$, or an aryloxy or heteroaryloxy group with 5 to 60 aromatic ring atoms which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; two or more of these substituents R$^4$ may also form a mono- or polycyclic, aliphatic, aromatic and/or benzoanellated ring system with one another.

R$^5$ in each instance, independently of one another, is selected from the group consisting of phenyl, naphthyl, CF$_3$, C(=O)R$^3$, P(=O)(R$^7$)$_2$, As(=O)(R$^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$ or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; two or more of these substituents R$^5$ may also form a mono- or polycyclic, aliphatic, aromatic and/or benzoanellated ring system with one another.

R$^6$ in each instance, independently of one another, is selected from the group consisting of phenyl, naphthyl, CF$_3$, Si(R$^4$)$_3$, C(=O)R$^3$, P(=O)(R$^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which may be substituted in each case with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —NR$^2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; two or more of these substituents R⁶ may also form a mono- or polycyclic, aliphatic, aromatic and/or benzoanellated ring system with one another.

$R^7$ in each instance, independently of one another, is selected from the group consisting of phenyl, naphthyl, $N(R^2)_2$, CN, $CF_3$, $C(=O)OR^3$, $C(=O)N(R^3)_2$, $Si(R^4)_3$, $C(=O)R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be substituted with —$R^9C=CR^9$—, —C≡C—, or one adjacent $CH_2$-group with —$Si(R^4)_2$—, —$Ge(R^4)_2$—, —$Sn(R^4)_2$—, —C(=O)—, —C(=S)—, —C(=Se)—, —C=N—, —C(=O)O—, —C(=O)N(R³)—, —P(=O)(R⁷)—, —As(=O)(R⁷)—, —P(=S)(R⁷)—, —As(=S)(R⁷)—, —S(=O)—, —S(=O)₂—, —NR²—, —O—, or —S— and wherein one or more H atoms may be replaced by deuterium, F, Cl, Br, I, CN, CF₃ or NO₂ or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^3$, or a combination of these systems; two or more of these substituents $R^7$ may also form a mono- or polycyclic, aliphatic, aromatic and/or benzoanellated ring system with one another.

$R^8$ in each instance, independently of one another, is selected from the group consisting of H, deuterium, phenyl, naphthyl, F, $CF_3$ or an aliphatic, aromatic and/or heteroaromatic hydrocarbon radical with 1 to 20 C atoms, in which also one or more H atoms may be replaced by F or $CF_3$; two or more substituents $R^8$ may also form a mono- or polycyclic, aliphatic ring system.

$R^9$ in each instance, independently of one another, is selected from the group consisting of H, deuterium, phenyl, naphthyl, $N(R^2)_2$, CN, $CF_3$, $NO_2$, OH, COOH, $C(=O)OR^3$, $C(=O)N(R^3)_2$, $Si(R^4)_3$, $B(OR^5)_2$, $C(=O)R^3$, $P(=O)(R^7)_2$, $P(=S)(R^7)_2$, $As(=O)(R^7)_2$, $P(=S)(R^7)_2$, $S(=O)R^3$, $S(=O)_2R^3$, $OSO_2R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^8$, wherein one or more non-adjacent $CH_2$ groups may be replaced by —$R^3C=CR^3$—, —C≡C—, or one adjacent $CH_2$-group by —$Si(R^4)_2$—, —$Ge(R^4)_2$—, —$Sn(R^4)_2$—, —C(=O)—, —C(=S)—, —C(=Se)—, —C=N—, —C(=O)O—, —C(=O)N(R³)—, —P(=O)(R⁷)—, —As(=O)(R⁷)—, —P(=S)(R⁷)—, —As(=S)(R⁷)—, —S(=O)—, —S(=O)₂—, —NR²—, —O—, or —S— and wherein one or more H atoms, ay be replaced by deuterium, F, Cl, Br, I, CN, CF₃ or NO₂, or an aromatic or heteroaromatic ring system with 5 to 60 aromatic ring atoms, which in each case may be substituted with one or more radicals $R^8$, or an aryloxy or heteroaryloxy group with 5 to 60 aromatic ring atoms, which may be substituted with one or more radicals $R^3$, or a diarylamino group, diheteroarylamino group or arylheteroarylamino group with 10 to 40 aromatic ring atoms, which may be substituted with one or more radicals $R^8$, or a combination of these systems; two or more of these substituents $R^9$ may also form a mono- or polycyclic, aliphatic, aromatic and/or benzoanellated ring system.

Polymerizable radicals are radicals comprising polymerizable functional entities that can undergo homopolymerization with themselves or copolymerization with other monomers. Thus the molecules according to the invention can be obtained as polymers with the following repeat units of formulas 7 and 8, which can be used as polymers in the light-emitting layer of the optoelectronic component.

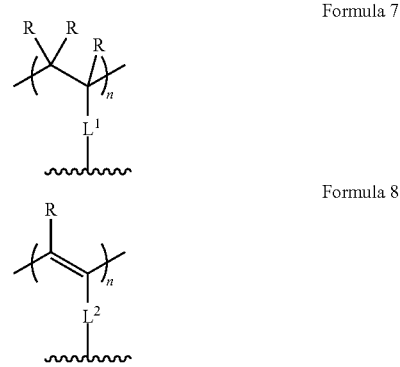

Formula 7

Formula 8

In formulas 7 and 8, L1 and L2 represent the same or different linker groups, which feature 0 to 20, in particular 1 to 15 or 2 to 10 carbon atoms, and wherein the curved line indicates the position through which the linker group is linked on the organic molecule of formula 1. In one embodiment the linker group L1 and/or L2 comprises a form —X-L3-, wherein X represents O or S and L3 represents a linker group selected from the group of a substituted and unsubstituted alkylene group (linear, branched or cyclic) and a substituted and unsubstituted arylene group, in particular a substituted or unsubstituted alkylene group with 1 to 10 carbon atoms or a substituted or unsubstituted phenylene group, wherein combinations are also possible. In another embodiment the linker group L1 and/or L2 comprises a form —C(=O)O—.

Advantageous embodiments of the repeat units are structures of formulas 9 to 14:

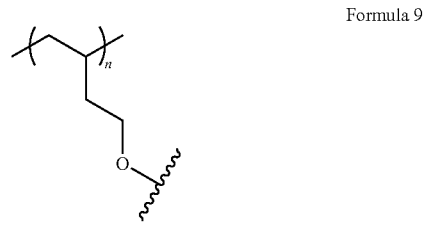

Formula 9

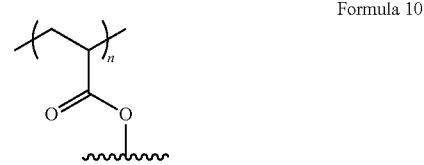

Formula 10

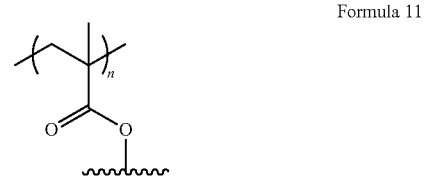

Formula 11

-continued

Formula 12

Formula 13

Formula 14

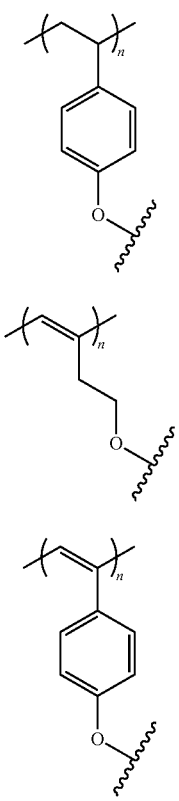

To produce the polymers comprising repeat units according to formulas 9 to 14, the polymerizable functional entities are linked via a linker group of formulas 15 to 20, which comprise a hydroxyl unit, to an organic molecule of formula 1 and the resulting compounds homopolymerized with themselves or copolymerized with other suitable monomers.

Formula 15

Formula 16

Formula 17

Formula 18

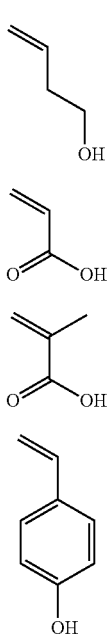

-continued

Formula 19

Formula 20

Polymers that comprise a unit according to formula 7 or formula 8 may contain either exclusively repeat units with a structure of general formula 7 or 8, or repeat units with a different structure. Examples of repeat units comprising other structures are featured by entities formed from corresponding monomers that are typically used or employed in copolymerizations. Examples of such repeat units produced from monomers are repeat units comprising unsaturated units such as ethylene or styrene.

One embodiment of the invention relates to organic molecules which feature
- a $\Delta E(S_1-T_1)$ value between the lowest excited singlet ($S_1$) state and the triplet ($T_1$) state located below it of less than 0.2 eV, in particular less than 0.1 eV and/or
- an emission lifetime of a maximum of 50 µs.

In one aspect the invention relates to the use of an organic molecule according to the invention as a luminescent emitter and/or as a host material and/or as an electron transport material and/or as a hole injection material and/or as a hole blocking material in an optoelectronic component, produced in particular by a vacuum evaporation process or from solution, wherein the optoelectronic component is selected in particular from the group consisting of:
- organic light-emitting diodes (OLEDs),
- light-emitting electrochemical cells,
- OLED sensors, in particular in gas and vapor sensors not hermetically sealed off from the outside,
- organic diodes
- organic solar cells,
- organic transistors,
- organic field effect transistors,
- organic lasers and
- down-conversion elements.

The fraction of the organic molecule according to the invention in the luminescent emitter and/or host material and/or electron transport material and/or hole injection material and/or hole blocking material in one embodiment amounts to 1% to 99% (wt.-%), in particular the fraction of emitter in optical light-emitting components, in particular in OLEDs, is between 5% and 80%.

In an additional aspect, the invention relates to optoelectronic components comprising an organic molecule according to the invention, wherein the optoelectronic component in particular is formed as a component selected from the group consisting of organic light-emitting diode (OLED), light-emitting electrochemical cell, OLED sensor, especially in gas and vapor sensors not hermetically sealed off to the outside, organic diode, organic solar cell, organic transistor, organic field effect transistor, organic laser and down-conversion element.

One embodiment relates to the optoelectronic component according to the invention, comprising a substrate, an anode and a cathode, wherein the anode and the cathode are applied to the substrate, and at least one light-emitting layer, which is disposed between the anode and the cathode and which contains an organic molecule according to the invention.

In another embodiment of the component the organic molecule is used as an emission material in an emission layer, wherein it can be used in combination with at least one host material or in particular as a pure layer. In one embodiment the fraction of the organic molecule as emission material in an emission layer in optical light-emitting components, in particular in OLEDs, is between 5% and 80% (wt.-%).

In another embodiment of the component according to the invention, the light-emitting layer comprising an organic molecule according to the invention is applied to a substrate.

In one embodiment the invention relates to an optoelectronic component in which the light-emitting layer exclusively contains an organic molecule according to the invention at 100% concentration, wherein the anode and the cathode is applied to the substrate, and the light-emitting layer is applied between the anode and cathode.

In another embodiment the optoelectronic component, in addition to the organic molecule according to the invention comprises at least one host material, wherein in particular the excited singlet state ($S_1$) and/or the excited triplet state ($T_1$) of the at least one host material is higher than that of the excited singlet state ($S_1$) and/or the excited triplet state ($T_1$) of the organic molecule, and wherein the anode and the cathode are applied to the substrate, and the light-emitting layer is applied between the anode and the cathode.

In an additional embodiment, the optoelectronic component comprises a substrate, an anode, a cathode and at least one each of a hole-injecting and an electron-injecting layer and at least one light-emitting layer, wherein the at least one light-emitting layer comprises an organic molecule according to the invention and a host material, the triplet ($T_1$) and singlet ($S_1$) energy levels of which are higher in energy than the triplet ($T_1$) and singlet ($S_1$) energy levels of the organic molecule, and wherein the anode and the cathode are applied on the substrate, and the hole- and electron-injecting layer is applied between the anode and the cathode, and the light-emitting layer is applied between the hole- and electron-injecting layers.

In an additional embodiment the optoelectronic component comprises a substrate, an anode, a cathode and at least one each of a hole-injecting and an electron-injecting layer, and at least one each of a hole-transporting and an electron-transporting layer, and at least one light-emitting layer, wherein the at least one light-emitting layer comprises an organic molecule according to the invention and a host material, the triplet ($T_1$) and singlet ($S_1$) energy levels of which have higher energy than the triplet ($T_1$) and singlet ($S_1$) energy levels of the organic molecule, and wherein the anode and the cathode are applied to the substrate, and the hole- and electron injecting layer is applied between the anode and the cathode, and the hole- and electron-transporting layer is applied between the hole- and electron-injecting layer, and the light-emitting layer is applied between the hole- and electron-transporting layer.

In another embodiment the optoelectronic component comprises at least one host material made of a material according to formula 1.

In another embodiment of the optoelectronic component the light-emitting layer contains fluorescent or phosphorescent material which comprises a structure of formula 1.

In another embodiment of the optoelectronic component, an organic molecule according to formula 1 and a functional material, for example in the form of an additional emitter material, a host material, or another organic molecule, which is capable of forming an exciplex with the molecule according to formula 1, form an exciplex. Functional materials are, for example, host materials such as MCP, electron transport materials such as TPBI and hole transport materials such as NPD or MTDATA. Exciplexes are adducts of electronically excited molecules and those in the electronic ground state which are capable of light emission.

In another embodiment of the optoelectronic component the emission is characterized by thermally activated delayed fluorescence (TADF).

In another embodiment of the optoelectronic component, organic molecules according to formula 1 are used as a charge transport layer.

In one aspect, the invention relates to a light-emitting material, comprising an organic molecule according to the invention and a host material, wherein die triplet ($T_1$) and singlet ($S_1$) energy levels of the host material are higher than the triplet ($T_1$) and singlet ($S_1$) energy levels of the organic molecule, and wherein the organic molecule emits fluorescence or thermally activated delayed fluorescence (TADF) and has an $\Delta E(S_1-T_1)$ value of between the lowest excited singlet ($S_1$) state and the triplet ($T_1$) state located below it, of less than 0.2 eV, in particular less than 0.1 eV.

One aspect of the invention relates to a method for producing an optoelectronic component comprising an organic molecule according to the invention. In one embodiment the method comprises the step of processing the organic molecule using a vacuum evaporation method or evaporation from solution.

In one embodiment the method comprises the application of the organic molecule to a support, wherein the application is especially achieved by wet chemistry, from colloidal suspension or by sublimation.

In another embodiment of the method at least one layer
- is coated using a sublimation method
- is coated with an OVPD (organic vapor phase deposition) method
- is coated with the aid of carrier gas sublimation or
- is produced from solution or with any desired printing method.

One aspect of the invention relates to a method for modifying the emission and/or absorption properties of an electronic component, wherein an organic molecule according to the invention is introduced into an optoelectronic component for conducting electrons or holes.

In addition, in another aspect the invention relates to the use of a molecule according to the invention for converting UV radiation or of blue light into visible light, in particular into green, yellow or red light (down-conversion), in particular in optoelectronic component of the type described here.

In an additional aspect the invention relates to an application in which at least one material with a structure according to formula 1, is excited by external energy to produce light. The external excitation may be electronic, optical or radioactive.

EXAMPLES

Example 1: DFT Calculation

Table 5 contains DFT calculations as well as examples of organic molecules according to the invention For optimizing the molecular structures the BP86 functional (Becke, A. D. Phys. Rev. A1988, 38, 3098-3100; Perdew, J. P. Phys. Rev. B1986, 33, 8822-8827) was used, wherein the resolution-of-identity-approximation (RI) (Sierka, M.; Hogekamp, A.; Ahlrichs, R. J. Chem. Phys. 2003, 118, 9136-9148; Becke, A D., J. Chem. Phys. 98 (1993) 5648-5652; Lee, C; Yang, W; Parr, R. G. Phys. Rev. B 37 (1988) 785-789) was employed. Excitation energies were calculated for the structure optimized using BP86 with der Time-Dependent DFT method (TD-DFT) using the B3LYP functional (Becke, A. D., J. Chem. Phys. 98 (1993) 5648-5652; Lee, C; Yang, W; Parr, R. G. Phys. Rev. B 37 (1988) 785-789; Vosko, S. H.; Wilk, L.; Nusair, M. Can. J. Phys. 58 (1980) 1200-1211; Stephens, P. J.; Devlin, F. J.; Chabalowski, C. F.; Frisch, M. J. J. Phys. Chem. 98 (1994) 11623-11627). In all computations def2-SV(P)-basic theorems (Weigend, F.; Ahlrichs, R. Phys. Chem. Chem. Phys. 2005, 7, 3297-3305; Rappoport, D.; Furche, F. J. Chem. Phys. 2010, 133, 134105/1-134105/11) and a m4 grid for numerical integration were used. All DFT computations were performed with the Turbomole program package (Version 6.5) (TURBOMOLE V6.4 2012, University of Karlsruhe and Forschungszentrum Karlsruhe GmbH, 1989-2007, TURBOMOLE GmbH, since 2007; http://www.turbomole.com).

Figure 3:
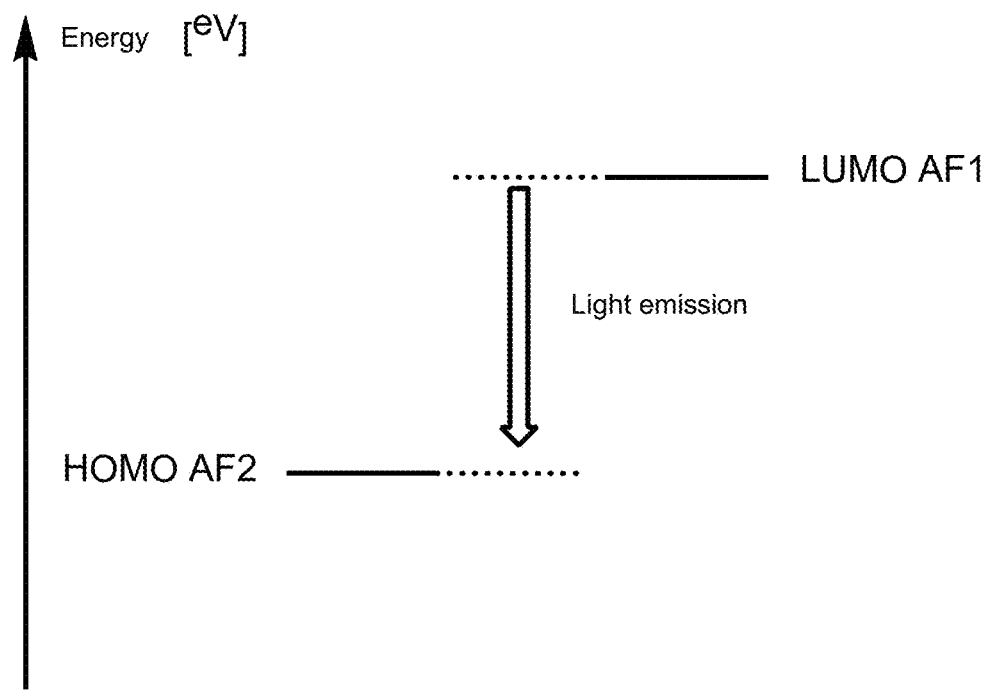
FIG. 3 is a schematic representation of the energy level diagram (relative energy in eV) of an emitter molecule according to the invention, without a separator.
Figure 4:
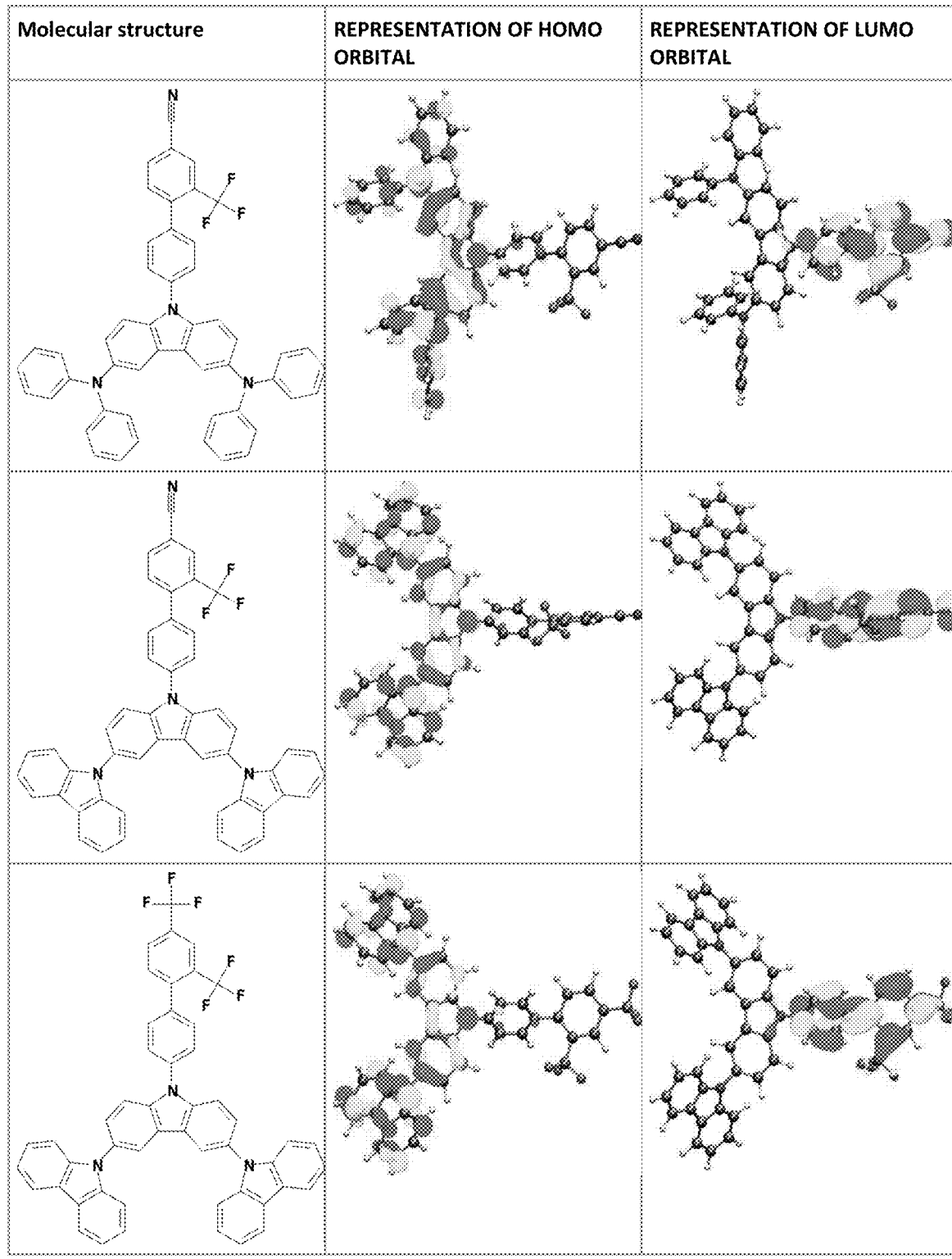
FIG. 4 is a table listing the calculated limiting orbitals of compounds according to the invention.
Figure 4:
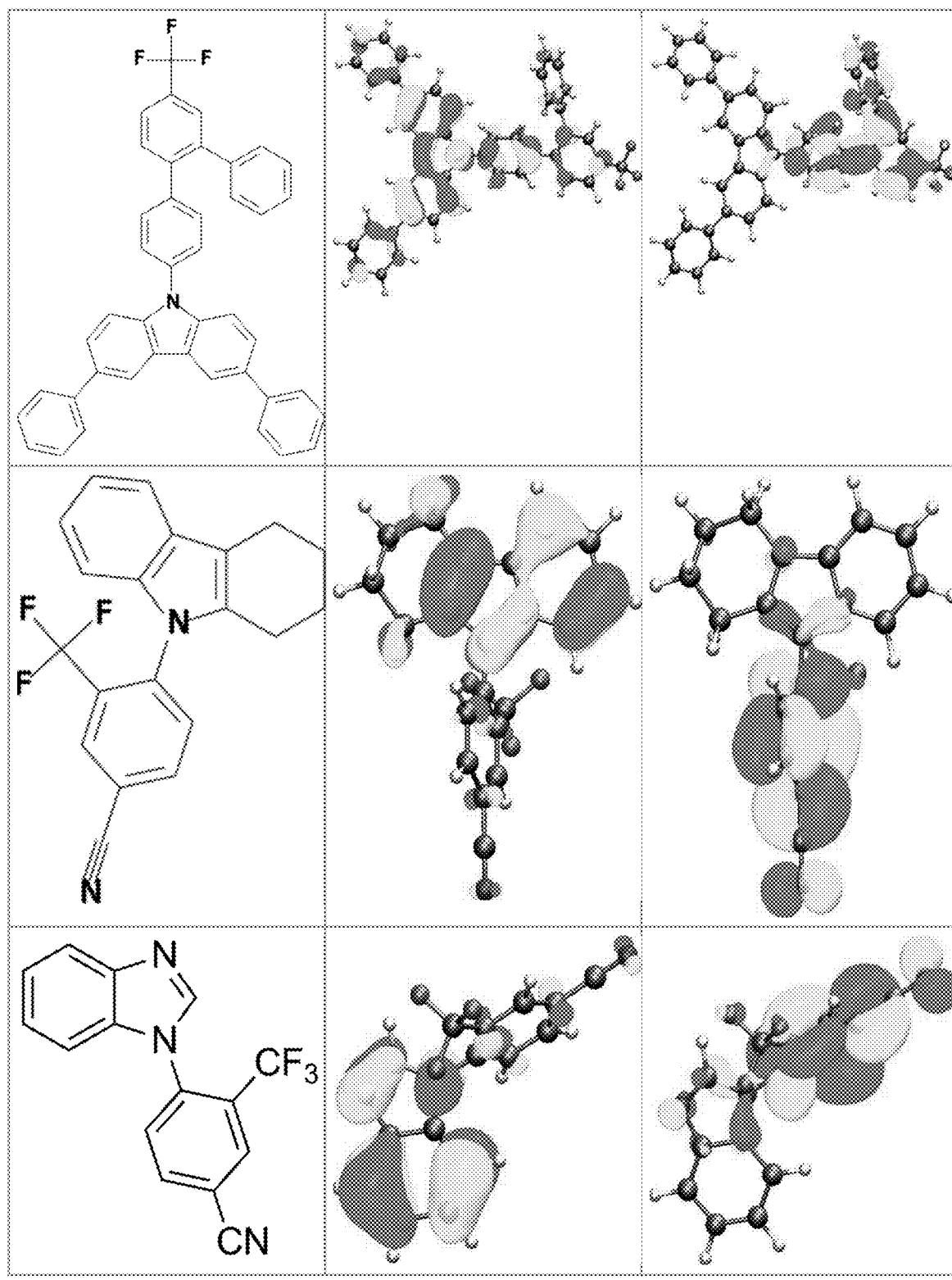
Figure 4:
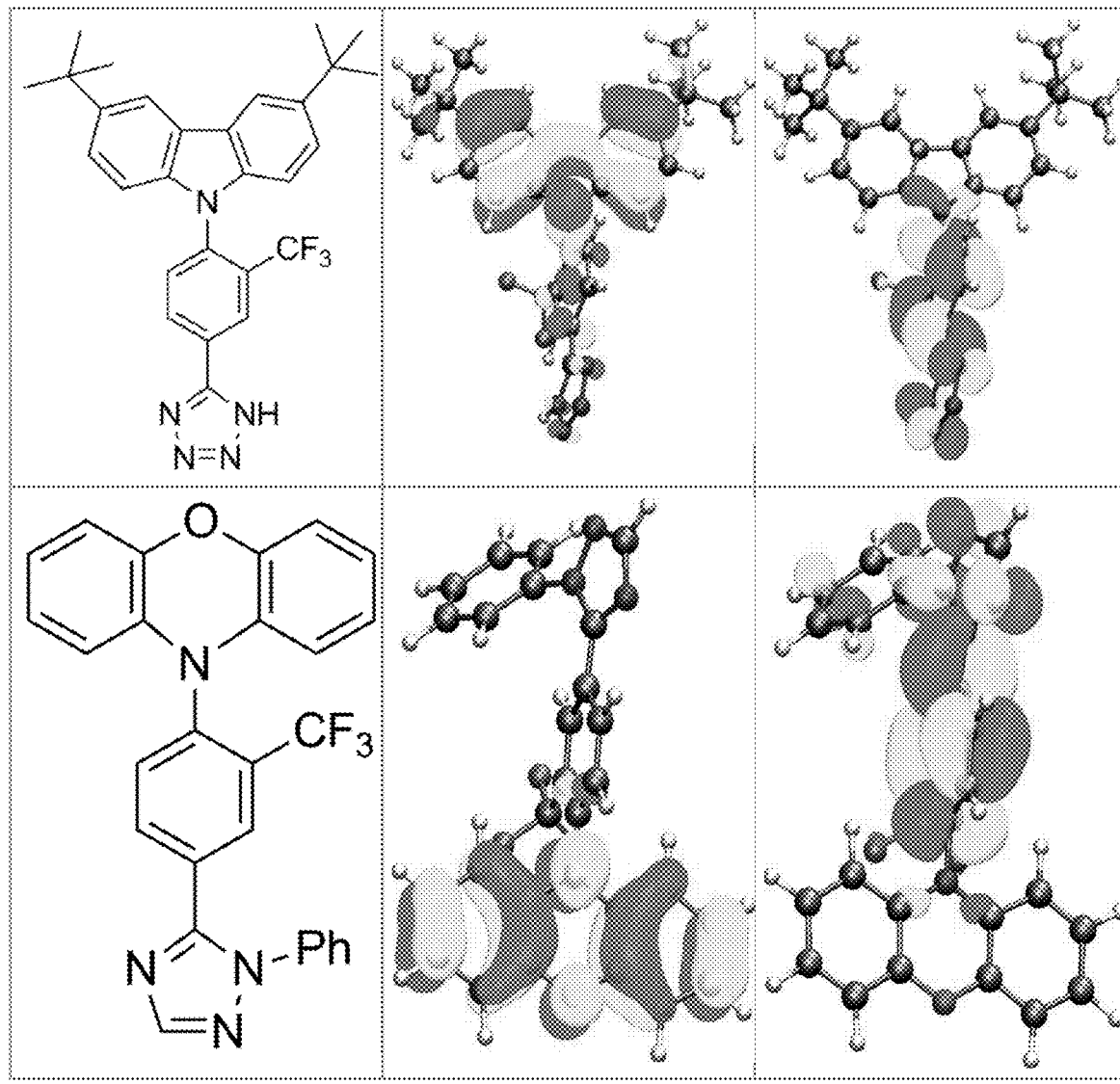
Figure 4:
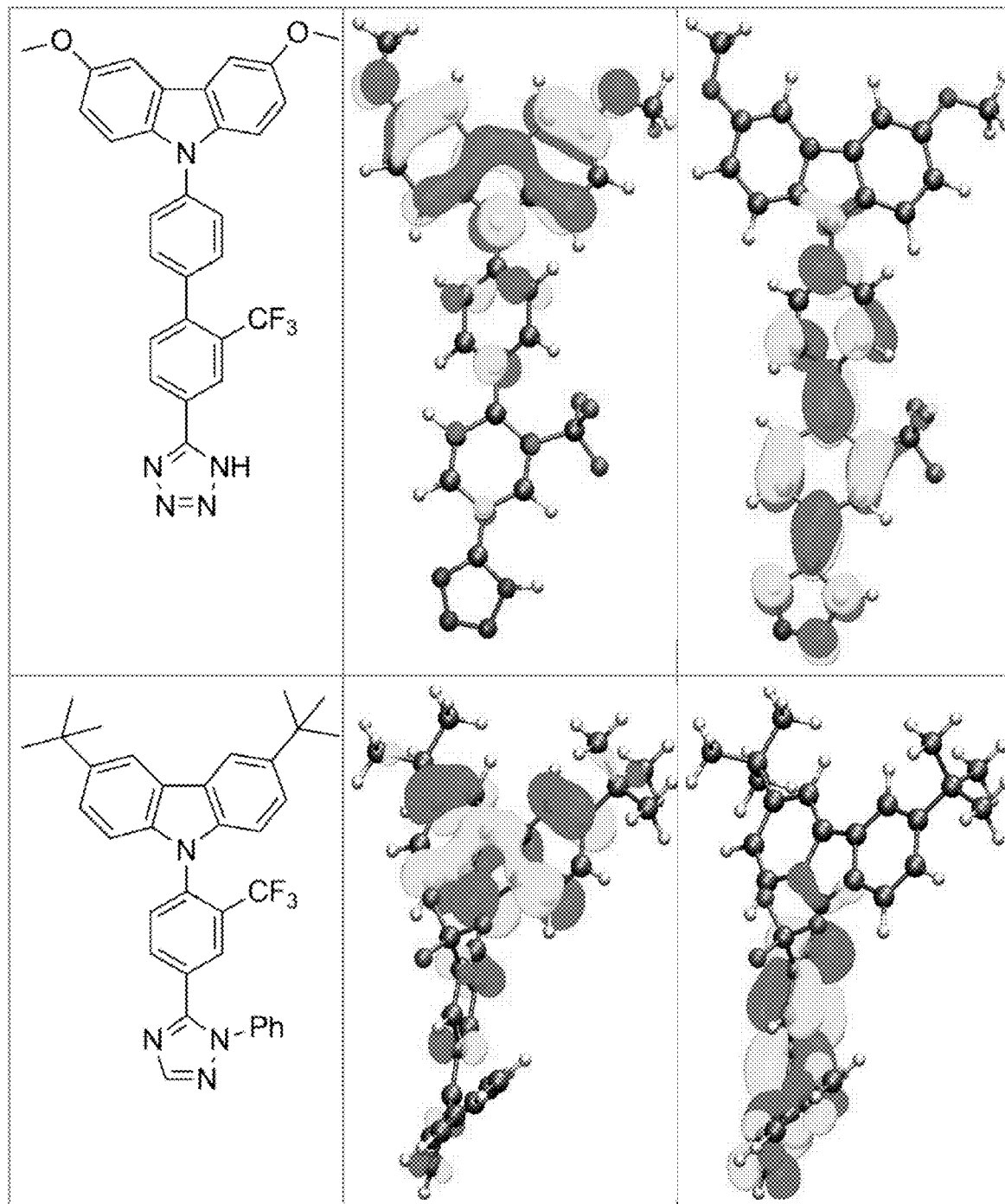
Figure 4:
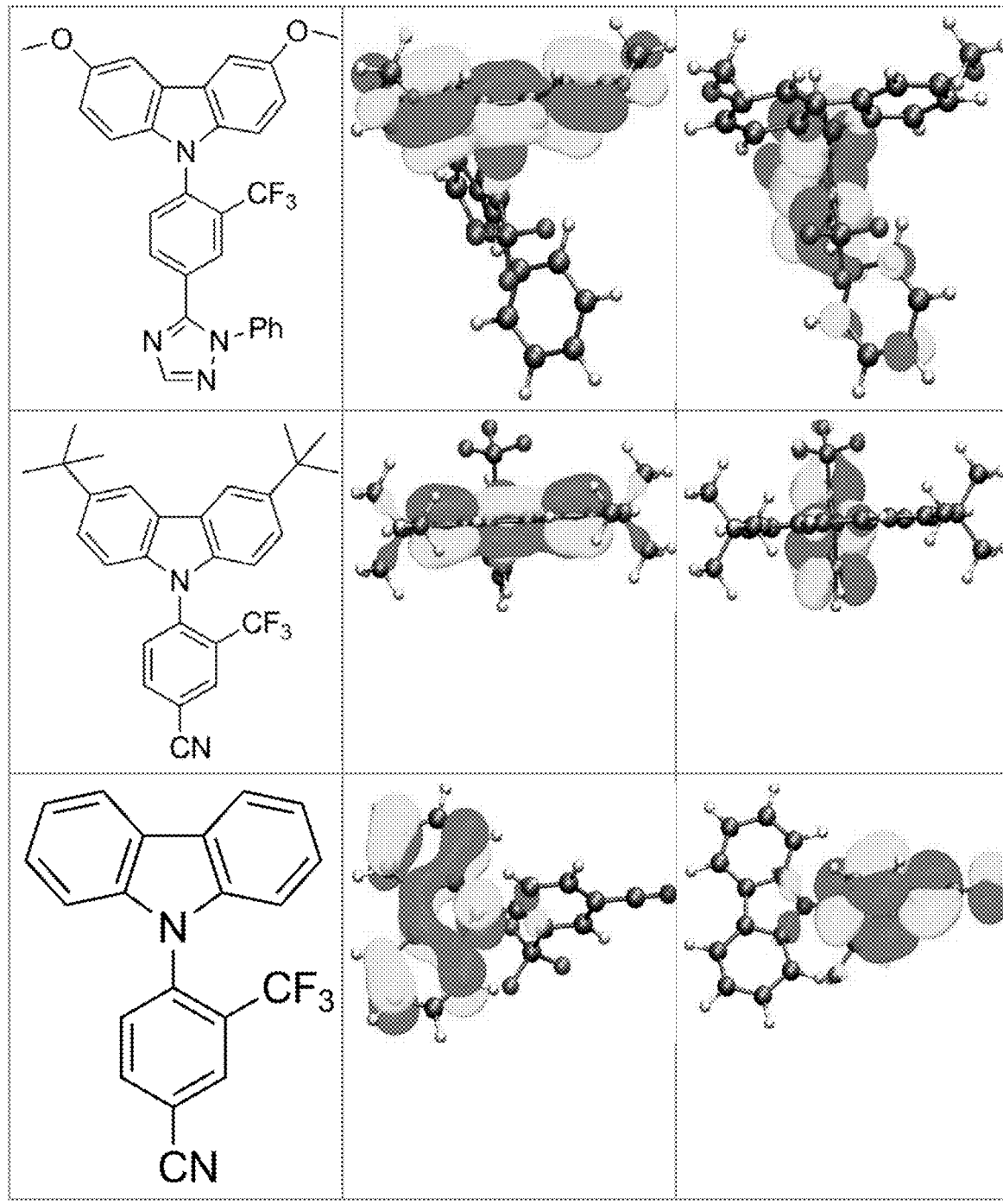
Figure 4:
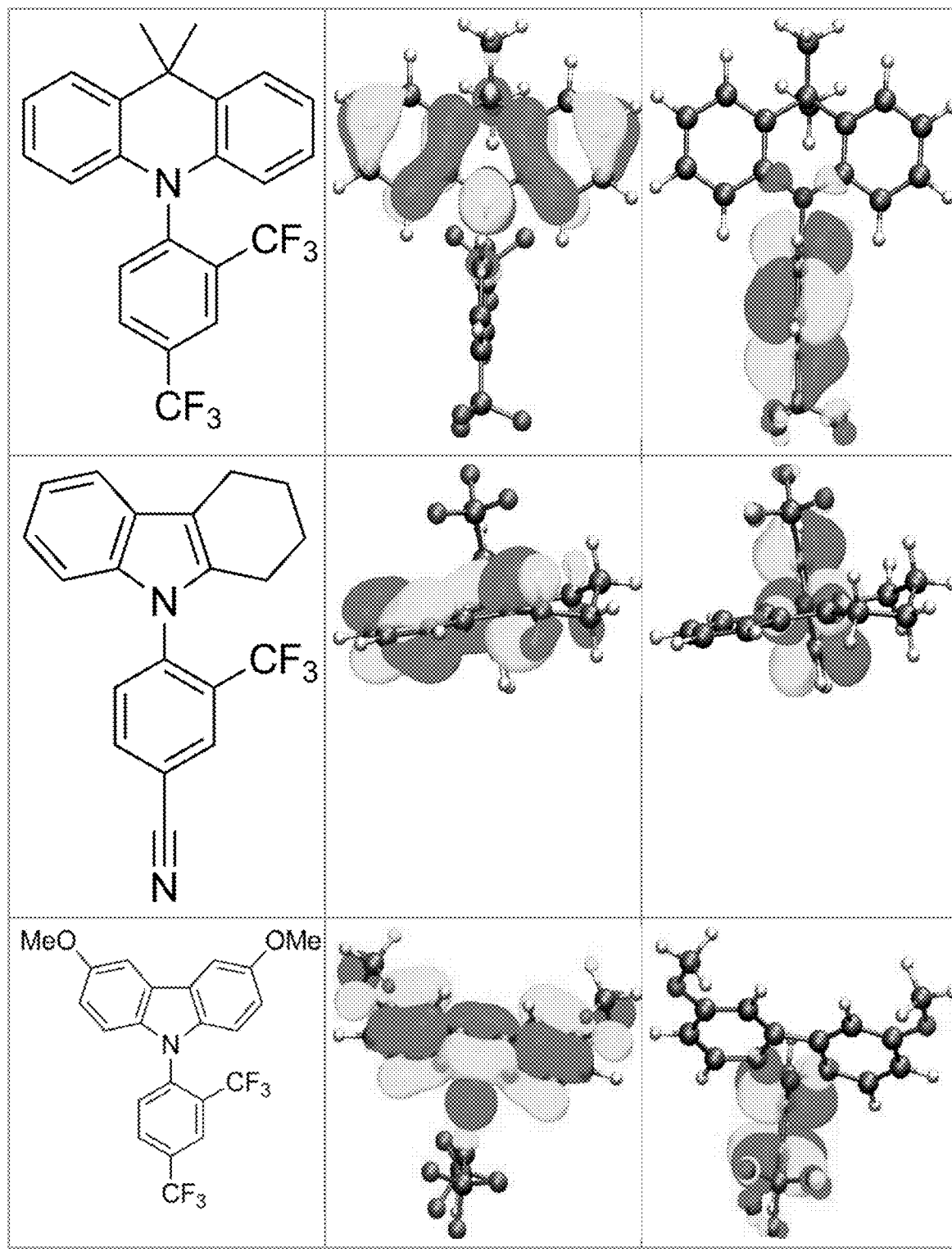
Figure 4:
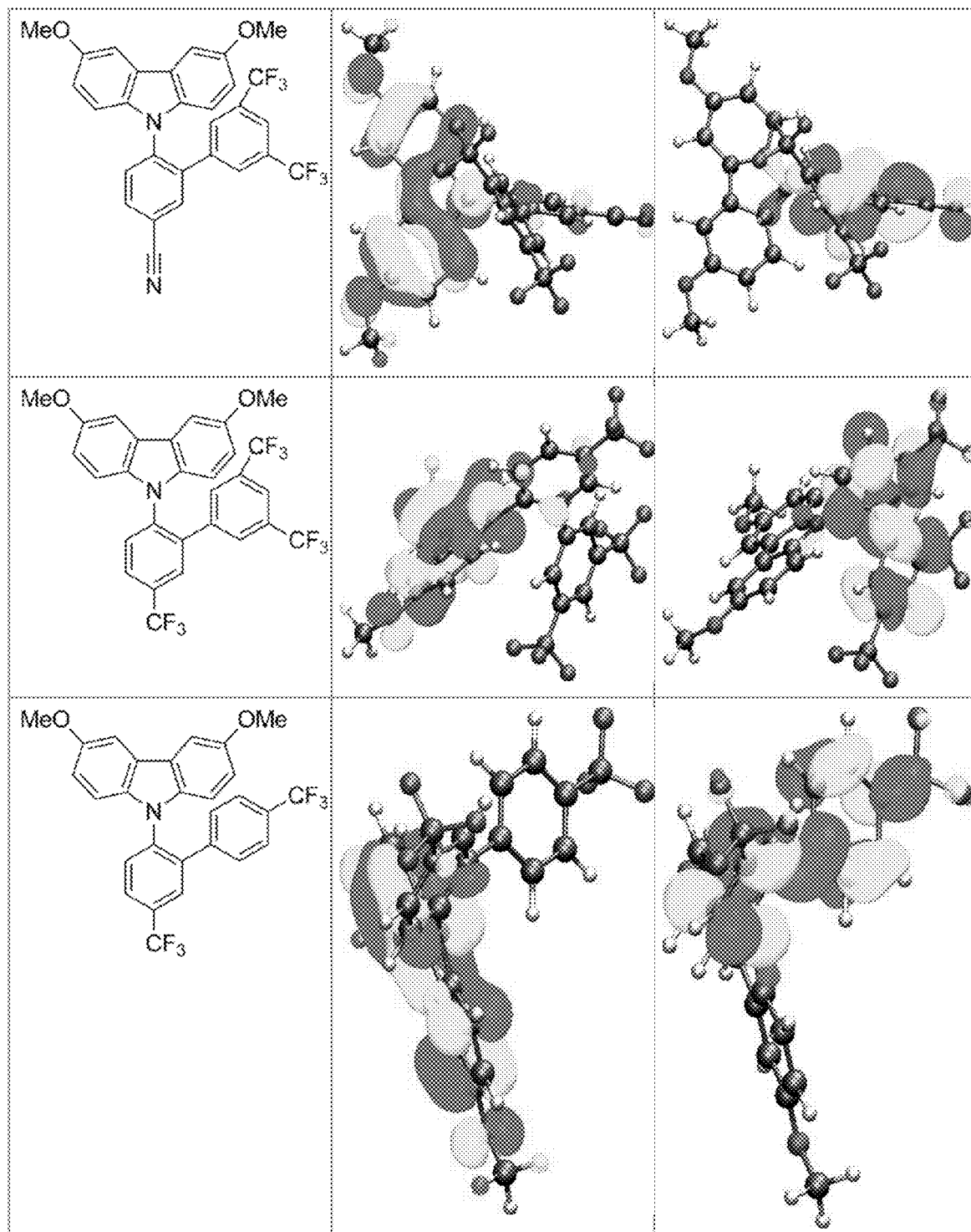
Figure 4:
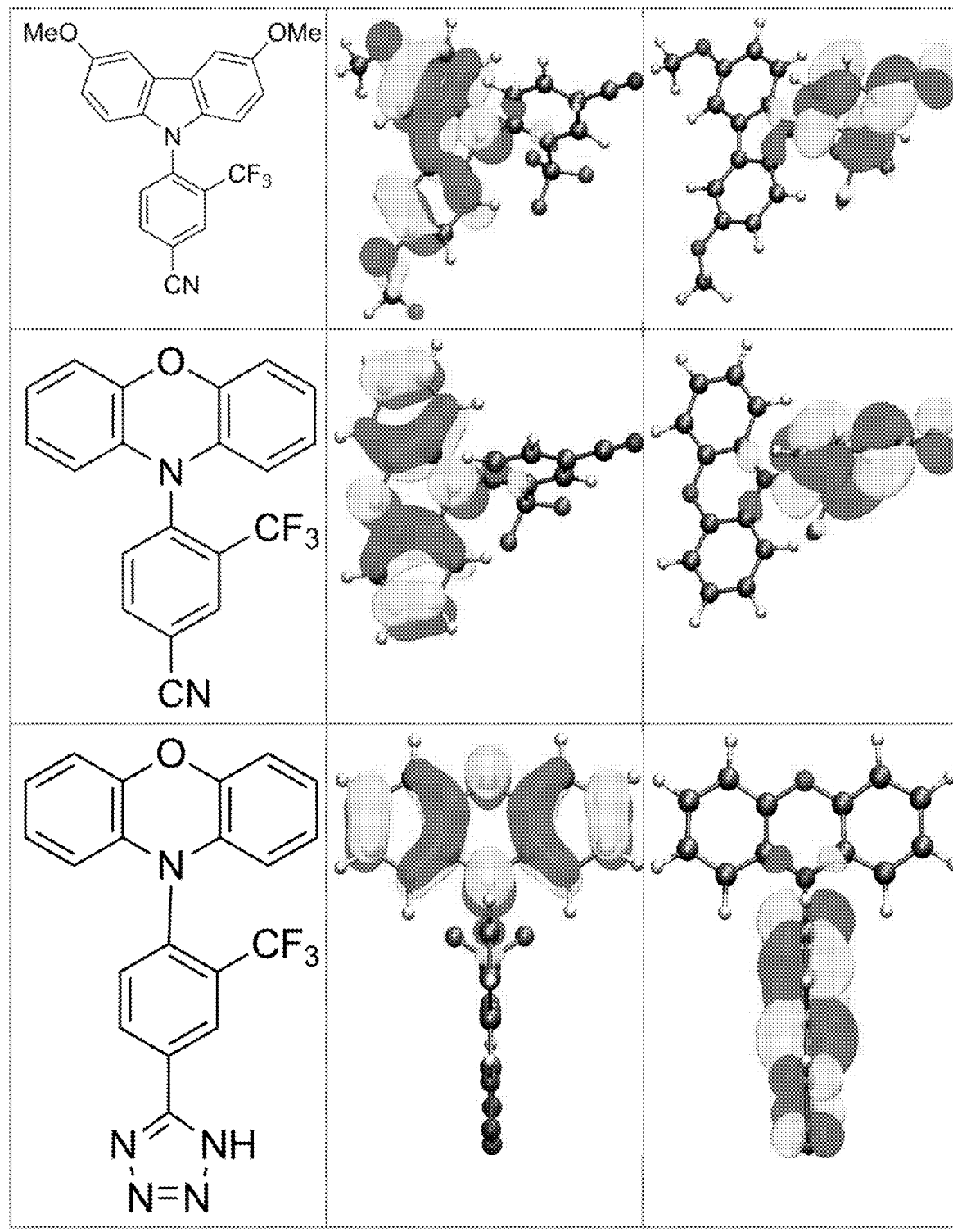
Figure 4:
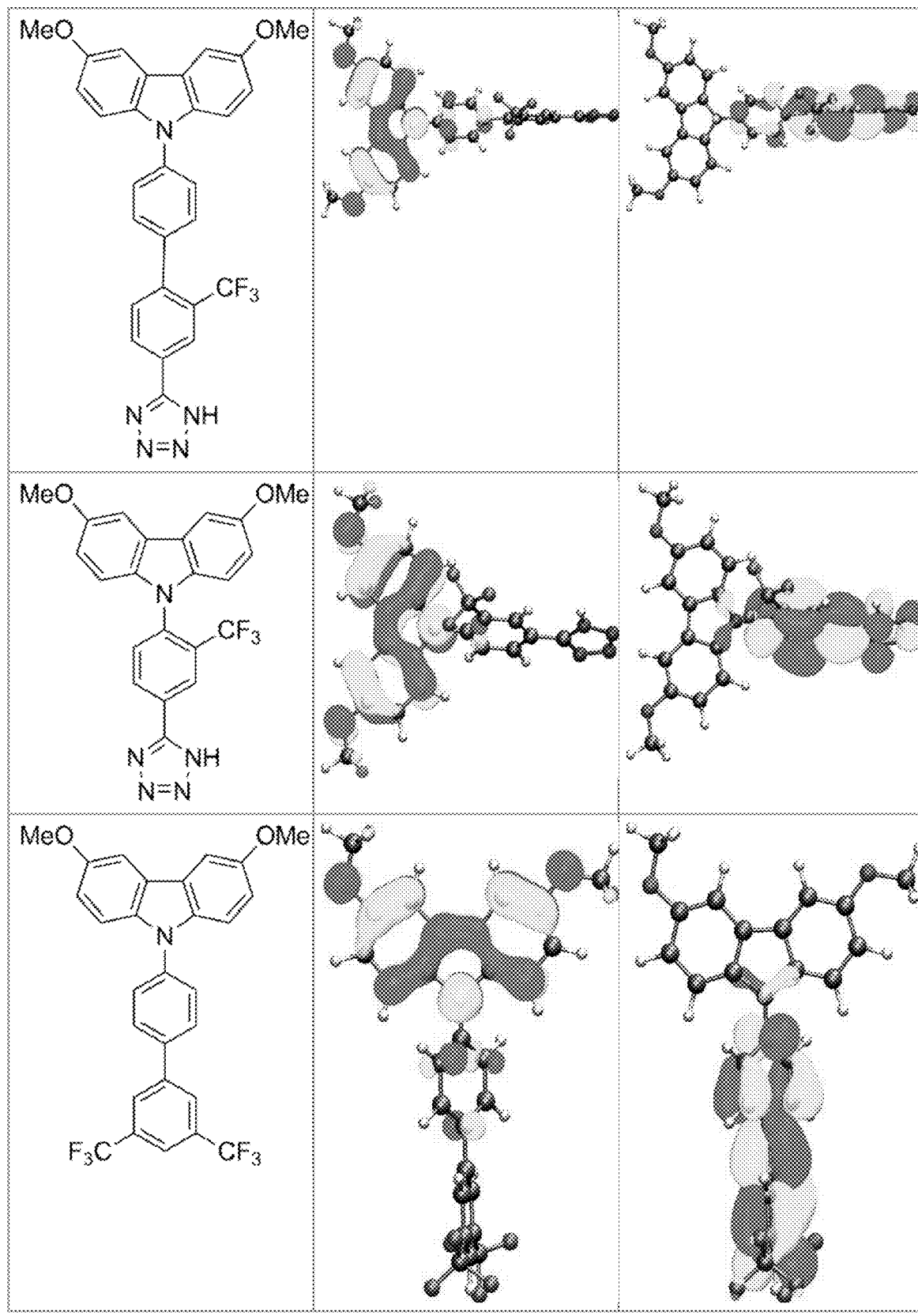
Figure 4:
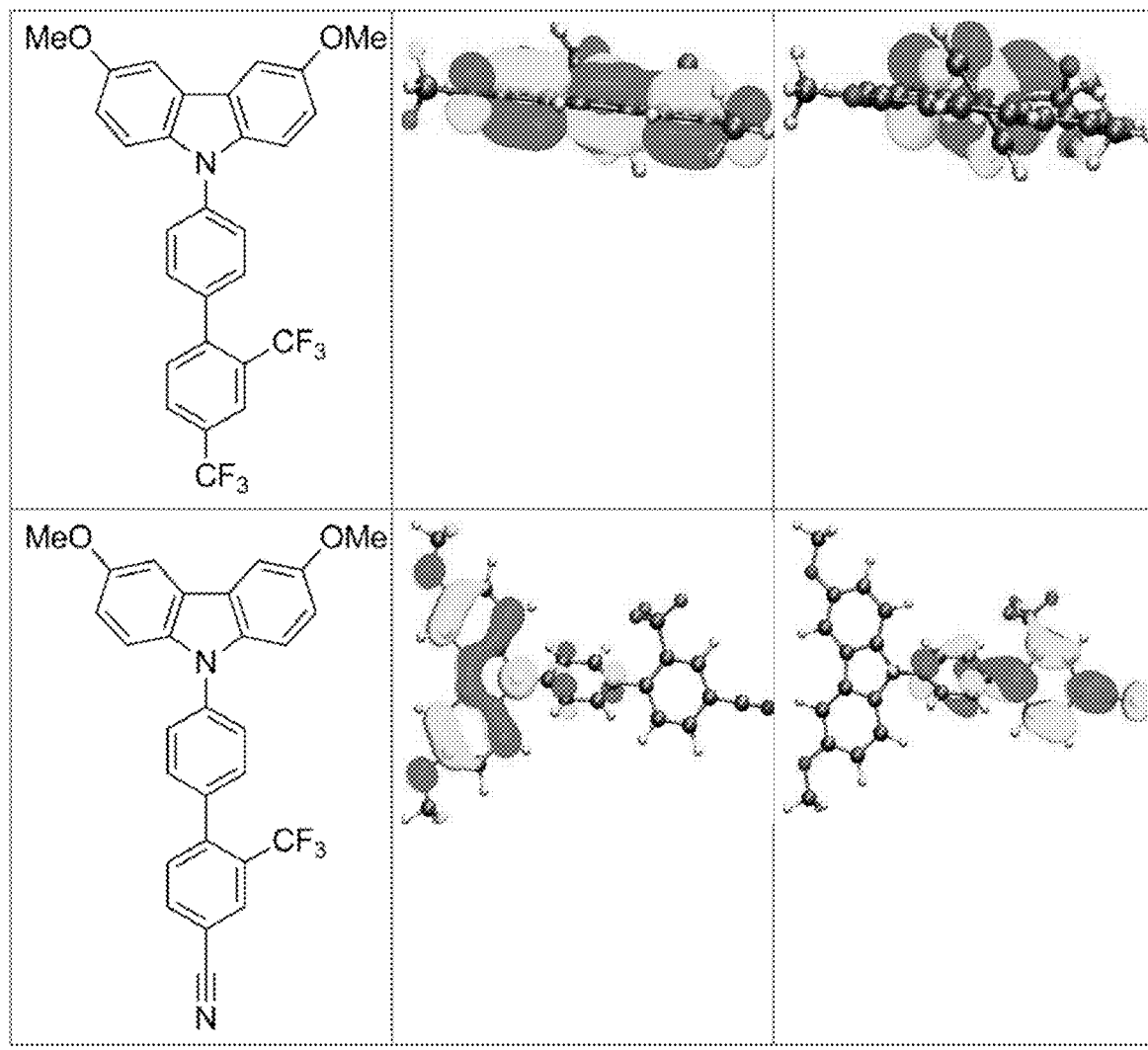
Figure 4:
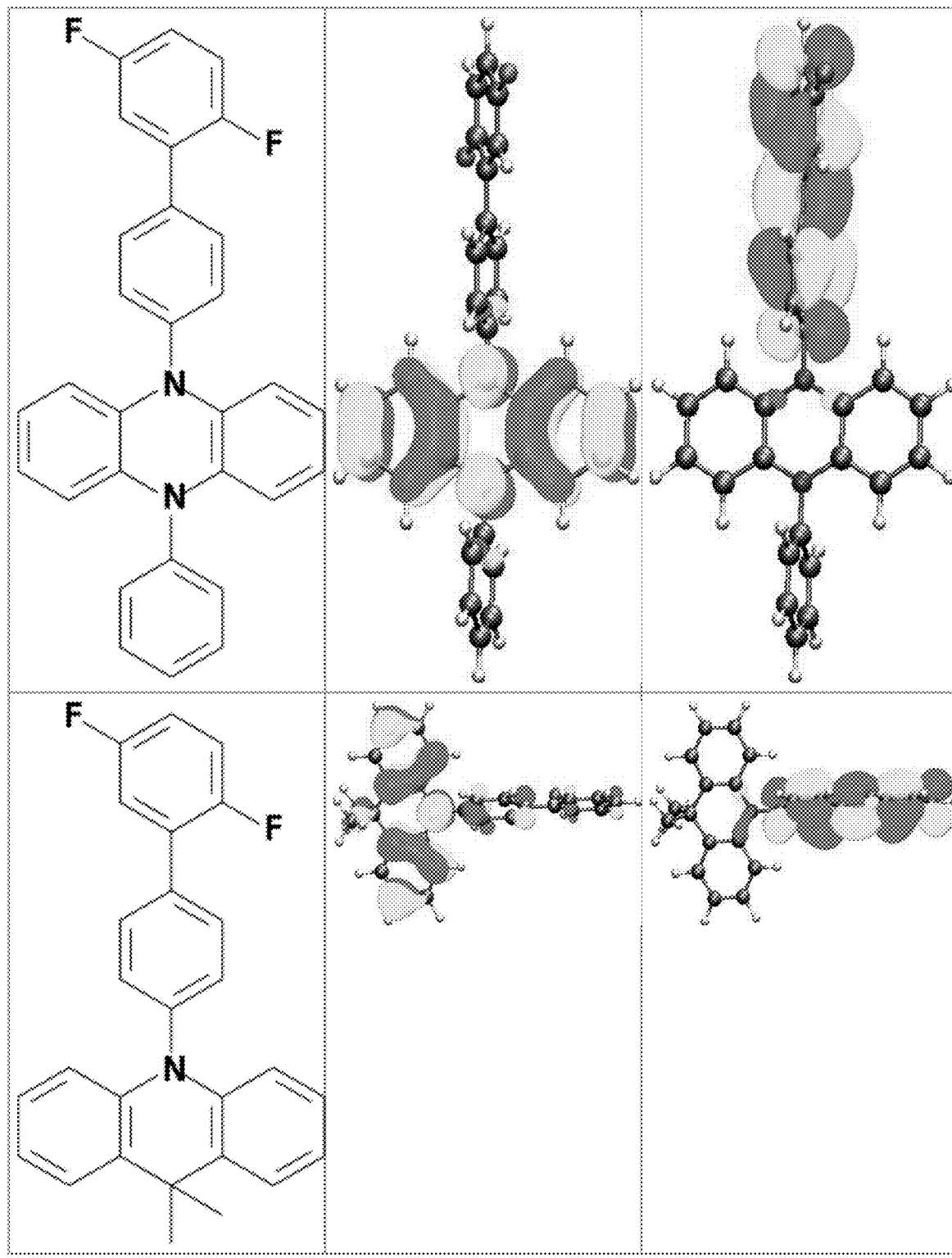
Figure 4:
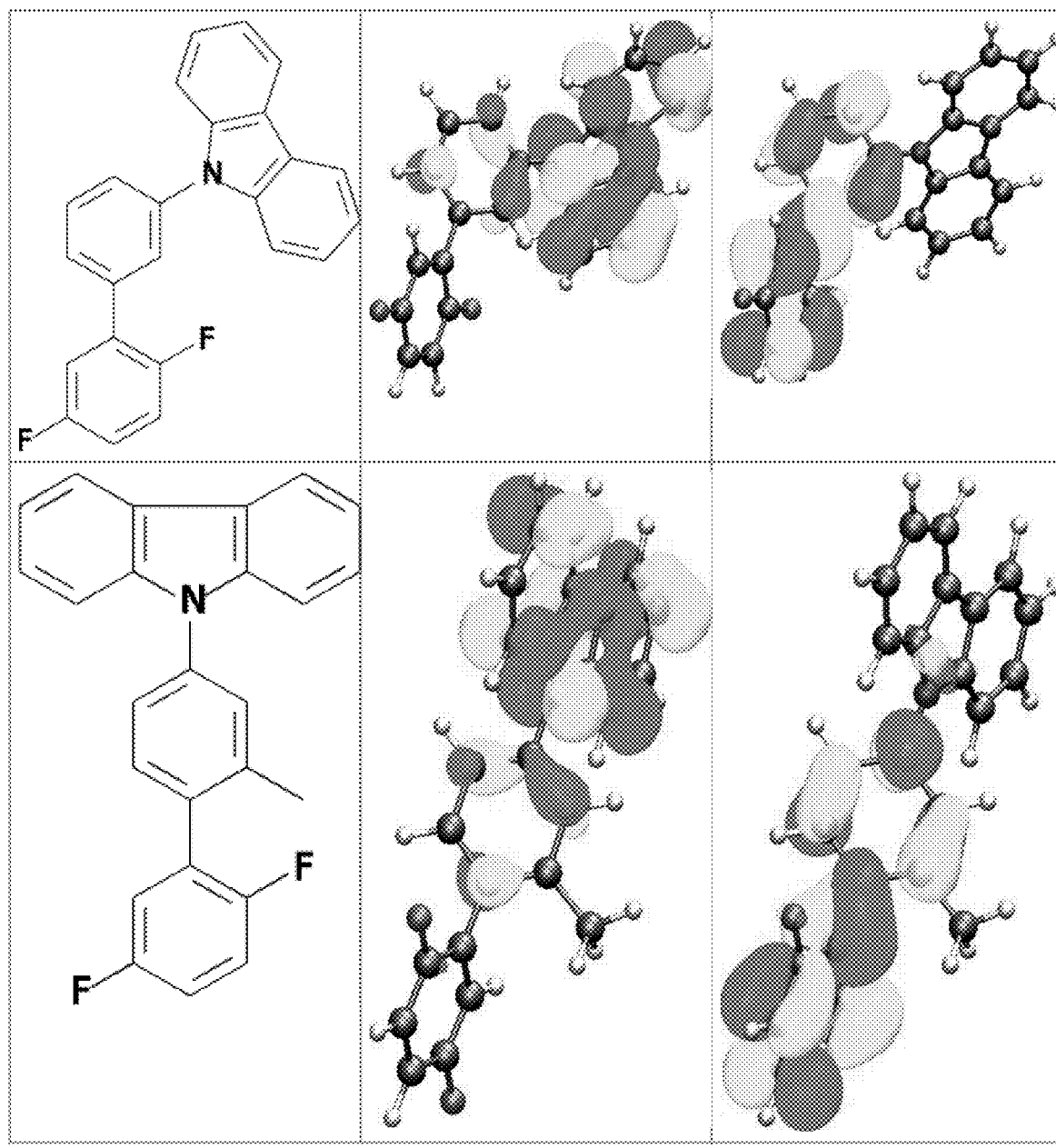
Figure 4:
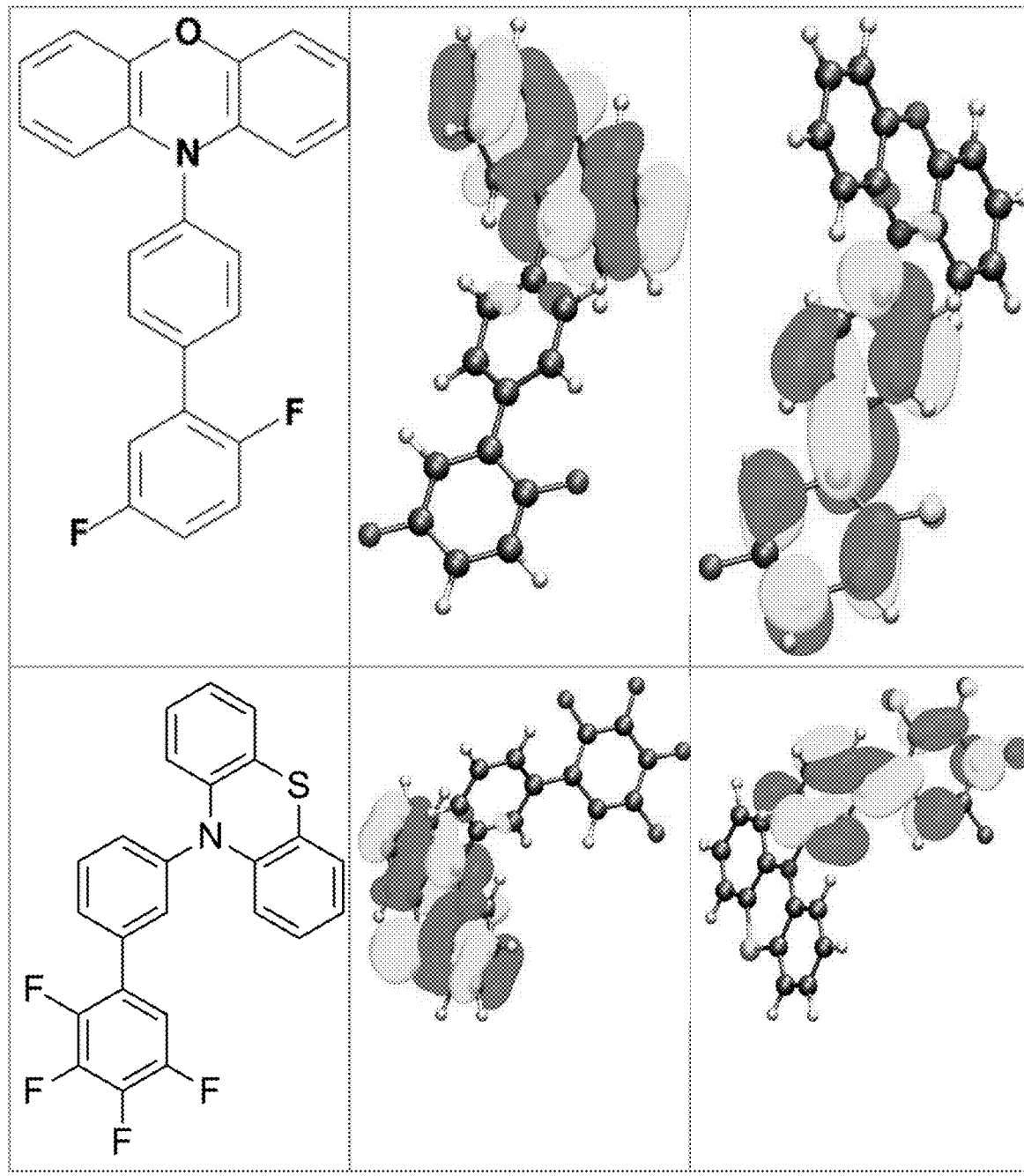
Figure 4:
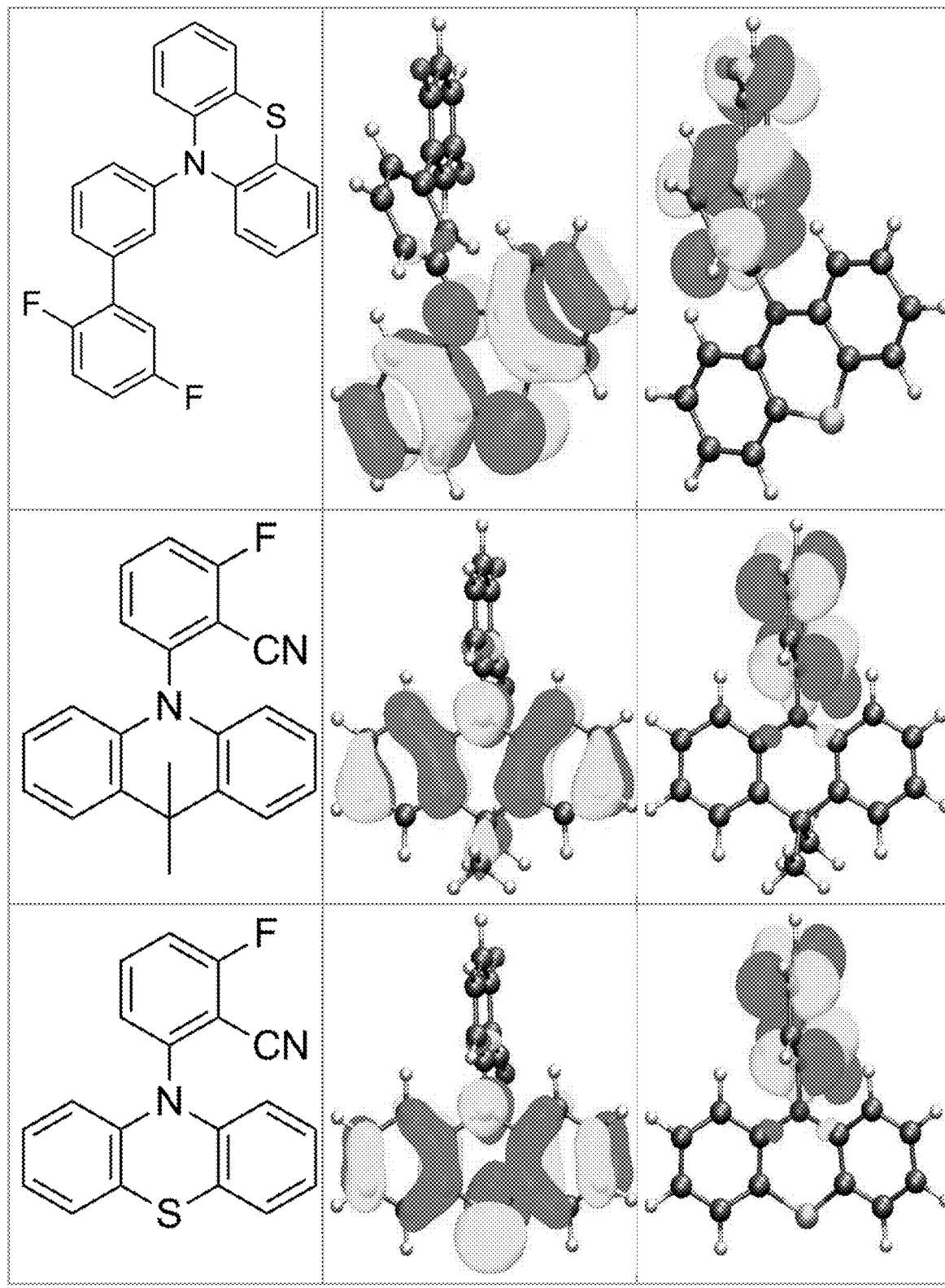
Figure 4:
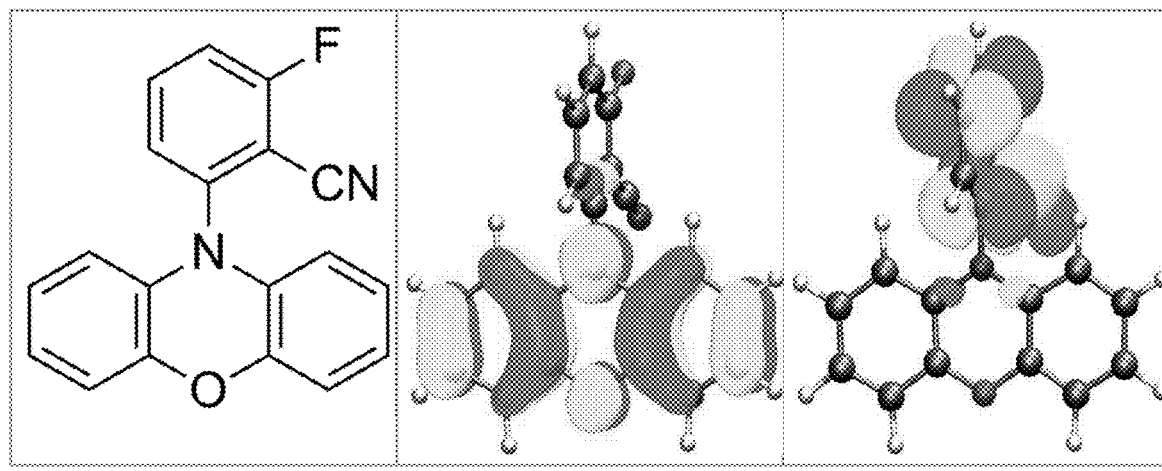

The limiting orbitals in FIG. 3 were calculated with the B3LYP functional for the optimized ground state geometries.

Example 2: PL Measurements

Photophysical Measurements
Pretreatment of Optical Glasses

All glasses (cuvettes and substrates made of quartz glass, diameter 1 cm) were cleaned after each use: rinsing three times each with dichloromethane, acetone, ethanol, demineralized water, immersing in 5% Hellmanex solution for 24 h, rinsing thoroughly with demineralized water. The optical glasses were blown dry with nitrogen.
Sample Preparation: Solutions 1-2 mg of the sample were dissolved in 100 ml of the respective solvent, concentration $10^{-5}$ mol/L. The cuvette was closed airtight and degassed for 10 min.
Sample Preparation, Film: Spin-Coating (Apparatus: Spin150, SPS Euro.)

The sample concentration corresponded to 10 mg/ml, made up in toluene or chlorobenzene.

Program: 1) 3 s at 400 rpm; 2) 20 s at 1000 rpm at 1000 rpm/s. 3) 10 s at 4000 rpm at 1000 Upm/s. After coating, the films were dried for 1 min at 70° C. in air on an LHG precision heating plate.
Absorption Spectroscopy Solutions: UV-VIS-spectra were recorded using an apparatus from Thermo Scientific, model Evolution 201. (See Sample preparation: Solutions)

Film: UV-VIS spectra were recorded on an apparatus from Thermo Scientific, model Evolution 201. (See Sample preparation, Film: Spin-Coating)
Photoluminescence Spectroscopy Und TCSPC Steady-state emission spectroscopy was performed with a fluorescence spectrometer from Horiba Scientific, model FluoroMax-4, equipped with a 150 W Xenon Arc lamps, excitation and emission monochromators and a Hamamatsu R928 photomultiplier tube, and a TCSPC option. Emissions and excitation spectra were corrected using standard correction curves.

The emission decay times were also measured on this system using the TCSPC method with the FM-2013 accessories and a TCSPC hub from Horiba Yvon Jobin. Excitation sources: NanoLED 370 (wavelength: 371 nm, pulse duration: 1.1 ns), NanoLED 290 (wavelength: 294 nm, pulse duration: <1 ns), SpectraLED 310 (wavelength: 314 nm), SpectraLED 355 (wavelength: 355 nm).

The evaluation (exponential fitting) was done using the DataStation software package and the DAS 6 evaluation software. The fit was provided using the chi-square method $$c^2 = \sum_{k=1}^{i} \frac{(e_i - o_i)^2}{e_i}$$

with $e_i$: size value predicted by the fit and $o_i$: measured value.

Quantum Efficiency Determination

The measurement of the photoluminescence quantum yield (PLQY) was performed using an Absolute PL Quantum Yield Measurement C9920-03G system from Hamamatsu Photonics. This consists of a 150 W Xenon gas discharge lamp, automatically adjustable Czemy-Tumer monochromators (250-950 nm) and an Ulbricht integrating sphere with highly reflective Spektralon coating (a Teflon derivative), which is connected over a glass fiber cable with a PMA-12 multichannel detector with BT—(back thinned) CCD Chip with 1024×122 pixels (size 24×24 µm). The evaluation of the quantum efficiency and the CIE coordinates was done using the software U6039-05 Version 3.6.0

For G9920-OXG (PMA-12). The emission maximum is given in nm, the quantum yield 0 in % and the CIE color coordinates as x,y values.

PLQY was determined for polymer films, solutions and powder samples using the following protocol:

1) Performance of quality assurance: The reference material used was anthracene in ethanol at a known concentration.

2) Determination of the excitation wavelength: First the absorption maximum of the organic molecule was determined and excitation performed with this.

3) Sample measurement: The absolute quantum yield of degassed solutions and films was determined under a nitrogen atmosphere. The calculation was performed within the system using the following equation:

$$\Phi_{PL} = \frac{n_{photon}, \text{ emitted}}{n_{photon}, \text{ absorbed}} = \frac{\int \frac{\lambda}{hc}[Int_{emitted}^{Sample}(\lambda) - Int_{absorbed}^{Sample}(\lambda)]d\lambda}{\int \frac{\lambda}{hc}[Int_{emitted}^{Reference}(\lambda) - Int_{absorbed}^{Reference}(\lambda)]d\lambda}$$

with the photon number $n_{photon}$ and the intensity Int.

Example 3: Synthesis of Molecules According to the Invention (Procedure 1)

Numerous examples according to the invention were synthesized under Buchwald-Hartwig amination conditions.

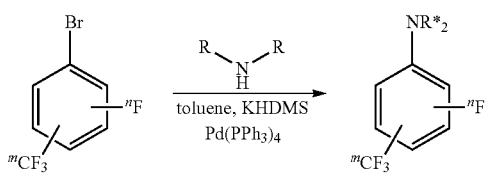

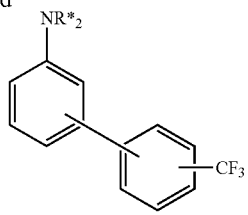

For this, a commercial bromide or iodide precursor (e.g., available from Sigma-Aldrich or Fluorochem, 1 equivalent) was dissolved in dry toluene under protective gas (50 mL per g educt). 1.2 equivalents of the commercial amine precursor, 1.5 equivalents of potassium disilyl hexamethylamide of sodium hydride or sodium alcoholate was added as base. Under a nitrogen countercurrent, tetrakis-triphenylpalladium (10 mol-%) or PdCl2(dppf) was added and heated for 24 hours under reflux.

The reaction mixture was quenched with water (10 mL), filtered over silica gel and then purified by MPLC. The crude product was purified by sublimation at 250° C. under 10E-5 mbar pressure and the purified product was then obtained as a solid.

Using this method, multiple substitutions can also be performed. In this case either diamino compounds such as bicarbazoles or dibromides are used. Then only 0.5 equivalents of the difunctional starting material are used.

Here a commercial fluorine precursor (available e.g. from Sigma-Aldrich or Fluorochem, 1 equivalent) under protective gas was dissolved in dry DMSO (50 mL per 2 g educt). 1.2 equivalents of the commercial amine precursor and 1.5 equivalents of potassium phosphate are added as the base. The mixture is heated for 24 hours under reflux.

The reaction mixture was added to water and the precipitate produced was separated, washed with water and dried. The crude product was either purified or further reacted (row 2). A further purification was performed by MPLC with cyclohexane/ethyl acetate as the mobile phase. the crude product was purified by sublimation at 250° C. under a pressure of 10E-5 mbar and the purified product then obtained as a solid.

With this method, multiple substitutions can also be performed; in this case either diamino compounds such as bicarbazoles or dibromides are used. In this case only 0.5 equivalents of the difunctional starting material are used.

Example 4: Synthesis of Molecules According to the Invention (Procedure 2)

Additional examples according to the invention can be produced by nucleophilic aromatic substitution. In this case commercially available starting materials used are aryl fluorides containing either additional fluorine or CF3 groups (top row) or an additional functionalizable radical such as I or Br, wherein successive reactions are possible (row 2). The Suzuki cross-coupling may be mentioned as an example here.

Example 5: Synthesis of Molecules According to the Invention (Procedure 3)

An additional synthesis route for molecules according to the invention is the BHAS method, which is familiar to the person skilled in the art (S. Lindner et al., Journal of Fluorine Chemistry 2015, 179, 102-105)

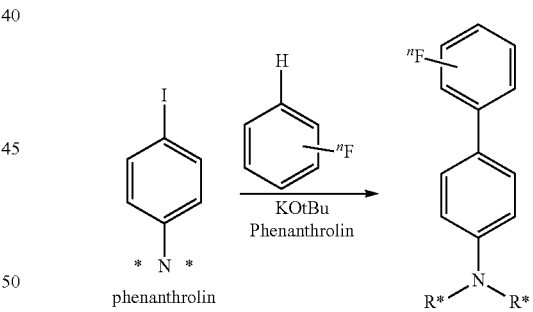

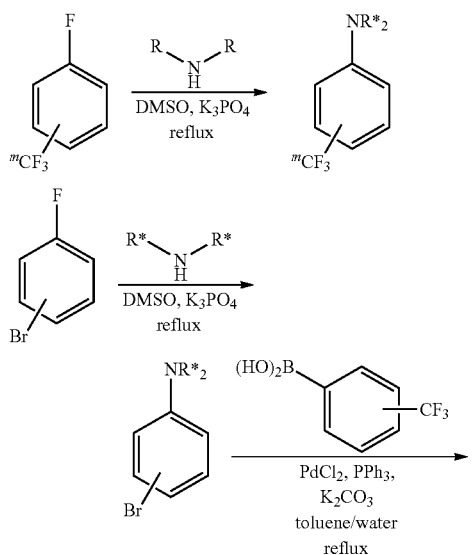

An aryl iodide (1 equivalent) is dissolved in a 20-fold excess of fluoroaromatic. Under a protective gas, 1 equivalent KOtBu and 50 mol-% phenanthroline are added and stirred under reflux.

After 48 hours the solvent was removed by distillation. The crude material was taken up in ethyl acetate, filtered over silica gel and then purified by MPLC. The crude product was purified by sublimation at 250° C. under a pressure of 10E-5 mbar and the purified product then obtained as the solid.

With this method it is also possible to perform multiple substitutions. In this case, di- or triodides are used. In this case only 0.5 and 0.33 equivalents of the di- or trifunctional starting material are used.

Example 6 to Example 13: Synthesis of Molecules According to the Invention (Procedure 1)

The compounds shown were produced as white to light yellow colored solids using the methods described in Examples 3, 4 and 5. The yields of the syntheses here were 10 to 80% based on the final synthesis step. The chemical characterization in this case is done by NMR spectroscopy in deuterochloroform as solvent (1H NMR, 13C NMR and 19F NMR). In addition, mass spectroscopy (LC-MC, FAB-MS) was used for confirmation of identity along with HPLC (THF-water, DAD for peak detection). The purity of the emitter after purification was at least 97% (HPLC).

Quantum chemical calculations were performed on all of the molecules shown using the methods described in Example 1 (see Table 5). The photophysical data given were measured according to the examples described in example 2. Thin films were measured in polymethyl methacrylate (PMMA) at 10 wt.-% dopant concentration.

| Example | Structure | $\lambda_{max}$ [nm] | $CIE_x$ | $CIE_y$ | PLQY [%] |
|---|---|---|---|---|---|
|  |  | 10% Emitter concentration in PMMA |  |  |  |
| 7 | *structure* | 466 | 0.19 | 0.25 | 26 |
| 8 | *structure* | 458 | 0.17 | 0.18 | 43 |
| 9 | *structure* | 473 | 0.20 | 0.27 | 17 |

-continued

| Example | Structure | $\lambda_{max}$ [nm] | $CIE_x$ | $CIE_y$ | PLQY [%] |
|---|---|---|---|---|---|
| 10 | [carbazole with two OMe groups, N-linked to biphenyl with two CF3 groups and CN] | 467 | 0.17 | 0.22 | 66 |
| 11 | [carbazole with two tBu groups, N-linked to phenyl with CF3 and CN] | 445 | 0.16 | 0.14 | 67 |
| 12 | [carbazole with two OMe groups, N-linked to phenyl with CF3 and CN] | 485 | 0.21 | 0.34 | 44 |
| 13 | [carbazole with two OMe groups, N-linked to phenyl with F and benzoyl] | 495 | 0.24 | 0.41 | 54 |

Although illustrative embodiments of the present invention have been described herein with reference to the accompanying drawings, it is to be understood that the invention is not limited to those precise embodiments, and that various other changes and modifications may be made by, one skilled in the art without departing from the scope or spirit of the invention.

The invention claimed is:
1. An organic molecule, comprising a structure of formula 1:

AF1-(Separator)$_m$-AF2    Formula 1 wherein:
m is 0 or 1;

AF1 is a first chemical entity, comprising a conjugated system;
AF2 is a second chemical entity, comprising a conjugated system;
AF1≠AF2;
wherein AF1 comprises a structure of formula 2-2:

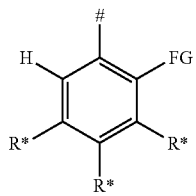

Formula 2-2 wherein
FG is selected from the group consisting of CF₃, SF₅, NH—(CF₃)₁, N—(CF₃)₂, O—CF₃, S—CF₃ and a group E*, which is an aryl or heteroaryl group with 6 to 18 aromatic ring atoms, which may be substituted with one or more radicals R⁸, and which as a constituent of the aromatic ring contains one or more groups V*, wherein the groups V* in each instance are selected to be the same or different, from =C(F)— and =C(CF₃)—;
=linking point on the separator or linking point on the chemical entity AF2; and wherein AF2 comprises a structure of formula 4:

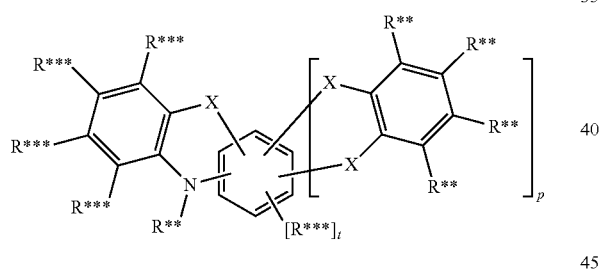

Formula 4 wherein
p is 0 or 1;
t=4−2p;
X is CR₂, NR, oxygen, sulfur or a direct bond, wherein maximally two place holders X are simultaneously a direct bond, wherein these are not constituents of the same ring;
R* is R or is selected from the following entities, wherein maximally two of the radicals R*** simultaneously are equal to one of the following entities:

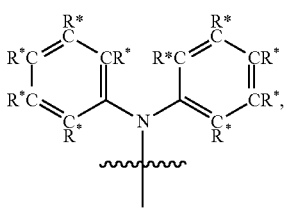

-continued

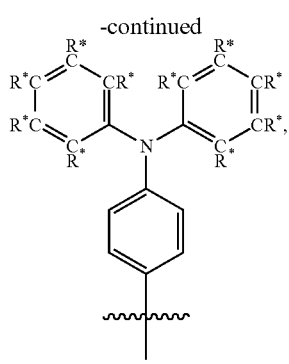

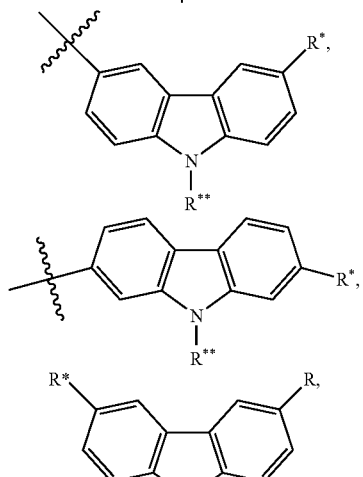

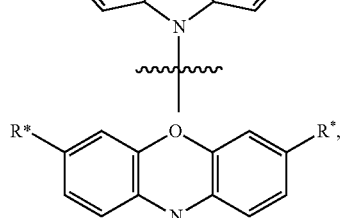

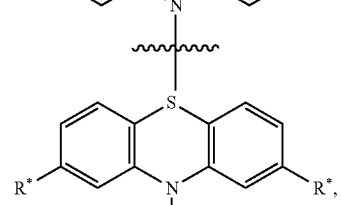

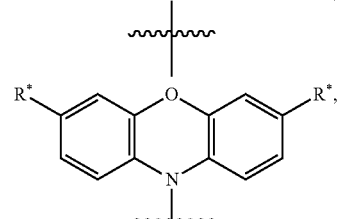

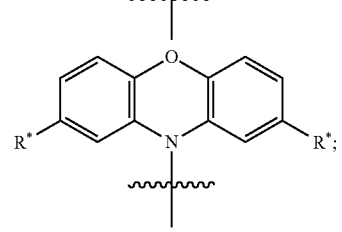

R** in each instance, independently of one another, is a radical R* or marks a linking point to a separator S or the chemical entity AF1 wherein exactly one R** is a linking point to a separator S or to the chemical entity AF1;
and wherein the separator S comprises a structure of formula 4S

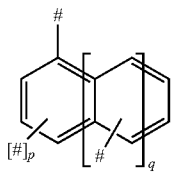

Formula 4S wherein
marks the linking point for the chemical entities AF1 and AF2;
p=0 or 1;
q=0 or 1;
and wherein p≠q;
Separator is a chemical entity that links AF1 and AF2 and wherein the separator is linked to the conjugated system of AF1 and to the conjugated system of AF2;
and wherein the following is applicable for formula 1, 2-2, and formula 4:
R* in each instance, independently of one another, is selected from the group consisting of H, deuterium, phenyl, naphthyl, —CN, —NO$_2$, C(=O)OH, C(=O)OR$^3$, C(=O)N(R$^3$)$_2$, C(=O)SR$^3$, C(=S)SR$^3$, Si(R$^4$)$_3$, B(OR$^5$)$_2$, B(N(R$^6$)$_2$)$_2$, C(=O)R$^3$, P(=O)(R$^7$)$_2$, As(=O)(R$^7$)$_2$, P(=S)(R$^7$)$_2$, As(=S)(R$^7$)$_2$, S(=O)R$^3$, S=NR$^3$, S(=O)NR$^3$, S(=O)$_2$NR$^3$, S(=O)$_2$R$^3$, O—S(=O)$_2$R$^3$, SF$_5$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$—, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$), —As(=S)(R$^7$)—, —S(=O)—, —S(=O)$_2$—, —O—, or —S— and wherein one or more H atoms may be replaced by deuterium, F, Cl, Br, I, CN, CF$_3$ or NO$_2$, or an aromatic or heteroaromatic ring system with 5 aromatic ring atoms, which in each case may be substituted with one or more radicals R$^2$, or an aryloxy or heteroaryloxy group with 5 to 60 aromatic ring atoms, which may be substituted with one or more radicals R$^9$; two or more of these substituents R* may also form a mono- or polycyclic, aliphatic, aromatic and/or benzoanellated ring system;
R$^2$ in each instance, independently of one another, is selected from the group consisting of H, deuterium, phenyl, naphthyl, CF$_3$, C(=O)OR$^3$, Si(R$^4$)$_3$, C(=O)R$^3$, P(=O)(R$^7$)$_2$, As(=O)(R$^7$)$_2$P(=S)(R$^7$)$_2$, As(=S)(R$^7$)$_2$, S(=O)R$^3$, S(=O)$_2$R$^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals R$^9$, wherein one or more adjacent CH$_2$ groups may be substituted with —R$^9$C=CR$^9$—, —C≡C— or one adjacent CH$_2$-group with —Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; here two or more of these substituents R$^2$ may also form with one another a mono- or polycyclic, aliphatic, aromatic and/or benzoanellated ring system;
R$^3$ in each instance, independently of one another, is selected from the group consisting of H, deuterium, phenyl, naphthyl, CF$_3$ or an aliphatic, aromatic and/or heteroaromatic hydrocarbon radical with 1 to 20 C atoms, in which also one or more H atoms may be replaced by F or CF$_3$; here also two or more substituents R$^3$ may also form a mono- or polycyclic, aliphatic ring system with one another;
R$^4$ in each instance, independently of one another, is selected from the group consisting of H, deuterium, phenyl, naphthyl, CN, CF$_3$, OH, C(=O)OR$^3$, C(=O)N(R$^3$)$_2$, C(=O)R$^3$, P(=O)(R$^7$)$_2$, As(=O)(R$^7$)$_2$, P(=S)(R$^7$)$_2$, As(=S)(R$^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals R$^9$, wherein one or more adjacent CH$_2$ groups may be replaced by —R$^9$C=CR$^9$—, —C≡C—, or one adjacent CH$_2$-groups by —C(=O)—, —C(=S)—, —C(=Se)—, —C=N—, —C(=O)O—, C(=O)N(R$^3$)—, —P(=O)(R$^7$)—, —As(=O)(R$^7$)—, —P(=S)(R$^7$), —As(=S)(R$^7$)—, —S(=O)—, —S(=O)$_2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, each of which may be substituted with one or more radicals R$^8$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; here, two or more of these substituents R$^4$ may also form a mono- or polycyclic, aliphatic, aromatic and/or benzoanellated ring system with one another;
R$^5$ in each instance, independently of one another, is selected from the group consisting of phenyl, naphthyl, CF$_3$, C(=O)R$^3$, P(=O)(R$^7$)$_2$, As(=O)(R$^7$)$_2$, a linear alkyl, alkoxy or thioalkoxy group with 1 to 40 C atoms or a linear alkenyl or alkynyl group with 2 to 40 C atoms or branched or cyclic alkyl, alkenyl, alkynyl, alkoxy or thioalkoxy group with 3 to 40 C atoms, which in each case may be substituted with one or more radicals R⁹, wherein one or more adjacent CH₂ groups may be replaced by —R⁹C=CR⁹—, —C≡C—, or one adjacent CH₂-group by —C(=O)—, —C(=S)—, —C(=Se)—, —C=N—, —C(=O)O—, —C(=O)N(R³)—, —P(=O)(R⁷)—, —As(=O)(R⁷)—, —P(=S)(R⁷)—, —As(=S)(R⁷)—, —S(=O)—, —S(=O)₂—, —O—, or —S— and wherein one or more H atoms may be replaced by deuterium, F, Cl, Br, I, CN, CF₃ or NO₂, or an aromatic or heteroaromatic ring system with 5 to 60 aromatic ring atoms, which in each case may be substituted with one or more radicals R⁹, or an aryloxy or heteroaryloxy group with 5 to 60 aromatic ring atoms, which may be substituted with one or more radicals R⁹, or a diarylamino group, diheteroarylamino group or arylheteroarylamino group with 10 to 40 aromatic ring atoms, which may be substituted with one or more radicals R⁹, or a combination of these systems; in this connection two or more of these substituents R⁵ may also form a mono- or polycyclic, aliphatic, aromatic and/or benzoanellated ring system;

R⁶ in each instance, independently of one another, is selected from the group consisting of phenyl, naphthyl, CF₃, C(=O)R³, P(=O)(R⁷)₂, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which may be substituted in each case with one or more radicals R⁹, wherein one or more adjacent CH₂ groups may be replaced by —R⁹C=CR⁹—, —C≡C—, or one adjacent CH₂-group by —C(=O)—, —C(=S)—, —C(=Se)—, —C=N—, —C(=O)O—, —C(=O)N(R³)—, —P(=O)(R⁷)—, —As(=O)(R⁷)—, —P(=S)(R⁷), —As(=S)(R⁷)—, —S(=O)—, —S(=O)₂—, —O—, or —S— and wherein one or more H atoms may be replaced by deuterium, F, Cl, Br, I, CN, CF₃ or NO₂, or an aromatic or heteroaromatic ring system with 5 to 60 aromatic ring atoms, which in each case may be substituted with one or more radicals R⁹, or an aryloxy or heteroaryloxy group with 5 to 60 aromatic ring atoms, which may be substituted with or more radicals R*, or a diarylamino group, diheteroarylamino group or arylheteroarylamino group with 10 to 40 aromatic ring atoms, which may be substituted with one or more radicals R⁹, or a combination of these systems; in this process two or more of these substituents R⁶ may also form a mono- or polycyclic, aliphatic, aromatic and/or benzoanellated ring system with one another;

R⁷ is in each instance, independently of one another, selected from the group consisting of phenyl, naphthyl, CN, CF₃, C(=O)OR³, C(=O)N(R³)₂, C(=O)R³, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals R⁹, wherein one or more adjacent CH₂ groups may be replaced by —R⁹C=CR⁹—, —C≡C—, or one adjacent CH₂-group by —Sn(R⁴)₂—, —C(=O)—, —C(=S)—, —C(=Se)—, —C=N—, —C(=O)O—, —C(=O)N(R³)—, —S(=O)—, —S(=O)₂—, —O—, or —S— and wherein one or more H atoms may be replaced by deuterium, F, Cl, Br, I, CN, CF₃ or NO₂, or an aromatic or heteroaromatic ring system with 5 to 60 aromatic ring atoms, which in each case may be substituted with one or more radicals R⁹, or an aryloxy or heteroaryloxy group with 5 to 60 aromatic ring atoms, which may be substituted with one or more radicals R⁹, or a diarylamino group, diheteroarylamino group or arylheteroarylamino group with 10 to 40 aromatic ring atoms, which may be substituted with one or more radicals R³, or a combination of these systems; here, two or more of these substituents R⁷ may also form a mono- or polycyclic, aliphatic, aromatic and/or benzoanellated ring system;

R⁸ is in each instance independently of one another selected from the group consisting of H, deuterium, phenyl, naphthyl, F, CF₃ or an aliphatic, aromatic and/or heteroaromatic hydrocarbon radical with 1 to 20 C atoms, in which also one or more H atoms may be replaced by F or CF₃; here, two or more substituents R⁸ may also form a mono- or polycyclic, aliphatic ring system; and R⁹ is in each instance independently of one another selected from the group consisting of H, deuterium, phenyl, naphthyl, CN, CF₃, NO₂, OH, COOH, C(=O)OR³, C(=O)N(R³)₂, C(=O)R³, S(=O)R³, S(=O)₂R³, OSO₂R³, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals R⁸, wherein one or more non-adjacent CH₂ groups may be replaced by —R³C=CR³—, or one adjacent CH₂-group by —C(=O)—, —C(=S)—, —C(=Se)—, —C=N—, —C(=O)O—, —C(=O)N(R³)—, —S(=O)—, —S(=O)₂—, —O—, or —S— and wherein one or more H atoms may be replaced by deuterium, F, Cl, Br, I, CN, CF₃ or NO₂, or an aromatic or heteroaromatic ring system with 5 to 60 aromatic ring atoms, which in each case may be substituted with one or more radicals R⁸, or an aryloxy or heteroaryloxy group with 5 to 60 aromatic ring atoms, which may be substituted with one or more radicals R³, or a diarylamino group, diheteroarylamino group or arylheteroarylamino group with 10 to 40 aromatic ring atoms, which may be substituted with one or more radicals R⁸, or a combination of these systems; here, two or more of these substituents R⁹ may also form with one another a mono- or polycyclic, aliphatic, aromatic and/or benzoanellated ring system.

2. The organic molecule according to claim 1, wherein AF2 is selected as one of the following structures, wherein the possible linking points on the separator or on the chemical entity AF2 are designated with lower-case letters a to z and a₂ to k₂;

6

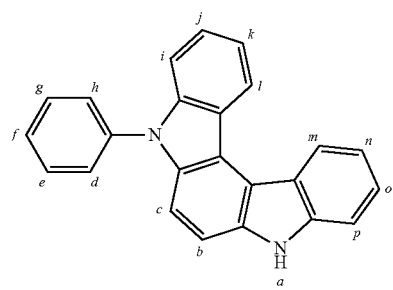

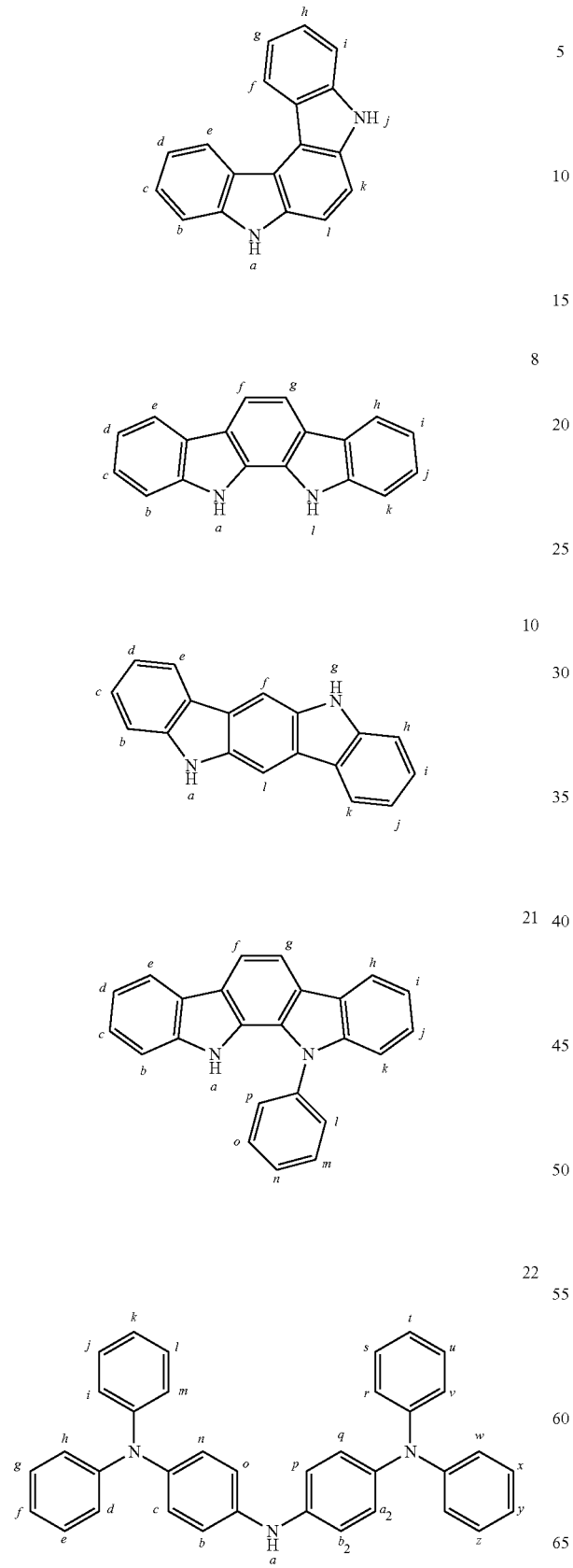
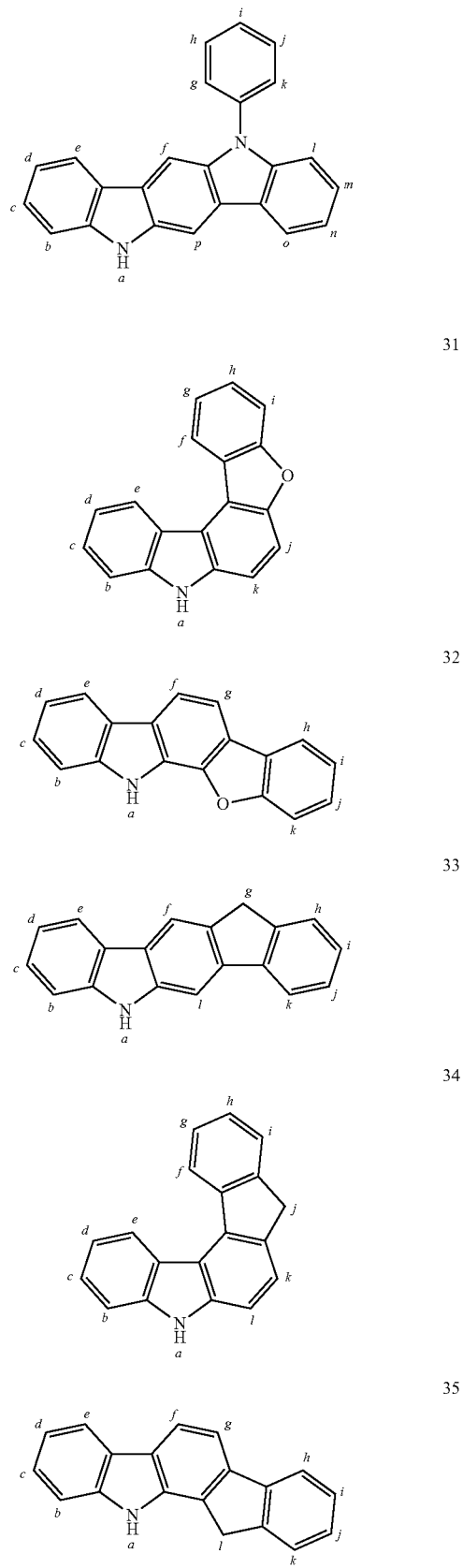

129
-continued
30
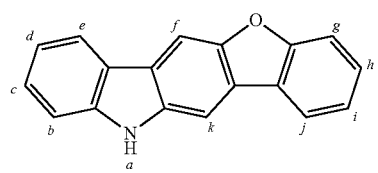
38
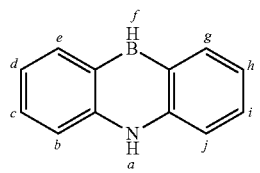
39
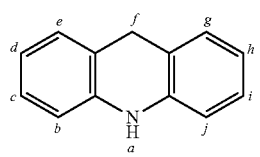
41
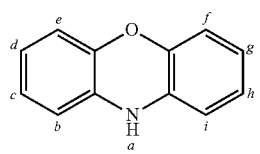
44
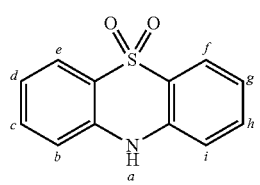
49
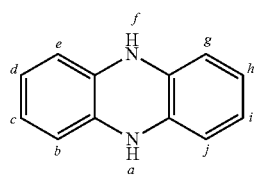
54
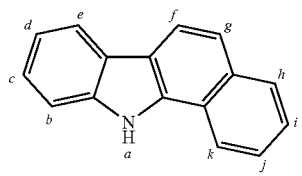
55
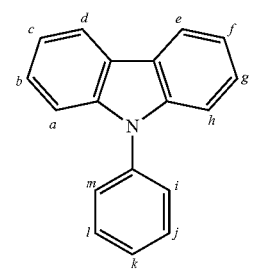
130
-continued
58
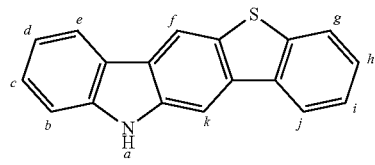
59
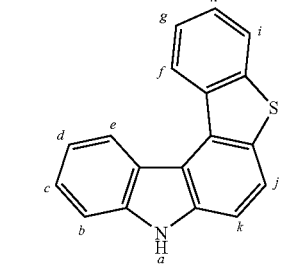
60
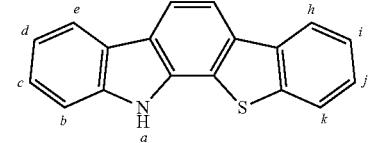
71
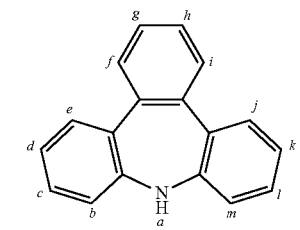
72
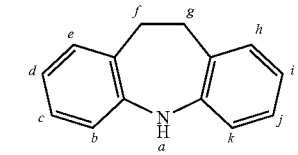
73
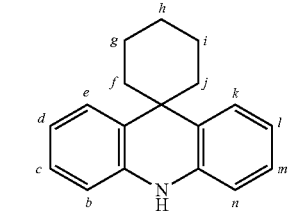
77
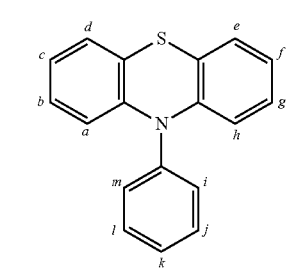

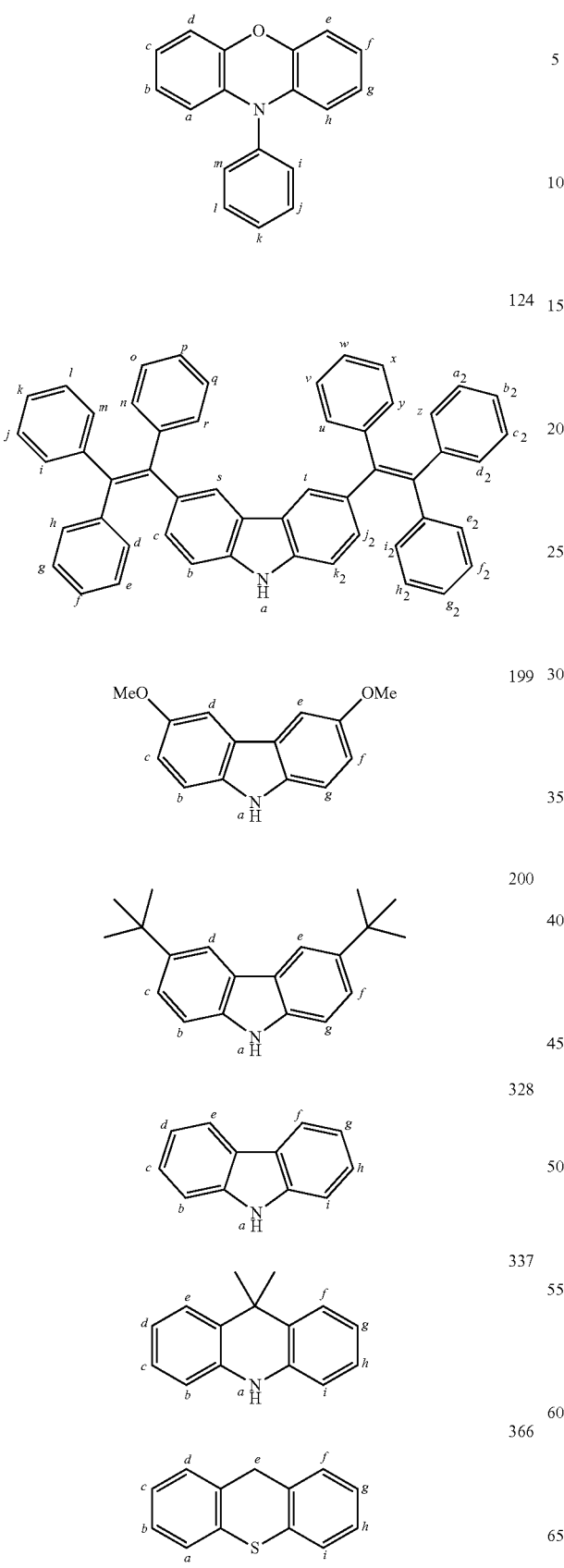
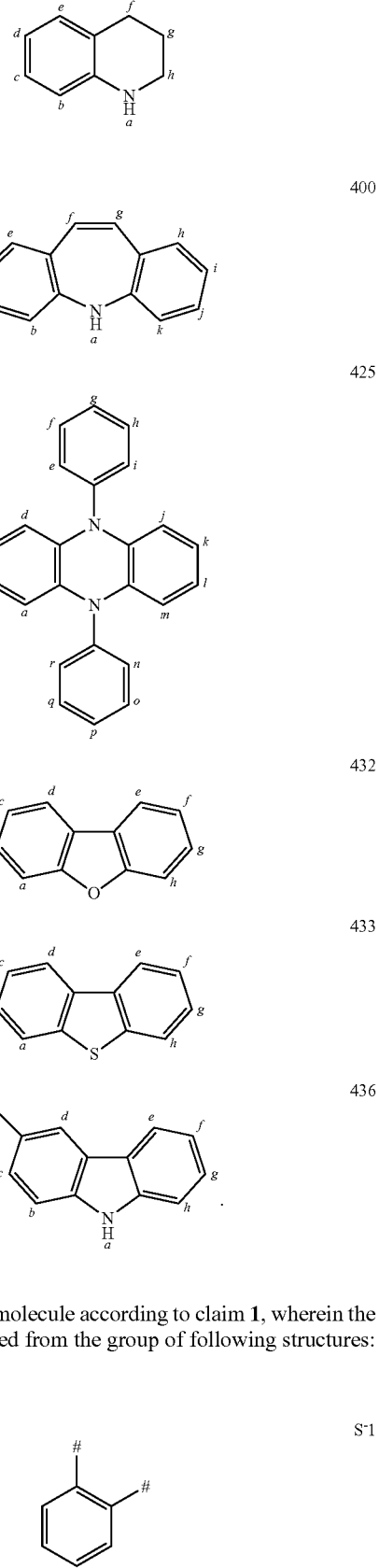
3. The organic molecule according to claim 1, wherein the separator is selected from the group of following structures:

-continued

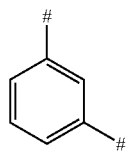
S-2

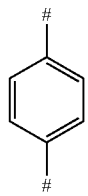
S-3

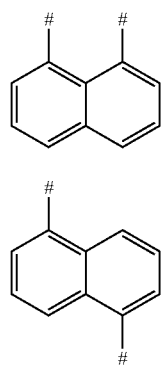
S-4

S-5 wherein # represent the linking points for the chemical entities AF1 and AF2.

4. An optoelectronic component, comprising an organic molecule according to claim 1.

5. The optoelectronic component according to claim 4, comprising
a substrate,
an anode,
a cathode, wherein the anode and the cathode are applied to the substrate, and
at least one light-emitting layer applied between the anode and cathode and containing the organic molecule.

6. The optoelectronic component according to claim 5, wherein the light-emitting layer contains fluorescent or phosphorescent materials and wherein the materials of the light-emitting layer are the organic molecules.

7. The optoelectronic component according to claim 4, in which the light-emitting layer comprises at least one host material, wherein the excited singlet state ($S_1$) and/or the excited triplet state ($T_1$) of the at least one host material is higher than that of the excited singlet state ($S_1$) and/or the excited triplet state ($T_1$) of the organic molecule.

8. The optoelectronic component according to claim 4, comprising at least one host material consisting of the organic molecule.

9. The optoelectronic component according to claim 4, in which the organic molecule together with a functional material form an exciplex.

10. The optoelectronic component according to claim 4, in which the organic molecule is part of a charge transport layer.

11. The optoelectronic component according to claim 4, wherein the optoelectronic component is an organic light-emitting diode, light-emitting electrochemical cell, organic light-emitting sensor, an organic diode, an organic solar cell, an organic transistor, an organic field-effect transistor, an organic laser or a down-conversion element.

12. The optoelectronic component according to claim 4, wherein the organic molecule is one of a luminescent emitter, an absorber, a host material, an electron transport material, a hole injection material, and a hole blocking material.

13. The optoelectronic component according to claim 12, wherein a proportion of the organic molecule in an emission layer in the optoelectronic component is 1% to 99%.

14. The optoelectronic component according to claim 12, wherein a proportion of the organic molecule in an emission layer in the optoelectronic component is 5% to 80%.

15. A method for producing an optoelectronic component, comprising processing the organic molecule according to claim 1 by a vacuum evaporation method or from a solution.

16. An organic molecule, comprising a structure of formula 1

$$AF1\text{-}(Separator)_m\text{-}AF2 \qquad \text{Formula 1}$$

wherein:
m is 0 or 1;
AF1 is a first chemical entity, comprising a conjugated system;
AF2 is a second chemical entity, comprising a conjugated system;
AF1≠AF2;
wherein AF1 is selected from the following structures:

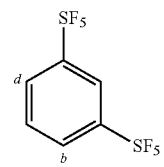
342

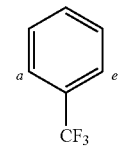
154

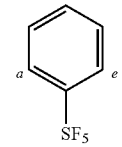
184 wherein the possible linking points on the separator or on the chemical entity AF2 are designated with lower-case letters a, b, d and e; and wherein AF2 comprises a structure of formula 3:

Formula 3

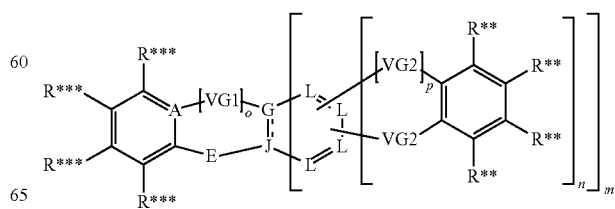

wherein:

n is 0 or 1;

p is 0 or 1;

VG1=bridging group selected from the group consisting of

NR, CR$_2$, O, S, a direct bond, BR, AsR, SiR$_2$, GeR$_2$,

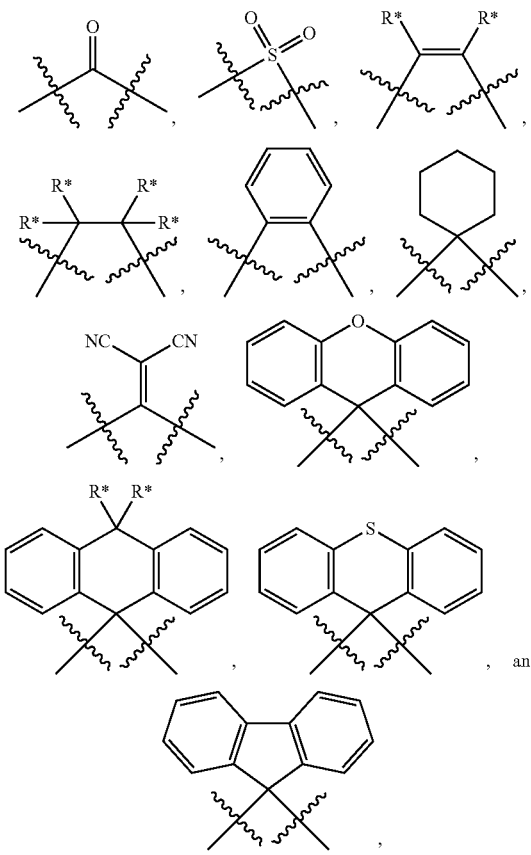

VG2=bridging group is in each instance, independently of one another, selected from the group consisting of CR$_2$, NR, O, S and a direct bond, wherein two entities VG2 are not simultaneously a direct bond;

E is NR**

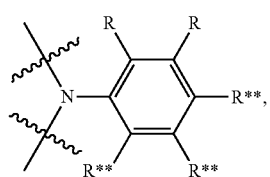

O or S;

L is CR* when n=0; L is CR or C (in the case of covalent bonding to VG2 when n=1;

R* is R or is selected from the following entities, wherein maximally two of the radicals R*** simultaneously are equal to one of the following entities:

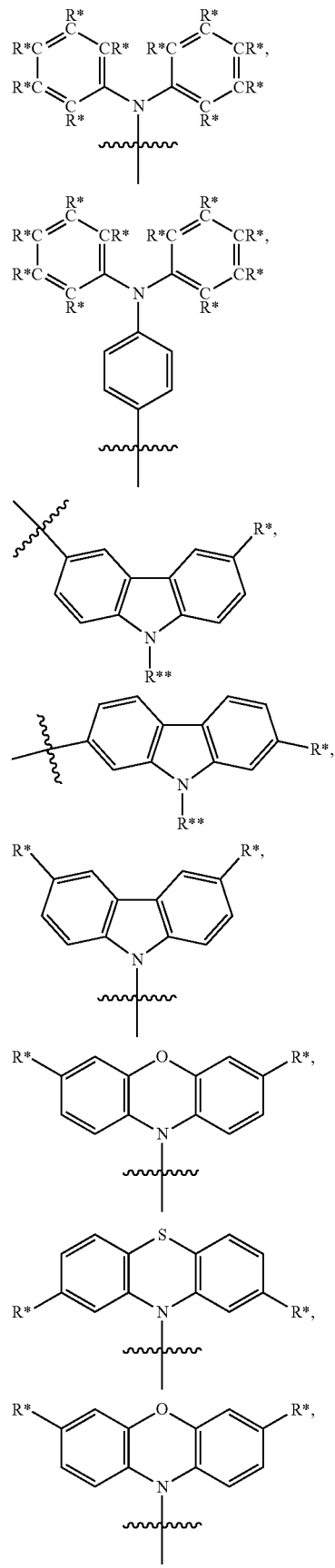

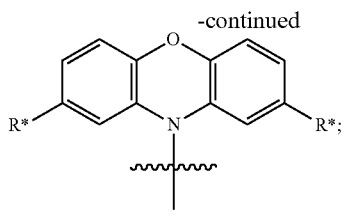

R** in each instance, independently of one another, is a radical R* or marks a linking point to a separator S or the chemical entity AF1 wherein exactly one R** is a linking point to a separator S or to the chemical entity AF1;

and wherein the separator S comprises a structure of formula 4S

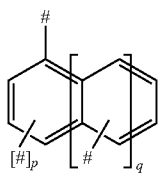

Formula 4S wherein

\# marks the linking point for the chemical entities AF1 and AF2, p=0 or 1, q=0 or 1, and wherein p≠q, Separator is a chemical entity that links AF1 and AF2 and wherein the separator is linked to the conjugated system of AF1 and to the conjugated system of AF2;

and wherein the following is applicable for formula 1 and formula 3:

$R^*$ in each instance, independently of one another, is selected from the group consisting of H, deuterium, phenyl, naphthyl, —CN, C(=O)OH, C(=O)OR$^3$, C(=O)N(R$^3$)$_2$, C(=O)SR$^3$, C(=S)SR$^3$, Si(R$^4$)$_3$, B(OR$^5$)$_2$, B(N(R$^6$)$_2$), C(=O)R$^3$, P(=O)(R$^7$)$_2$, As(=O)(R$^7$), P(=S)(R$^7$)$_2$, As(=S)(R$^7$)$_2$, S(=O)R$^3$, S=NR$^3$, S(=O)NR$^3$, S(=O)$_2$NR$^3$, S(=O)$_2$R$^3$, O—S(=O)$_2$R$^3$, SF$_5$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals R$^9$, wherein one or more adjacent CH$_2$ groups may be replaced by —R$^9$C=CR$^9$—, —C≡C—, or one adjacent CH$_2$-group by —Si(R$^4$)$_2$—, —Ge(R$^4$)$_2$—, —Sn(R$^4$)$_2$—, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —O—, or —S— and wherein one or more H atoms may be replaced by deuterium, F, Cl, Br, I, CN, CF$_3$ or NO$_2$, or an aromatic or heteroaromatic ring system with 5 aromatic ring atoms, which in each case may be substituted with one or more radicals R$^2$, or an aryloxy or heteroaryloxy group with 5 to 60 aromatic ring atoms, which may be substituted with one or more radicals R$^9$; two or more of these substituents R* may also form a mono—or polycyclic, aliphatic, aromatic and/or benzoanellated ring system;

$R^2$ in each instance, independently of one another, is selected from the group consisting of H, deuterium, phenyl, naphthyl, CF$_3$, C(=O)OR$^3$, Si(R$^4$)$_3$, C(=O)R$^3$, P(=O)(R$^7$)$_2$, As(=O)(R$^7$)$_2$P(=S)(R$^7$)$_2$, As(=S)(R$^7$)$_2$, S(=O)R$^3$, S(=O)$_2$R$^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals R$^9$, wherein one or more adjacent CH$_2$ groups may be substituted with —R$^9$C=CR$^9$—, —C≡C—, or one adjacent CH$_2$-group with —Si(R$^4$)$_2$—, —Ge(R$^4$)$_2$—, —Sn(R$^4$)$_2$, —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$)—, —As(=S)(R$^7$)—, —S(=O)—, —S(=O)$_2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, which in each case may be substituted with one or more radicals R$^9$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals R$^9$, or a combination of these systems; here two or more of these substituents R$^2$ may also form with one another a mono- or polycyclic, aliphatic, aromatic and/or benzoanellated ring system;

$R^3$ in each instance, independently of one another, is selected from the group consisting of H, deuterium, phenyl, naphthyl, CF$_3$ or an aliphatic, aromatic and/or heteroaromatic hydrocarbon radical with 1 to 20 C atoms, in which also one or more H atoms may be replaced by F or CF$_3$, here also two or more substituents R$^3$ may also form a mono- or polycyclic, aliphatic ring system with one another;

$R^4$ in each instance, independently of one another, is selected from the group consisting of H, deuterium, phenyl, naphthyl, CN, CF$_3$, OH, C(=O)OR$^3$, C(=O)N(R$^3$)$_2$, C(=O)R$^3$, P(=O)(R$^7$)$_2$, As(=O)(R$^7$)$_2$, P(=S)(R$^7$)$_2$, As(=S)(R$^7$)$_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which in each case may be substituted with one or more radicals R$^9$, wherein one or more adjacent CH$_2$ groups may be replaced by —R$^9$C=CR$^9$—, —C≡C—, or one adjacent CH$_2$-groups by —C(=O)—, —C(=S)—, —C(=Se)—, —C=N—, —C(=O)O—, —C(=O)N(R$^3$)—, —P(=O)(R$^7$)—, —As(=O)(R$^7$)—, —P(=S)(R$^7$), —As(=S)(R$^7$)—, —S(=O)—, —S(=O)$_2$—, —O—, or —S— and wherein one or more H atoms may be replaced by deuterium, F, Cl, Br, I, CN, CF$_3$ or NO$_2$, or an aromatic or heteroaromatic ring system with 5 to 60 aromatic ring atoms, each of which may be substituted with one or more radicals R$^8$, or an aryloxy or heteroaryloxy group with 5 to 60 aromatic ring atoms, which may be substituted with one or more radicals R$^9$, or a diarylamino group, diheteroarylamino group or arylheteroarylamino group with 10 to 40 aromatic ring atoms, which may be substituted with one or more radicals $R^9$, or a combination of these systems; here, two or more of these substituents $R^4$ may also form a mono- or polycyclic, aliphatic, aromatic and/or benzoanellated ring system with one another;

$R^5$ in each instance, independently of one another, is selected from the group consisting of phenyl, naphthyl, $CF_3$, $C(=O)R^3$, $P(=O)(R^7)_2$, $As(=O)(R^7)_2$, a linear alkyl, alkoxy or thioalkoxy group with 1 to 40 C atoms or a linear alkenyl or alkynyl group with 2 to 40 C atoms or branched or cyclic alkyl, alkenyl, alkynyl, alkoxy or thioalkoxy group with 3 to 40 C atoms, which in each case may be substituted with one or more radicals $R^9$, wherein one or more adjacent $CH_2$ groups may be replaced by —$R^9C=CR^9$—, —C≡C—, or one adjacent $CH_2$-group by —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$)—, —As(=S)($R^7$)—, —S(=O)—, —S(=O)$_2$—, —O—, or —S— and wherein one or more H atoms may be replaced by deuterium, F, Cl, Br, I, CN, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^9$, or a combination of these systems; in this connection two or more of these substituents $R^5$ may also form a mono- or polycyclic, aliphatic, aromatic and/or benzoanellated ring system;

$R^6$ in each instance, independently of one another, is selected from the group consisting of phenyl, naphthyl, $CF_3$, $C(=O)R^3$, $P(=O)(R^7)_2$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, which may be substituted in each case with one or more radicals $R^9$, wherein one or more adjacent $CH_2$ groups may be replaced by —$R^9C=CR^9$—, —C≡C—, or one adjacent $CH_2$-group by —C(=O)—, —C(=S)—, —C(=Se)—, —C=N—, —C(=O)O—, —C(=O)N($R^3$)—, —P(=O)($R^7$)—, —As(=O)($R^7$)—, —P(=S)($R^7$), —As(=S)($R^7$)—, —S(=O)—, —S(=O)$_2$—, —O—, or —S— and wherein one or more H atoms may be replaced by deuterium, F, Cl, Br, I, CN, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with or more radicals R*, or a diarylamino group, diheteroarylamino group or arylheteroarylamino group with 10 to 40 aromatic ring atoms, which may be substituted with one or more radicals $R^9$, or a combination of these systems; in this process two or more of these substituents $R^6$ may also form a mono- or polycyclic, aliphatic, aromatic and/or benzoanellated ring system with one another;

$R^7$ is in each instance, independently of one another, selected from the group consisting of phenyl, naphthyl, CN, $CF_3$, $C(=O)OR^3$, $C(=O)N(R^3)_2$, $C(=O)R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^9$, wherein one or more adjacent $CH_2$ groups may be replaced by —$R^9C=CR^9$—, —C≡C—, or one adjacent $CH_2$-group by —Sn($R^4$), —C(=O)—, —C(=S)—, —C(=Se)—, —C=N—, —C(=O)O—, —C(=O)N($R^3$)—, —S(=O)—, —S(=O)$_2$—, —O—, or —S— and wherein one or more H atoms may be replaced by deuterium, F, Cl, Br, I, CN, $CF_3$ or $NO_2$, or an aromatic or heteroaromatic ring system with 5 to 60 aromatic ring atoms, which in each case may be substituted with one or more radicals $R^9$, or an aryloxy or heteroaryloxy group with 5 to 60 aromatic ring atoms, which may be substituted with one or more radicals $R^9$, or a diarylamino group, diheteroarylamino group or arylheteroarylamino group with 10 to 40 aromatic ring atoms, which may be substituted with one or more radicals $R^3$, or a combination of these systems; here, two or more of these substituents $R^7$ may also form a mono- or polycyclic, aliphatic, aromatic and/or benzoanellated ring system;

$R^8$ is in each instance independently of one another selected from the group consisting of H, deuterium, phenyl, naphthyl, F, $CF_3$ or an aliphatic, aromatic and/or heteroaromatic hydrocarbon radical with 1 to 20 C atoms, in which also one or more H atoms may be replaced by F or $CF_3$; here, two or more substituents $R^8$ may also form a mono- or polycyclic, aliphatic ring system; and $R^9$ is in each instance independently of one another selected from the group consisting of H, deuterium, phenyl, naphthyl, CN, $CF_3$, $NO_2$, OH, COOH, $C(=O)OR^3$, $C(=O)N(R^3)$, $C(=O)R^3$, $S(=O)R^3$, $S(=O)_2R^3$, $OSO_2R^3$, a linear alkyl, alkoxy or thioalkoxy group with 1 to 40 C atoms or a linear alkenyl or alkynyl group with 2 to 40 C atoms or a branched or cyclic alkyl, alkenyl, alkynyl, alkoxy or thioalkoxy group with 3 to 40 C atoms, each of which may be substituted with one or more radicals $R^8$, wherein one or more non-adjacent $CH_2$ groups may be replaced by —$R^3C=CR^3$—, —C≡C—, or one adjacent $CH_2$-group by —C(=O)—, —C(=S)—, —C(=Se)—, —C=N—, —C(=O)O—, —C(=O)N($R^3$)—, —S(=O)—, —S(=O)$_2$—, —O—, or —S— and wherein one or more H atoms may be replaced by deuterium, F, Cl, Br, I, CN, $CF_3$ or $NO_2$, or an aromatic or heteroaromatic ring system with 5 to 60 aromatic ring atoms, which in each case may be substituted with one or more radicals $R^8$, or an aryloxy or heteroaryloxy group with 5 to 60 aromatic ring atoms, which may be substituted with one or more radicals $R^3$, or a diarylamino group, diheteroarylamino group or arylheteroarylamino group with 10 to 40 aromatic ring atoms, which may be substituted with one or more radicals $R^8$, or a combination of these systems; here, two or more of these substituents $R^9$ may also form with one another a mono- or polycyclic, aliphatic, aromatic and/or benzoanellated ring system.

17. The organic molecule according to claim 16, wherein AF2 comprises a structure of formula 4:

Formula 4

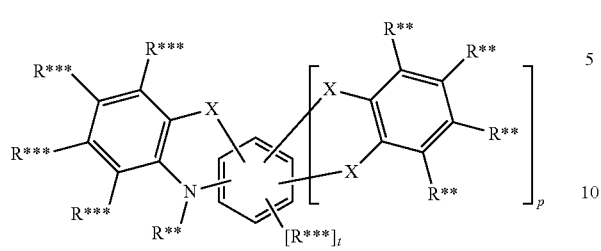

wherein p is 0 or 1;

t=4−2p;

X is CR$_2$, NR, oxygen, sulfur or a direct bond, wherein maximally two place holders X are simultaneously a direct bond, wherein these are not constituents of the same ring.

18. The organic molecule according to claim 17, wherein AF2 is selected as one of the following structures, wherein the possible linking points on the separator or on the chemical entity AF2 are designated with lower-case letters a to z and $a_2$ to $k_2$;

6

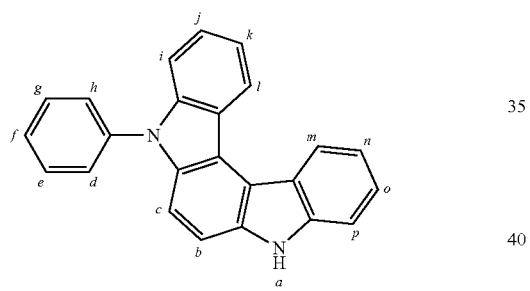

7

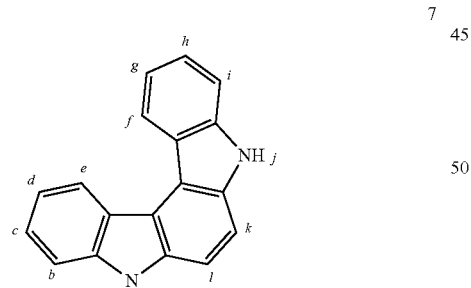

8

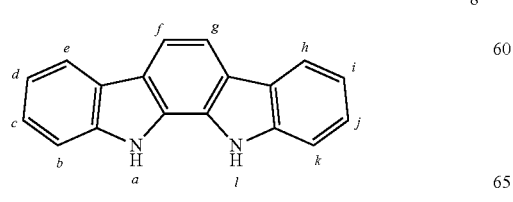

10

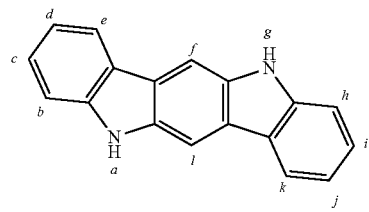

21

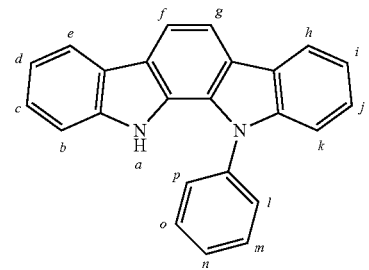

24

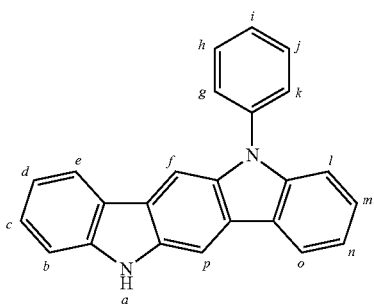

31

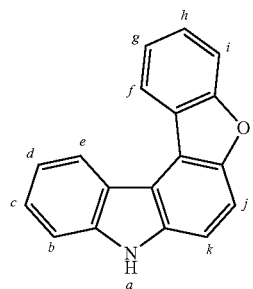

32

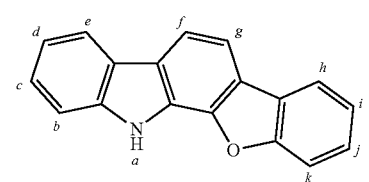

33

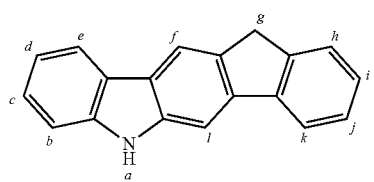

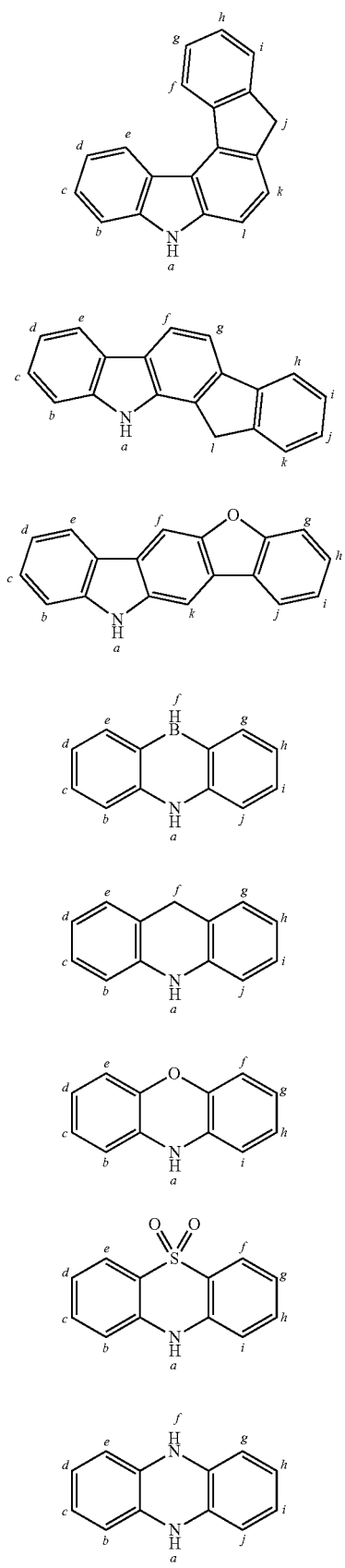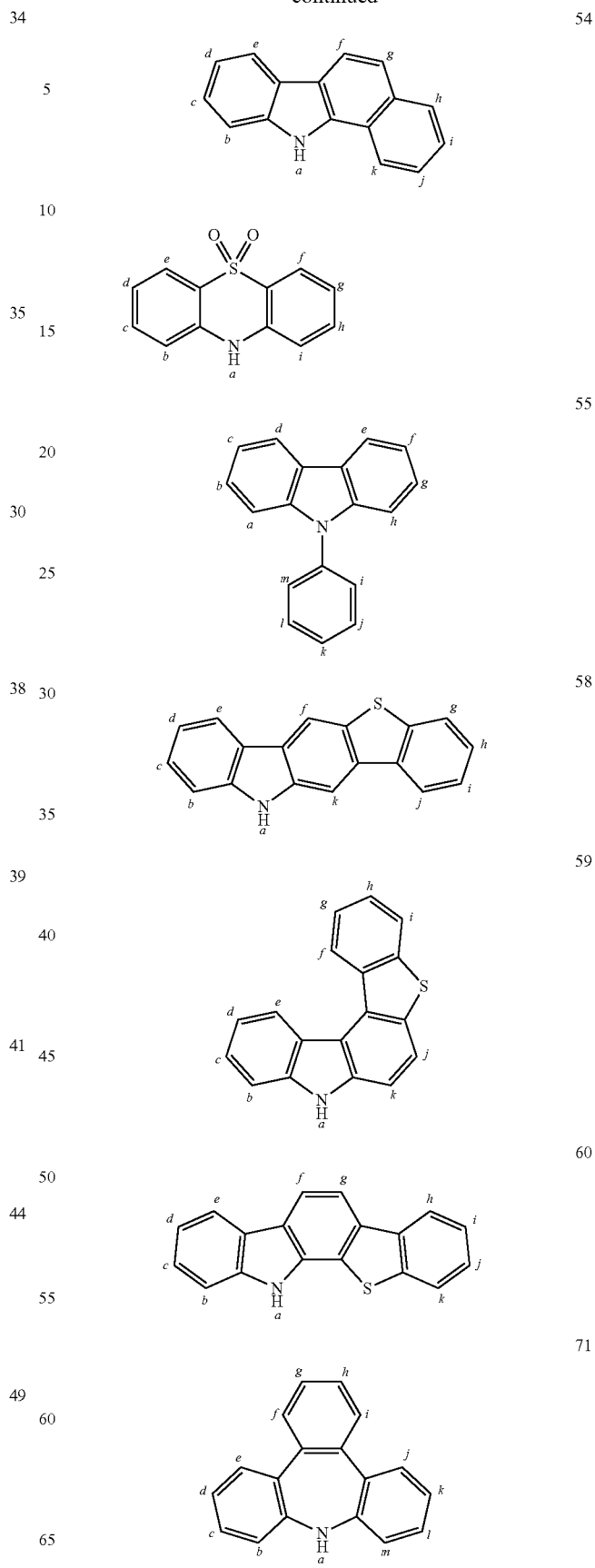

72
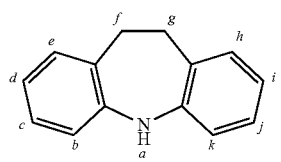
73
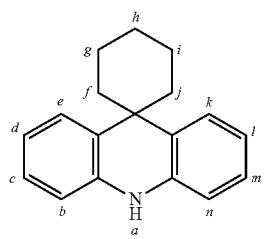
77
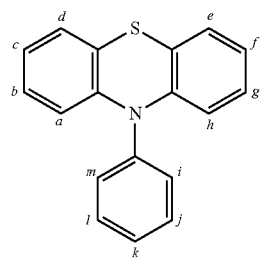
78
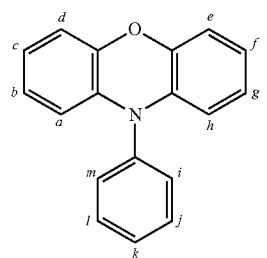
124
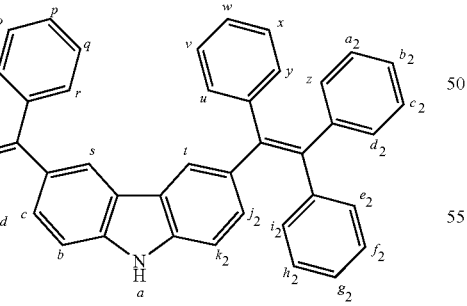
199
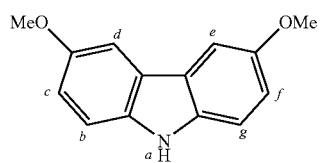
200
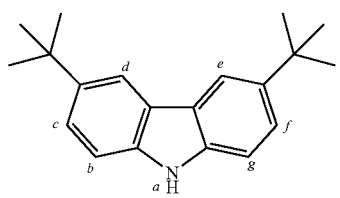
328
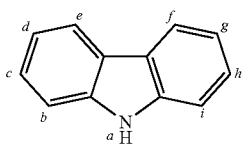
337
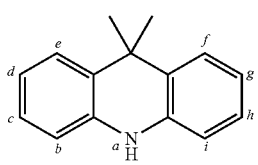
366
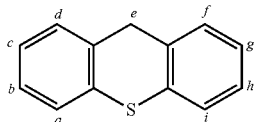
383
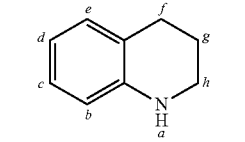
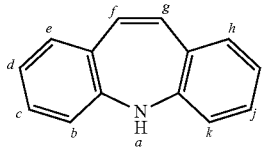
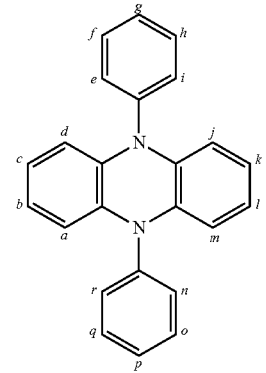
432
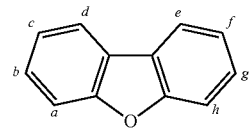

-continued

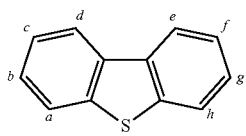
433

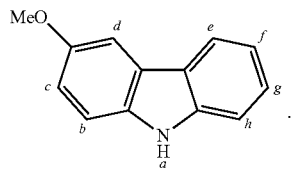
436

19. An optoelectronic component, comprising an organic molecule according to claim 16.

20. The optoelectronic component according to claim 19, comprising
  a substrate,
  an anode,
  a cathode, wherein the anode and the cathode are applied to the substrate, and
  at least one light-emitting layer applied between the anode and cathode and containing the organic molecule.

* * * * *